US008610862B2

(12) United States Patent
Kimura

(10) Patent No.: US 8,610,862 B2
(45) Date of Patent: Dec. 17, 2013

(54) LIQUID CRYSTAL DISPLAY DEVICE AND ELECTRONIC APPLIANCE

(71) Applicant: Semiconductor Energy Laboratory Co., Ltd., Atsugi (JP)

(72) Inventor: Hajime Kimura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/795,173

(22) Filed: Mar. 12, 2013

(65) Prior Publication Data

US 2013/0215369 A1 Aug. 22, 2013

Related U.S. Application Data

(63) Continuation of application No. 12/909,237, filed on Oct. 21, 2010, and a continuation of application No. 11/806,148, filed on May 30, 2007, now Pat. No. 7,847,904.

(30) Foreign Application Priority Data

Jun. 2, 2006 (JP) ................................ 2006-155471

(51) Int. Cl.
*G02F 1/1343* (2006.01)
*G02F 1/1345* (2006.01)

(52) U.S. Cl.
USPC .......................................................... 349/141

(58) Field of Classification Search
USPC ................................ 349/43, 49–53, 141–143
See application file for complete search history.

(56) References Cited

U.S. PATENT DOCUMENTS

| | | | |
|---|---|---|---|
| 5,623,157 | A | 4/1997 | Miyazaki et al. |
| 5,680,190 | A | 10/1997 | Michibayashi et al. |
| 5,870,160 | A | 2/1999 | Yanagawa et al. |
| 5,966,193 | A | 10/1999 | Zhang et al. |
| 6,034,757 | A | 3/2000 | Yanagawa et al. |
| 6,108,065 | A | 8/2000 | Ota et al. |
| 6,108,066 | A | 8/2000 | Yanagawa et al. |
| 6,160,600 | A | 12/2000 | Yamazaki et al. |
| 6,233,034 | B1 | 5/2001 | Lee et al. |
| 6,281,953 | B1 | 8/2001 | Lee et al. |
| 6,411,357 | B1 | 6/2002 | Ting et al. |
| 6,449,026 | B1 | 9/2002 | Min et al. |
| 6,462,800 | B1 | 10/2002 | Kim et al. |
| 6,507,383 | B1 | 1/2003 | Abe et al. |

(Continued)

FOREIGN PATENT DOCUMENTS

| | | |
|---|---|---|
| JP | 07-036030 | 2/1995 |
| JP | 09-146108 | 6/1997 |

(Continued)

*Primary Examiner* — Akm Enayet Ullah
(74) *Attorney, Agent, or Firm* — Nixon Peabody LLP; Jeffrey L. Costellia

(57) ABSTRACT

A pixel electrode or a common electrode is a light-transmissive conductive film; therefore, it is formed of ITO conventionally. Accordingly, the number of manufacturing steps and masks, and manufacturing cost have been increased. An object of the present invention is to provide a semiconductor device, a liquid crystal display device, and an electronic appliance each having a wide viewing angle, less numbers of manufacturing steps and masks, and low manufacturing cost compared with a conventional device. A semiconductor layer of a transistor, a pixel electrode, and a common electrode of a liquid crystal element are formed in the same step.

30 Claims, 135 Drawing Sheets

(56) References Cited

U.S. PATENT DOCUMENTS

| | | | | |
|---|---|---|---|---|
| 6,522,380 | B2 | 2/2003 | Lee et al. | |
| 6,525,798 | B1 | 2/2003 | Yamakita et al. | |
| 6,600,535 | B1 | 7/2003 | Tsuda et al. | |
| 6,611,310 | B2 | 8/2003 | Kurahashi et al. | |
| 6,710,835 | B2 | 3/2004 | Kurahashi et al. | |
| 6,774,970 | B1 | 8/2004 | Sekiguchi | |
| 6,803,982 | B2 | 10/2004 | Komatsu | |
| 6,833,882 | B2 | 12/2004 | Lee | |
| 6,914,656 | B2 | 7/2005 | Sakamoto et al. | |
| 6,917,392 | B2 | 7/2005 | Hannuki et al. | |
| 6,933,528 | B2 | 8/2005 | Itakura et al. | |
| 6,963,382 | B1 | 11/2005 | Yamazaki et al. | |
| 7,009,206 | B2 * | 3/2006 | Lee et al. | 257/72 |
| 7,088,409 | B2 | 8/2006 | Itou et al. | |
| 7,106,400 | B1 | 9/2006 | Tsuda et al. | |
| 7,130,010 | B2 | 10/2006 | Jeoung | |
| 7,157,303 | B2 | 1/2007 | Son | |
| 7,189,585 | B2 | 3/2007 | Yamazaki et al. | |
| 7,248,324 | B2 | 7/2007 | Ono et al. | |
| 7,251,005 | B2 | 7/2007 | Ono et al. | |
| 7,251,006 | B2 | 7/2007 | Ono et al. | |
| 7,253,863 | B2 | 8/2007 | Ono et al. | |
| 7,256,854 | B2 | 8/2007 | Ono et al. | |
| 7,271,869 | B2 | 9/2007 | Ono et al. | |
| 7,303,987 | B2 | 12/2007 | Lim et al. | |
| 7,362,400 | B2 | 4/2008 | Itou et al. | |
| 7,456,924 | B2 | 11/2008 | Ono et al. | |
| 7,492,417 | B2 | 2/2009 | Hirakata et al. | |
| 7,515,237 | B2 | 4/2009 | Park et al. | |
| 7,563,658 | B2 * | 7/2009 | Ishizuka et al. | 438/162 |
| 7,605,898 | B2 | 10/2009 | Ochiai et al. | |
| 7,616,282 | B2 | 11/2009 | Yamazaki et al. | |
| 7,656,491 | B2 * | 2/2010 | Yamazaki et al. | 349/141 |
| 7,683,996 | B2 | 3/2010 | Ono et al. | |
| 7,692,748 | B2 | 4/2010 | Ono et al. | |
| 7,697,100 | B2 | 4/2010 | Ono et al. | |
| 7,705,949 | B2 | 4/2010 | Ono et al. | |
| 7,733,455 | B2 | 6/2010 | Ono et al. | |
| 7,816,682 | B2 | 10/2010 | Kimura | |
| 7,829,394 | B2 * | 11/2010 | Takano et al. | 438/149 |
| 7,902,034 | B2 * | 3/2011 | Yamazaki et al. | 438/406 |
| 7,936,429 | B2 | 5/2011 | Ono et al. | |
| 7,955,912 | B2 * | 6/2011 | Ohnuma et al. | 438/155 |
| 8,035,786 | B2 | 10/2011 | Ono et al. | |
| 8,045,116 | B2 | 10/2011 | Ono et al. | |
| 8,338,865 | B2 * | 12/2012 | Kimura | 257/257 |
| 8,357,021 | B2 * | 1/2013 | Sakakura et al. | 445/11 |
| 2001/0011981 | A1 | 8/2001 | Yamamoto et al. | |
| 2001/0043304 | A1 | 11/2001 | Matsumoto | |
| 2001/0046027 | A1 | 11/2001 | Tai et al. | |
| 2002/0044140 | A1 | 4/2002 | Inukai | |
| 2002/0063835 | A1 | 5/2002 | Kim | |
| 2002/0140891 | A1 | 10/2002 | Tomioka et al. | |
| 2002/0176030 | A1 | 11/2002 | Matsumoto | |
| 2003/0103181 | A1 | 6/2003 | Imayama et al. | |
| 2003/0133066 | A1 | 7/2003 | Ono et al. | |
| 2003/0218664 | A1 | 11/2003 | Sakamoto et al. | |
| 2004/0051100 | A1 | 3/2004 | Yamazaki et al. | |
| 2004/0183978 | A1 | 9/2004 | Jeoung | |
| 2005/0001959 | A1 | 1/2005 | Chang | |
| 2005/0105033 | A1 | 5/2005 | Itou et al. | |
| 2005/0128390 | A1 | 6/2005 | Yang | |
| 2005/0140867 | A1 | 6/2005 | Choi | |
| 2005/0231673 | A1 | 10/2005 | Yamazaki et al. | |
| 2005/0264731 | A1 | 12/2005 | Itou et al. | |
| 2006/0001817 | A1 | 1/2006 | Yamazaki et al. | |
| 2006/0055859 | A1 | 3/2006 | Jin et al. | |
| 2006/0092356 | A1 | 5/2006 | Morimoto et al. | |
| 2006/0092363 | A1 | 5/2006 | Hasegawa et al. | |
| 2006/0103789 | A1 | 5/2006 | Takahashi et al. | |
| 2006/0164575 | A1 | 7/2006 | Su et al. | |
| 2006/0186413 | A1 | 8/2006 | Sakakura et al. | |
| 2006/0192912 | A1 | 8/2006 | Itou et al. | |
| 2006/0215086 | A1 | 9/2006 | Kurasawa | |
| 2006/0215087 | A1 | 9/2006 | Matsushima et al. | |
| 2006/0267891 | A1 | 11/2006 | Nishimura et al. | |
| 2007/0002199 | A1 | 1/2007 | Fujikawa et al. | |
| 2007/0013820 | A1 | 1/2007 | Jeoung | |
| 2007/0126969 | A1 | 6/2007 | Kimura et al. | |
| 2007/0146591 | A1 | 6/2007 | Kimura et al. | |
| 2007/0146605 | A1 | 6/2007 | Park et al. | |
| 2007/0153198 | A1 | 7/2007 | Cho et al. | |
| 2007/0236640 | A1 | 10/2007 | Kimura | |
| 2007/0284627 | A1 | 12/2007 | Kimura | |
| 2008/0149937 | A1 | 6/2008 | Moriwaki | |
| 2009/0096974 | A1 | 4/2009 | Ono et al. | |
| 2009/0189156 | A1 * | 7/2009 | Akimoto | 257/43 |
| 2010/0060811 | A1 | 3/2010 | Yamazaki et al. | |
| 2010/0120180 | A1 | 5/2010 | Yamazaki et al. | |
| 2011/0024758 | A1 | 2/2011 | Kimura | |
| 2011/0032435 | A1 | 2/2011 | Kimura | |
| 2012/0002150 | A1 | 1/2012 | Ono et al. | |
| 2012/0002151 | A1 | 1/2012 | Ono et al. | |

FOREIGN PATENT DOCUMENTS

| | | |
|---|---|---|
| JP | 09-292504 | 11/1997 |
| JP | 2000-089255 | 3/2000 |
| JP | 2001-056474 | 2/2001 |
| JP | 2001-059976 | 3/2001 |
| JP | 2001-083540 | 3/2001 |
| JP | 2002-182228 | 6/2002 |
| JP | 2002-221736 | 8/2002 |
| JP | 2002-268074 | 9/2002 |
| JP | 2004-157552 | 6/2004 |
| JP | 2004-252071 | 9/2004 |
| JP | 2005-107489 | 4/2005 |
| WO | WO-01-33292 A1 | 5/2001 |

* cited by examiner

60Hz insertion of dark image

90Hz insertion of dark image

120Hz insertion of dark image

LIQUID CRYSTAL DISPLAY DEVICE AND ELECTRONIC APPLIANCE

BACKGROUND OF THE PRESENT INVENTION

1. Field of the Present Invention

The present invention relates to a semiconductor device, a liquid crystal display device and an electronic appliance. In particular, the present invention relates to a liquid crystal display device and an electronic appliance that control molecular orientation of liquid crystal molecules by generation of an electrical field parallel to a substrate.

2. Description of the Related Art

As for a liquid crystal display device, there are a vertical electrical field type in which an electrical field vertical to a substrate is applied to liquid crystal and a transverse electrical field type in which an electrical field parallel to a substrate is applied to liquid crystal. A liquid crystal display device of a transverse electrical field type is superior in a viewing angle characteristic to that of a vertical electrical field type.

As a method for controlling a gray scale by generating an electrical field parallel to a substrate (transverse electrical field) to move liquid crystal molecules in a plane parallel to the substrate, there are an IPS (In-Plane Switching) mode and an FFS (Fringe-Field Switching) mode.

An IPS liquid crystal display device is provided with two interdigitated electrodes (also referred to as comb teeth-shaped electrodes or comb-shaped electrodes) over one of a pair of substrates. A transverse electrical field is generated by a potential difference between these electrodes (one of interdigitated electrodes is a pixel electrode and the other is a common electrode), which moves liquid crystal molecules in a plane parallel to the substrate.

An FFS liquid crystal display device is provided with a second electrode over one of a pair of substrates, and a first electrode over the second electrode. The first electrode has a slit (opening pattern), and the second electrode has a plate shape (planar shape to cover most slits of the first electrodes). A transverse electrical field is generated by a potential difference between these electrodes (one of the first electrode and the second electrode is a pixel electrode and the other is a common electrode), which moves liquid crystals in a plane parallel to the substrate.

That is, the liquid crystal molecules which are oriented parallel to the substrate (so-called homogeneous orientation) can be controlled in a direction parallel to the substrate; therefore, a viewing angle is increased.

Conventionally, a pixel electrode or a common electrode has been a light-transmissive conductive film; therefore, it has been formed of ITO (indium tin oxide) (Patent Document 1: Japanese Published Patent Application No. 2000-89255).

SUMMARY OF THE PRESENT INVENTION

As described above, the pixel electrode or the common electrode has been a light-transmissive conductive film; therefore, it has been formed of ITO conventionally. Accordingly, the number of manufacturing steps and masks, and manufacturing cost have been increased.

An object of the present invention is to provide a semiconductor device, a liquid crystal display device, and an electronic appliance each having a wide viewing angle, which is manufactured through a smaller number of steps using less masks at low cost compared with a conventional device.

A liquid crystal display device of the present invention includes a substrate, and a transistor and a liquid crystal element that are formed over the substrate. Further, a semiconductor film of the transistor and a pixel electrode or a common electrode of the liquid crystal element are films formed in the same step.

Note that the liquid crystal element is only necessary to be capable of rotating a molecular orientation of liquid crystal molecules controlling the amount of light generally in direction parallel to the substrate by a transverse electrical field generated due to a potential difference between the pixel electrode and the common electrode provided to connect between pixels of a plurality of pixels in a pixel portion.

According to a structure of a liquid crystal display device of the present invention, a transistor and a liquid crystal element provided with a first electrode and a second electrode are provided over a substrate, and the first electrode includes a film in the same layer as a semiconductor layer of the transistor.

According to another structure of a liquid crystal display device of the present invention, a first electrode, a second electrode, and a transistor are provided over a substrate, and the first electrode includes a film in the same layer as a semiconductor layer of the transistor. A molecular orientation of liquid crystal molecules in a liquid crystal layer is changed depending on a potential difference between the first electrode and the second electrode.

According to another structure of a liquid crystal display device of the present invention, in the above structure, the first electrode is a comb-teeth shaped electrode, and the second electrode is a plate-like electrode.

According to another structure of a liquid crystal display device of the present invention, a transistor and a liquid crystal element provided with a first electrode, a second electrode, and a third electrode are provided over a substrate, and the first electrode or the second electrode includes a film in the same layer as a semiconductor layer of the transistor. The second electrode and the third electrode are electrically connected.

According to another structure of a liquid crystal display device of the present invention, a transistor and a liquid crystal element provided with a first electrode and a second electrode are provided over a substrate, and the first electrode and the second electrode each include a film in the same layer as a semiconductor layer of the transistor.

According to another structure of a liquid crystal display device of the present invention, a first electrode, a second electrode, and a transistor are provided over a substrate, and the first electrode and the second electrode each include a film in the same layer as a semiconductor layer of the transistor. A molecular orientation of liquid crystal molecules in a liquid crystal layer is changed depending on a potential difference between the first electrode and the second electrode.

According to another structure of a liquid crystal display device of the present invention, a first electrode, a second electrode, a third electrode, and a transistor are provided over a substrate, and the first electrode includes a film in the same layer as a semiconductor layer of the transistor. A molecular orientation of liquid crystal molecules in a liquid crystal layer is changed by an electrical field generated due to a potential difference between the first electrode and the second electrode, and an electrical field generated due to a potential difference between the first electrode and the third electrode.

According to another structure of a liquid crystal display device of the invention, in the above structure, the first electrode and the second electrode are comb teeth-shaped electrodes.

According to another structure of a liquid crystal display device of the invention, in the above structure, the first electrode and the second electrode are comb teeth-shaped electrodes, and the third electrode is a plate-like electrode.

An electronic appliance of the present invention includes the liquid crystal display device having any of the above structures for a display portion.

A switch used in the present invention may be any switch such as an electrical switch or a mechanical switch. That is, it may be anything as long as it can control a current flow and is not limited to a particular type. It may be, for example, a transistor, a diode (PN diode, PIN diode, Schottky diode, diode-connected transistor, or the like), a thyristor, or a logic circuit configured with them. Therefore, in the case of using a transistor as a switch, polarity (conductivity) thereof is not particularly limited because the transistor operates as a simple switch. However, when an off current is preferred to be small, a transistor of polarity with a small off current is preferably used. For example, a transistor which has an LDD region or a multi-gate structure has a small off current. Further, it is desirable that an n-channel transistor be employed when the potential of a source terminal of the transistor operating as a switch is closer to a low potential side power source (Vss, GND, 0 V or the like), and a p-channel transistor be employed when a potential of the source terminal is closer to a high potential side power source (Vdd or the like). This helps the switch operate efficiently since the absolute value of the gate-source voltage of the transistor can be increased.

It is to be noted that a CMOS switch can also be applied by using both n-channel and p-channel transistors. In the case of such a CMOS switch, a current can be applied when a switch of either the p-channel transistor or the n-channel transistor is conductive, which helps the switch operate efficiently. For example, even when a voltage of an input signal to a switch is either high or low, an appropriate voltage can be outputted. In addition, a voltage amplitude value of a signal for turning on or off a switch can be made small; therefore, power consumption can be lowered. It is to be noted that when a transistor is used as a switch, the transistor includes an input terminal (one of a source terminal and a drain terminal), an output terminal (the other of the source terminal and the drain terminal), and a terminal for controlling conduction (gate terminal). On the other hand, when a diode is used as a switch, there is the case where a terminal for controlling conduction is not included. Thus, the number of wirings for controlling terminals can be reduced.

Note that in the present invention, the description "being connected" includes the case where elements are electrically connected, the case where elements are functionally connected, and the case where elements are directly connected. Accordingly, in the configurations disclosed by the present invention, other elements may be interposed between elements having a predetermined connecting relation. For example, one or more elements which enable an electrical connection (for example, a switch, a transistor, a capacitor, an inductor, a resistor, or a diode) may be provided between a certain portion and a certain portion. In addition, one or more circuits which enable a functional connection may be provided between connection, such as a logic circuit (for example, an inverter, a NAND circuit, or a NOR circuit), a signal converter circuit (for example, a DA converter circuit, an AD converter circuit, or a gamma correction circuit), a potential level converter circuit (for example, a power supply circuit such as a booster circuit or a step-down circuit, or a level shifter circuit for changing a potential level of an H signal or an L signal), a voltage source, a current source, a switching circuit, or an amplifier circuit (for example, a circuit which can increase the signal amplitude, the amount of current, or the like, such as an operational amplifier, a differential amplifier circuit, a source follower circuit, or a buffer circuit), a signal generating circuit, a memory circuit, or a control circuit. Alternatively, the elements may be directly connected without other elements or other circuits interposed therebetween. Note that when elements are connected without other elements or circuits interposed therebetween, such elements are described as "being directly connected" in this specification. On the other hand, when elements are described as "being electrically connected", the following cases are included: the case where such elements are electrically connected (that is, connected with other elements interposed therebetween), the case where such elements are functionally connected (that is, connected with other circuits interposed therebetween), and the case where such elements are directly connected (that is, connected without other elements or other circuits interposed therebetween).

Note that various modes besides a liquid crystal element can be applied to a display element. For example, a display medium in which contrast is changed by an electromagnetic effect can be used, such as an EL element (organic EL element, inorganic EL element, EL element containing organic material and inorganic material), an electron emitting element, a liquid crystal element, an electronic ink, a light diffraction element, a discharging element, a digital micromirror device (DMD), a piezoelectric element, or a carbon nanotube. It is to be noted that an EL panel type display device using an EL element includes an EL display; a display device using an electron emitting element includes a field emission display (FED), an SED type flat panel display (Surface-conduction Electron-emitter Display), and the like; a liquid crystal panel type display device using a liquid crystal element includes a liquid crystal display; a digital paper type display device using an electronic ink includes electronic paper; a display device using a light diffraction element includes a grating light valve (GLV) type display; a PDP (Plasma Display Panel) type display using a discharging element includes a plasma display; a DMD panel type display device using a micromirror element includes a digital light processing (DLP) type display device; a display device using a piezoelectric element includes a piezoelectric ceramic display; a display device using a carbon nanotube includes a nano emissive display (NED); and the like.

Note that in the present invention, various types of transistors can be applied to a transistor. Therefore, types of transistors which can be applied are not limited to a certain type. For example, a thin film transistor (TFT) including a non-single crystalline semiconductor film typified by amorphous silicon or polycrystalline silicon can be applied. With use of them, following advantages can be provided: such transistors can be manufactured at a low manufacturing temperature, can be manufactured at low cost, and can be formed over a large substrate, and transistors that can transmit light can be manufactured by being formed over a light-transmissive substrate. In addition, a MOS transistor, a junction transistor, a bipolar transistor, a transistor formed using a semiconductor substrate or an SOI substrate, or the like can be employed. With use of them, transistors with few variations, transistors with a high current supply capability, or transistors with a small size can be manufactured, and a circuit with low power consumption can be constructed. Further, a transistor including a compound semiconductor such as ZnO, a-InGaZnO, SiGe, or GaAs, or a thin film transistor obtained by thinning such compound semiconductors can be employed. Accordingly, such transistors can be manufactured at a low manufacturing temperature, can be manufactured at a room temperature, and can be formed directly on a low heat-resistant substrate such as a plastic substrate or a film substrate. A transistor or the like formed by an ink-jet method or a printing method may also be employed. With use of them, such transistors can be manufactured at a room temperature, can be manufactured at a low vacuum, and can be manufactured using a large substrate. In addition, since such transistors can be manufactured without use of a mask (reticle), the layout of the transistors can be easily changed. A transistor including an organic semiconductor or a carbon nanotube, or other transistors can be applied as well. With use of them, the transistors can be formed over a substrate which can be bent. Note that a non-single crystalline semiconductor film may include hydrogen or halogen. In addition, various types of substrates can be applied to a substrate provided with transistors are formed without limitation to a certain type. With use of them, transistors may be formed using, for example, a single crystalline substrate or an SOI substrate, a glass substrate, a quartz substrate, a plastic substrate, a paper substrate, a cellophane substrate, a stone substrate, a stainless steel substrate, or a substrate made of a stainless steel foil. In addition, after formation of transistors over a substrate, the transistors may be transposed onto another substrate. With use of the aforementioned substrates, transistors with excellent properties and with low power consumption can be formed, and thus, a device that is not easily broken or have high heat resistance can be formed.

A transistor can have various structures without limitation to a certain structure. For example, a multi-gate structure having two or more gate electrodes may be used. With the multi-gate structure, channel regions are connected in series; therefore, a plurality of transistors are connected in series. With the multi-gate structure, an off current can be reduced, and the withstand voltage of the transistor can be increased, which improves reliability. In addition, even if a drain-source voltage fluctuates when the transistor operates in a saturation region, drain-source current does not fluctuate very much, and stable characteristics can be provided. In addition, a structure in which gate electrodes are formed above and below a channel may be used. With the use of the structure in which gate electrodes are formed above and below the channel, a channel region is enlarged so that the amount of current flowing therethrough is increased, or a depletion layer can be easily formed, so that the S value is decreased. Further, when the gate electrodes are provided above and below the channel, a plurality of transistors are connected in parallel.

Further, a gate electrode may be provided above or below the channel. Either a staggered structure or an inversely staggered structure may be employed. A channel region may be divided into a plurality of regions, or connected in parallel or in series. Further, a source electrode or a drain electrode may overlap with a channel (or a part of it), thereby preventing a charge from being accumulated in a part of the channel and being unstable operation. Further, an LDD region may be provided. By providing an LDD region, an off current can be reduced and reliability can be improved by improving the withstand voltage of a transistor, and further stable characteristics can be obtained since a drain-source current does not change so much even when a drain-source voltage changes in the operation in a saturation region.

It is to be noted in the present invention that one pixel corresponds to the smallest unit of an image. Accordingly, in the case of a full color display device formed of color elements of R (red), G (green), and B (blue), one pixel is formed of a dot of an R color element, a dot of a G color element, and a dot of a B color element. It is to be noted that color elements are not limited to three colors, and may be formed of more than three colors or a color other than RGB. For example, RGB to which white is added (RGBW) or RGB to which one or more colors selected from yellow, cyan, magenta, emerald green, vermilion, and the like are added can be employed. Alternatively, a similar color to at least one of RGB may be added to RGB, for example, R, G, B1, and B2 may be employed. Although B1 and B2 are both blue, they have slightly different frequencies. By using such a color element, a more realistic image can be displayed and power consumption can be reduced. It is to be noted that one pixel may include a plurality of dots of certain color elements of a certain color. In this case, each of the plurality of dots of the color elements may each have a different size of region which contributes to display. Further, a gray scale may be expressed by controlling each of the plurality of dots of the color elements. This method is referred to as an area gray scale method. Alternatively, the viewing angle may be expanded by supplying each of a plurality of dots of a certain color elements with a slightly different signal.

It is to be noted in the present invention that pixels may be arranged in matrix. Here, the case where pixels are arranged in matrix corresponds to the case where pixels are arranged on a straight line or a jagged line in vertical direction and transverse direction. Therefore, the case where pixels are arranged in matrix also corresponds to the case where pixels are arranged in the form of stripes or the case where dots of three color elements are arranged in what is called a delta pattern or in a Bayer pattern when full color display is carried out using the three color elements (for example, RGB). It is to be noted that color elements are not limited to three colors and may be more than three colors, for example, RGBW (W is white) or RGB to which one or more of yellow, cyan, magenta, and the like are added. The dots of the color elements may have different sizes of a display regions. Accordingly, reduction in power consumption and longer lifetime of a display element can be achieved.

Note that a transistor is an element having at least three terminals of a gate, a drain, and a source. The transistor has a channel region between a drain region and a source region, and can supply a current through the drain region, the channel region, and the source region. Here, since the source and the drain of the transistor may change depending on the structure, the operating conditions, and the like of the transistor, it is difficult to define which is a source or a drain. Therefore, in the present invention, a region functioning as a source or a drain may not be called the source or the drain. In such the case, for example, one of the source and the drain may be called a first terminal and the other terminal may be called a second terminal. Note also that a transistor may be an element having at least three terminals of a base, an emitter, and a collector. In this case also, one of the emitter and the collector may be similarly called a first terminal and the other terminal may be called a second terminal.

A gate wiring (also referred to as a scan line, a gate line, a gate signal line, or the like) means a wiring for connecting between gate electrodes of pixels, or a wiring for connecting a gate electrode to another wiring.

However, there is a portion functioning as both a gate electrode and a gate wiring. Such a region may be called either a gate electrode or a gate wiring. That is, there is a region where a gate electrode and a gate wiring cannot be clearly distinguished from each other. For example, in the case where a channel region overlaps with an extended gate wiring, the overlapped region functions as both a gate wiring and a gate electrode. Accordingly, such a region may be called either a gate electrode or a gate wiring.

In addition, a region formed of the same material as a gate electrode and connected to the gate electrode may also be called a gate electrode. Similarly, a region formed of the same material as a gate wiring and connected to the gate wiring may also be called a gate wiring. In a strict sense, such a region may not overlap with a channel region, or may not have a function of connecting to another gate electrode. However, there is a region formed of the same material as a gate electrode or a gate wiring and connected to the gate electrode or the gate wiring due to precision or the like in manufacturing. Accordingly, such a region may also be called either a gate electrode or a gate wiring.

In a multi-gate transistor, for example, a gate electrode of one transistor is often connected to a gate electrode of another transistor with use of a conductive film which is formed of the same material as the gate electrode. Since such a region is a region for connecting a gate electrode to another gate electrode, it may be called a gate wiring, while it may also be called a gate electrode since a multi-gate transistor can be considered as one transistor. That is, a region which is formed of the same material as a gate electrode or a gate wiring and connected thereto may be called either the gate electrode or the gate wiring. In addition, for example, a part of a conductive film which connects a gate electrode and a gate wiring may also be called either a gate electrode or a gate wiring.

Note that a gate terminal means a part, of a gate electrode or a part of a region which is electrically connected to the gate electrode.

It is to be noted that a source includes a source region, a source electrode, and a source wiring (also referred to as source line, source signal line, or the like), or a part of them. A source region corresponds to a semiconductor region which contains a lot of P-type impurities (boron, gallium, or the like) or N-type impurities (phosphorus, arsenic, or the like). Therefore, a region containing a small amount of P-type impurities or N-type impurities, that is, an LDD (Lightly Doped Drain) region is not included in a source region. A source electrode corresponds to a conductive layer of a part which is formed of a different material from a source region and electrically connected to the source region. However, a source electrode may be referred to as a source electrode including a source region. A source wiring corresponds to a wiring for connecting source electrodes of pixels and connecting a source electrode and another wiring.

However, there is a part which functions as a source electrode and also as a source wiring. Such a region may be referred to as a source electrode or a source wiring. That is, there is a region which cannot be specifically determined as a source electrode or a source wiring. For example, when there is a source region overlapping a source wiring which is extended, the region functions as a source wiring and also as a source electrode. Therefore, such a region may be referred to as a source electrode or a source wiring.

Further, a portion which is formed of the same material as a source electrode and connected to the source electrode may be referred to as a source electrode as well. A portion which connects one source electrode and another source electrode may also be referred to as a source electrode as well. Further, a portion overlapping a source region may be referred to as a source electrode. Similarly, a region which is formed of the same material as a source wiring and connected to the source wiring may be referred to as a source wiring. In a strict sense, such a region may not have a function to connect to another source electrode. However, there is a region which is formed of the same material as a source electrode or a source wiring and connected to a source electrode or a source wiring due to a manufacturing margin and the like. Therefore, such a region may also be referred to as a source electrode or a source wiring.

Also, for example, a conductive film of a portion which connects a source electrode and a source wiring may be referred to as a source electrode or a source wiring.

It is to be noted that a source terminal corresponds to a part of a source region, a source electrode, or a region electrically connected to a source electrode.

It is to be noted that as for a drain, the similar thing to a source can be applied.

It is to be noted in the present invention that a semiconductor device corresponds to a device including a circuit having a semiconductor element (transistor, diode, or the like). Further, a semiconductor device may be a general device which can function by utilizing semiconductor characteristics.

Further, a display device corresponds to a device including a display element (liquid crystal element, EL element, or the like). It is to be noted that a display device may be a main body of a display panel in which a plurality of pixels including display elements such as liquid crystal elements or EL elements and a peripheral driver circuit for driving the pixels are formed over the same substrate. Further, a display device may include a peripheral driver circuit disposed over a substrate by wire bonding or a bump, that is, a so-called chip on glass (COG). Furthermore, a display device may include the one provided with a flexible printed circuit (FPC) or a printed wiring board (PWB) (IC, resistor, capacitor, inductor, transistor, or the like). Moreover, a display device may include an optical sheet such as a polarizing plate or a retardation film. In addition, a backlight unit (such as a light guide plate, a prism sheet, a diffusion sheet, a reflection sheet, a light source (an LED, a cold-cathode tube, or the like)) may be included.

A light emitting device corresponds to a display device including a self-light emitting display element such as an EL element or an element used for an FED in particular. A liquid crystal display device corresponds to a display device including a liquid crystal element.

It is to be noted in the present invention that when it is described that an object is formed on another object, it does not necessarily mean that the object is in direct contact with the another object. In the case where the above two objects are not in direct contact with each other, still another object may be interposed therebetween. Accordingly, when it is described that a layer B is formed on a layer A, it means either the case where the layer B is formed in direct contact with the layer A, or the case where another layer (such as a layer C or a layer D) is formed in direct contact with the layer A, and then the layer B is formed in direct contact with the another layer. In addition, when it is described that an object is formed over or above another object, it does not necessarily mean that the object is in direct contact with the another object, and another object may be interposed therebetween. Accordingly, when it is described that a layer B is formed over or above a layer A, it means either the case where the layer B is formed in direct contact with the layer A, or the case where another layer (such as a layer C or a layer D) is formed in direct contact with the layer A, and then the layer B is formed in direct contact with the another layer. Similarly, when it is described that an object is formed below or under another object, it means either the case where the objects are in direct contact with each other or not in contact with each other.

Therefore, a liquid crystal display device with a wide viewing angle and low manufacturing cost compared with a conventional device can be provided.

BRIEF DESCRIPTION OF DRAWINGS

FIG. 120A is a diagram showing a main structure of a liquid crystal display panel of the present invention, and FIG. 120B is a diagram showing a cross section of the main structure of the liquid crystal display panel of the present invention.

FIG. 121A is a diagram showing a main structure of a liquid crystal display panel of the present invention, and FIG. 121B is a diagram showing a cross section of the main structure of the liquid crystal display panel of the present invention.

FIG. 122A is a diagram showing a main structure of a liquid crystal display panel of the present invention, and FIG. 122B is a diagram showing a cross section of the main structure of the liquid crystal display panel of the present invention.

FIG. 123A is a diagram showing a main structure of a liquid crystal display panel of the present invention, and FIG. 123B is a diagram showing a cross section of the main structure of the liquid crystal display panel of the present invention.

FIG. 124A is a diagram showing a main structure of a liquid crystal display panel of the present invention, and FIG. 124B is a diagram showing a cross section of the main structure of the liquid crystal display panel of the present invention.

FIG. 125A is a diagram showing a main structure of a liquid crystal display panel of the present invention, and FIG. 125B is a diagram showing a cross section of the main structure of the liquid crystal display panel of the present invention.

FIGS. 126A to 126C are diagrams each showing a cross section of a main structure of a liquid crystal display panel of the present invention.

FIGS. 127A to 127C are diagrams each showing a cross section of a main structure of a liquid crystal display panel of the present invention.

FIGS. 128A to 128C are diagrams each showing a cross section of a Main structure of a liquid crystal display panel of the present invention.

FIGS. 129A to 129C are diagrams each showing a cross section of a main structure of a liquid crystal display panel of the present invention.

FIGS. 130A and 130B are diagrams each showing a cross section of a main structure of a liquid crystal display panel of the present invention.

FIGS. 131A and 131B are diagrams each showing a cross section of a main structure of a liquid crystal display panel of the present invention.

Figure 132A:
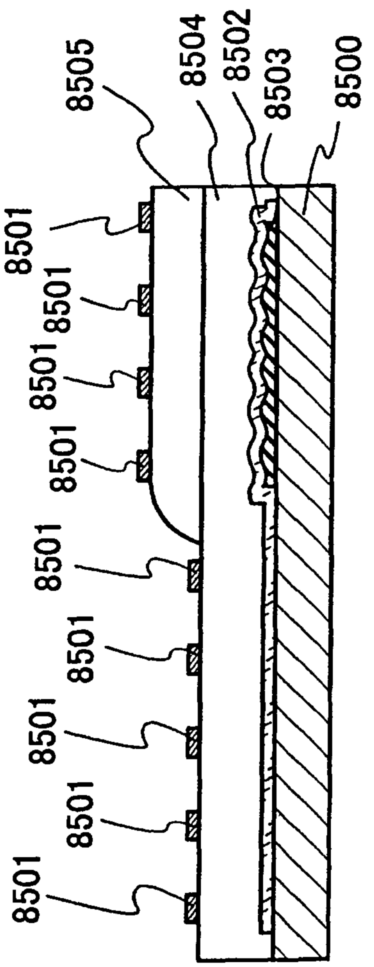
Figure 132B:
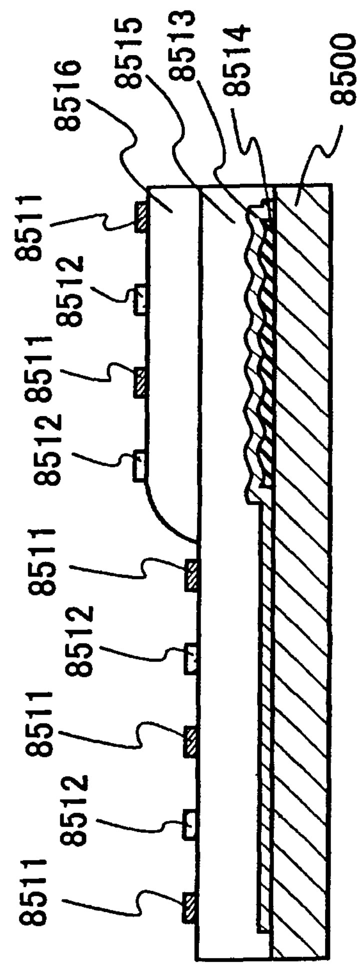

FIGS. 132A and 132B are diagrams each showing a cross section of a main structure of a liquid crystal display panel of the present invention.

Figure 133A:
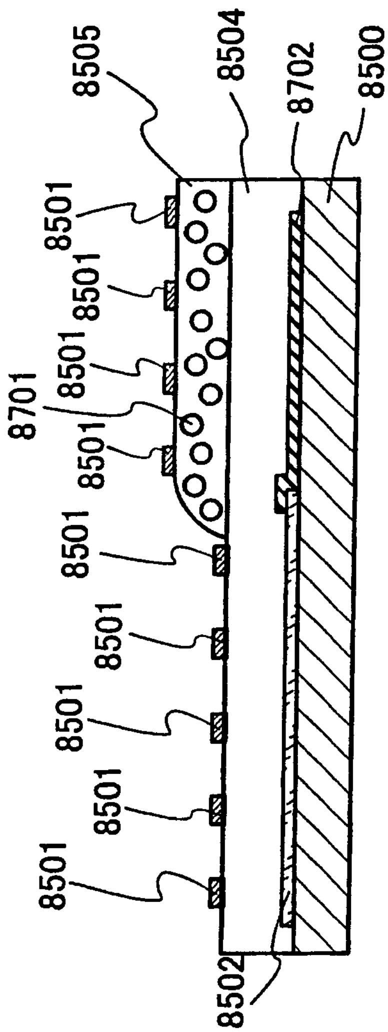
Figure 133B:
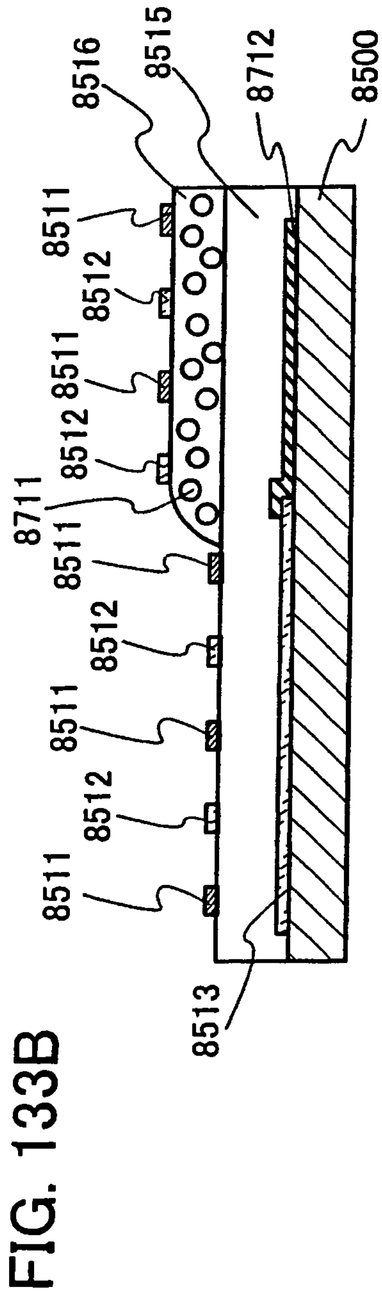

FIGS. 133A and 133B are diagrams each showing a cross section of a main structure of a liquid crystal display panel of the present invention.

Figure 134A:
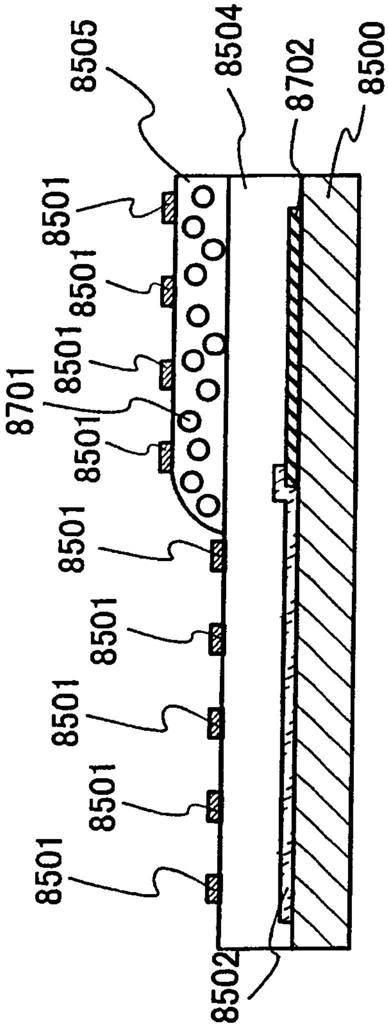
Figure 134B:
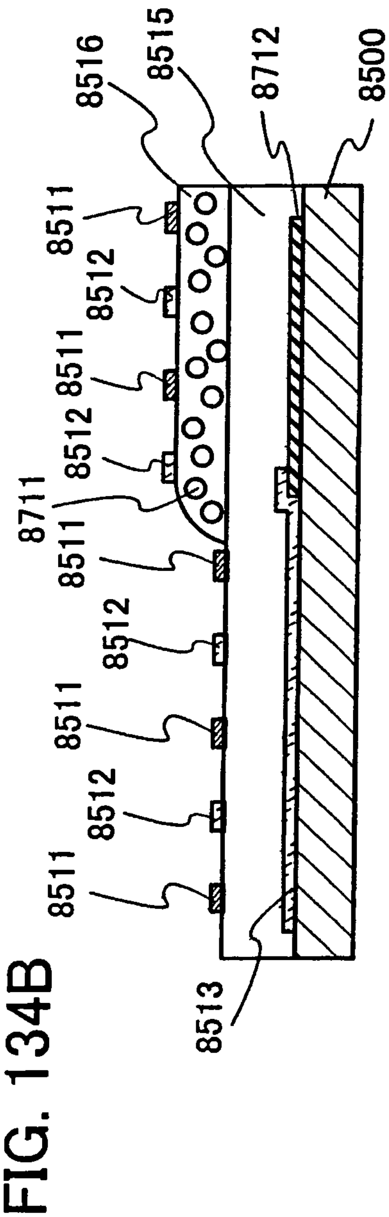

FIGS. 134A and 134B are diagrams each showing a cross section of a main structure of a liquid crystal display panel of the present invention.

Figure 135A:
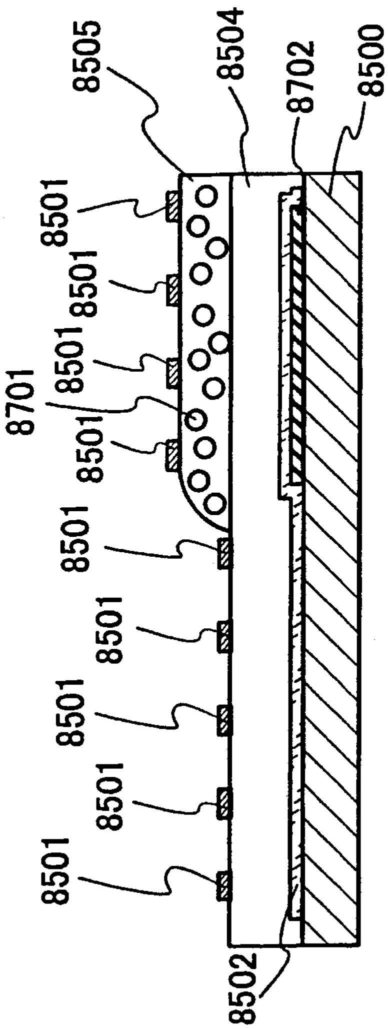
Figure 135B:
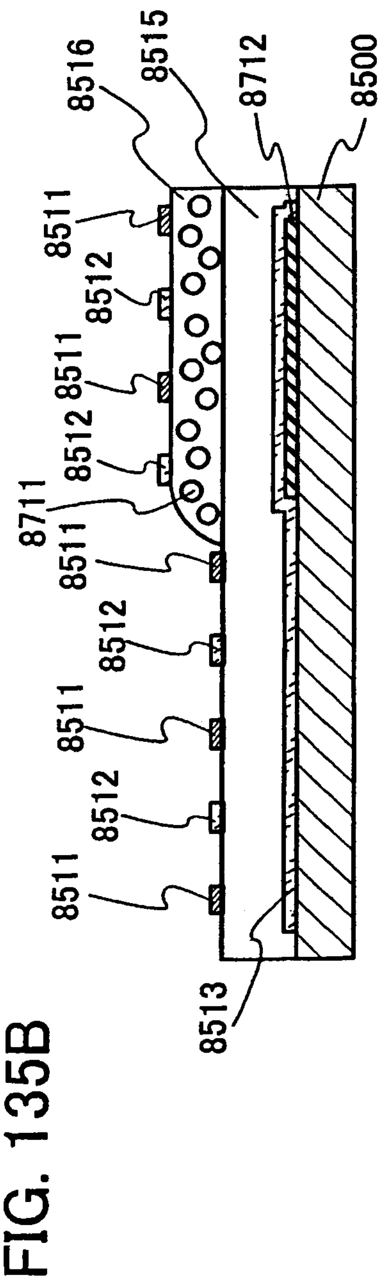

FIGS. 135A and 135B are diagrams each showing a cross section of a main structure of a liquid crystal display panel of the present invention.

DETAILED DESCRIPTION OF THE PRESENT INVENTION

Although the present invention is fully described by way of embodiment modes and embodiments with reference to the accompanying drawings, it is to be understood that various changes and modifications will be apparent to those skilled in the art. Therefore, unless such changes and modifications depart from the spirit and the scope of the present invention, they should be construed as being included therein.

Embodiment Mode 1

First, brief description is made of a structure of a display panel of Embodiment Mode 1 of the present invention.

In the display panel of Embodiment Mode 1 of the present invention, a liquid crystal layer is sandwiched between a first substrate and a second substrate provided so as to face the first substrate.

A pixel portion of a display panel of Embodiment Mode 1 of the present invention is formed over a first substrate. The pixel portion includes a plurality of wirings (hereinafter referred to as signal lines) that are supplied with a signal (hereinafter referred to as a video signal) for expressing a gray scale and a plurality of wirings (hereinafter referred to as scan lines) that selects a pixel to which the video signal is written.

In the pixel portion, a plurality of pixels are arranged in matrix corresponding to the scan lines and the signal lines. Each pixel is connected to any one of the scan lines and any one of the signal lines. Each pixel includes at least one transistor and a pixel electrode.

The transistor, of each pixel is provided in the vicinity of intersection of the scan line and the signal line. The transistor controls charge and discharge of a charge to the pixel electrode of each pixel.

Further, each pixel includes a liquid crystal element in which a molecular orientation of liquid crystal molecules in a liquid crystal layer is changed depending on a potential difference between the pixel electrode provided independently for each pixel and a common electrode provided to connect between pixels of a plurality of pixels in the pixel portion.

As the liquid crystal layer, a ferroelectric liquid crystal (FLC), a nematic liquid crystal, a smectic liquid crystal, a liquid crystal which is to be homogeneously oriented, a liquid crystal which is to be homeotropically oriented, or the like can be used.

An electrical field is generated by a potential difference between the pixel electrode and the common electrode. The electrical field includes many transverse components that are parallel to the first substrate (that is, parallel to the pixel electrode and the common electrode). A change of the molecular orientation of liquid crystal molecules means rotation of a liquid crystal molecule in a plane parallel to the first substrate (that is, in a plane parallel to the pixel electrode and the common electrode).

It is to be noted that, in this specification, "rotation in a plane parallel to an electrode" includes parallel rotation which includes discrepancy invisible to the human eye. In other words, "rotation in a plane parallel to an electrode" also includes rotation which mainly includes vector components in a plane direction but also includes a few vector components in a normal direction in addition to the vector components in the plane direction.

Figures 92A, 92B, 92C:
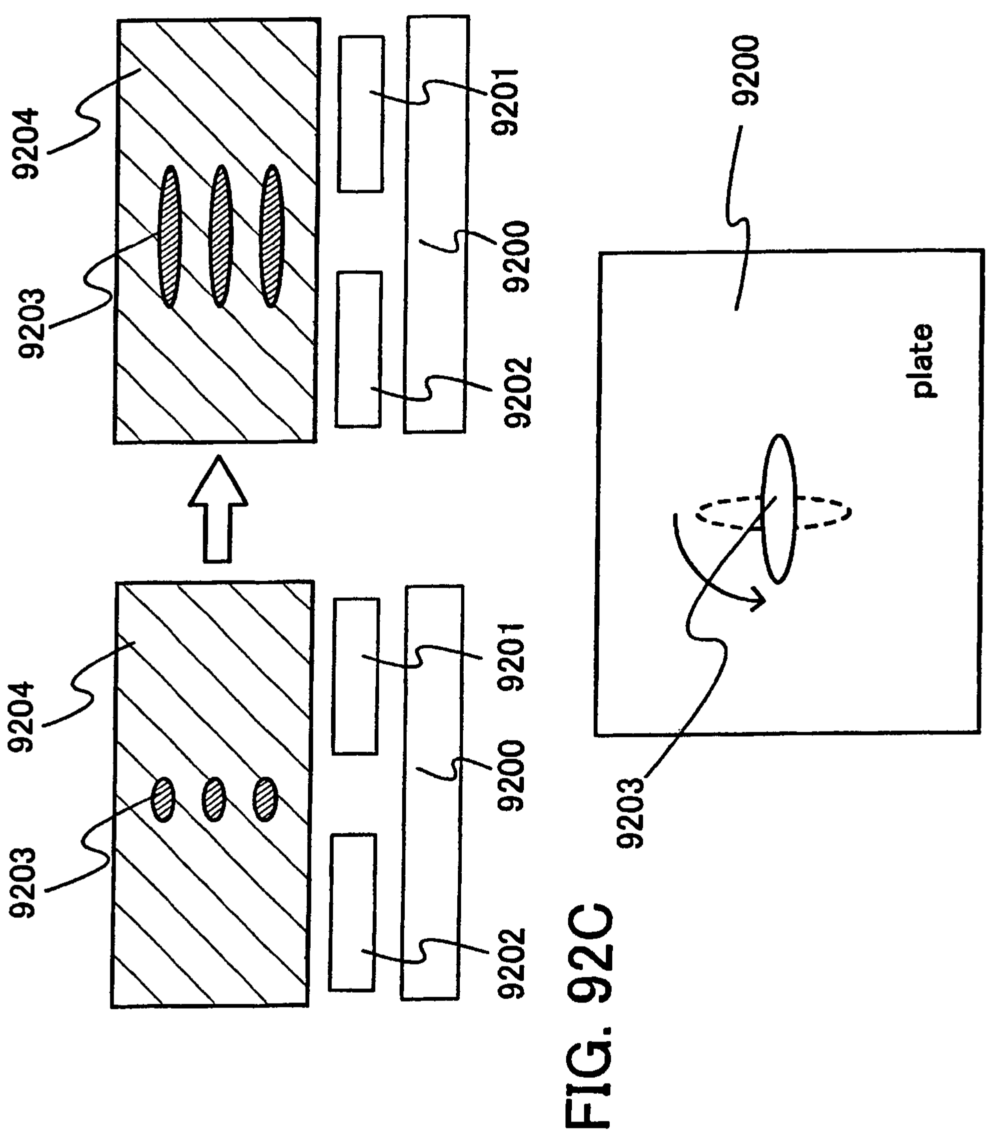
FIGS. 92A and 92B are diagrams each showing arrangement of electrodes of a liquid crystal element and orientation of liquid crystal molecules.
FIG. 92C is a diagram showing a rotation direction of a liquid crystal molecule.
Figure 95:
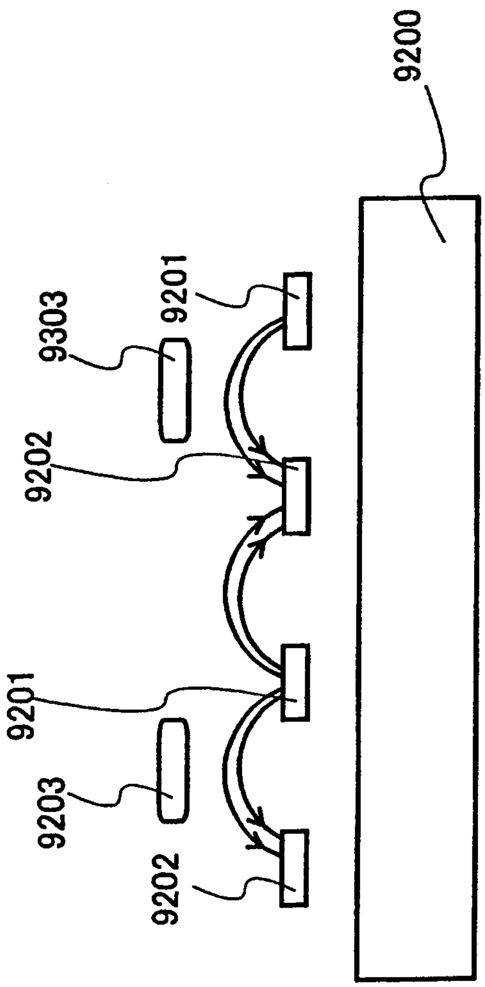
FIG. 95 is a diagram showing arrangement of electrodes of a liquid crystal element.

For example, an IPS liquid crystal display device includes pixel electrodes 9201 and common electrodes 9202 over a substrate 9200 as shown in FIG. 95. When a potential difference is generated between the pixel electrodes 9201 and the common electrodes 9202, an electrical field shown by an arrow in the drawing is generated. Then, liquid crystal molecules 9203 over the pixel electrodes 9201 and the common electrodes 9202 rotate. In other words, as shown in FIGS. 92A and 92B, an orientation of the liquid crystal molecules 9203 in a liquid crystal layer 9204 is changed. Further, when seen from above, the liquid crystal molecules 9203 rotate as shown by an arrow in FIG. 92C.

Figure 93A:
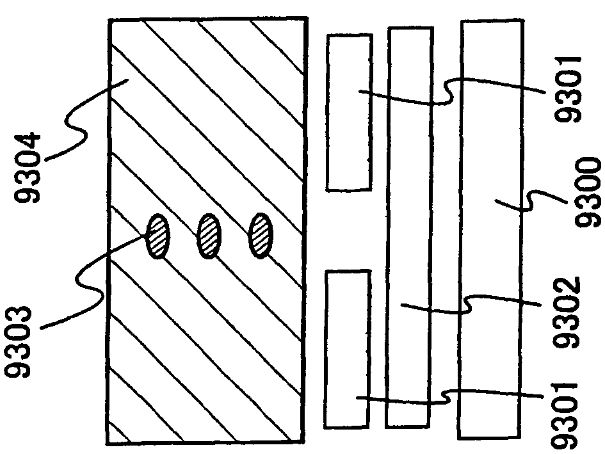
FIGS. 93A and 93B are diagrams each showing arrangement of electrodes of a liquid crystal element and orientation of liquid crystal molecules.
Figure 93B:
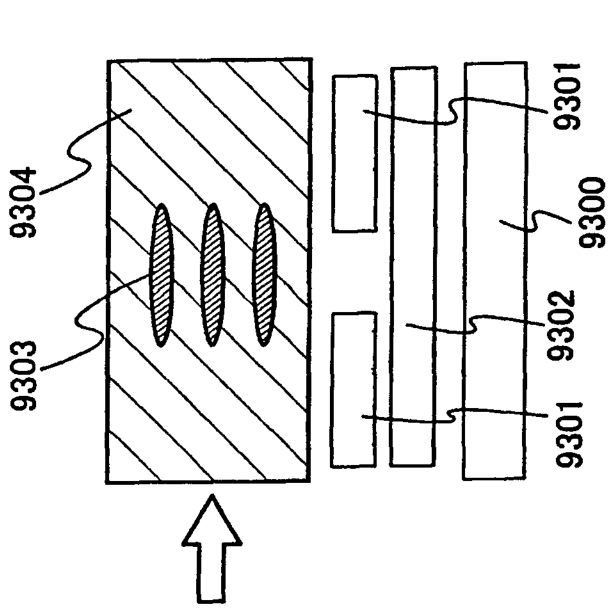
Figure 93C:
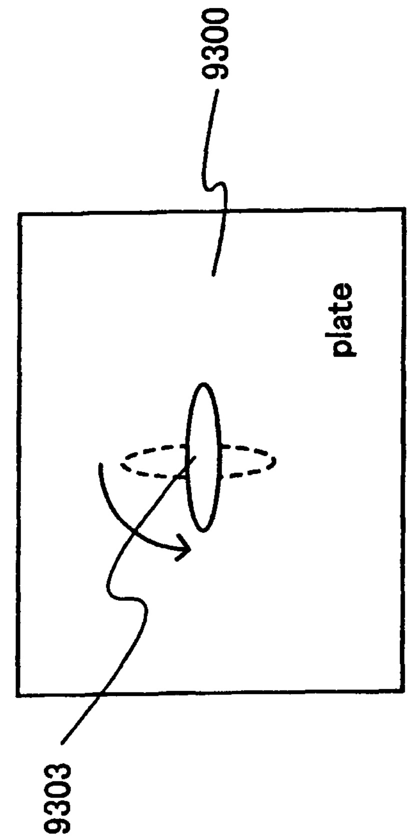
FIG. 93C is a diagram showing a rotation direction of a liquid crystal molecule.
Figure 96:
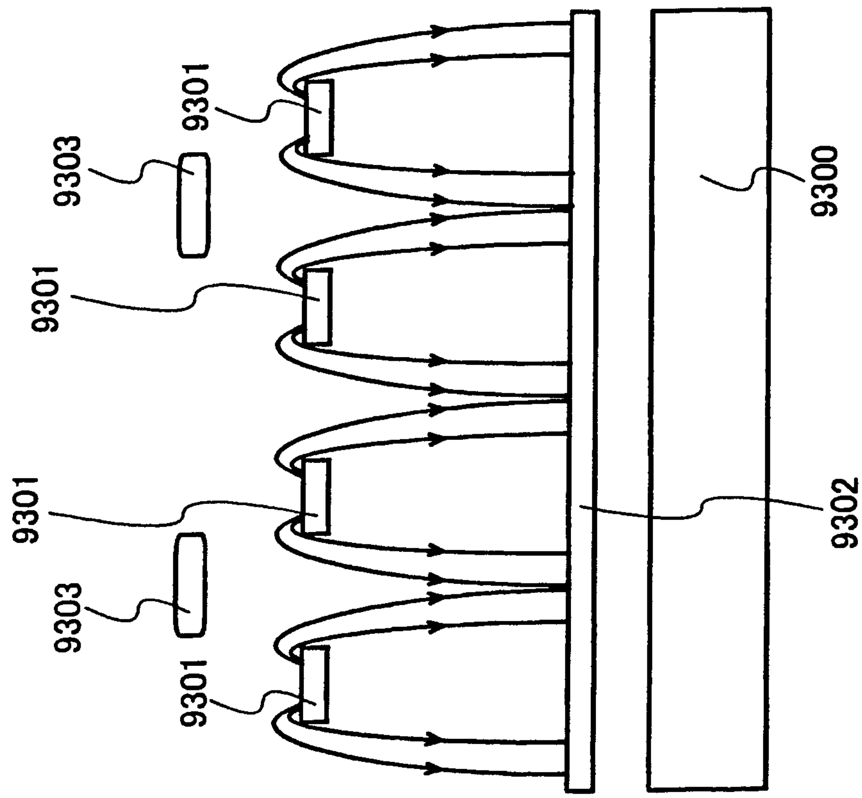
FIG. 96 is a diagram showing arrangement of electrodes of a liquid crystal element.

An FFS liquid crystal display device includes common electrodes 9302 over a substrate 9300 and pixel electrodes 9301 over the common electrode 9302 as shown in FIG. 96. When a potential difference is generated between the pixel electrodes 9301 and the common electrode 9302, an electrical field shown by an arrow in the drawing is generated. Then, liquid crystal molecules 9303 over the pixel electrodes 9301 rotate. In other words, as shown in FIGS. 93A and 93B, an orientation of the liquid crystal molecules 9303 in a liquid crystal layer 9304 is changed. Further, when seen from above, the liquid crystal molecules 9303 rotate as shown by an arrow in FIG. 93C. Note that the positions of the pixel electrodes and the common electrode are exchangeable.

Figures 94A, 94B, 94C:
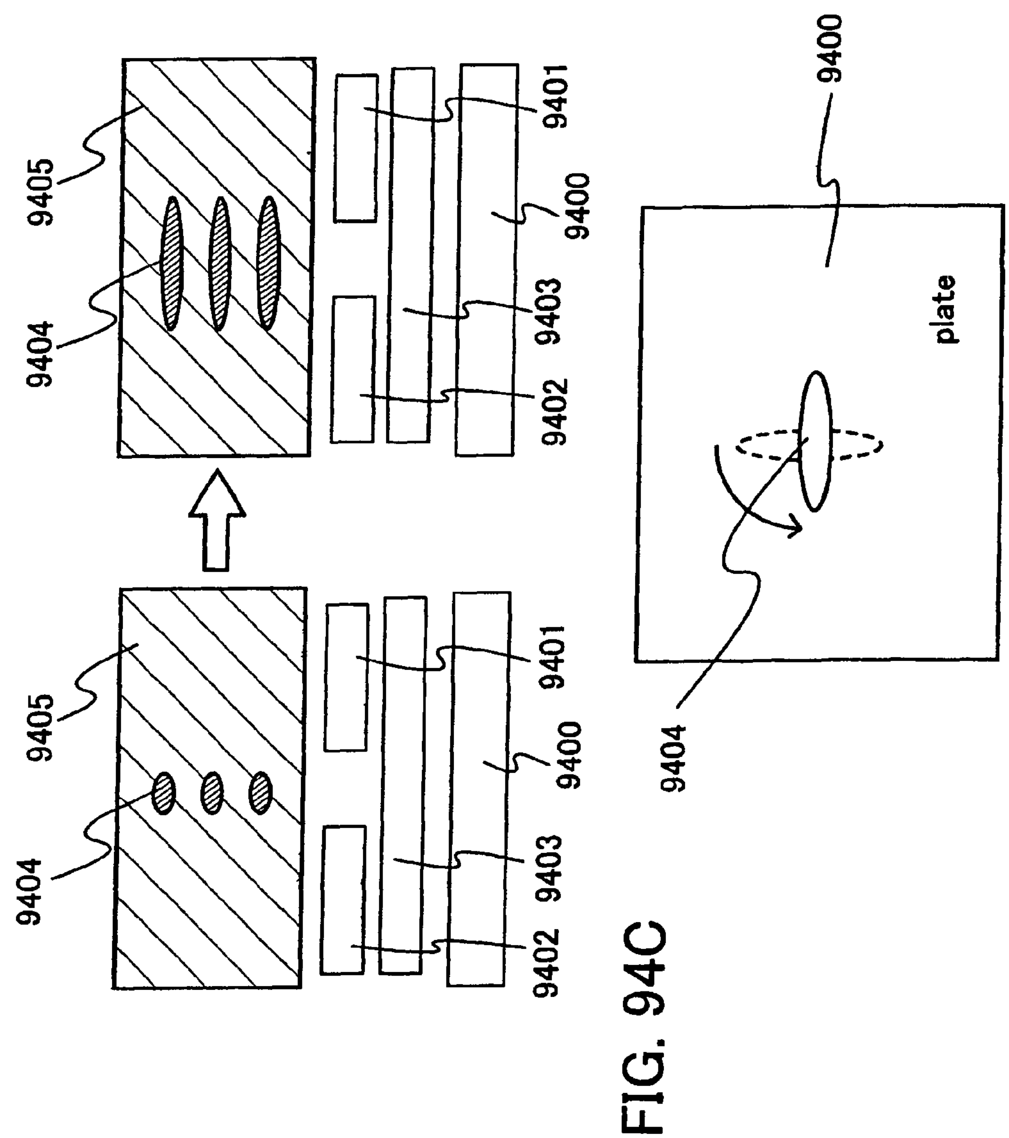
FIGS. 94A and 94B are diagrams each showing arrangement of electrodes of a liquid crystal element and orientation of liquid crystal molecules.
FIG. 94C is a diagram showing a rotation direction of a liquid crystal molecule.
Figure 97:
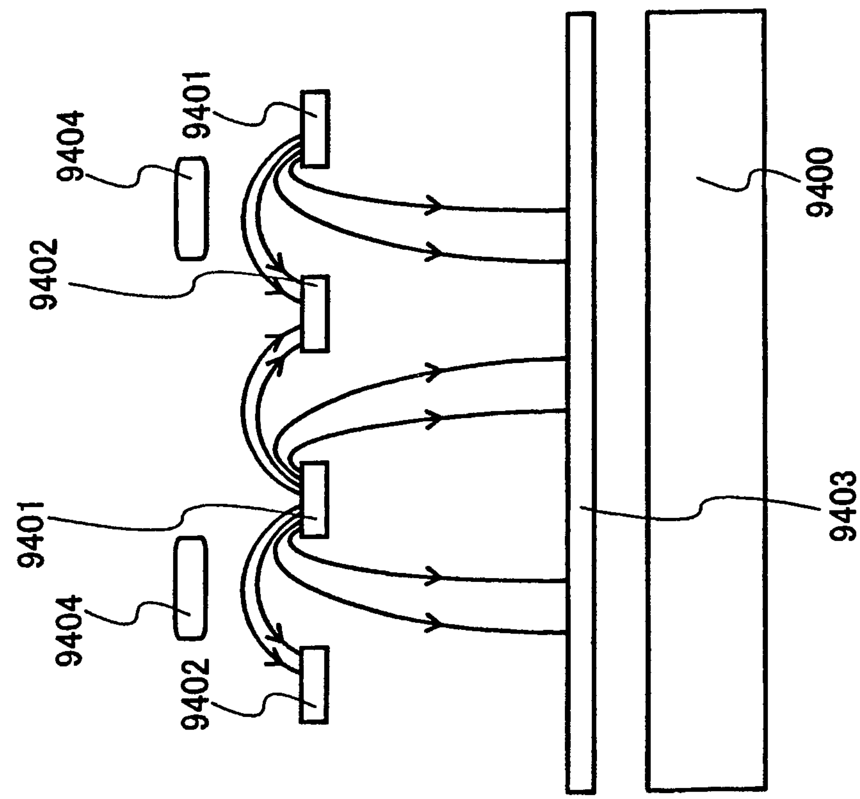
FIG. 97 is a diagram showing arrangement of electrodes of a liquid crystal element.

Furthermore, a liquid crystal display device for which an IPS mode and an FFS mode are combined includes second common electrode 9403 over a substrate 9400 and pixel electrodes 9401 and first common electrodes 9402 over the second common electrode 9403 as shown in FIG. 97. When a potential difference is generated between the pixel electrodes 9401 and the common electrodes (the second common electrode 9403 and the first common electrodes 9402), an electrical field shown by an arrow in the drawing is generated. Then, liquid crystal molecules 9404 over the pixel electrodes 9401 and the first common electrodes 9402 rotate. In other words, as shown in FIGS. 94A and 94B, an orientation of the liquid crystal molecules 9404 in a liquid crystal layer 9405 is changed. Further, when seen from above, the liquid crystal molecules 9404 rotate as shown by an arrow in FIG. 94C. The common electrodes exist below, in a transverse direction, and in an oblique direction (including an obliquely upward direction and an obliquely downward direction) with respect to electrodes functioning as the pixel electrodes, whereby electrical field components parallel to the substrate are further generated. Accordingly, a viewing angle characteristic is enhanced. Note that the pixel electrodes and the common electrode are exchangeable.

Thus, it is allowed as long as the molecular orientation of the liquid crystal molecules controlling the amount of light can be rotated in a parallel direction with respect to the substrate by a transverse electrical field generated due to a potential difference between the pixel electrode and the common electrode. Therefore, electrodes having various shapes can be used as the pixel electrode and the common electrode. That is, liquid molecules tilt in an electrical field direction when a transverse electrical field is generated due to a potential difference between the pixel electrode and the common electrode, whereby the liquid crystal layer may transmit light (such a display device is referred to as a display device of a normally black mode) or the liquid crystal layer may transmit no light (such a display device is referred to as a display device of a normally white mode).

For example, as for an electrode shape seen from above the substrate, a interdigitated electrode (also referred to as a comb teeth-shaped electrode or a comb-shaped electrode), an electrode provided with a slit (opening), or an electrode covering an entire surface (also referred to as a plate-like electrode) can be used as each of the pixel electrode and the common electrode.

Examples of electrode shapes seen from above the substrate are shown in FIGS. 118A to 119D.

Figure 118A:
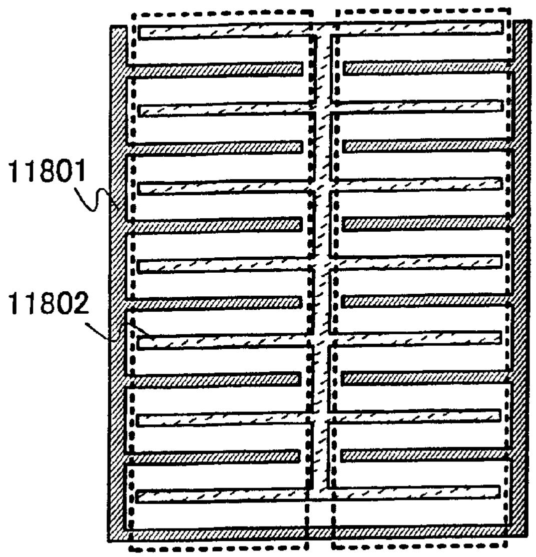
FIGS. 118A to 118D are diagrams each showing an electrode structure of a liquid crystal element.

In FIG. 118A, a first electrode 11801 and a second electrode 11802 are comb teeth-shaped electrodes. One of the first electrode 11801 and the second electrode 11802 is a pixel electrode and the other is a common electrode. Regions of the first electrode 11801 and the second electrode 11802, which are indicated by dotted lines, are branch portions of the first electrode 11801 and the second electrode 11802. That is, an electrode portion, which contributes to generating mainly an intense electrical field component among electrical fields parallel to an electrode surface to be generated when a potential difference is caused between the first electrode 11801 and the second electrode 11802, is referred to as a branch portion. Note that the first electrode 11801 and the second electrode 11802 are suitable for electrodes of a liquid crystal element of a so-called IPS liquid crystal display panel.

Figure 118B:
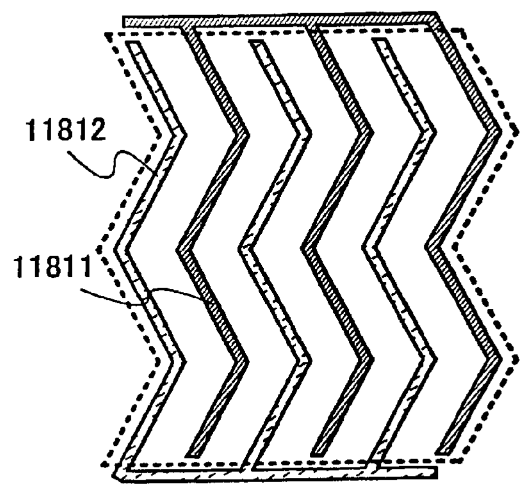

In FIG. 118B, a first electrode 11811 and a second electrode 11812 are comb teeth-shaped electrodes. One of the first electrode 11811 and the second electrode 11812 is a pixel electrode and the other is a common electrode. A region of the first electrode 11811 and the second electrode 11812, which is indicated by dotted lines, is a branch portion of the first electrode 11811 and the second electrode 11812. Note that the branch portion of the first electrode 11811 and the second electrode 11812 has a zigzag shape. Note that the first electrode 11811 and the second electrode 11812 are suitable for electrodes of a liquid crystal element of a so-called IPS liquid crystal display panel.

Figure 118C:
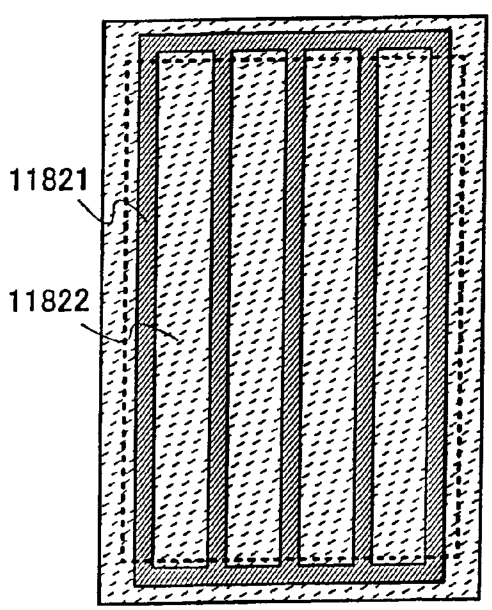

In FIG. 118C, a first electrode 11821 is an electrode provided with slits, and a second electrode 11822 is a plate-like electrode. One of the first electrode 11821 and the second electrode 11822 is a pixel electrode and the other is a common electrode. A region of the first electrode 11821, which is indicated by dotted lines, is a branch portion of the first electrode 11821. Note that the first electrode 11821 and the second electrode 11822 are suitable for electrodes of a liquid crystal element of a so-called FFS liquid crystal display panel.

Figure 118D:
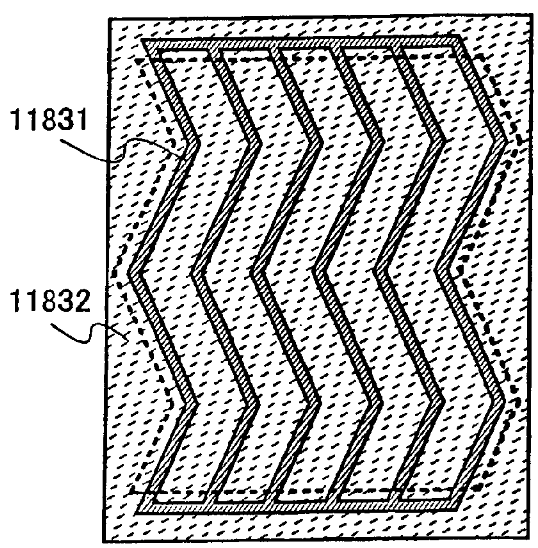

In FIG. 118D, a first electrode 11831 is an electrode provided with slits, and a second electrode 11832 is a plate-like electrode. One of the first electrode 11831 and the second electrode 11832 is a pixel electrode and the other is a common electrode. A region of the first electrode 11831, which is indicated by dotted lines, is a branch portion of the electrode. The slits of the first electrode 11831 each have a zigzag shape. Note that the first electrode 11831 and the second electrode 11832 are suitable for electrodes of a liquid crystal element of a so-called FFS liquid crystal display panel.

Figure 119A:
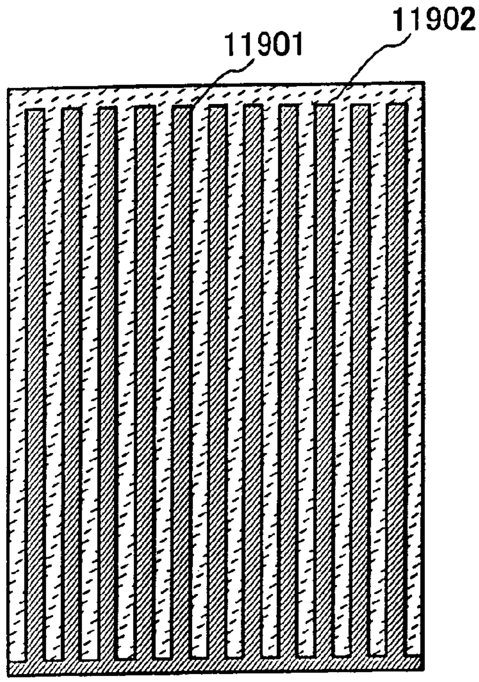
FIGS. 119A to 119D are diagrams each showing an electrode structure of a liquid crystal element.

In FIG. 119A, a first electrode 11901 is a comb teeth-shaped electrode, and a second electrode 11902 is a plate-like electrode. One of the first electrode 11901 and the second electrode 11902 is a pixel electrode and the other is a common electrode. Note that the first electrode 11901 and the second electrode 11902 are suitable for electrodes of a liquid crystal element of a so-called FFS liquid crystal display panel.

Figure 119B:
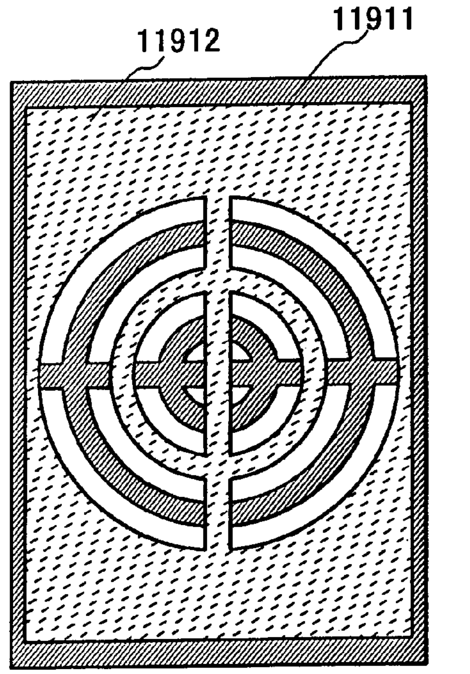

In FIG. 119B, each of a first electrode 11911 and a second electrode 11912 is an electrode provided with a slit. One of the first electrode 11911 and the second electrode 11912 is a pixel electrode and the other is a common electrode. Note that the first electrode 11911 and the second electrode 11912 are suitable for electrodes of a liquid crystal element of a so-called IPS liquid crystal display panel.

Figure 119C:
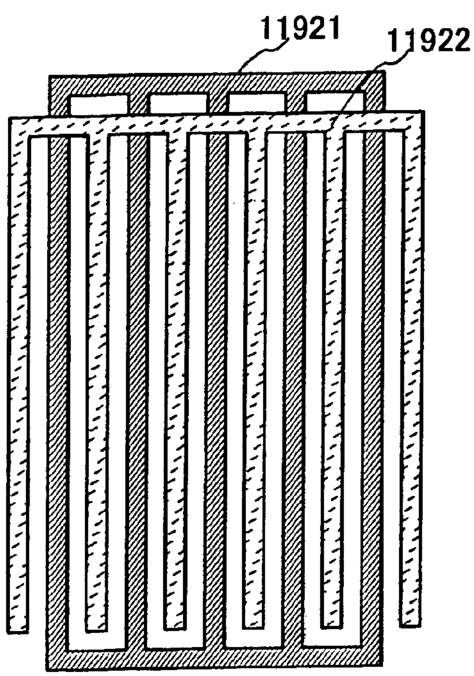

In FIG. 119C, a first electrode 11921 is an electrode provided with slits, and a second electrode 11922 is a comb teeth-shaped electrode. One of the first electrode 11921 and the second electrode 11922 is a pixel electrode and the other is a common electrode. Note that the first electrode 11921 and the second electrode 11922 are suitable for electrodes of a liquid crystal element of a so-called IPS liquid crystal display panel.

Figure 119D:
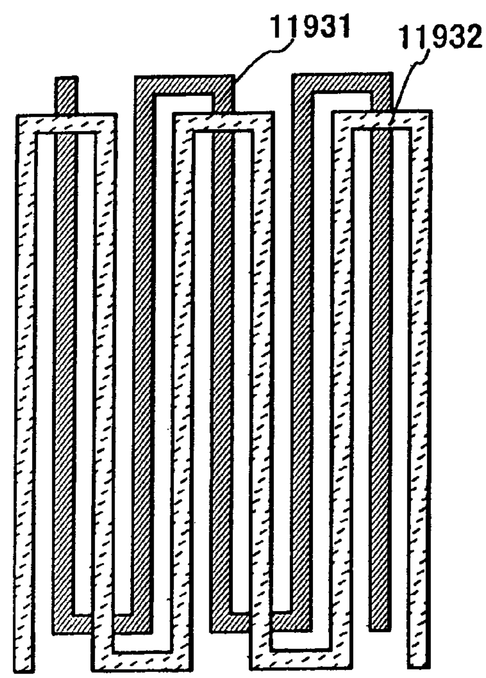

In FIG. 119D, a first electrode 11931 and a second electrode 11932 are comb teeth-shaped electrodes. One of the first electrode 11931 and the second electrode 11932 is a pixel electrode and the other is a common electrode. Note that the first electrode 11931 and the second electrode 11932 are suitable for electrodes of a liquid crystal element of a so-called IPS liquid crystal display panel.

Note that these are examples of electrode shapes, and the present invention is not limited thereto.

Thus, in this specification, a comb teeth-shaped electrode includes an electrode having a shape in which in a branch portion of an electrode, one end of a branch is connected to an end of another branch adjacent to the branch. An electrode provided with a slit includes an electrode having a shape in which in a branch portion of an electrode, both ends of adjacent branches are connected. A plate-like electrode includes an electrode extending across regions of a plurality of branches of the other electrodes.

Further, a cross-sectional shape of the pixel electrode and the common electrode may be a concave-convex shape, a meandering shape or a planar shape. In the case where the pixel electrode or the common electrode is used as an reflective film of a reflective liquid crystal display panel or a semi-transmissive liquid crystal display panel, the cross-sectional shape of the pixel electrode or the common electrode is a concave-convex shape or a meandering shape, whereby outside light can be reflected diffusely by the pixel electrode or the common electrode. Therefore, luminance can be improved and at the same time, mirroring reflection can be prevented. Note that various combinations can be applied to the shape of the pixel electrode and the shape of the common electrode.

It is to be node that in the reflective liquid crystal display panel or the semi-transmissive liquid crystal display panel, an insulating film may be made to function as a light scattering layer by formation of a concave-convex surface of the insulating film in a reflection region or addition of particles for scattering light in the insulating film. Thus, even if the reflective film does not have a concave-convex surface, mirroring reflection can be prevented, so that an electrical field having components in a desired direction component can be formed easily for a liquid crystal layer when the pixel electrode or the common electrode is used as the reflective film.

Further, a film for adjusting thickness of a liquid crystal layer may be arranged in the semi-transmissive liquid crystal display panel in order to thin thickness of the liquid crystal layer (so-called cell gap) between a portion which reflects light to perform display (reflection region) and a portion which transmits light from a backlight or the like to perform display (transmission region).

Note that in the case of the reflective liquid crystal display panel or the semi-transmissive liquid crystal display panel, the path length of light passing through the liquid crystal layer does not vary significantly depending on a portion in one pixel. Therefore, an insulating film for adjusting thickness of the liquid crystal layer (cell gap) is not necessarily arranged.

Note that a direction in which liquid crystal molecules tilt when a transverse electrical field generated due to a potential difference between the pixel electrode and the common electrode is deviated from the electrical field direction, whereby a liquid crystal display panel with higher responsivity can be provided. Further, responsivity between intermediate gray scales may be enhanced by provision of a so-called overdrive circuit that is a control circuit for driving liquid crystal molecules at a high speed.

Note that shapes of the pixel electrode and the common electrode are devised, whereby so-called multi-domain orientation may be achieved. That is to say, when a transverse electrical field is generated in the liquid crystal layer due to a potential difference between the pixel electrode and the common electrode, the liquid crystal molecules are set to tilt in a plurality of directions. Thus, variation of color tones depending on a viewing angle may be reduced. In that case, it is set that the pixel electrode and the common electrode are electrodes each provided with a boomerang-shaped slit or a zigzag slit, or branch portions of the electrodes each have a boomerang shape or a zigzag shape. Accordingly, variation of color tones depending on a viewing angle can be extremely small; therefore, a liquid crystal display panel with high chromatic purity and high contrast ratio can be provided.

For the pixel electrode or the common electrode, films formed in the same step as a film used for a semiconductor layer (a semiconductor film functioning as a channel, a source, or a drain) of the transistor is used. Note that for at least a part of the pixel electrode or the common electrode, films formed in the same step as a film used for the semiconductor layer of the transistor may be used.

For the semiconductor layer of the transistor, a non-single crystalline semiconductor film (including an amorphous semiconductor film and a polycrystalline semiconductor film) typified by an amorphous semiconductor and a polycrystalline semiconductor (also referred to as polysilicon) can be used. Alternatively, a compound semiconductor film of ZnO, a-InGaZnO or the like may be used. A non-single crystalline semiconductor film may contain hydrogen or halogen. That is to say, a non-single crystalline semiconductor film or a compound semiconductor film is used also for at least a part of the pixel electrode or the common electrode.

Note that the semiconductor layer of the transistor desirably has thickness such that light is transmitted. Preferably, the semiconductor layer of the transistor has thickness of 10 nm to 100 nm, more preferably, 45 nm to 60 nm. Further, a non-single crystalline semiconductor film or a compound semiconductor film each having thickness approximately equal to that of the semiconductor layer of the transistor is preferably used also for at least a part of the pixel electrode or the common electrode.

Films formed in the same step as a film used for the semiconductor layer of the transistor each have a light-transmitting property; therefore, it is preferably used for the pixel electrode or the common electrode of the transmissive liquid crystal display panel, and a part of the pixel electrode or the common electrode of the semi-transmissive liquid crystal display panel. It is needless to say that they may be used for the pixel electrode or the common electrode of the reflective liquid crystal display panel.

Films formed in the same step means a plurality of films formed by separation of a stretch of film after formation of the stretch of film. The films formed in the same step are also referred to as films in the same layer. Therefore, when even films arranged over a stretch of film are in different layers if they are not formed in the same step, the films.

In other words, a stretch of film is formed by a chemical vapor deposition (CVD) method, a sputtering method, a vacuum evaporation method or a spin-coating method and the film is patterned, so that films in the same layer can be formed.

Note that patterning is to process a film shape, which means forming a film pattern by a photolithography technique (including, for example, forming a contact hole in photosensitive acrylic and processing photosensitive acrylic into a spacer), forming a mask pattern by a photolithography technique and etching with use of the mask pattern, or the like. That is, in the patterning step, a part of film is selectively removed.

The films in the same layer include those with different thicknesses or components.

For example, in the case of patterning films in the same layer, thickness of a mask pattern is controlled and the mask pattern is isotropically etched, thereby the films in the same layer can have different thicknesses or may include films containing different components by addition of impurities into a part of the films in the same layer.

Further, all of the films formed in the same step may be formed over a stretch of film, or some of the films formed in the same step may be formed over films in different layers.

That is, a bottom film contact with a first film and a second film formed in the same step is not limited.

Note that the above description is made of a main structure of the liquid crystal display panel of Embodiment Mode 1 of the present invention; however, the present invention is not limited to this. That is, a polarizing plate, a retardation film, a color filter, a backlight, a scan line driver circuit for supplying a signal to a scan line, a signal line driver circuit for supplying a signal to a signal line, and the like may be included.

For a backlight light source, a fluorescent lamp (a cold-cathode fluorescent tube or a hot-cathode fluorescent tube), a light-emitting diode, a CRT, an EL (inorganic or organic), an incandescent lamp, or the like can be used as appropriate. Also, a combination of a light guide plate, a reflector, a light source, a diffusion sheet, a reflection sheet, and the like can be a backlight.

That is, the liquid crystal display device described in this embodiment mode includes a substrate, and a transistor and a liquid crystal element that are formed over the substrate. Further, a semiconductor layer of the transistor and a pixel electrode or a common electrode of the liquid crystal element are films formed in the same step.

Note that the semiconductor layer of the transistor may be a part of the pixel electrode or the common electrode of the liquid crystal element. In other words, the pixel electrode and the common electrode of the liquid crystal element may have a stacked-layer structure of the semiconductor layer of the transistor and another conductive film.

Note that the liquid crystal element may rotate a molecular orientation of liquid crystal molecules controlling amount of light generally in a parallel direction with respect to the substrate by a transverse electrical field generated due to a potential difference between the pixel electrode and the common electrode provided to connect between pixels of a plurality of pixels in a pixel portion.

Further, the liquid crystal display panel of Embodiment Mode 1 of the present invention is described in detail.

A transistor, a first electrode to be a pixel electrode of a liquid crystal element, and a second electrode to be a common electrode of the liquid crystal element are formed over a first substrate. Note that in this specification, the first substrate over which the transistor, the first electrode, and the second electrode are formed is referred to as a circuit substrate. In addition, in a liquid crystal display panel, the circuit substrate and the second substrate (counter substrate) provided so as to face the circuit substrate are attached to each other, and a liquid crystal layer is interposed therebetween. Note that the first electrode to be the pixel electrode of the liquid crystal element and the second electrode to be the common electrode of the liquid crystal element may also be formed over the counter substrate.

Subsequently, a structure of a circuit substrate, which is applicable to the liquid crystal display panel of Embodiment Mode 1 of the present invention, is described below.

Figure 61A:
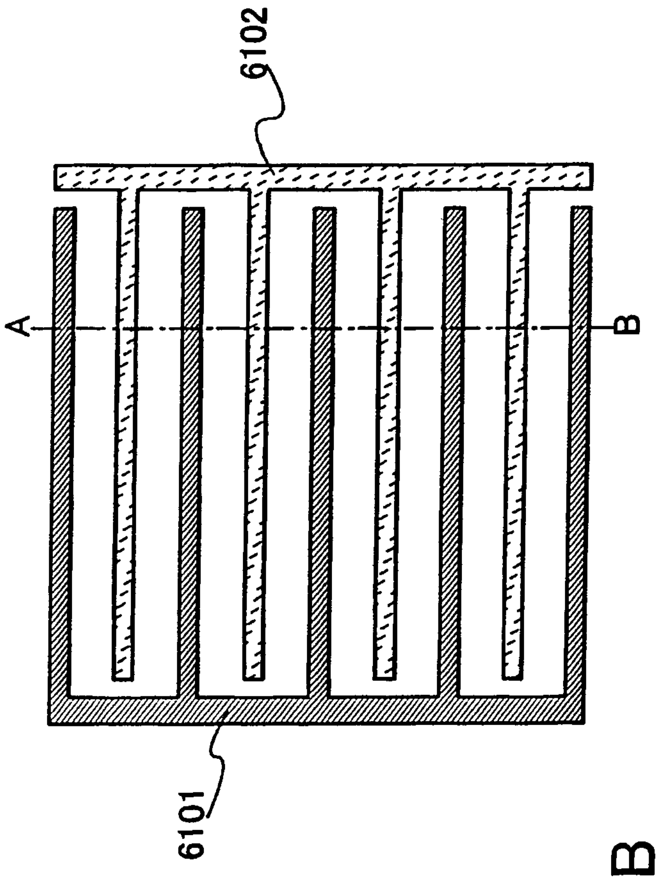
FIG. 61A is a diagram showing a main structure of a liquid crystal display panel of the present invention.
Figure 61B:
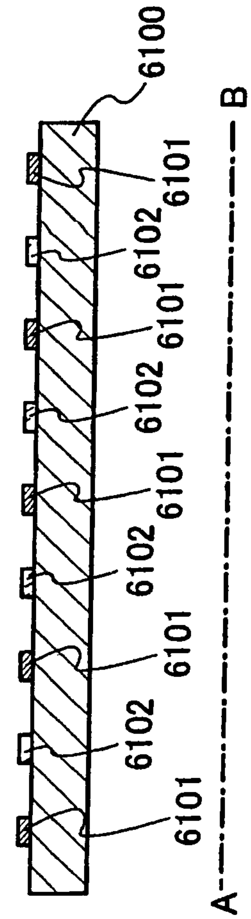
FIG. 61B is a diagram showing a cross section of the main structure of the liquid crystal display panel of the present invention.

First, description is made of a first structure of the circuit substrate of Embodiment Mode 1 of the present invention. FIG. 61A shows a top plan view of the first structure. FIG. 61B shows a cross sectional view taken along a dashed-dotted line A-B in FIG. 61A. A first electrode 6101 and a second electrode 6102 are provided over a substrate 6100. One of the first electrode 6101 and the second electrode 6102 is a pixel electrode and the other is a common electrode. The first electrode 6101 is a film formed in the same layer as the semiconductor layer of the transistor. Note that the second electrode 6102 may be a film formed in the same layer as the semiconductor layer of the transistor, or another film.

Figure 66A:
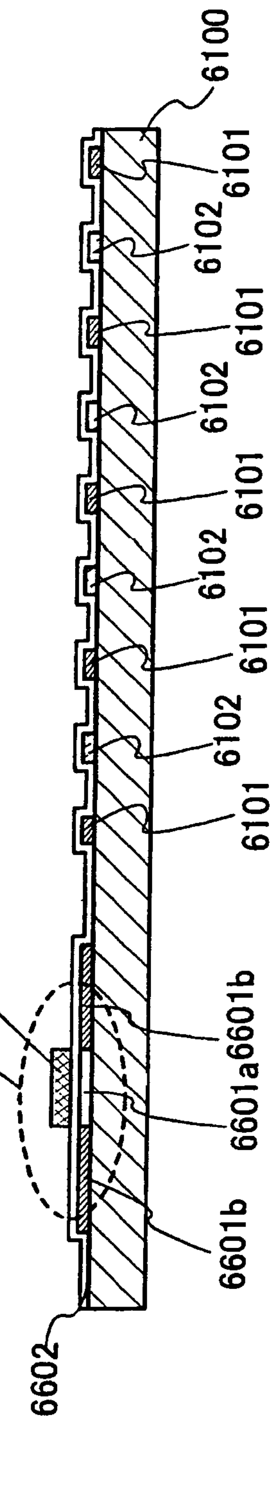
FIGS. 66A and 66B are diagrams each showing a relation between an electrode of a liquid crystal element and a semiconductor layer of a transistor.
Figure 66B:
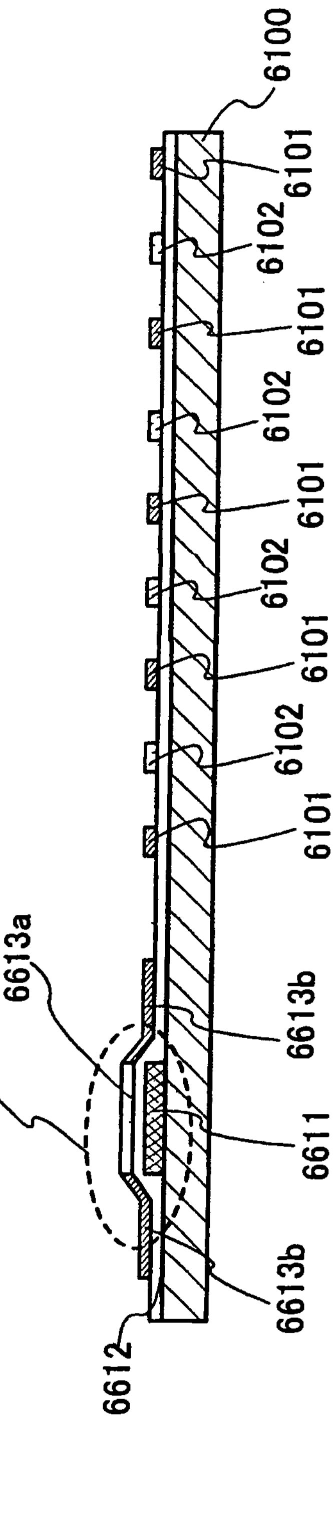

Note that FIGS. 66A and 66B each show a structure example of the circuit substrate in the case of having a transistor over the substrate 6100. The transistor shown in FIG. 66A is a so-called top-gate transistor, whereas the transistor shown in FIG. 66B is a so-called bottom-gate transistor.

The circuit substrate of FIG. 66A includes a transistor 6604, a first electrode 6101 and a second electrode 6102. Further, a semiconductor layer of the transistor 6604 includes a channel formation region 6601*a* and impurity regions 6601*b*. The circuit substrate includes a gate electrode 6603 over the channel formation region 6601*a* with an insulating film 6602 interposed therebetween. The first electrode 6101 is a film in the same layer as the semiconductor layer of the transistor 6604.

The circuit substrate of FIG. 66B includes a transistor 6614, the first electrode 6101 and the second electrode 6102. Further, a semiconductor layer of the transistor 6614 includes a channel formation region 6613*a* and impurity regions 6613*b*. The circuit substrate includes a gate electrode 6611 below the channel formation region 6613*a* with an insulating film 6612 interposed therebetween. The first electrode 6101 is a film in the same layer as the semiconductor layer of the transistor 6614.

The first electrode 6101 and the second electrode 6102 each have a comb-teeth shape, and are arranged so that branch portions of the electrodes are alternate. Note that in FIG. 61B, the first electrode 6101 and the second electrode 6102 are provided directly on the substrate 6100; however, the present invention is not limited to this. The first electrode 6101 and the second electrode 6102 may be formed over different insulating films formed over the substrate 6100. Therefore, the first electrode 6101 and the second electrode 6102 may be arranged so as to deviate vertically from a surface of the substrate 6100 when seen as a cross section. The circuit substrate of this structure is suitable for a so-called IPS liquid crystal display panel.

Figure 62A:
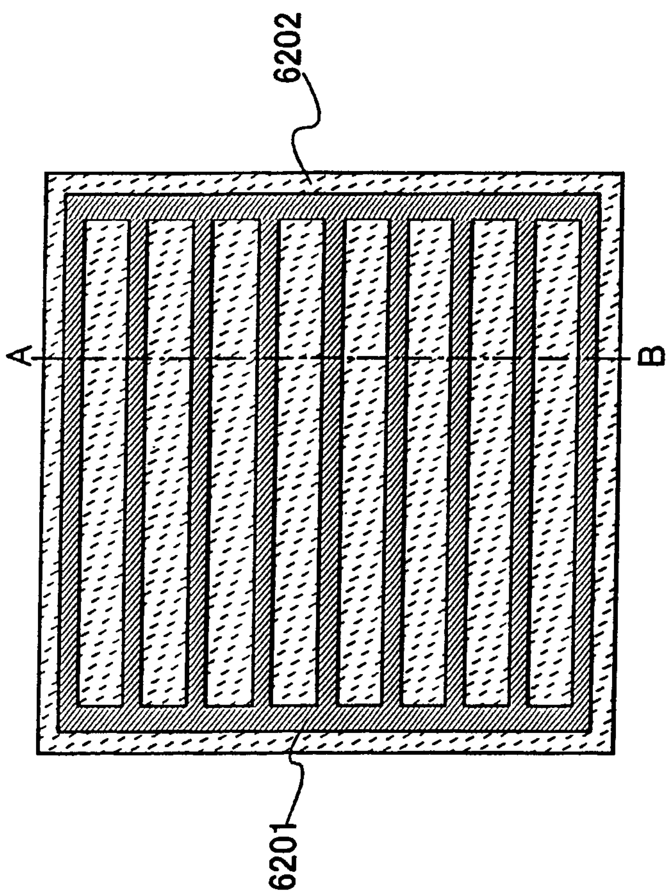
FIG. 62A is a diagram showing a main structure of a liquid crystal display panel of the present invention.
Figure 62B:
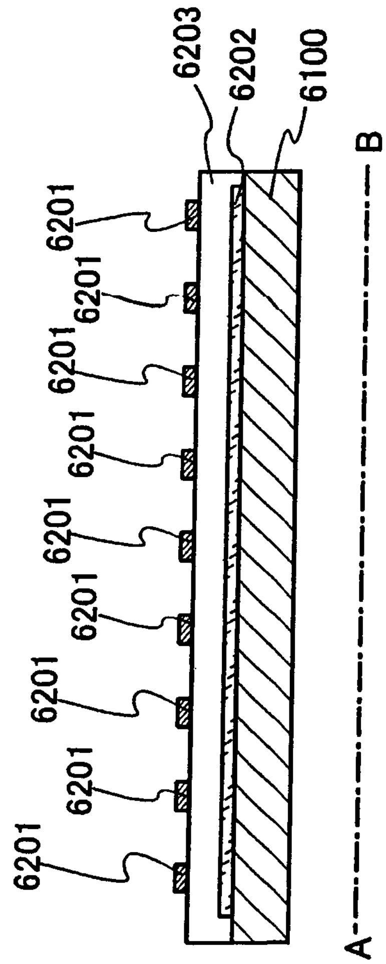
FIG. 62B is a diagram showing a cross section of the main structure of the liquid crystal display panel of the present invention.

Next, description is made of a second structure of the circuit substrate of Embodiment Mode 1 of the present invention. FIG. 62A shows a top plan view of the second structure. FIG. 62B shows a cross sectional view taken along a dashed-dotted line A-B in FIG. 62A. A second electrode 6202 is provided over a substrate 6100, an insulating film 6203 is provided so as to cover the second electrode 6202, and a first electrode 6201 is provided over the insulating film 6203. One of the first electrode 6201 and the second electrode 6202 is a pixel electrode and the other is a common electrode. The first electrode 6201 is a film formed in the same layer as the semiconductor layer of the transistor. The first electrode 6201 has slits. The second electrode 6202 is a plate-like (a shape covering an entire surface) electrode. Note that in FIG. 62A, rectangular slits are used as an example; however, the present invention is not limited to this. Note that in FIG. 62B, the second electrode 6202 is provided directly on the substrate 6100; however, the present invention is not limited to this. The circuit substrate of this structure is suitable for a so-called FFS liquid crystal display panel.

Figure 63A:
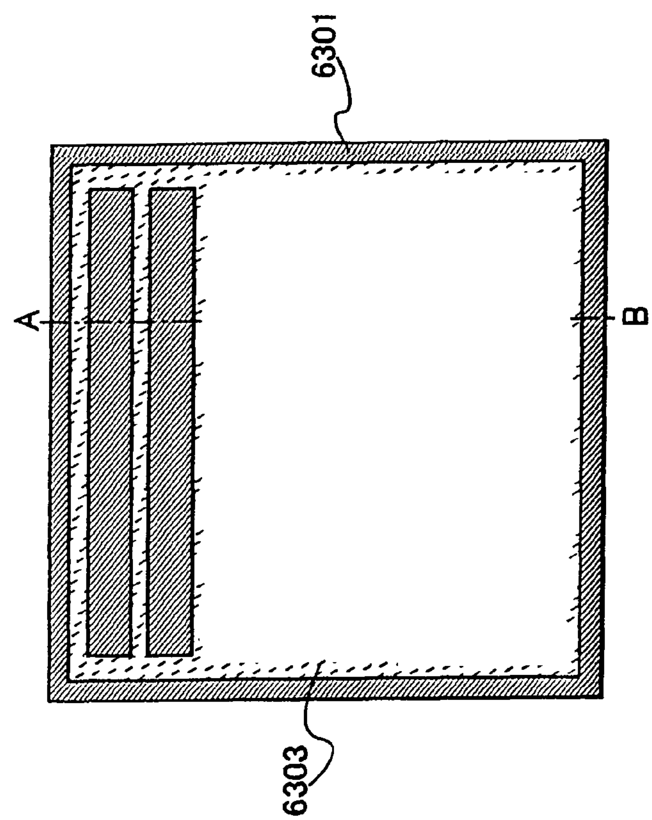
FIG. 63A is a diagram showing a main structure of a liquid crystal display panel of the present invention.
Figure 63B:
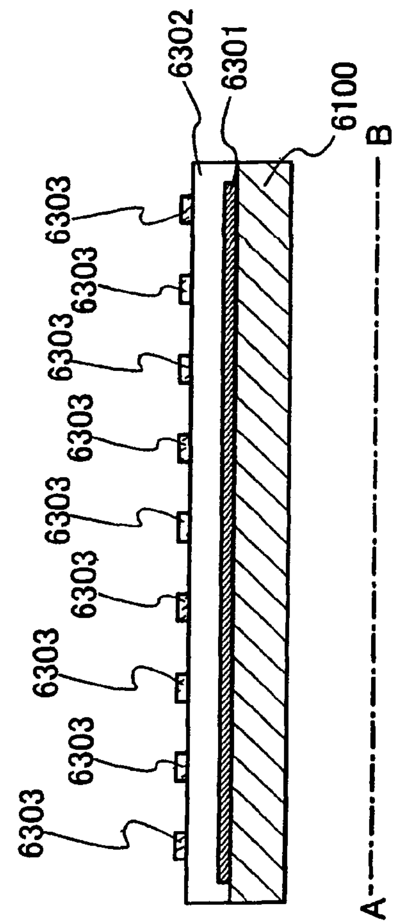
FIG. 63B is a diagram showing a cross section of the main structure of the liquid crystal display panel of the present invention.

Next, description is made of a third structure of the circuit substrate of Embodiment Mode 1 of the present invention. FIG. 63A shows a top plan view of the third structure. FIG. 63B shows a cross sectional view taken along a dashed-dotted line A-B in FIG. 63A. A first electrode 6301 is provided over a substrate 6100, an insulating film 6302 is provided so as to cover the first electrode 6301, and a second electrode 6303 is provided over the insulating film 6302. One of the first electrode 6301 and the second electrode 6303 is a pixel electrode and the other is a common electrode. The first electrode 6301 is a film formed in the same layer as the semiconductor layer of the transistor. The first electrode 6301 is a plate-like (a shape covering an entire surface) electrode. The second electrode 6303 has slits. Note that in FIG. 63A, rectangular slits are used as an example; however, the present invention is not limited to this. Note that in FIG. 63B, the first electrode 6301 is provided directly on the substrate 6100; however, the present invention is not limited to this. The circuit substrate of this structure is suitable for a so-called FFS liquid crystal display panel.

Figure 64A:
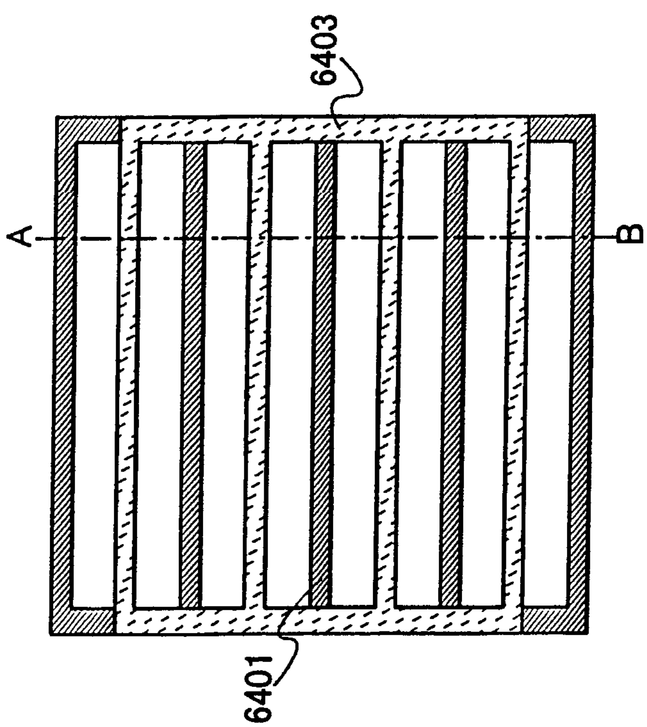
FIG. 64A is a diagram showing a main structure of a liquid crystal display panel of the present invention.
Figure 64B:
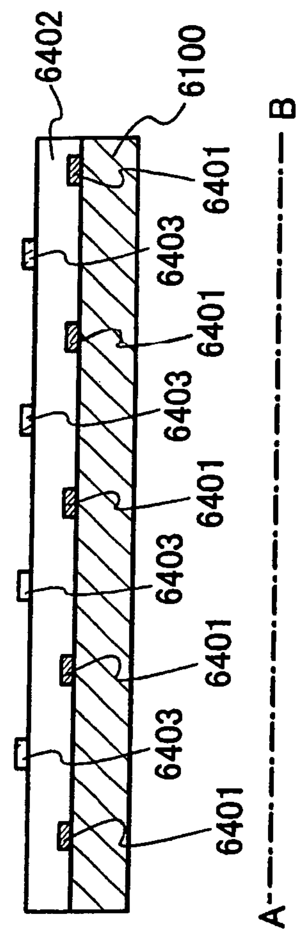
FIG. 64B is a diagram showing a cross section of the main structure of the liquid crystal display panel of the present invention.

Next, description is made of a fourth structure of the circuit substrate of Embodiment Mode 1 of the present invention. FIG. 64A shows a top plan view of the fourth structure. FIG. 64B shows a cross sectional view taken along a dashed-dotted line A-B in FIG. 64A. A first electrode 6401 is provided over a substrate 6100, an insulating film 6402 is provided so as to cover the first electrode 6401, and a second electrode 6403 is provided over the insulating film 6402. One of the first electrode 6401 and the second electrode 6403 is a pixel electrode and the other is a common electrode. The first electrode 6401 is a film formed in the same layer as the semiconductor layer of the transistor. Each of the first electrode 6401 and the second electrode 6403 has slits. Note that in FIG. 64A, rectangular slits are used as an example; however, the present invention is not limited to this. Note that in FIG. 64B, the first electrode 6401 is provided directly on the substrate 6100; however, the present invention is not limited to this. The circuit substrate of this structure is suitable for a so-called IPS liquid crystal display panel.

Figure 65A:
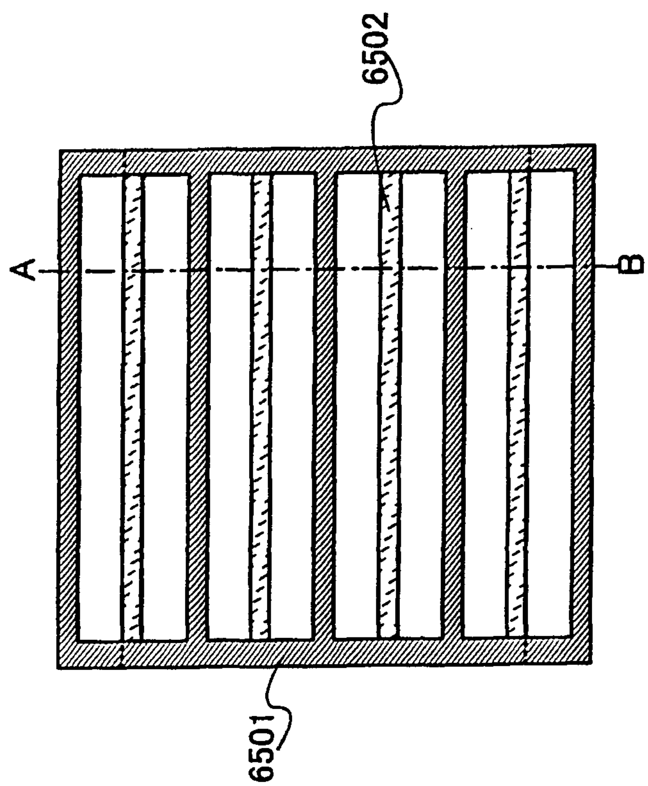
FIG. 65A is a diagram showing a main structure of a liquid crystal display panel of the present invention.
Figure 65B:
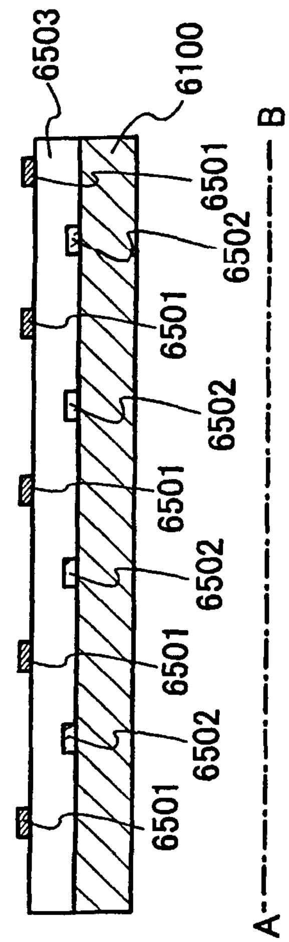
FIG. 65B is a diagram showing a cross section of the main structure of the liquid crystal display panel of the present invention.

Next, description is made of a fifth structure of the circuit substrate of Embodiment Mode 1 of the present invention. FIG. 65A shows a top plan view of the fifth structure. FIG. 65B shows a cross sectional view taken along a dashed-dotted line A-B in FIG. 65A. A second electrode 6502 is provided over a substrate 6100, an insulating film 6503 is provided so as to cover the second electrode 6502, and a first electrode 6501 is provided over the insulating film 6503. One of the first electrode 6501 and the second electrode 6502 is a pixel electrode and the other is a common electrode. The first electrode 6501 is a film formed in the same layer as the semiconductor layer of the transistor. Each of the first electrode 6501 and the second electrode 6502 has slits. Note that in FIG. 65A, rectangular slits are used as an example; however, the present invention is not limited to this. Note that in FIG. 65B, the second electrode 6502 is provided directly on the substrate 6100; however, the present invention is not limited to this. The circuit substrate of this structure is suitable for a so-called IPS liquid crystal display panel.

Figure 67A:
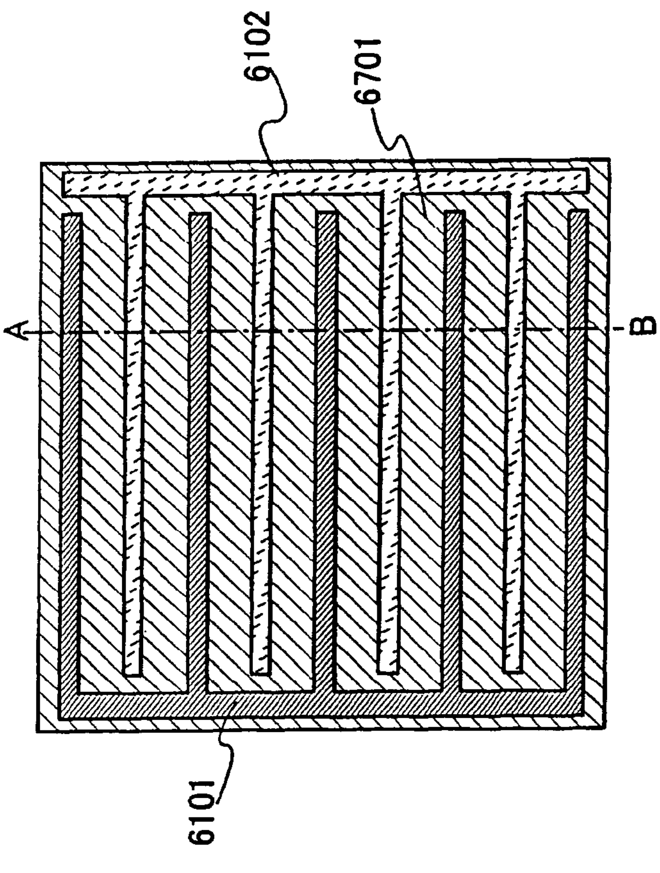
FIG. 67A is a diagram showing a main structure of a liquid crystal display panel of the present invention.
Figure 67B:
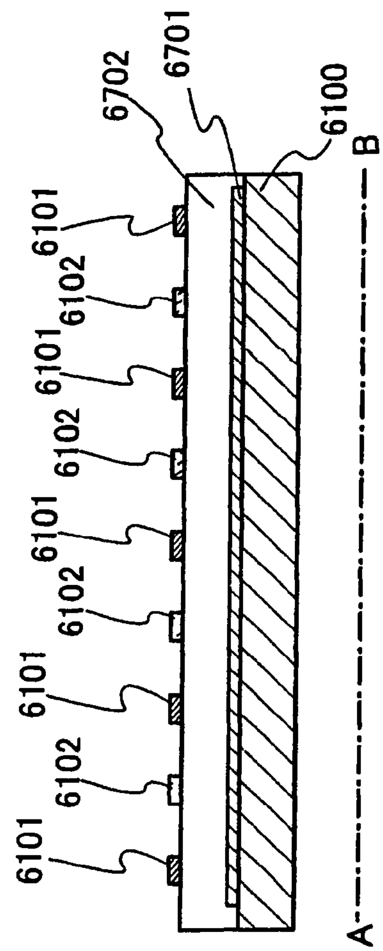
FIG. 67B is a diagram showing a cross section of the main structure of the liquid crystal display panel of the present invention.

Next, description is made of a sixth structure of the circuit substrate of Embodiment Mode 1 of the present invention. FIG. 67A shows a top plan view of the sixth structure. FIG. 67B shows a cross sectional view taken along a dashed-dotted line A-B in FIG. 67A. A third electrode 6701 is provided over a substrate 6100, an insulating film 6702 is provided so as to cover the third electrode 6701, and a first electrode 6101 and a second electrode 6102 are provided over the insulating film 6702. One of the first electrode 6101 and the second electrode 6102 is a pixel electrode and the other is a common electrode. The third electrode 6701 is also a pixel electrode or a common electrode. The first electrode 6101 is a film formed in the same layer as the semiconductor layer of the transistor. The first electrode 6101 and the second electrode 6102 each have a comb-teeth shape, and are arranged so that branch portions of the electrodes are alternate. Note that in FIG. 67B, the third electrode 6701 is provided directly on the substrate 6100; however, the present invention is not limited to this. The circuit substrate of this structure is suitable for a liquid crystal display panel for which a so-called LPS mode and a so-called FFS mode are combined.

Figure 68A:
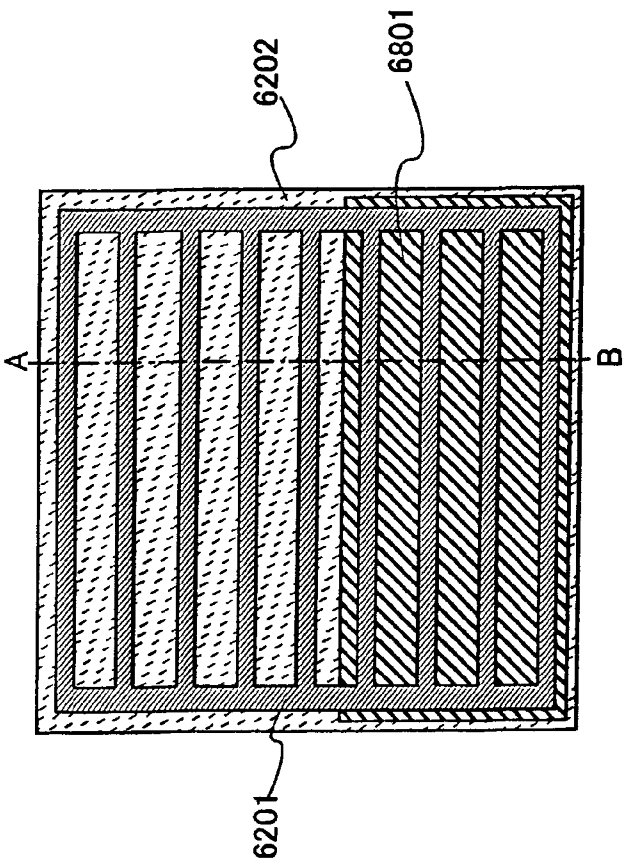
FIG. 68A is a diagram showing a main structure of a liquid crystal display panel of the present invention.
Figure 68B:
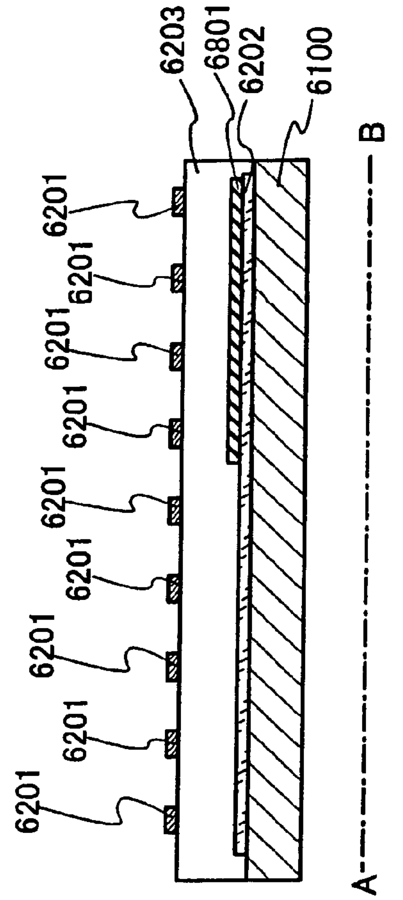
FIG. 68B is a diagram showing a cross section of the main structure of the liquid crystal display panel of the present invention.
Figure 120A:
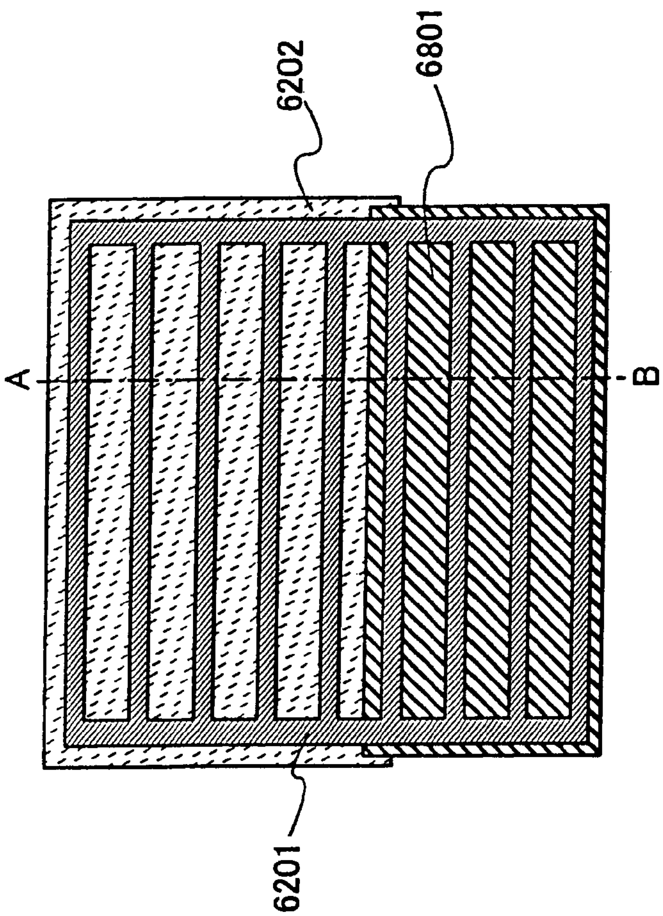
Figure 120B:
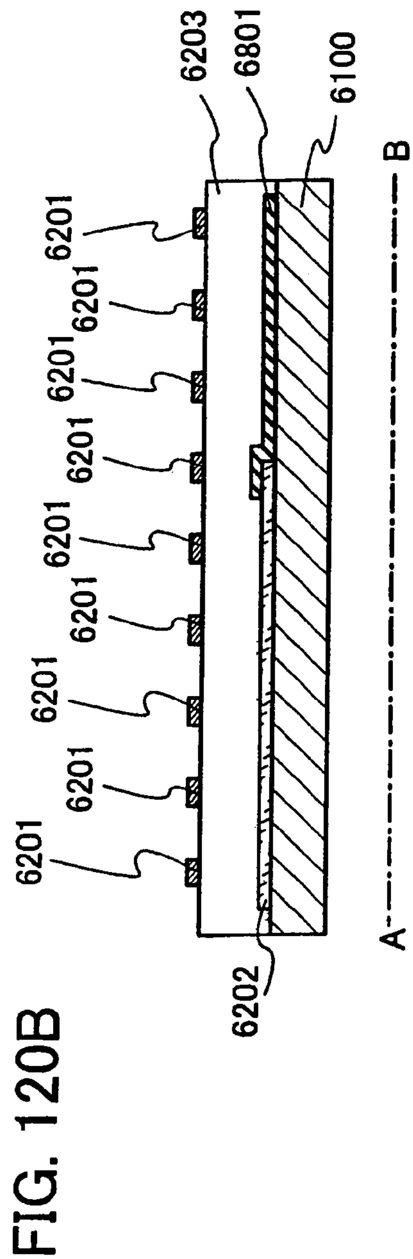
Figure 123A:
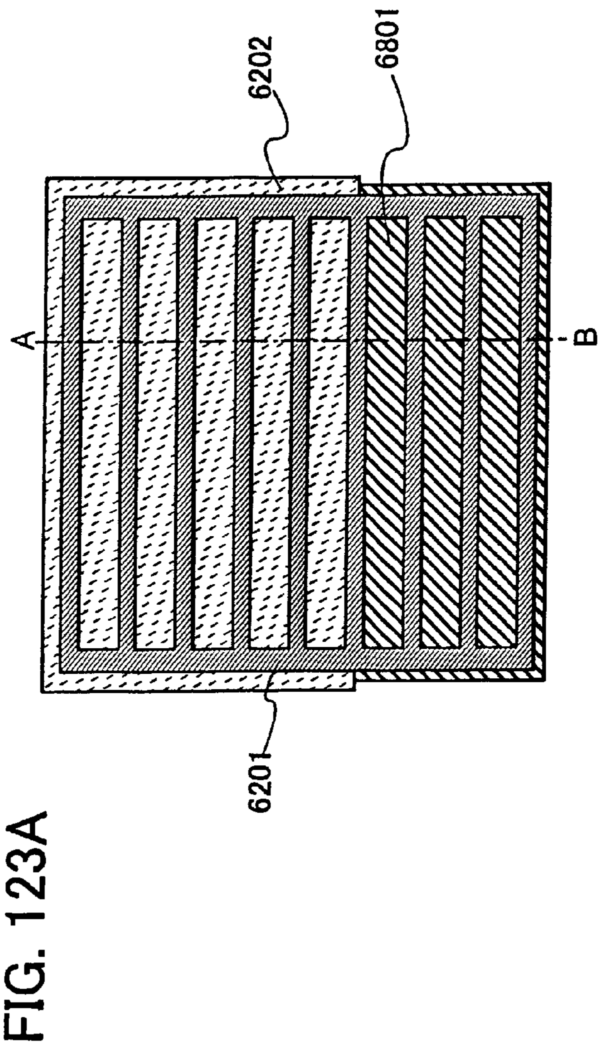
Figure 123B:
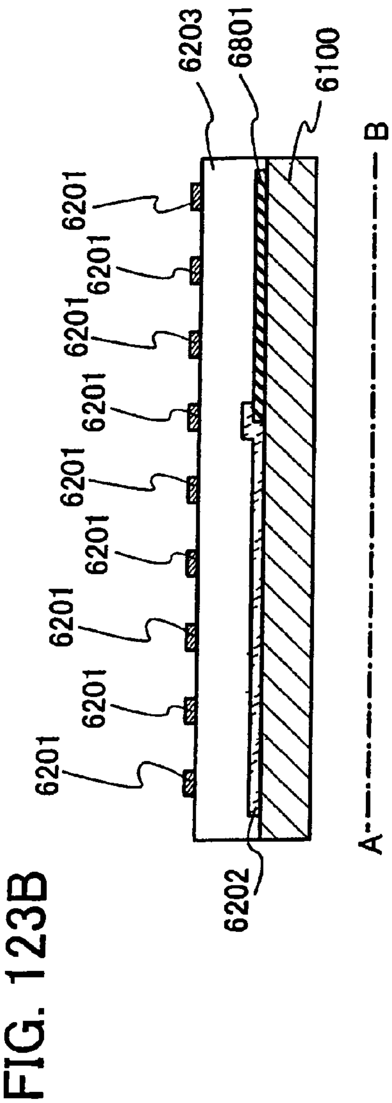
Figure 126A:
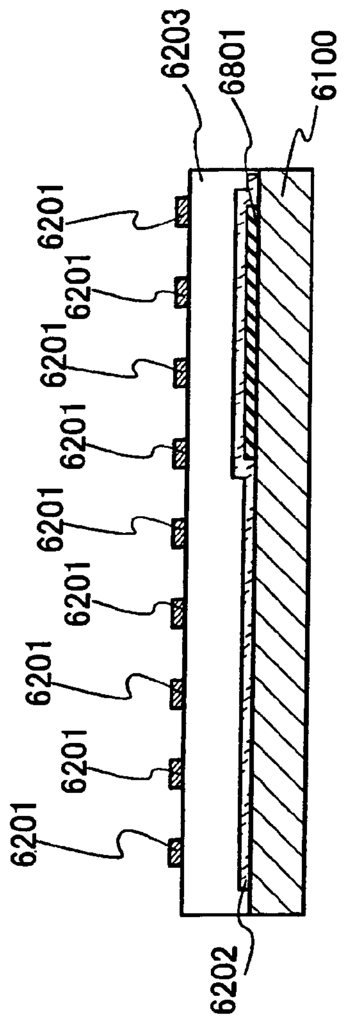

Next, description is made of a seventh structure of the circuit substrate of Embodiment Mode 1 of the present invention. FIG. 68A shows a top plan view of the seventh structure. FIG. 68B shows a cross sectional view taken along a dashed-dotted line A-B in FIG. 68A. FIGS. 68A and 68B show a structure in which a conductive film 6801 having reflectivity is provided over the second electrode 6202. Note that as shown in FIGS. 120A and 120B, the conductive film 6801 having reflectivity may be provided over the substrate 6100, and the conductive film 6801 having reflectivity may be provided so as to partially overlap the second electrode 6202. When using ITO for the second electrode 6202, the structure of FIGS. 120A and 120B is employed so that a film breakage can be prevented. Alternatively, as shown in FIGS. 123A and 123B, the conductive film 6801 having reflectivity may be provided over the substrate 6100, and the second electrode 6202 may be provided so as to partially overlap the conductive film 6801 having reflectivity. Further alternatively, as shown in FIG. 126A, the conductive film 6801 having reflectivity may be provided over the substrate 6100, and the second electrode 6202 may be provided so as to overlap the conductive film 6801 having reflectivity. It is to be noted that when using a metal film and ITO for the conductive film 6801 and the second electrode 6202 respectively in this case, oxidization of the metal film can be prevented and reflectance can be enhanced. In the case where the second electrode 6202 is a conductive film having reflectivity, this structure is suitable for a reflective liquid crystal display panel. On the other hand, in the case where the second electrode 6202 has a light-transmitting property, this structure is suitable for a semi-transmissive liquid crystal display panel.

Figure 69A:
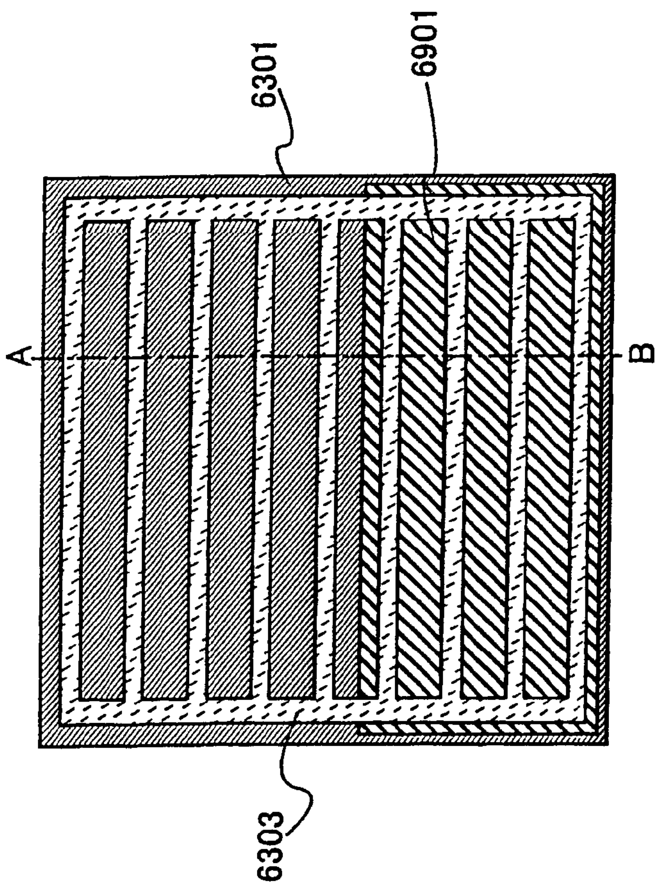
FIG. 69A is a diagram showing a main structure of a liquid crystal display panel of the present invention.
Figure 69B:
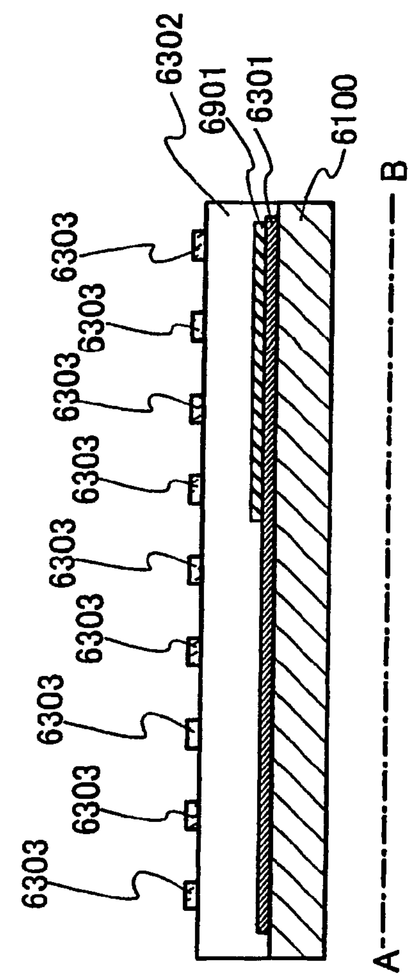
FIG. 69B is a diagram showing a cross section of the main structure of the liquid crystal display panel of the present invention.
Figure 121A:
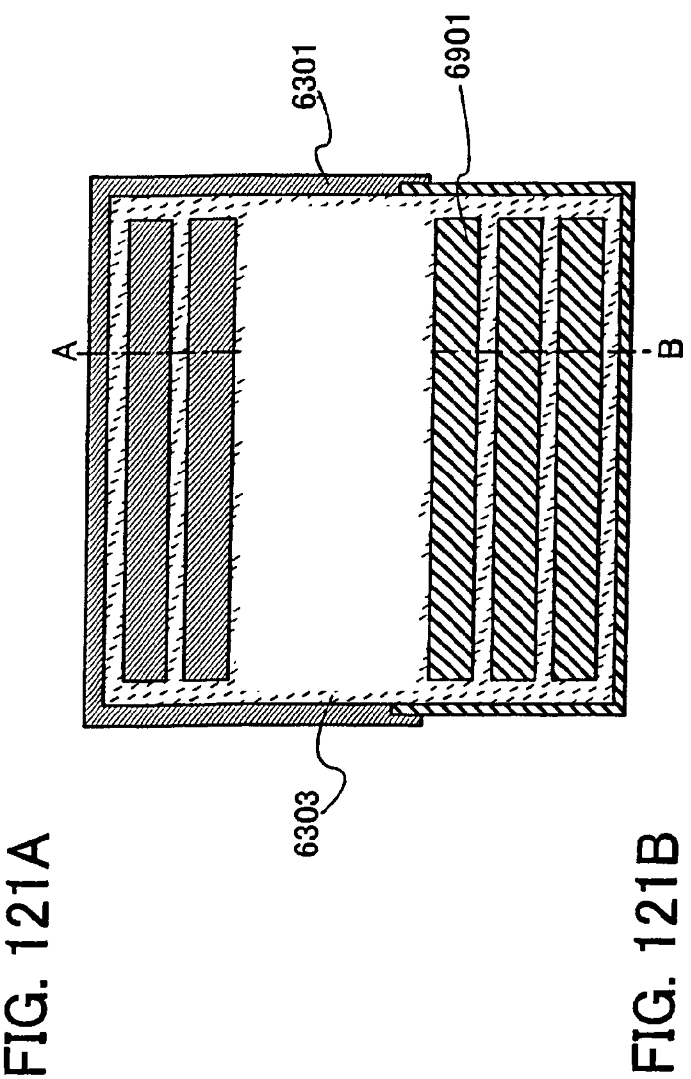
Figure 121B:
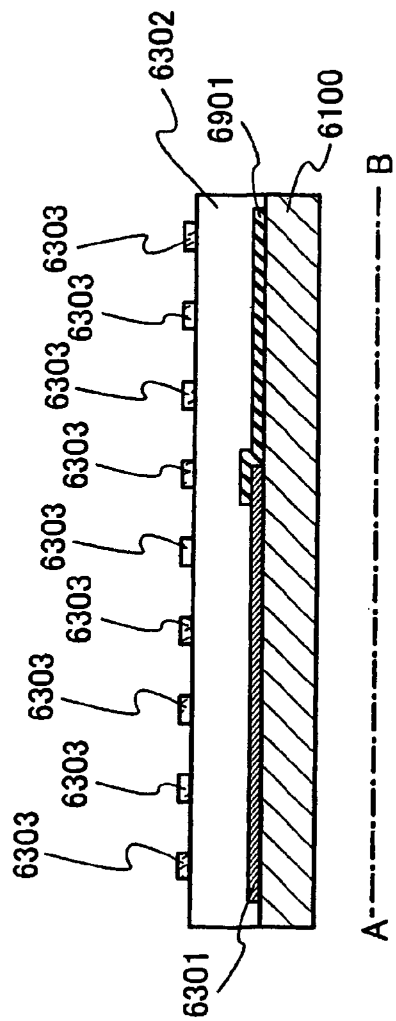
Figure 124A:
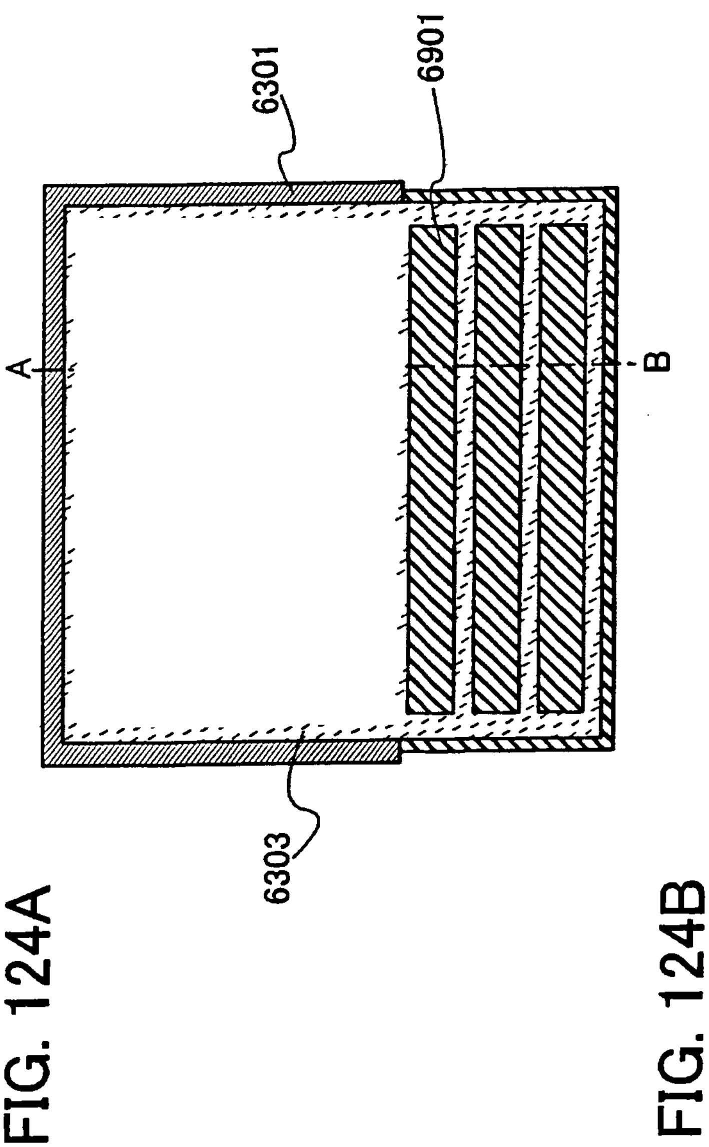
Figure 124B:
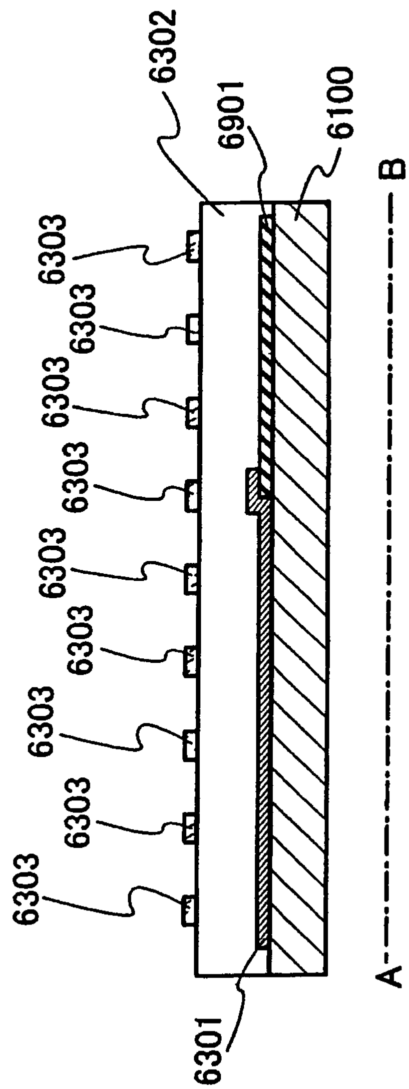
Figure 126B:
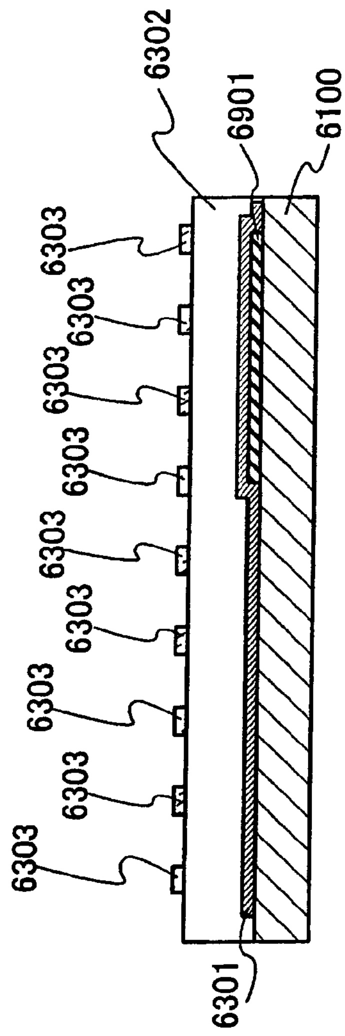

Next, description is made of an eighth structure of the circuit substrate of Embodiment Mode 1 of the present invention. FIG. 69A shows a top plan view of the eighth structure. FIG. 69B shows a cross sectional view taken along a dashed-dotted line A-B in FIG. 69A. FIGS. 69A and 69B show a structure in which a conductive film 6901 having reflectivity is provided over the first electrode 6301. Note that as shown in FIGS. 121A and 121B, the conductive film 6901 having reflectivity may be provided over the substrate 6100, and the conductive film 6901 having reflectivity may be provided so as to partially overlap the first electrode 6301. Alternatively, as shown in FIGS. 124A and 124B, the conductive film 6901 having reflectivity may be provided over the substrate 6100, and the first electrode 6301 may be provided so as to partially overlap the conductive film 6901 having reflectivity. Further alternatively, as shown in FIG. 126B, the conductive film 6901 having reflectivity may be provided over the substrate 6100, and the first electrode 6301 may be provided so as to overlap the conductive film 6901 having reflectivity. It is to be noted that when using a metal film for the conductive film 6901 in this case, oxidization of the metal film can be prevented and reflectance can be enhanced. The first electrode 6301 has a light-transmitting property since it is a film in the same layer as the semiconductor layer of the transistor. Therefore, this structure is suitable for a semi-transmissive liquid crystal display panel.

Figure 70A:
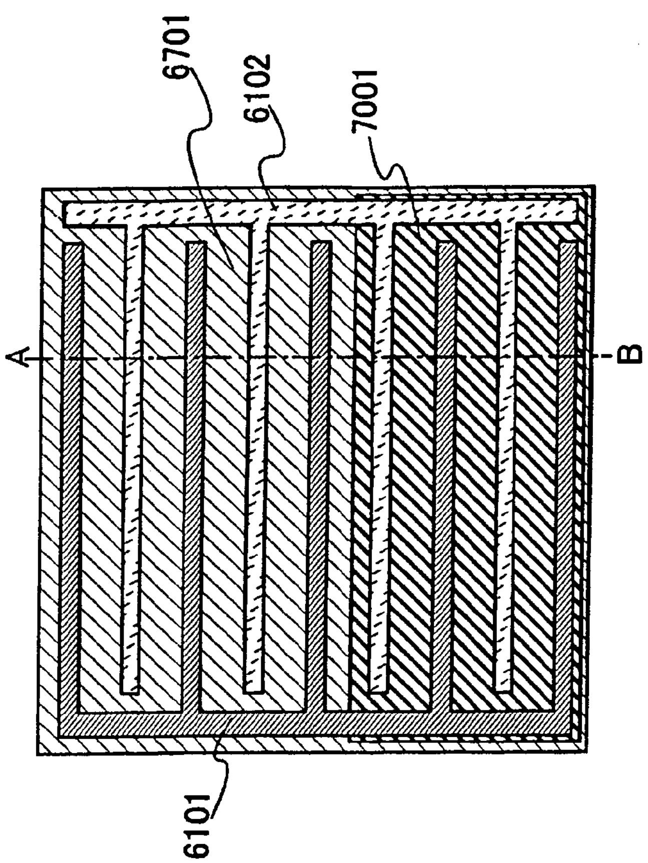
FIG. 70A is a diagram showing a main structure of a liquid crystal display panel of the present invention.
Figure 70B:
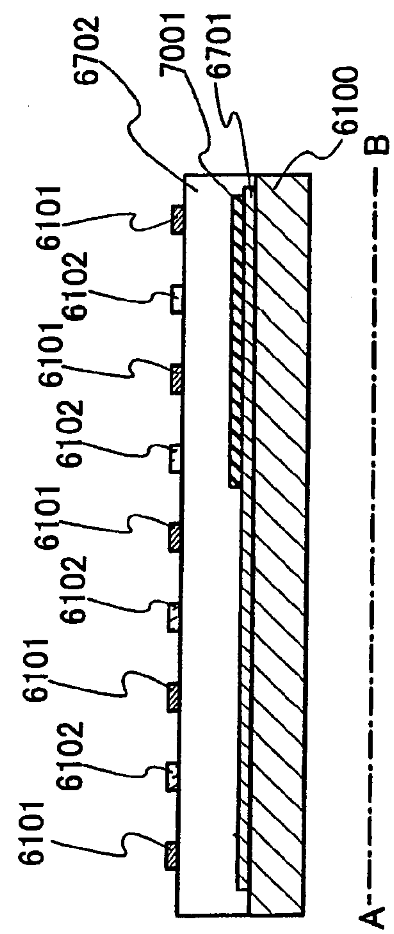
FIG. 70B is a diagram showing a cross section of the main structure of the liquid crystal display panel of the present invention.
Figure 122A:
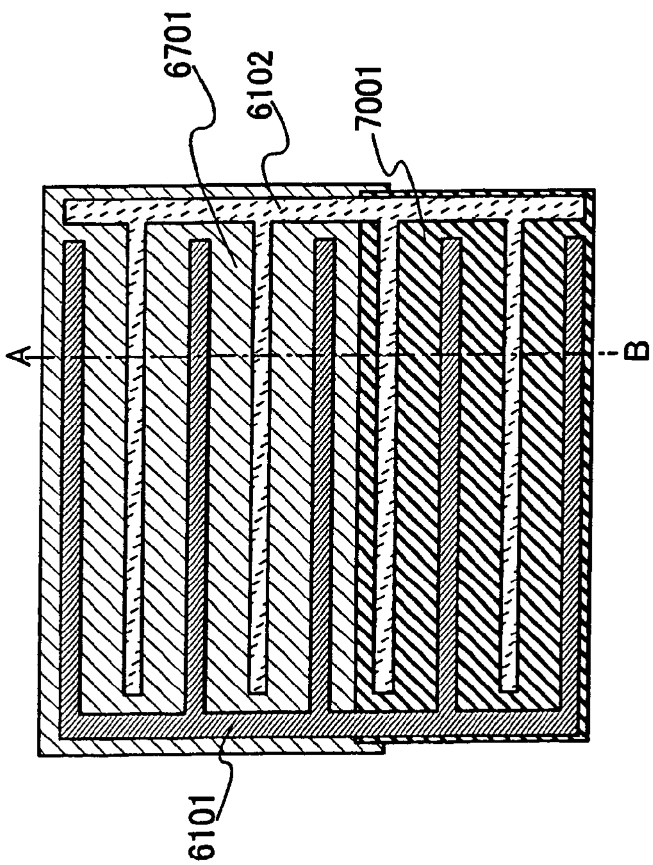
Figure 122B:
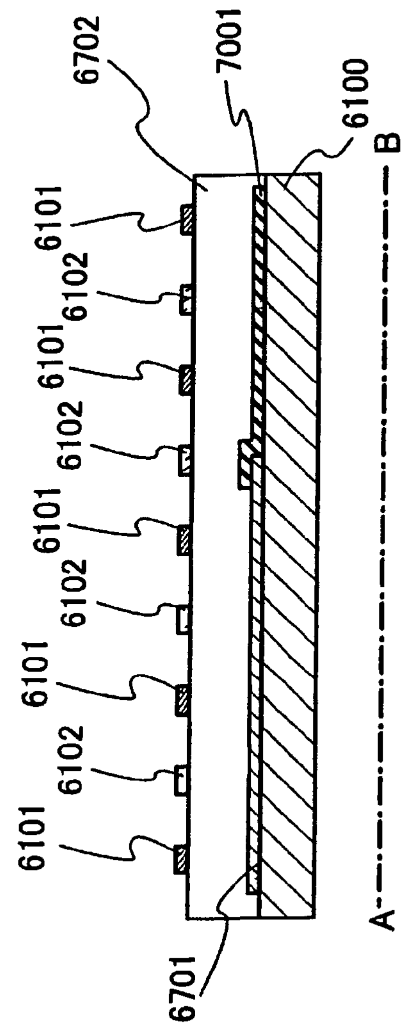
Figure 125A:
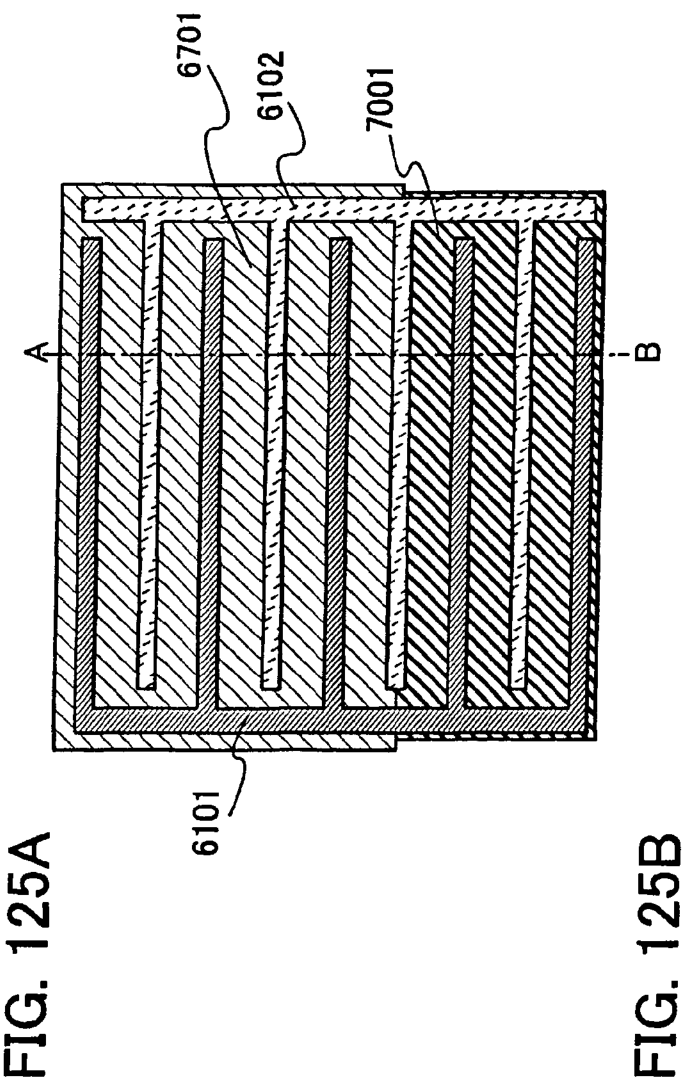
Figure 125B:
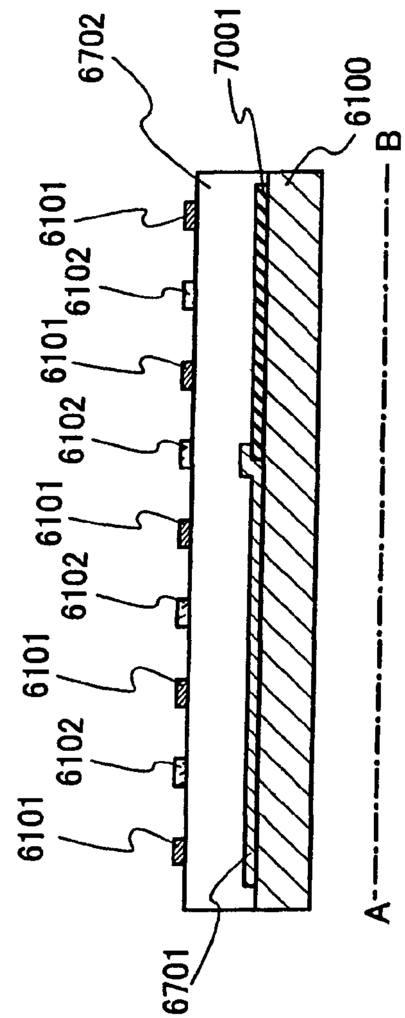
Figure 126C:
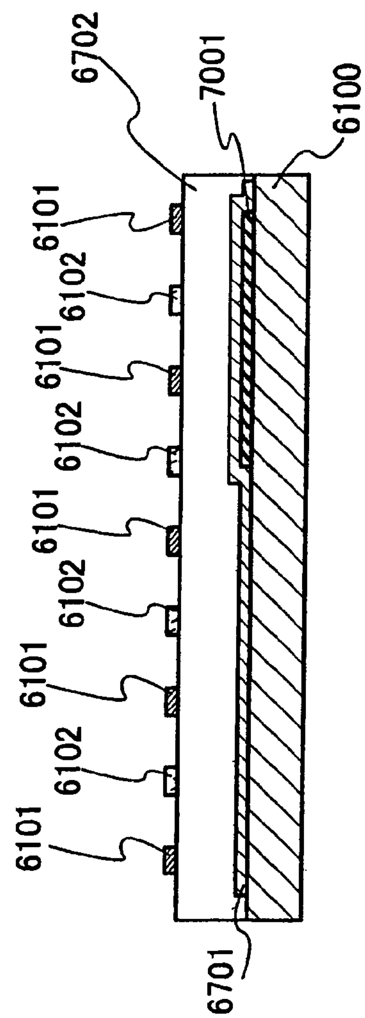

Next, description is made of a ninth structure of the circuit substrate of Embodiment Mode 1 of the present invention. FIG. 70A shows a top plan view of the ninth structure. FIG. 70B shows a cross sectional view taken along a dashed-dotted line A-B in FIG. 70A. FIGS. 70A and 70B show a structure in which a conductive film 7001 having reflectivity is provided over the third electrode 6701. Note that as shown in FIGS. 122A and 122B, the conductive film 7001 having reflectivity may be provided over the substrate 6100, and the conductive film 7001 having reflectivity may be provided so as to partially overlap the third electrode 6701. When using ITO for the third electrode 6701, the structure of FIGS. 122A and 122B is employed so that a film breakage can be prevented. Alternatively, as shown in FIGS. 125A and 125B, the conductive film 7001 having reflectivity may be provided over the substrate 6100, and the third electrode 6701 may be provided so as to partially overlap the conductive film 7001 having reflectivity. Further alternatively, as shown in FIG. 126C, the conductive film 7001 having reflectivity may be provided over the substrate 6100, and the third electrode 6701 may be provided so as to overlap the conductive film 7001 having reflectivity. It is to be noted that when using a metal film and ITO for the conductive film 7001 and the third electrode 6701 respectively in this case, oxidization of the metal film can be prevented and reflectance can be enhanced. In the case where the third electrode 6701 is the conductive film having reflectivity, this structure is suitable for a reflective liquid crystal display panel. On the other hand, in the case where the third electrode 6701 has a light-transmitting property, this structure is suitable for a semi-transmissive liquid crystal display panel.

Figure 71A:
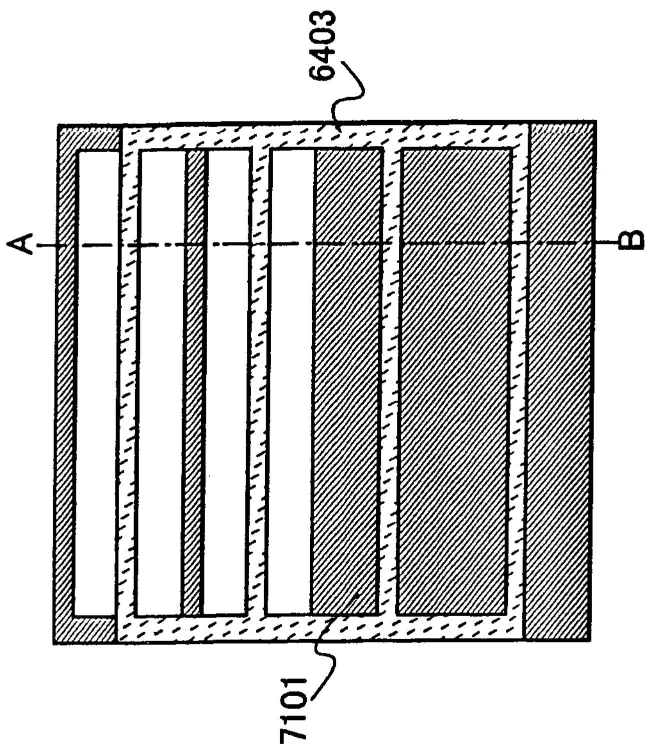
FIG. 71A is a diagram showing a main structure of a liquid crystal display panel of the present invention.
Figure 71B:
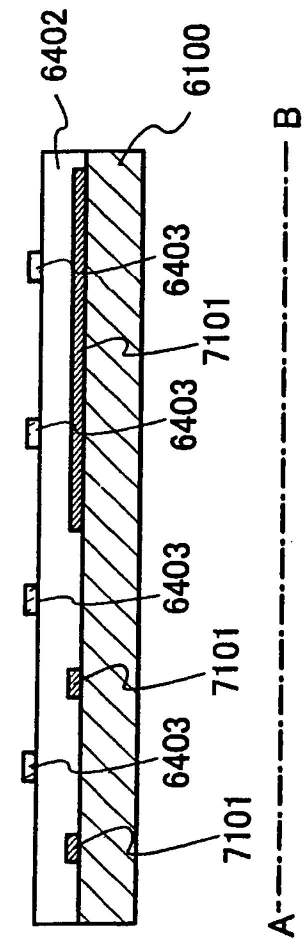
FIG. 71B is a diagram showing a cross section of the main structure of the liquid crystal display panel of the present invention.

Next, description is made of a tenth structure of the circuit substrate of Embodiment Mode 1 of the present invention. FIG. 71A shows a top plan view of the tenth structure. FIG. 71B shows a cross sectional view taken along a dashed-dotted line A-B in FIG. 71A. According to the tenth structure, a first electrode 7101 including a plate-like region (having a shape covering an entire surface) and a region having a plurality of slits is used instead of the first electrode 6401 in the fourth structure. The circuit substrate of this structure is suitable for a liquid crystal display panel for which a so-called IPS mode and a so-called FFS mode are combined. Being a film formed in the same layer as the semiconductor layer of the transistor, the first electrode 7101 has a light-transmitting property. Therefore, this structure is suitable for a semi-transmissive liquid crystal display panel.

Figure 72A:
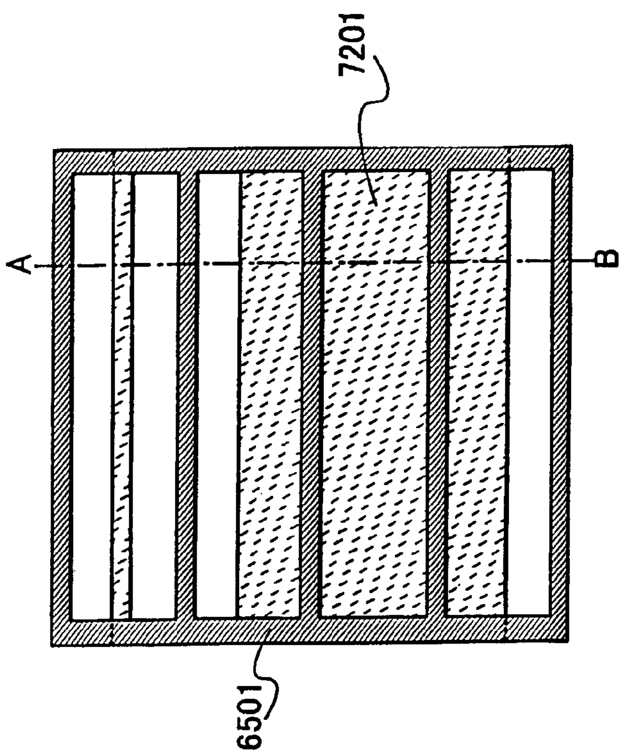
FIG. 72A is a diagram showing a main structure of a liquid crystal display panel of the present invention.
Figure 72B:
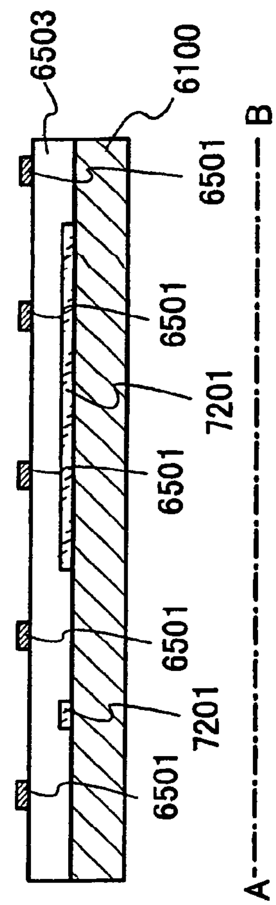
FIG. 72B is a diagram showing a cross section of the main structure of the liquid crystal display panel of the present invention.

Next, description is made of an eleventh structure of the circuit substrate of Embodiment Mode 1 of the present invention. FIG. 72A shows a top plan view of the eleventh structure. FIG. 72B shows a cross sectional view taken along a dashed-dotted line A-B in FIG. 72A. According to the eleventh structure, a second electrode 7201 including a plate-like region (having a shape covering an entire surface) and a region having a plurality of slits is used instead of the second electrode 6502 in the fifth structure. The circuit substrate of this structure is suitable for a liquid crystal display panel for which a so-called IPS mode and a so-called FFS mode are combined. In the case where the second electrode 7201 is the conductive film having reflectivity, this structure is suitable for a reflective liquid crystal display panel. On the other hand, in the case where the second electrode 7201 has a light-transmitting property, this structure is suitable for a semi-transmissive liquid crystal display panel.

Figure 73A:
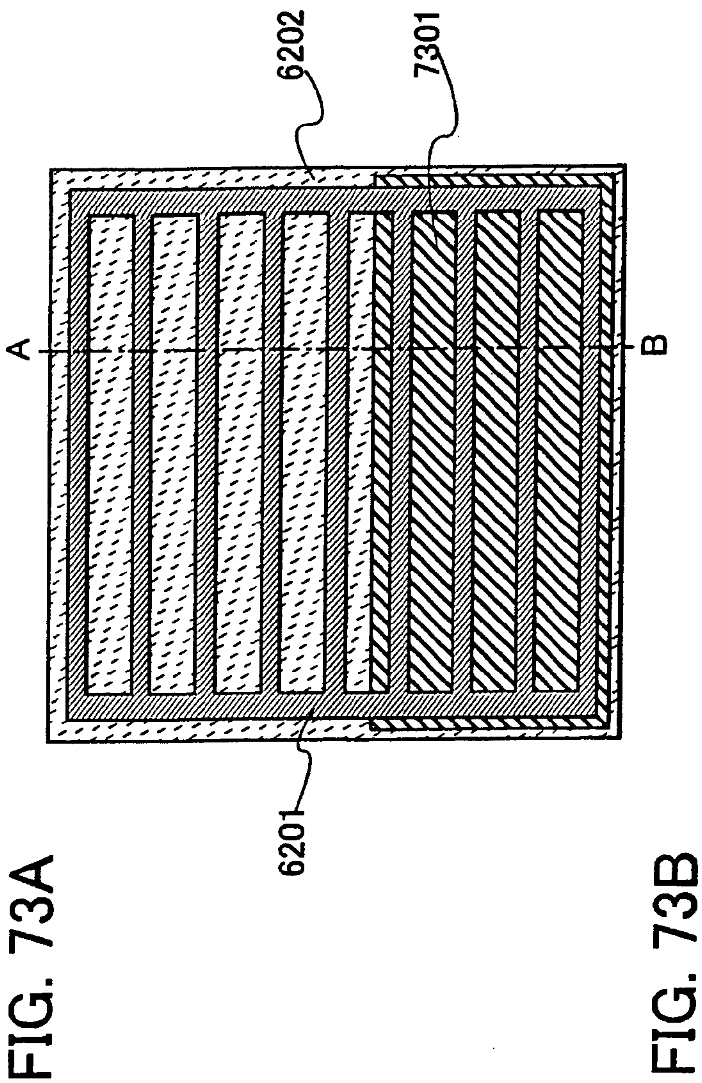
FIG. 73A is a diagram showing a main structure of a liquid crystal display panel of the present invention.
Figure 73B:
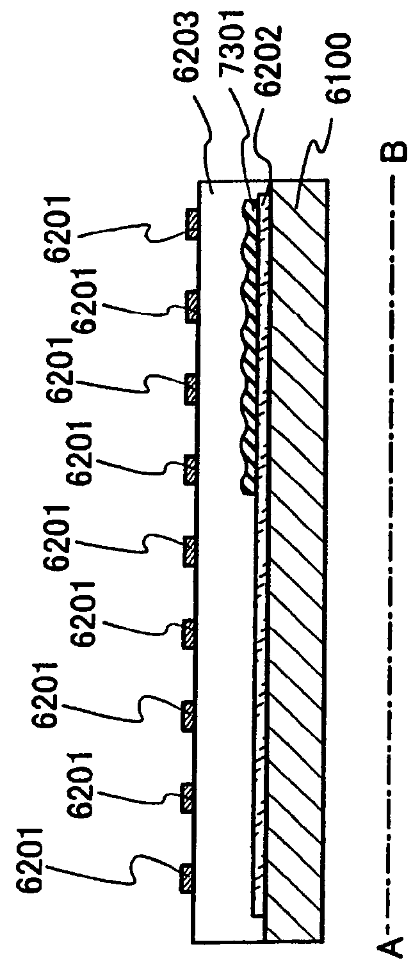
FIG. 73B is a diagram showing a cross section of the main structure of the liquid crystal display panel of the present invention.
Figures 127A, 127B, 127C:
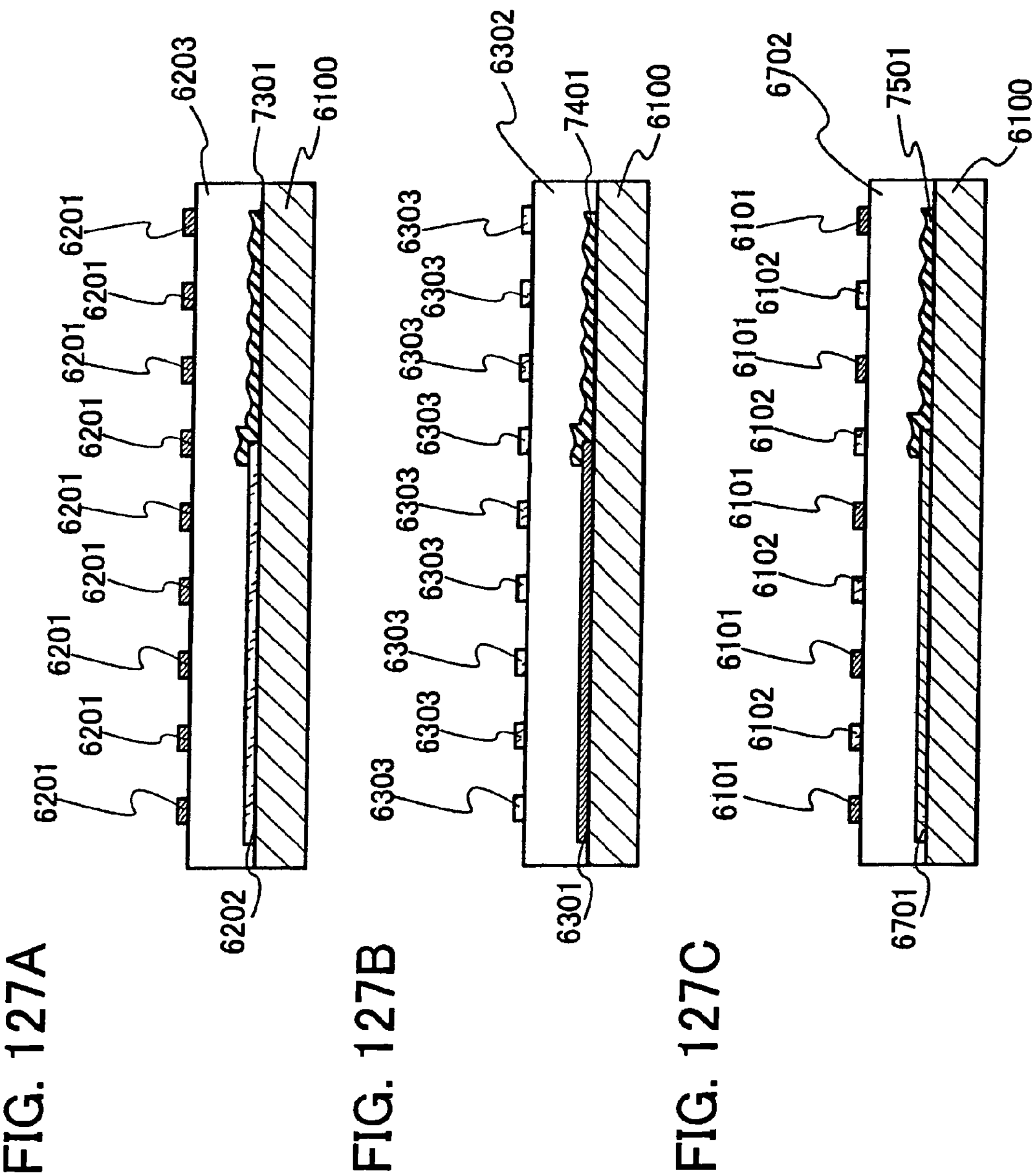
Figures 128A, 128B, 128C:
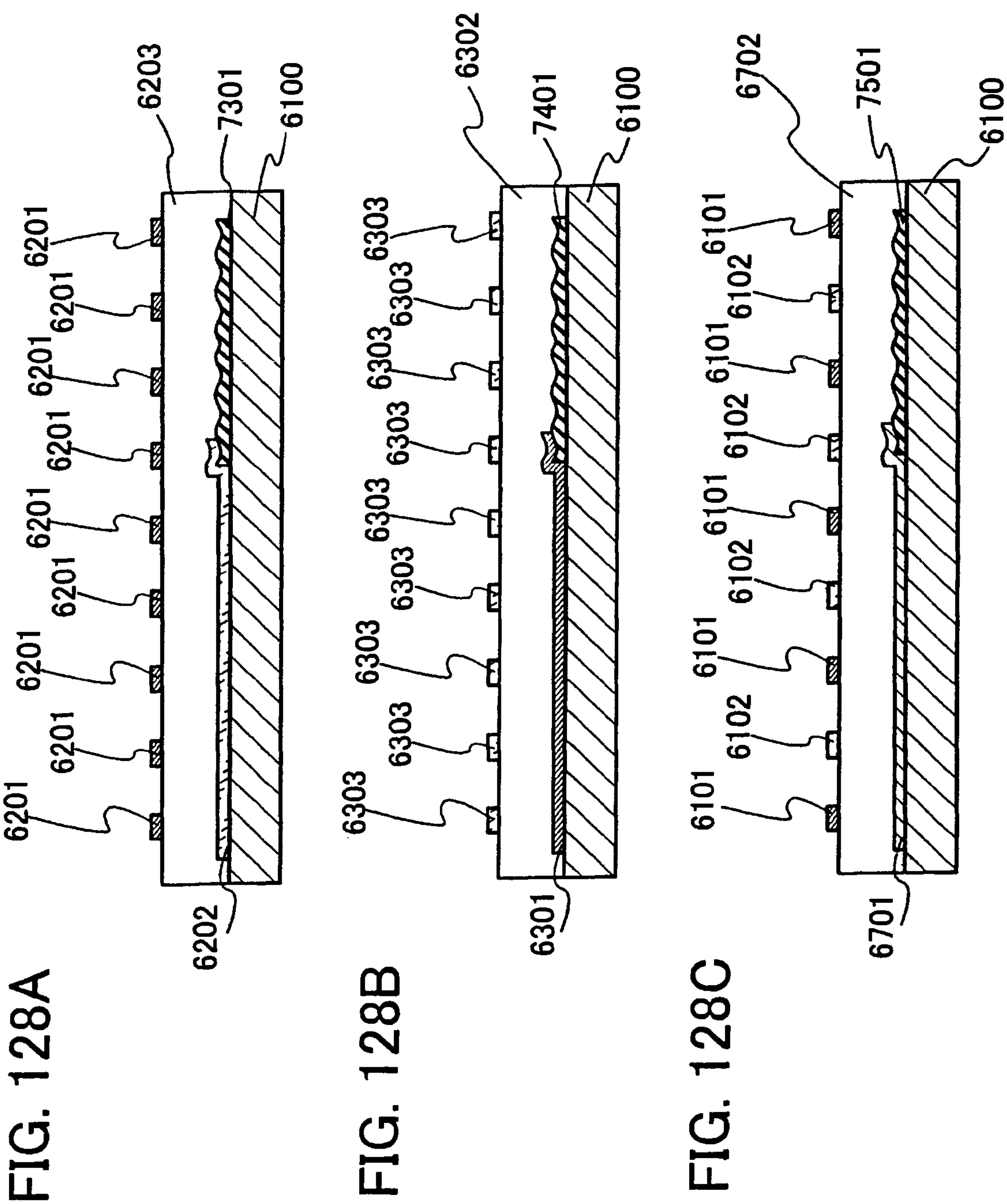
Figures 129A, 129B, 129C:
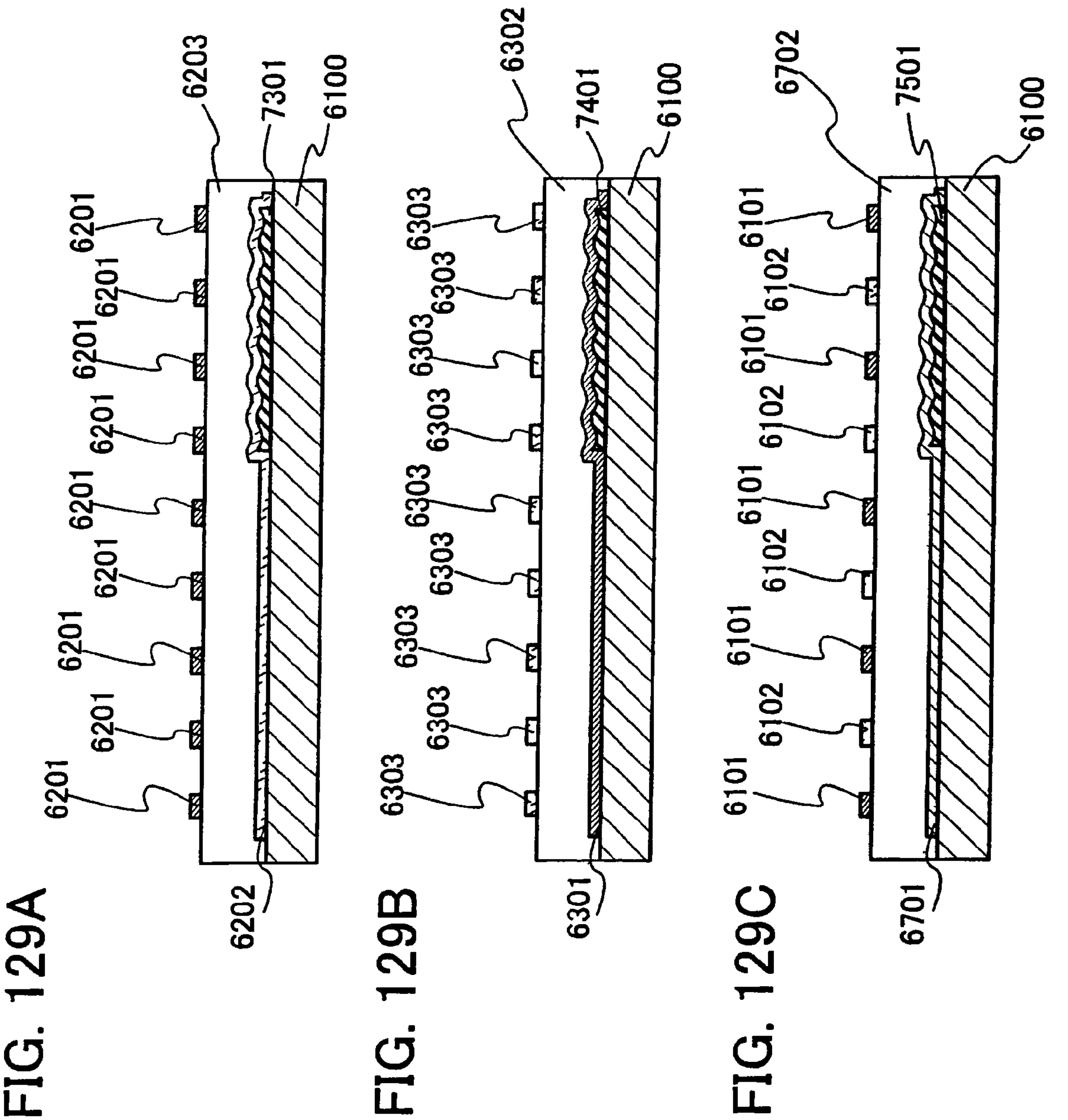

Next, description is made of a twelfth structure of the circuit substrate of Embodiment Mode 1 of the present invention. FIG. 73A shows a top plan view of the twelfth structure. FIG. 73B shows a cross sectional view taken along a dashed-dotted line A-B in FIG. 73A. According to the twelfth structure, a concave-convex shaped conductive film 7301 having reflectivity is used instead of the conductive film 6801 having reflectivity in the seventh structure. In addition, FIGS. 127A, 128A, and 129A each show a structure in which the concave-convex shaped conductive film 7301 having reflectivity is applied instead of the conductive film 6801 having reflectivity in FIGS. 120B, 123B, and 126A. In FIG. 129A, in the case of using a metal film and ITO for the conductive film 7301 and the second electrode 6202 respectively, oxidization of the metal film can be prevented and reflectance can be enhanced. In the case where the second electrode 6202 is a conductive film having reflectivity, this structure is suitable for a reflective liquid crystal display panel. On the other hand, in the case where the second electrode 6202 has a light-transmitting property, this structure is suitable for a semi-transmissive liquid crystal display panel.

Figure 74A:
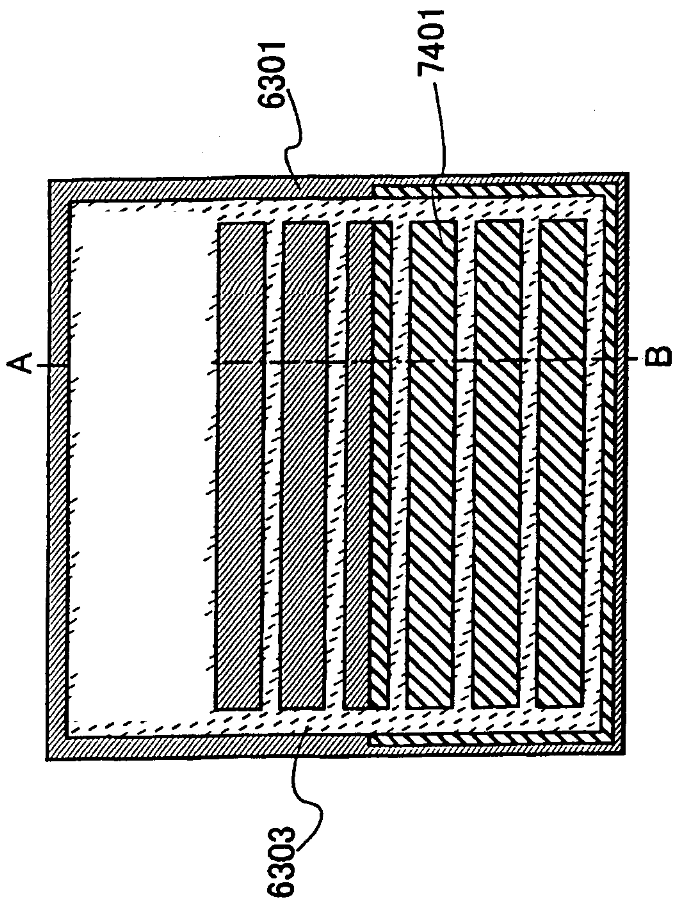
FIG. 74A is a diagram showing a main structure of a liquid crystal display panel of the present invention.
Figure 74B:
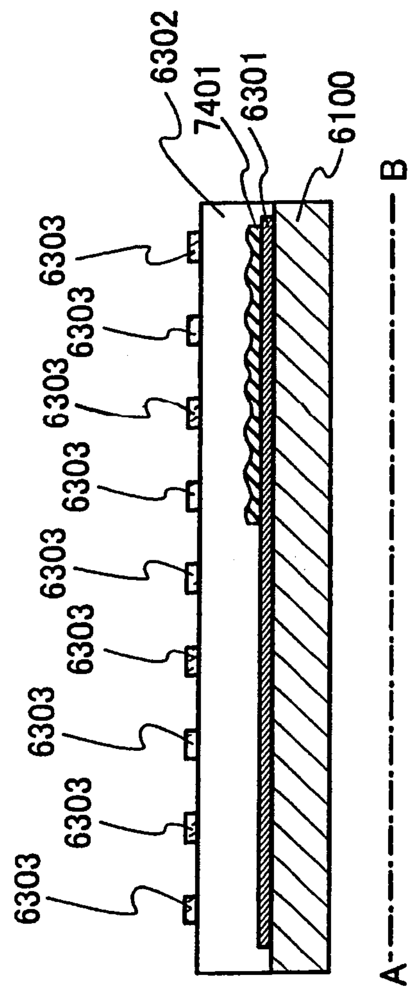
FIG. 74B is a diagram showing a cross section of the main structure of the liquid crystal display panel of the present invention.

Next, description is made of a thirteenth structure of the circuit substrate of Embodiment Mode 1 of the present invention. FIG. 74A shows a top plan view of the thirteenth structure. FIG. 74B shows a cross sectional view taken along a dashed-dotted line A-B in FIG. 74A. According to the thirteenth structure, a concave-convex shaped conductive film 7401 having reflectivity is used instead of the conductive film 6901 having reflectivity in the eighth structure. In addition, FIGS. 127B, 128B, and 129B each show a structure in which a concave-convex shaped conductive film 7401 having reflectivity is applied instead of the conductive film 6901 having reflectivity in FIGS. 121B, 124B, and 126B. In FIG. 129B, in the case of using a metal film for the conductive film 7401, oxidization of the metal film can be prevented and reflectance can be enhanced. Being a film formed in the same layer as the semiconductor layer of the transistor, the first electrode 7401 has a light-transmitting property. Therefore, this structure is suitable for a semi-transmissive liquid crystal display panel.

Figure 75A:
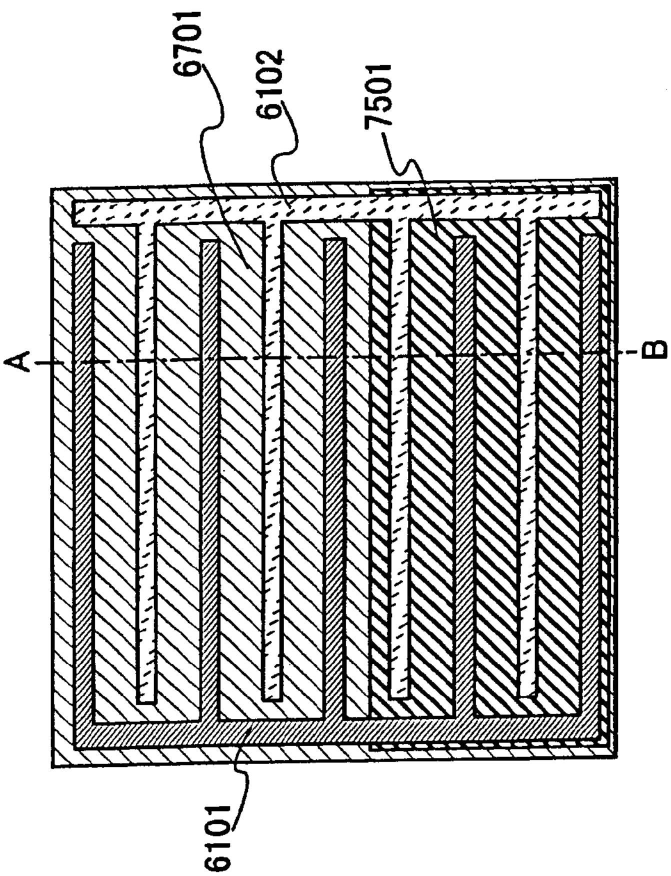
FIG. 75A is a diagram showing a main structure of a liquid crystal display panel of the present invention.
Figure 75B:
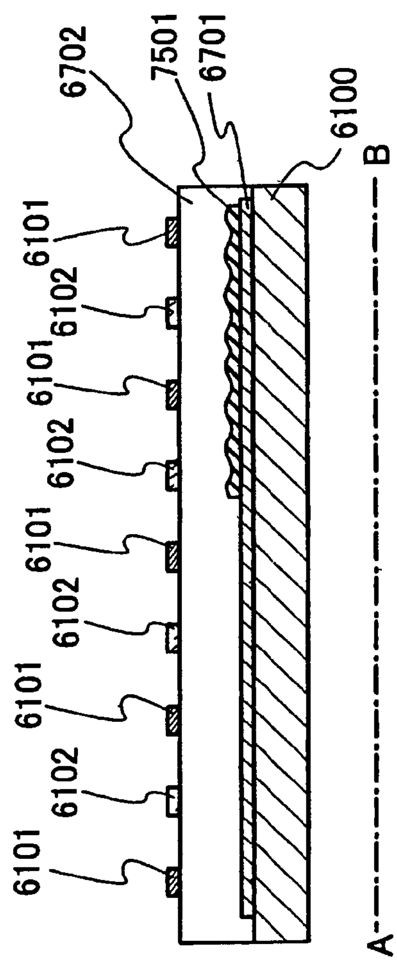
FIG. 75B is a diagram showing a cross section of the main structure of the liquid crystal display panel of the present invention.

Next, description is made of a fourteenth structure of the circuit substrate of Embodiment Mode 1 of the present invention. FIG. 75A shows a top plan view of the fourteenth structure. FIG. 75B shows a cross sectional view taken along a dashed-dotted line A-B in FIG. 75A. According to the fourteenth structure, a concave-convex shaped conductive film 7501 having reflectivity is used instead of the conductive film 7001 having reflectivity in the ninth structure. In addition, FIGS. 127C, 128C, and 129C each show a structure in which the concave-convex shaped conductive film 7501 having reflectivity is applied instead of the conductive film 7001 having reflectivity in FIGS. 122B, 125B, and 126C. In FIG. 129C, in the case of using a metal film and ITO for the conductive film 7501 and the third electrode 6701 respectively, oxidization of the metal film can be prevented and reflectance can be enhanced. In the case where the third electrode 6701 is a conductive film having reflectivity, this structure is suitable for a reflective liquid crystal display panel. On the other hand, in the case where the third electrode 6701 has a light-transmitting property, this structure is suitable for a semi-transmissive liquid crystal display panel.

Figure 76A:
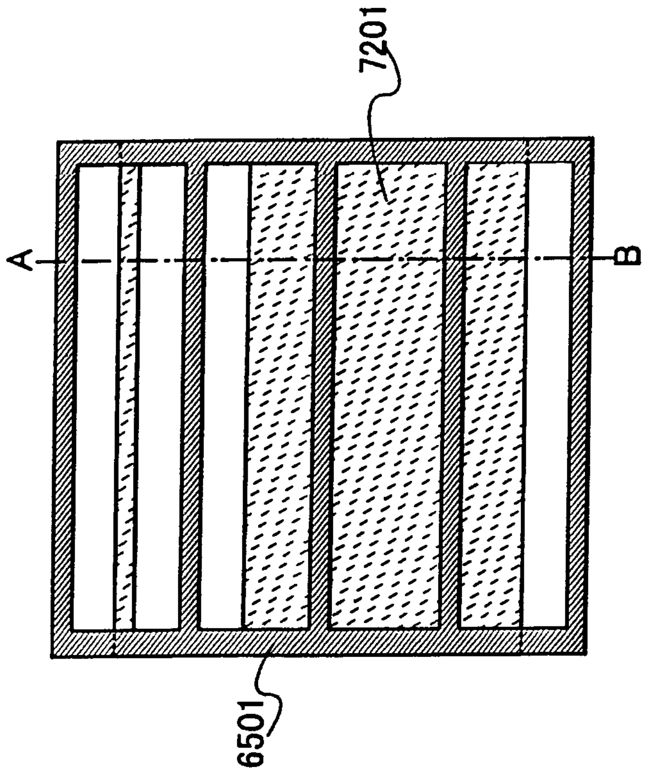
FIG. 76A is a diagram showing a main structure of a liquid crystal display panel of the present invention.
Figure 76B:
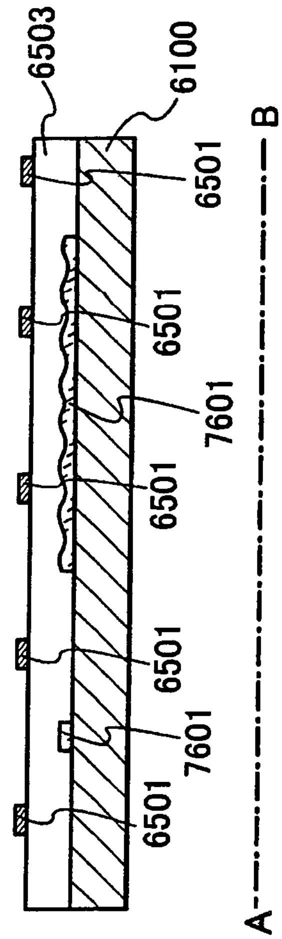
FIG. 76B is a diagram showing a cross section of the main structure of the liquid crystal display panel of the present invention.

Next, description is made of a fifteenth structure of the circuit substrate of Embodiment Mode 1 of the present invention. FIG. 76A shows a top plan view of the fifteenth structure. FIG. 76B shows a cross sectional view taken along a dashed-dotted line A-B in FIG. 76A. According to the fifteenth structure, a concave-convex shaped second electrode 7601 is used instead of the second electrode 7201 in the eleventh structure. In the case where the second electrode 7201 is a conductive film having reflectivity, this structure is suitable for a reflective liquid crystal display panel. On the other hand, in the case where the second electrode 7201 has a light-transmitting property, this structure is suitable for a semi-transmissive liquid crystal display panel.

Figure 77A:
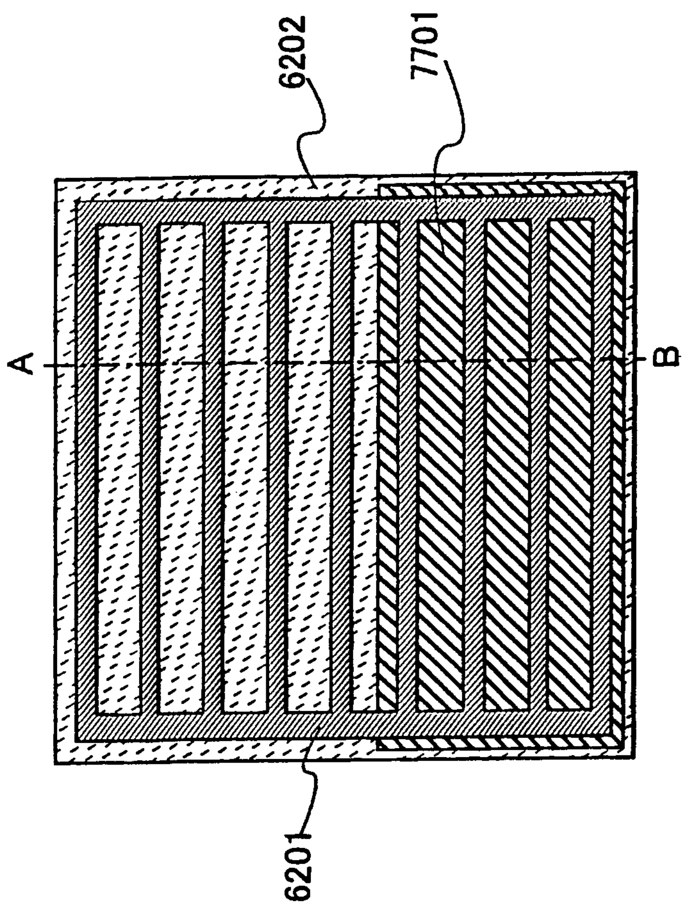
FIG. 77A is a diagram showing a main structure of a liquid crystal display panel of the present invention.
Figure 77B:
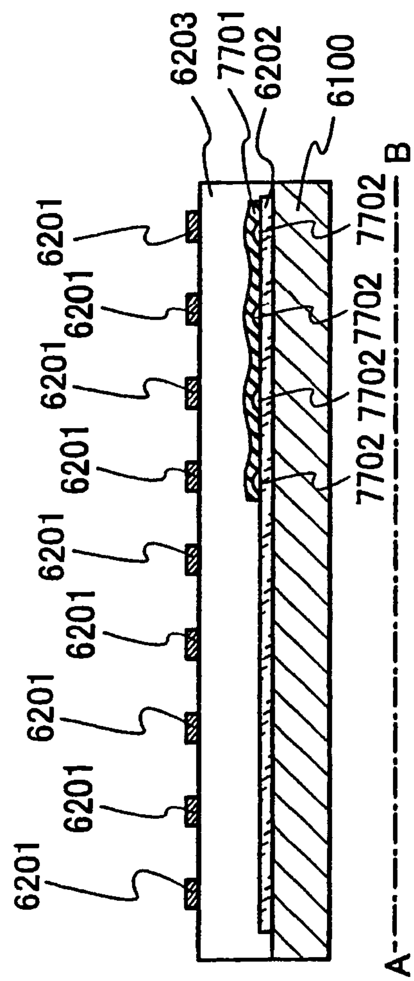
FIG. 77B is a diagram showing a cross section of the main structure of the liquid crystal display panel of the present invention.

Next, description is made of a sixteenth structure of the circuit substrate of Embodiment Mode 1 of the present invention. FIG. 77A shows a top plan view of the sixteenth structure. FIG. 77B shows a cross sectional view taken along a dashed-dotted line A-B in FIG. 77A. According to the sixteenth structure, by formation of a projection 7702 on the second electrode 6202 and formation of a concave-convex shaped conductive film 7701 having reflectivity over the second electrode 6202 and projection 7702, the concave-convex shaped conductive film 7701 having reflectivity is used instead of the conductive film 6801 having reflectivity in the seventh structure. In the case where the second electrode 6202 is a conductive film having reflectivity, this structure is suitable for a reflective liquid crystal display panel. On the other hand, in the case where the second electrode 6202 has a light-transmitting property, this structure is suitable for a semi-transmissive liquid crystal display panel.

A shape of the projection 7702 is reflected, whereby a concave-convex shape is formed on a surface of the conductive film 7701. Using the projection 7702 makes it easy to adjust great height differences of concavity and convexity and the number of concavity and convexity.

Figure 78A:
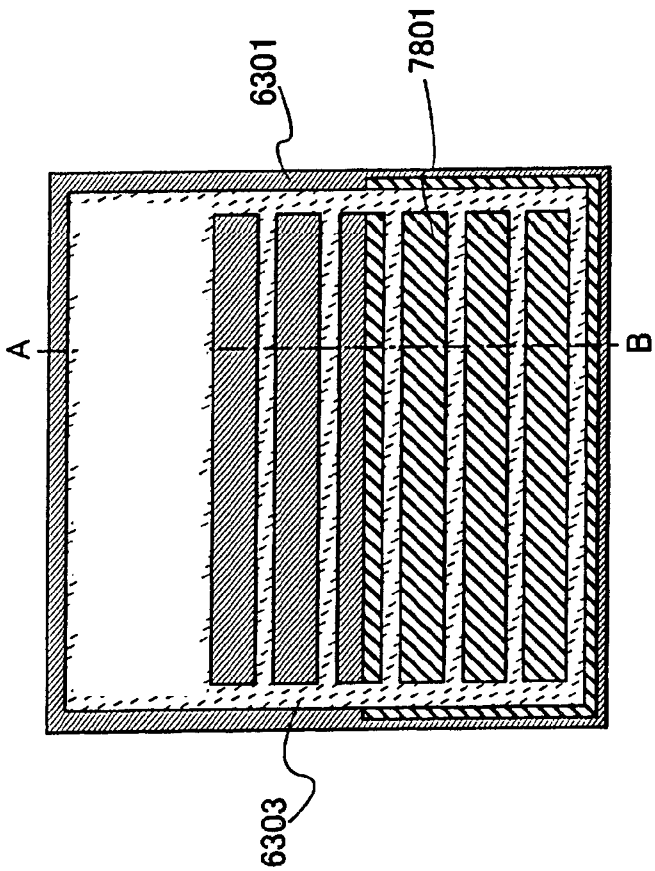
FIG. 78A is a diagram showing a main structure of a liquid crystal display panel of the present invention.
Figure 78B:
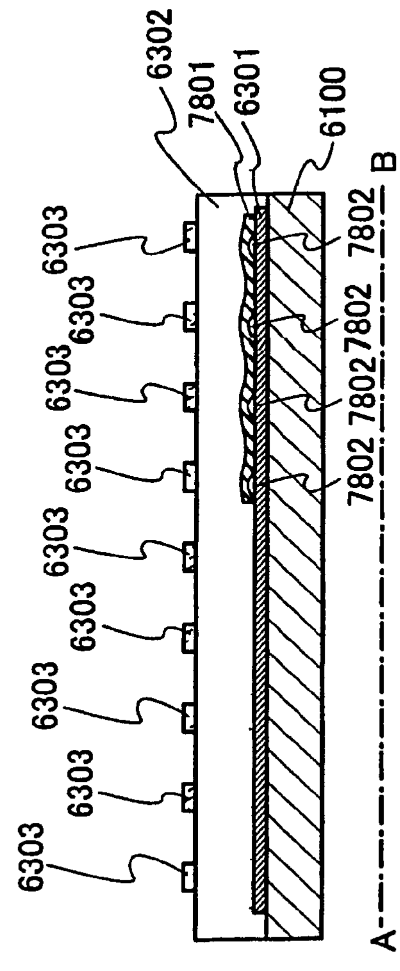
FIG. 78B is a diagram showing a cross section of the main structure of the liquid crystal display panel of the present invention.

Next, description is made of a seventeenth structure of the circuit substrate of Embodiment Mode 1 of the present invention. FIG. 78A shows a top plan view of the seventeenth structure. FIG. 78B shows a cross sectional view taken along a dashed-dotted line A-B in FIG. 78A. According to the seventeenth structure, by formation of a projection 7702 on the first electrode 6301 and formation of a conductive film 7801 having reflectivity over the first electrode 6301 and a projection 7802, the concave-convex shaped conductive film 7801 is used instead of the conductive film 6901 having reflectivity in the eighth structure. Being a film formed in the same layer as the semiconductor layer of the transistor, the first electrode 6301 has a light-transmitting property. Therefore, this structure is suitable for a semi-transmissive liquid crystal display panel.

A shape of the projection 7802 is reflected, whereby a concave-convex shape is formed on a surface of the conductive film 7801. Using the projection 7802 makes it easy to adjust great height differences of concavity and convexity and the number of concavity and convexity.

Figure 79A:
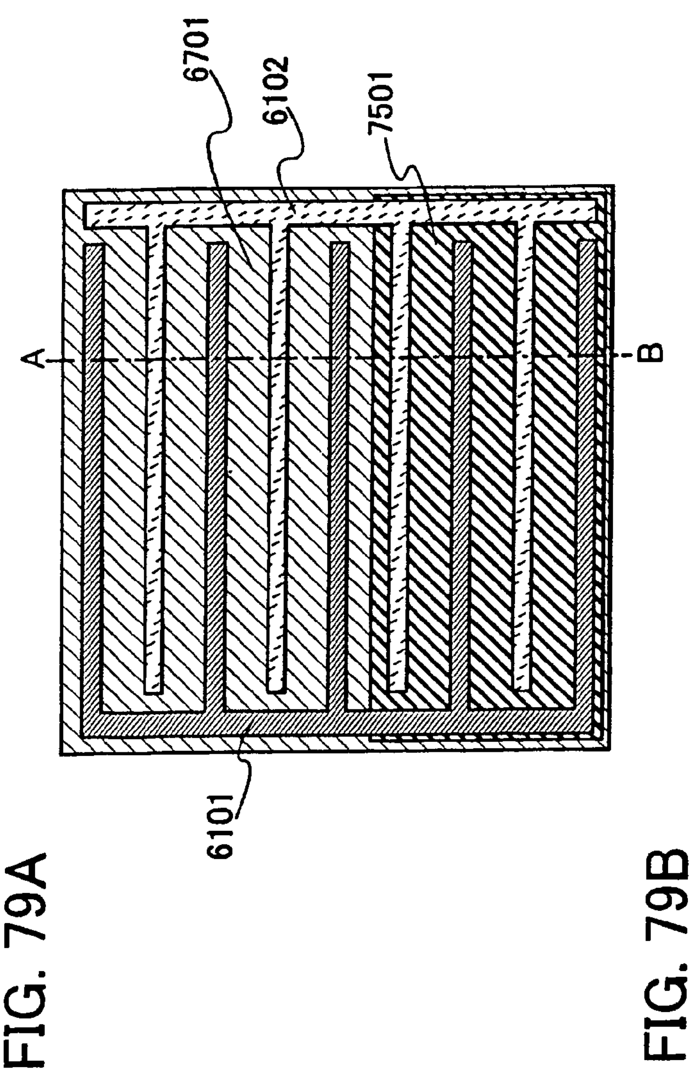
FIG. 79A is a diagram showing a main structure of a liquid crystal display panel of the present invention.
Figure 79B:
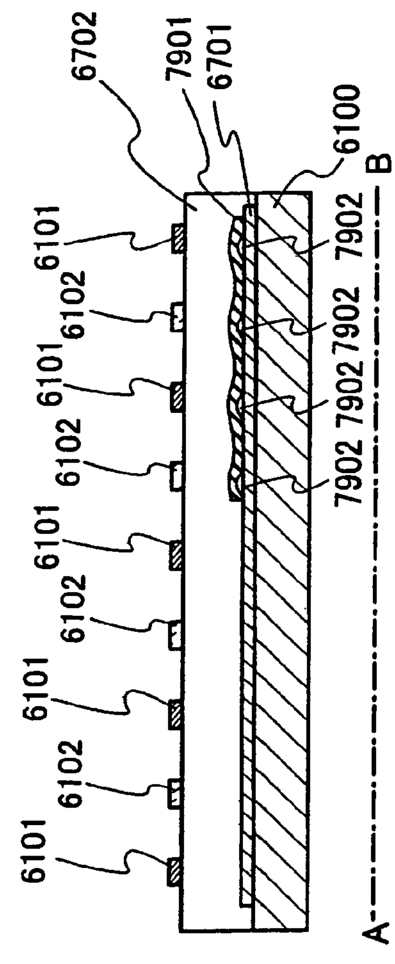
FIG. 79B is a diagram showing a cross section of the main structure of the liquid crystal display panel of the present invention.

Next, description is made of an eighteenth structure of the circuit substrate of Embodiment Mode 1 of the present invention. FIG. 79A shows a top plan view of the eighteenth structure. FIG. 79B shows a cross sectional view taken along a dashed-dotted line A-B in FIG. 79A. According to the eighteenth structure, by formation of a projection 7902 on the third electrode 6701 and formation of a conductive film 7901 having reflectivity over the third electrode 6701 and the projection 7902, the concave-convex shaped conductive film 7901 is used instead of the conductive film 7001 having reflectivity in the ninth structure. In the case where the third electrode 6701 is the conductive film having reflectivity, this structure is suitable for a reflective liquid crystal display panel. On the other hand, in the case where the third electrode 6701 has a light-transmitting property, this structure is suitable for a semi-transmissive liquid crystal display panel.

A shape of the projection 7902 is reflected, whereby a concave-convex shape is formed on a surface of the conductive film 7901. Using the projection 7902 makes it easy to adjust great height differences of concavity and convexity and the number of concavity and convexity.

Figure 80A:
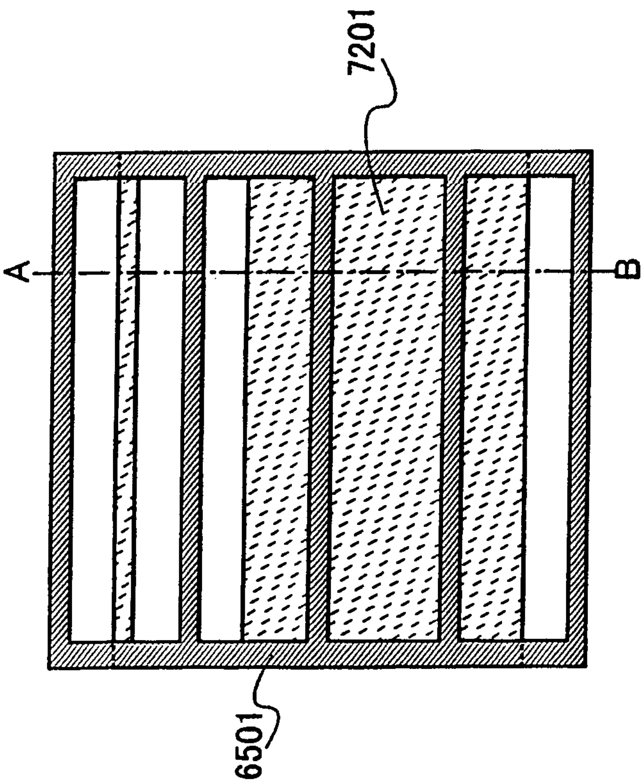
FIG. 80A is a diagram showing a main structure of a liquid crystal display panel of the present invention.
Figure 80B:
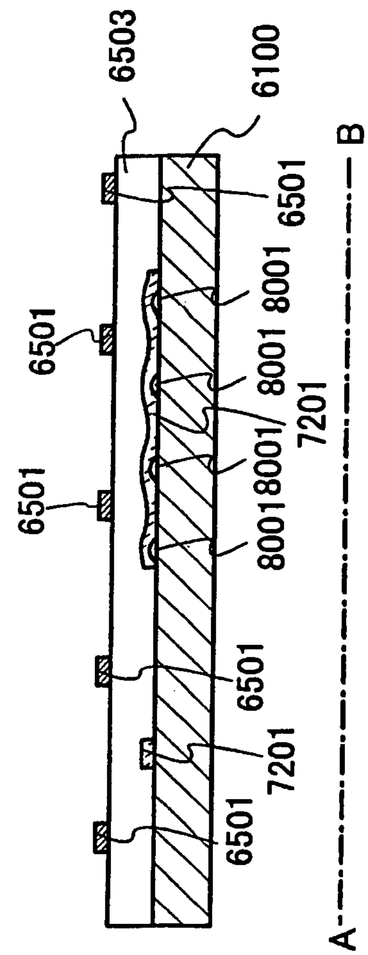
FIG. 80B is a diagram showing a cross section of the main structure of the liquid crystal display panel of the present invention.

Next, description is made of a nineteenth structure of the circuit substrate of Embodiment Mode 1 of the present invention. FIG. 80A shows a top plan view of the nineteenth structure. FIG. 80B shows a cross sectional view taken along a dashed-dotted line A-B in FIG. 80A. According to the nineteenth structure, by formation of a projection 8001 on the substrate 6100 and formation of the second electrode 7201 over the substrate 6100 and the projection 8001, a plate-like (a shape covering an entire surface) region of the second electrode 7201 has concavity and convexity in the eleventh structure. In the case where the second electrode 7201 is a conductive film having reflectivity, this structure is suitable for a reflective liquid crystal display panel. On the other hand, in the case where the second electrode 7201 has a light-transmitting property, this structure is suitable for a semi-transmissive liquid crystal display panel.

A shape of the projection 8001 is reflected, whereby a concave-convex shape is formed on a surface of the second electrode 7201. Using the projection 8001 makes it easy to adjust great height differences of concavity and convexity and the number of concavity and convexity.

Figure 81A:
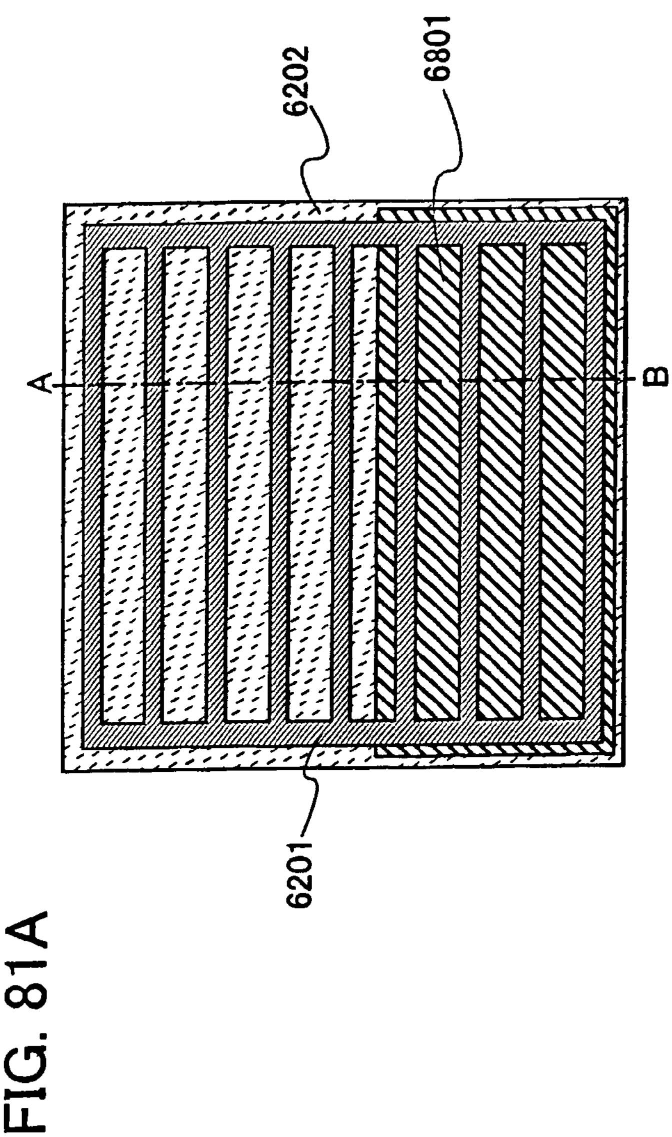
FIG. 81A is a diagram showing a main structure of a liquid crystal display panel of the present invention.
Figure 81B:
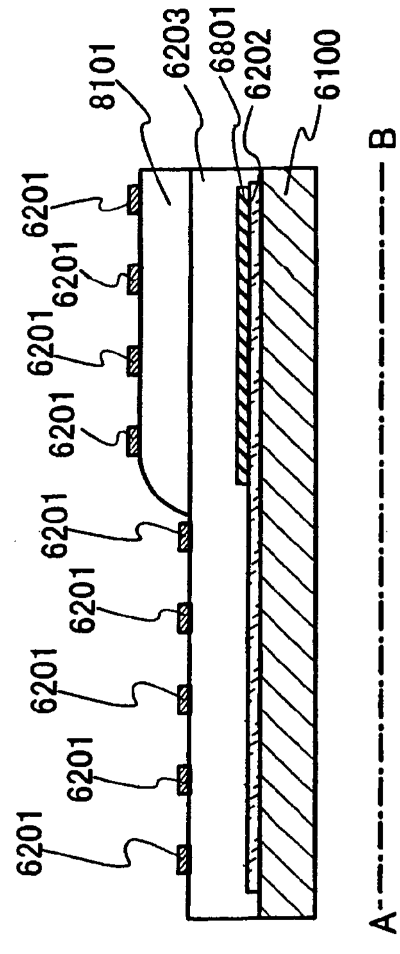
FIG. 81B is a diagram showing a cross section of the main structure of the liquid crystal display panel of the present invention.

Next, description is made of a twentieth structure of the circuit substrate of Embodiment Mode 1 of the present invention. FIG. 81A shows a top plan view of the twentieth structure. FIG. 81B shows a cross sectional view taken along a dashed-dotted line A-B in FIG. 81A. According to the twentieth structure, an insulating film 8101 is formed over the insulating film 6203 and above a region (reflection region) where the conductive film 6801 is formed in the seventh structure. The second electrode 6202 has a light-transmitting property, and this structure is a semi-transmissive liquid crystal display panel. That is, an opening is formed in the insulating film 8101 over the insulating film 6203 and above a region (transmission region) where the second electrode 6202 is formed and the conductive film 6801 is not formed. Therefore, a cell gap in the transmission region can be thicker than that in the reflection region.

Figure 82A:
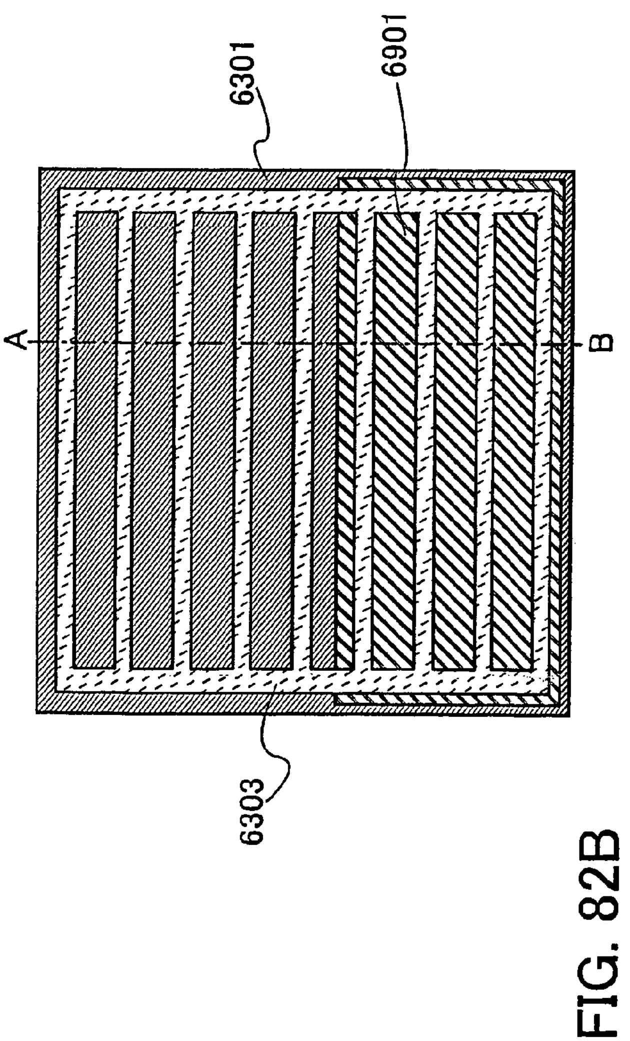
FIG. 82A is a diagram showing a main structure of a liquid crystal display panel of the present invention.
Figure 82B:
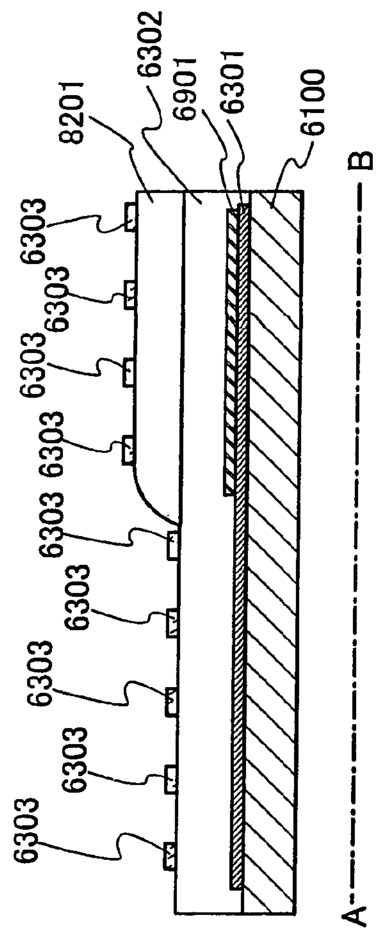
FIG. 82B is a diagram showing a cross section of the main structure of the liquid crystal display panel of the present invention.

Next, description is made of a twenty-first structure of the circuit substrate of Embodiment Mode 1 of the present invention. FIG. 82A shows a top plan view of the twenty-first structure. FIG. 82B shows a cross sectional view taken along a dashed-dotted line A-B in FIG. 82A. According to the twenty-first structure, an insulating film 8201 is formed over the insulating film 6302 and above a region (reflection region) where the conductive film 6901 is formed in the eighth structure. The first electrode 6301 has a light-transmitting property, and this structure is a semi-transmissive liquid crystal display panel. That is, an opening is formed in the insulating film 8201 over the insulating film 6302 and above a region (transmission region) where the first electrode 6301 is formed and the conductive film 6901 is not formed. Therefore, a cell gap in the transmission region can be thicker than that in the reflection region.

Figure 83A:
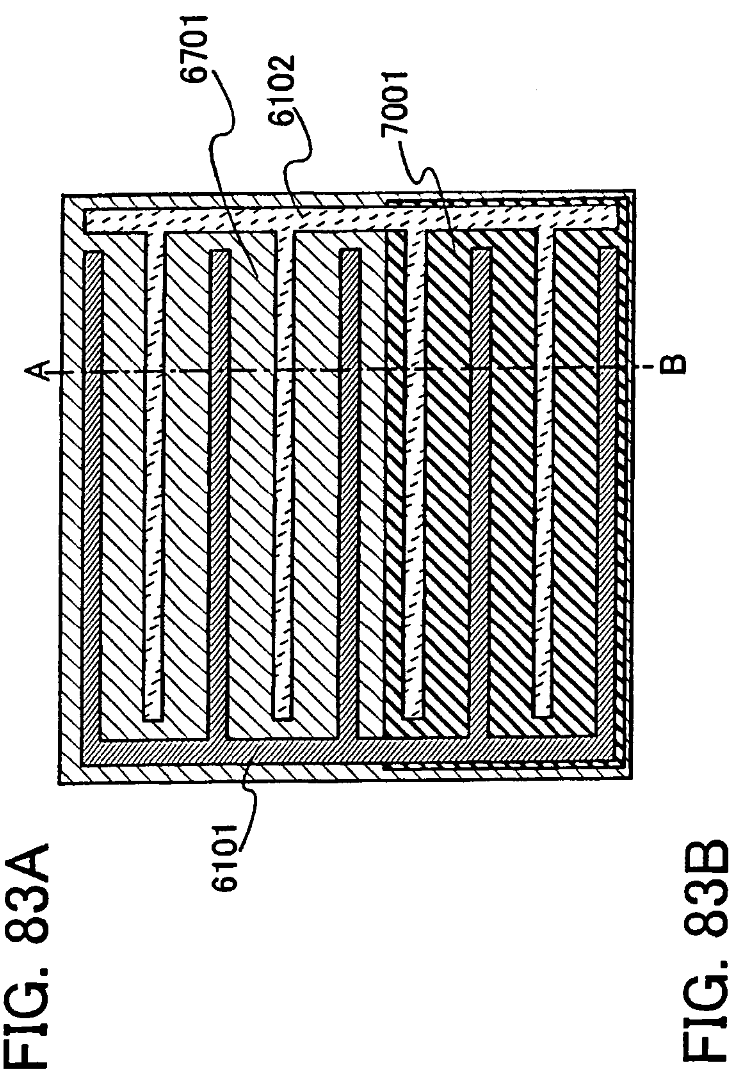
FIG. 83A is a diagram showing a main structure of a liquid crystal display panel of the present invention.
Figure 83B:
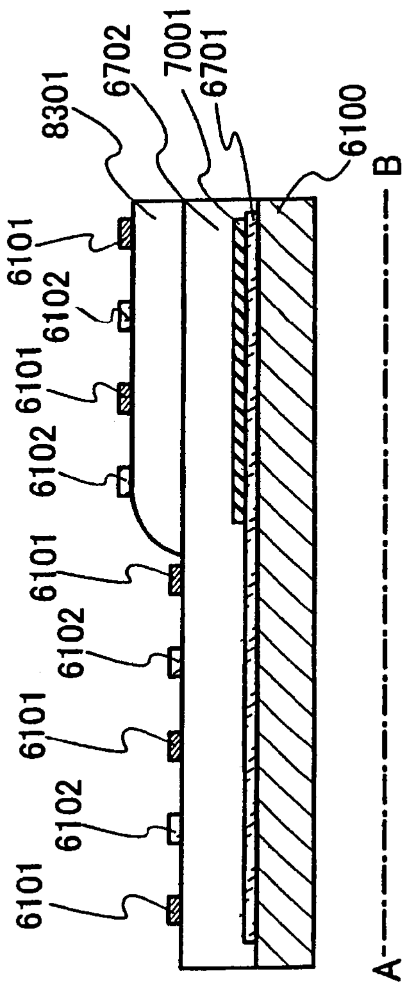
FIG. 83B is a diagram showing a cross section of the main structure of the liquid crystal display panel of the present invention.

Next, description is made of a twenty-second structure of the circuit substrate of Embodiment Mode 1 of the present invention. FIG. 83A shows a top plan view of the twenty-second structure. FIG. 83B shows a cross sectional view taken along a dashed-dotted line A-B in FIG. 83A. According to the twenty-second structure, an insulating film 8301 is formed over the insulating film 6702 and above a region (reflection region) where the conductive film 7001 is formed in the ninth structure. The third electrode 6701 has a light-transmitting property, and this structure is a semi-transmissive liquid crystal display panel. That is, an opening is formed in the insulating film 8301 over the insulating film 6702 and above a region (transmission region) where the third electrode 6701 is formed and the conductive film 7001 is not formed. Therefore, a cell gap in the transmission region can be thicker than that in the reflection region.

Figure 84A:
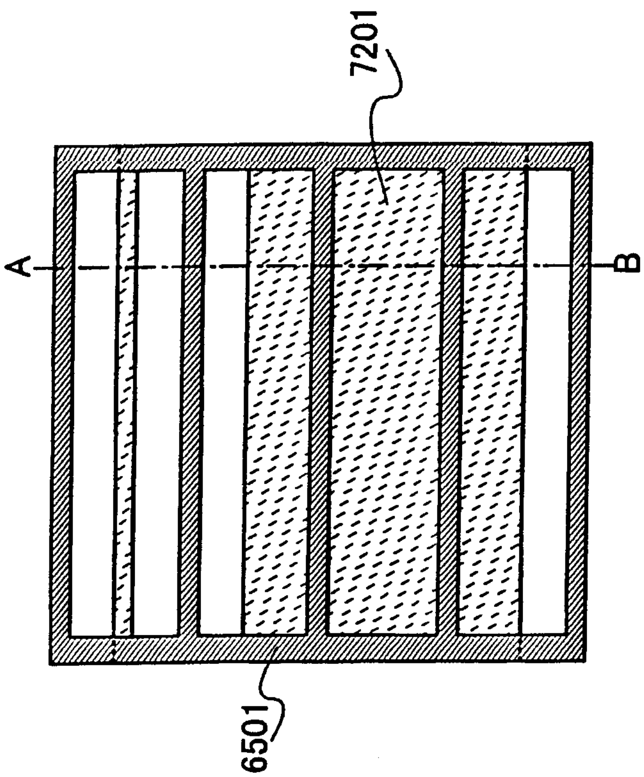
FIG. 84A is a diagram showing a main structure of a liquid crystal display panel of the present invention.
Figure 84B:
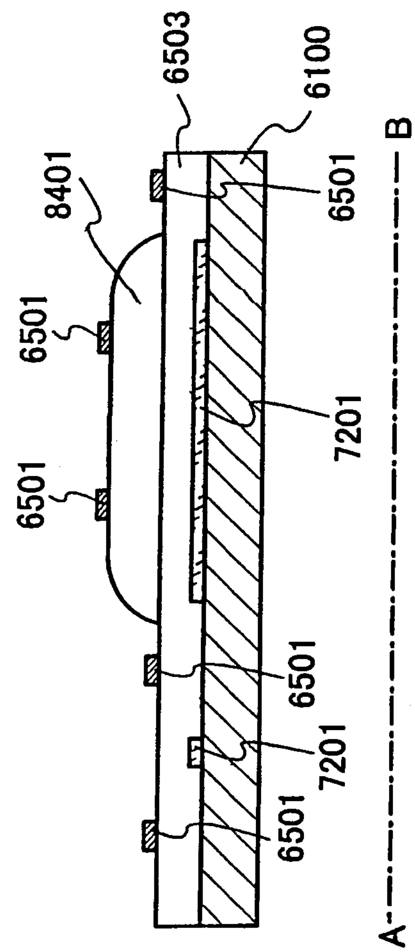
FIG. 84B is a diagram showing a cross section of the main structure of the liquid crystal display panel of the present invention.

Next, description is made of a twenty-third structure of the circuit substrate of Embodiment Mode 1 of the present invention. FIG. 84A shows a top plan view of the third structure. FIG. 84B shows a cross sectional view taken along a dashed-dotted line A-B in FIG. 84A. According to the twenty-third structure, an insulating film 8401 is formed over the insulating film 6503 and above a plate-like region (reflection region) of the second electrode 7201 in the eleventh structure. The second electrode 7201 has reflectivity, and this structure is a semi-transmissive liquid crystal display panel. That is, an opening is formed in the insulating film 8401 over the insulating film 6503 and above a region (transmission region) where the second electrode 7201 has a slit. Therefore, a cell gap in the transmission region can be thicker than that in the reflection region.

Figure 85A:
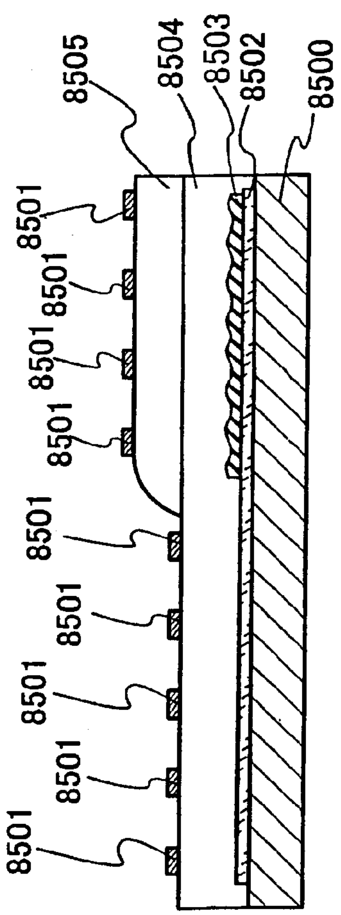
FIGS. 85A to 85C are diagrams each showing a cross section of a main structure of a liquid crystal display panel of the present invention.
Figure 130A:
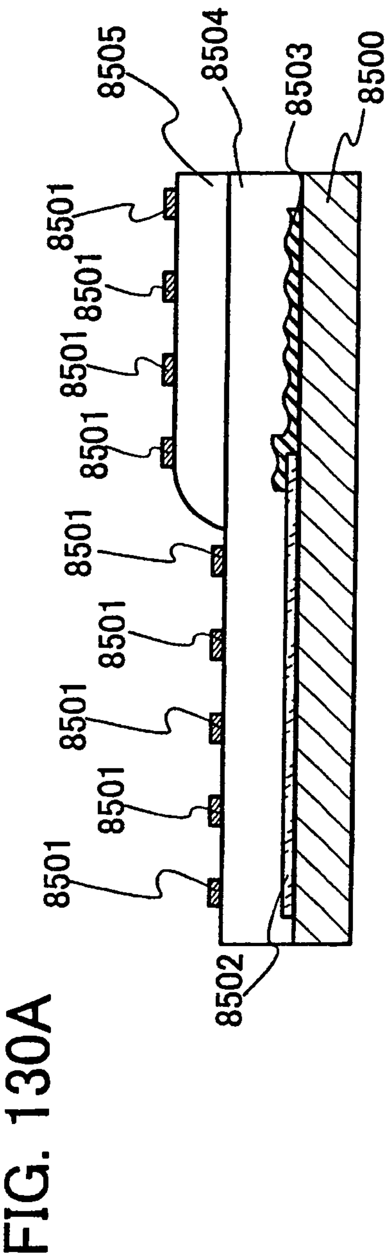
Figure 131A:
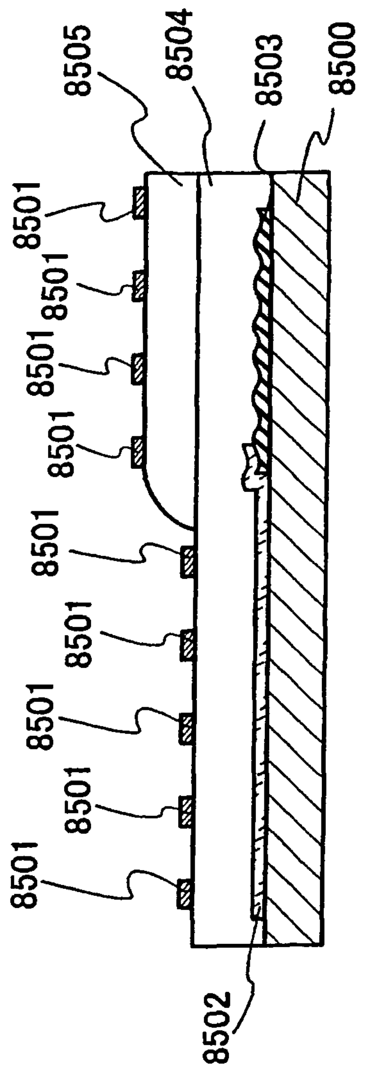

Next, description is made of a twenty-fourth structure of the circuit substrate of Embodiment Mode 1 of the present invention. The twenty-fourth structure is described with reference to a cross sectional view of a circuit substrate in FIG. 85A. A second electrode 8502 is provided over a substrate 8500, and a concave-convex shaped conductive film 8503 having reflectivity, which has smaller area than the second electrode 8502, is provided over the second electrode 8502. The second electrode 8502 has a light-transmitting property, and this structure is a semi-transmissive liquid crystal display panel. An insulating film 8504 is provided over the second electrode 8502 and the conductive film 8503. An insulating film 8505 is formed having an opening provided over the insulating film 8504 above a region (transmission region) where the second electrode 8502 is formed and the conductive film 8503 is not formed. In addition, a first electrode 8501 of which some branches are directly on the insulating film 8504 and of which some branches are directly on the insulating film 8505 is provided. Therefore, a cell gap in the transmission region can be thicker than that in a reflection region (a region above the conductive film 8503). Note that as shown in FIG. 130A, the conductive film 8503 having reflectivity may be provided over the substrate 8500, and the conductive film 8503 having reflectivity may be provided so as to partially overlap the second electrode 8502. In the case of using ITO for the second electrode 8502, the structure of FIG. 130A is employed so that a film breakage can be prevented. Alternatively, as shown in FIG. 131A, the conductive film 8503 having reflectivity may be provided over the substrate 8500, and the second electrode 8502 may be provided so as to partially overlap the conductive film 8503 having reflectivity. Further alternatively, as shown in FIG. 132A, the conductive film 8503 having reflectivity may be provided over the substrate 8500, and the second electrode 8502 may be provided so as to partially cover the conductive film 8503 having reflectivity. In FIG. 132A, in the case of using a metal film and ITO for the conductive film 8503 and the second electrode 8502 respectively, oxidization of the metal film can be prevented and reflectance can be enhanced.

Figure 85B:
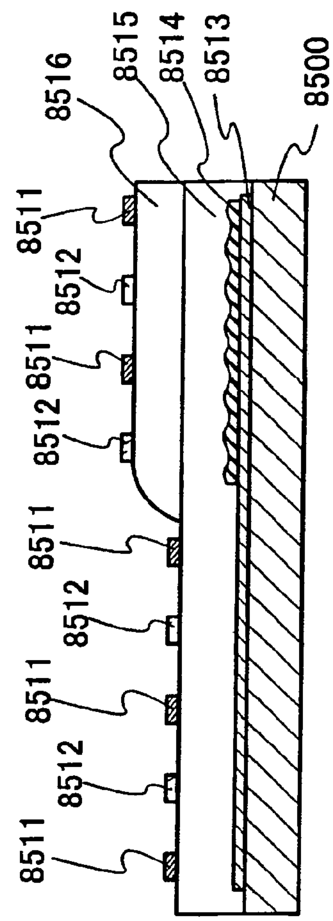
Figure 130B:
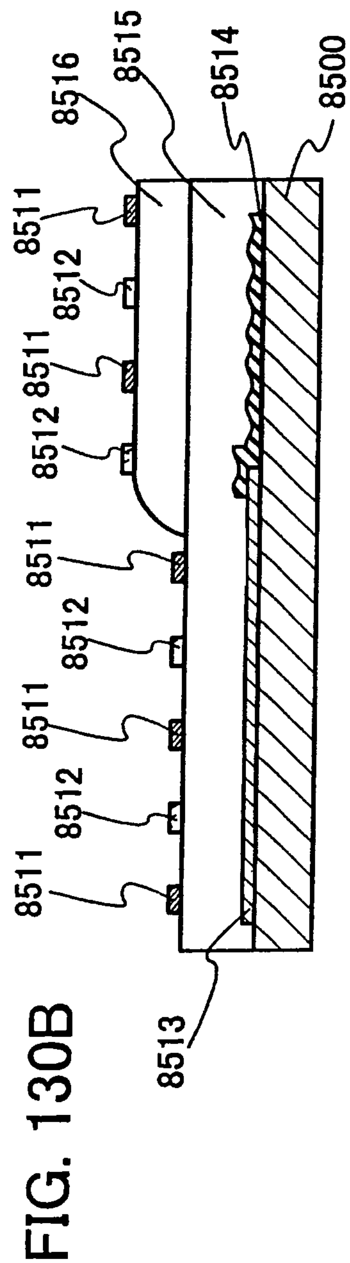
Figure 131B:
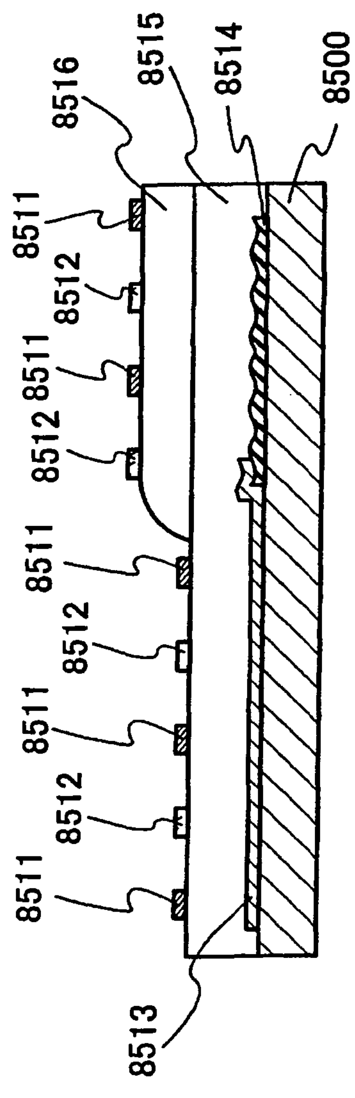

Next, description is made of a twenty-fifth structure of the circuit substrate of Embodiment Mode 1 of the present invention. The twenty-fifth, structure is described with reference to a cross sectional view of a circuit substrate in FIG. 85B. A third electrode 8513 is provided over a substrate 8500, and a concave-convex shaped conductive film 8514 having reflectivity, which has smaller area than the third electrode 8513, is provided over the third electrode 8513. The third electrode 8513 has a light-transmitting property, and this structure is a semi-transmissive liquid crystal display panel. An insulating film 8515 is provided over the third electrode 8513 and the conductive film 8514. An insulating film 8516 is formed having an opening provided over the insulating film 8515 above a region (transmission region) where the third electrode 8513 is formed and the conductive film 8514 is not formed. In addition, a first electrode 8511 and a second electrode 8512 each of which some branches are directly on the insulating film 8515 and each of which some branches are directly on the insulating film 8516 is provided. Therefore, a cell gap in the transmission region can be thicker than that in a reflection region (a region above the conductive film 8514). Note that as shown in FIG. 130B, the conductive film 8514 having reflectivity may be provided over the substrate 8500, and the conductive film 8514 having reflectivity may be provided so as to partially overlap the third electrode 8513. In the case of using ITO for the third electrode 8513, the structure of FIG. 130B is employed so that a film breakage can be prevented. Alternatively, as shown in FIG. 131B, the conductive film 8514 having reflectivity may be provided over the substrate 8500, and the third electrode 8513 may be provided so as to partially overlap the conductive film 8514 having reflectivity. Further alternatively, as shown in FIG. 132B, the conductive film 8514 having reflectivity may be provided over the substrate 8500, and the third electrode 8513 may be provided so as to cover the conductive film 8514 having reflectivity. In FIG. 132A, in the case of using a metal film and ITO for the conductive film 8514 and the second electrode 8513 respectively, oxidization of the metal film can be prevented and reflectance can be enhanced.

Figure 85C:
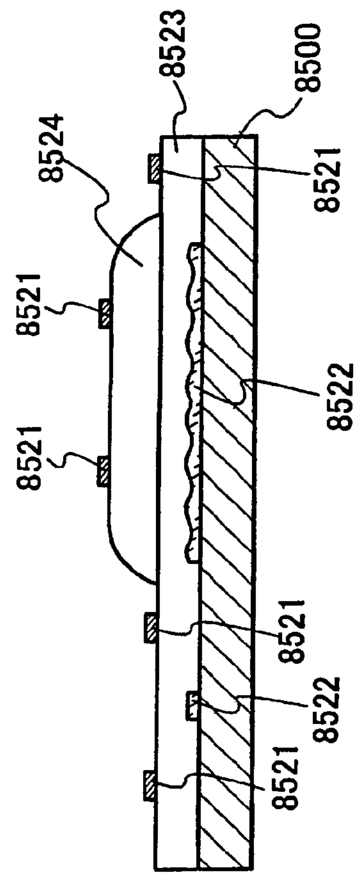

Next, description is made of a twenty-sixth structure of the circuit substrate of Embodiment Mode 1 of the present invention. The twenty-sixth structure is described with reference to a cross sectional view of a circuit substrate in FIG. 85C. A second electrode 8522 is provided over the substrate 8500. The second electrode 8522 includes a region having a slit and a plate-like region, and the plate-like region has concavity and convexity. The second electrode 8522 has reflectivity, and this structure is a semi-transmissive liquid crystal display panel. In addition, an insulating film 8523 is provided over the second electrode 8522 and the substrate 8500. An insulating film 8524 is provided over the insulating film 8523 above a plate-like region (reflection region) of the second electrode 8522. That is, an opening is formed in the insulating film 8524 over the insulating film 8523 above a region (transmission region) where the second electrode 8522 has a plate shape. In addition, a first electrode 8521 of which some branches are directly on the insulating film 8523 and of which some branches are directly on the insulating film 8524 is provided. Therefore, a cell gap in the transmission region can be thicker than that in the reflection region.

Figures 86A, 86B, 86C:
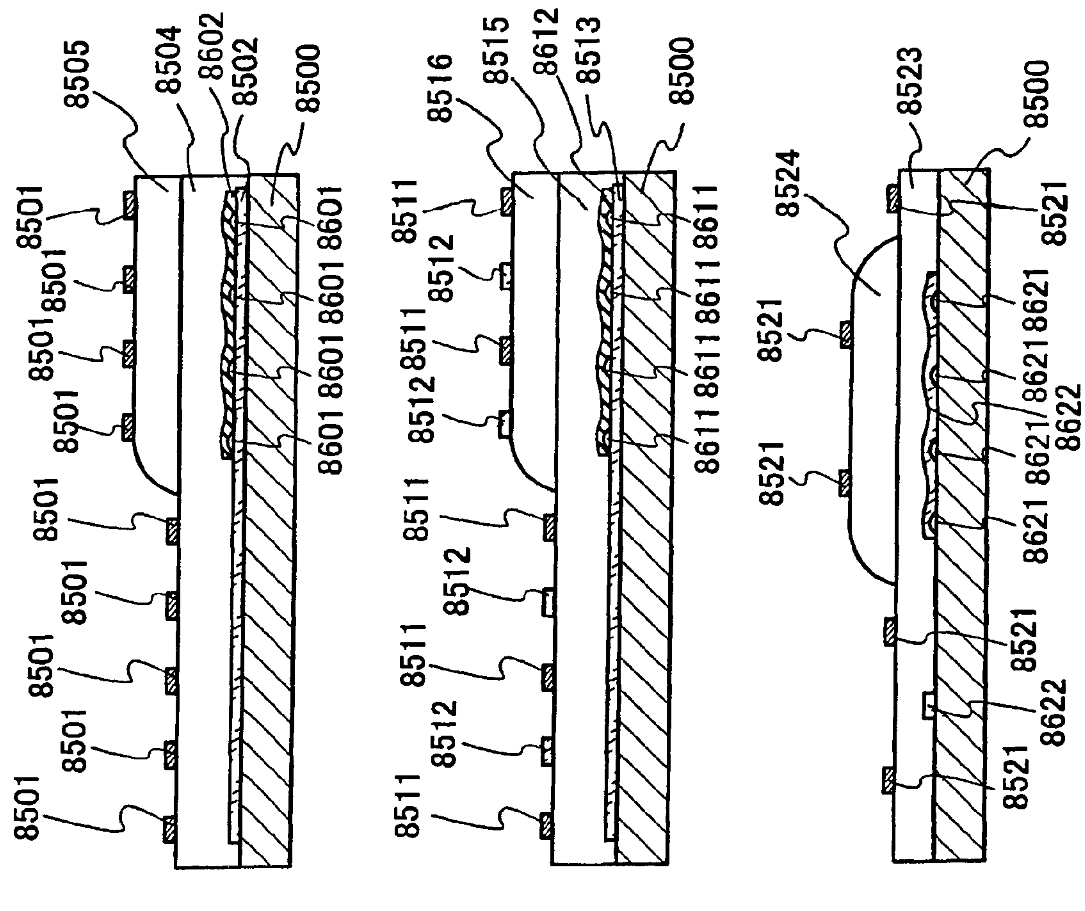
FIGS. 86A to 86C are diagrams each showing a cross section of a main structure of a liquid crystal display panel of the present invention.

Next, description is made of a twenty-seventh structure of the circuit substrate of Embodiment Mode 1 of the present invention. The twenty-seventh structure is described with reference to a cross sectional view of a circuit substrate in FIG. 86A. According to the twenty-seventh structure, by formation of projections 8601 on the second electrode 8502 and formation of a conductive film 8602 having reflectivity over the second electrode 8502 and the projections 8601, the conductive film 8602 having concavity and convexity formed by the projections 8601 is used instead of the conductive film 8503 having reflectivity in the twenty-fourth structure. Then, the second electrode 8502 has a light-transmitting property, and this structure is a semi-transmissive liquid crystal display panel.

A shape of the projection 8601 is reflected, whereby a concave-convex shape is formed on a surface of the conductive film 8602. Using the projection 8601 makes it easy to adjust great height differences of concavity and convexity and the number of concavity and convexity.

Next, description is made of a twenty-eighth structure of the circuit substrate of Embodiment Mode 1 of the present invention. The twenty-eighth structure is described with reference to a cross sectional view of a circuit substrate in FIG. 86B. According to the twenty-eighth structure, by formation of projections 8611 on the third electrode 8513 and formation of a conductive film 8612 having reflectivity over the third electrode 8513 and the projections 8611, the conductive film 8612 having concavity and convexity formed by the projections 8611 is used instead of the conductive film 8612 having concavity and convexity in the twenty-fifth structure. Then, third electrode 8513 has a light-transmitting property, and this structure is a semi-transmissive liquid crystal display panel.

A shape of the projections 8611 is reflected, whereby a concave-convex shape is formed on a surface of the conductive film 8612. Using the projections 8611 makes it easy to adjust great height differences of concavity and convexity and the number of concavity and convexity.

Next, description is made of a twenty-ninth structure of the circuit substrate of Embodiment Mode 1 of the present invention. The twenty-ninth structure is described with reference to a cross sectional view of a circuit substrate in FIG. 86C. According to the twenty-ninth structure, by formation of projections 8621 on the substrate 8500 and formation of a second electrode 8622 having reflectivity over the substrate 8500 and the projections 8621, the second electrode 8622 having concavity and convexity formed by the projections 8621 is used instead of the second electrode 8522 having concavity and convexity in the twenty-sixth structure. Then, the second electrode 8622 has reflectivity, and this structure is a semi-transmissive liquid crystal display panel.

The shape of the projection 8621 is reflected, whereby a concave-convex shape is formed on a surface of the second electrode 8622. Using the projection 8621 makes it easy to adjust great height differences of concavity and convexity and the number of concavity and convexity.

Figure 87A:
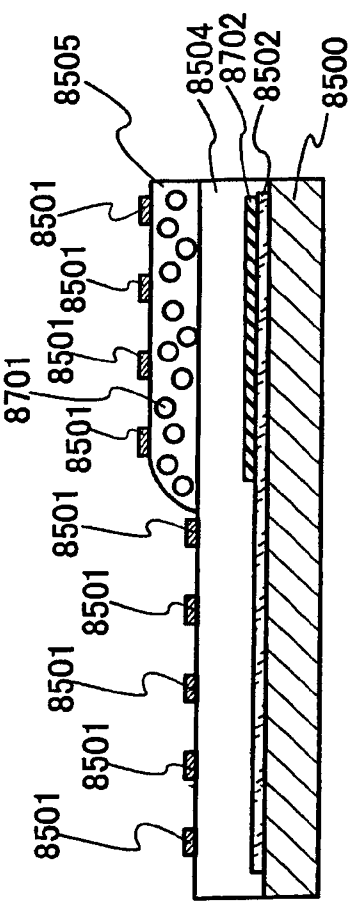
FIGS. 87A to 87C are diagrams each showing a cross section of a main structure of a liquid crystal display panel of the present invention.

Next, description is made of a thirtieth structure of the circuit substrate of Embodiment Mode 1 of the present invention. The thirtieth structure is described with reference to a cross sectional view of a circuit substrate in FIG. 87A. According to the thirtieth structure, a planar conductive film 8702 is applied instead of the concave-convex shaped conductive film 8503, and the insulating 8505 includes particles 8701 functioning as a scattering material in the twenty-fourth structure. Note that as shown in FIG. 133A, the conductive film 8702 having reflectivity may be provided over the substrate 8500, and the conductive film 8702 having reflectivity may be provided so as to partially overlap the second electrode 8502. When using ITO for the second electrode 8502, the structure of FIG. 133A is employed so that a film breakage can be prevented. Alternatively, as shown in FIG. 134A, the conductive film 8702 having reflectivity may be provided over the substrate 8500, and the second electrode 8502 may be provided so as to partially overlap the conductive film 8702 having reflectivity. Further alternatively, as shown in FIG. 135A, the conductive film 8702 having reflectivity may be provided over the substrate 8500, and the second electrode 8502 may be provided so as to cover the conductive film 8702 having reflectivity. In FIG. 135A, in the case of using a metal film and ITO for the conductive film 8702 and the second electrode 8502 respectively, oxidization of the metal film can be prevented and reflectance can be enhanced. Then, the second electrode 8502 has a light-transmitting property, and this structure is a semi-transmissive liquid crystal display panel.

Figure 87B:
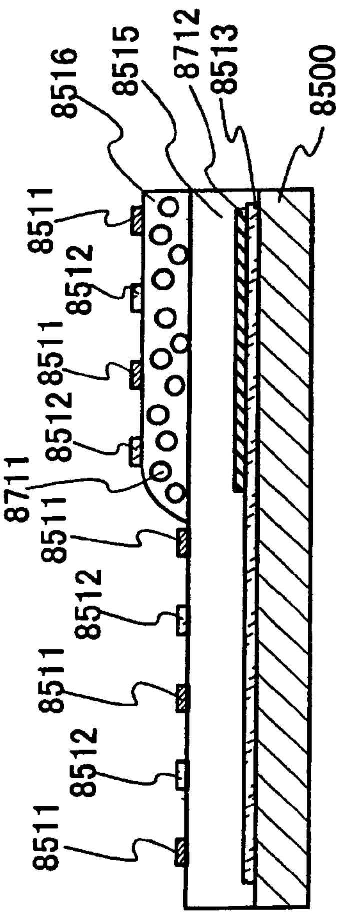

Next, description is made of a thirty-first structure of the circuit substrate of Embodiment Mode 1 of the present invention. The thirty-first structure is described with reference to a cross sectional view of a circuit substrate in FIG. 87B. According to the thirty-first structure, a planar conductive film 8712 is applied instead of the concave-convex shaped conductive film 8514, and the insulating film 8516 includes particles 8711 functioning as a scattering material in the twenty-fifth structure. Note that as shown in FIG. 133B, the conductive film 8712 having reflectivity may be provided over the substrate 8500, and the conductive film 8712 having reflectivity may be provided so as to partially overlap the third electrode 8513. When using ITO for the third electrode 8513, the structure of FIG. 133B is employed so that a film breakage can be prevented. Alternatively, as shown in FIG. 134B, the conductive film 8712 having reflectivity may be provided over the substrate 8500, and the third electrode 8513 may be provided so as to partially overlap the conductive film 8712 having reflectivity. Further alternatively, as shown, in FIG. 135B, the conductive film 8712 having reflectivity may be provided over the substrate 8500, and the third electrode 8513 may be provided so as to cover the conductive film 8712 having reflectivity. In FIG. 135B, in the case of using a metal film and ITO for the conductive film 8712 and the second electrode 8513 respectively, oxidization of the metal film can be prevented and reflectance can be enhanced. Then, the second electrode 8513 has a light-transmitting property, and this structure is a semi-transmissive liquid crystal display panel.

Figure 87C:
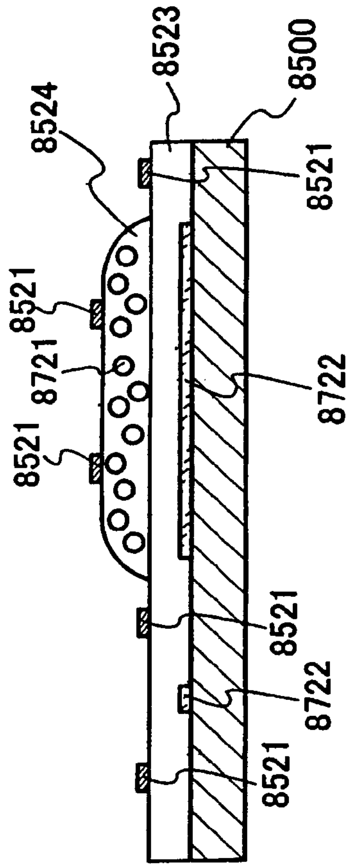

Next, description is made of a thirty-second structure of the circuit substrate of Embodiment Mode 1 of the present invention. The thirty-second structure is described with reference to a cross sectional view of a circuit substrate in FIG. 87C. According to the thirty-second structure, a planar conductive film 8722 is applied instead of the concave-convex shaped second electrode 8522, and the insulating 8524 includes particles 8721 functioning as a scattering material in the twenty-sixth structure. Then, the second electrode 8722 has reflectivity, and this structure is a semi-transmissive liquid crystal display panel.

Thus, circuit substrates having various structures can be applied to the liquid crystal display panel of Embodiment Mode 1 of the present invention.

Further, a main structure of a liquid crystal display panel in the case where the circuit substrate described above and a counter substrate are attached to each other is described below.

Figure 88:
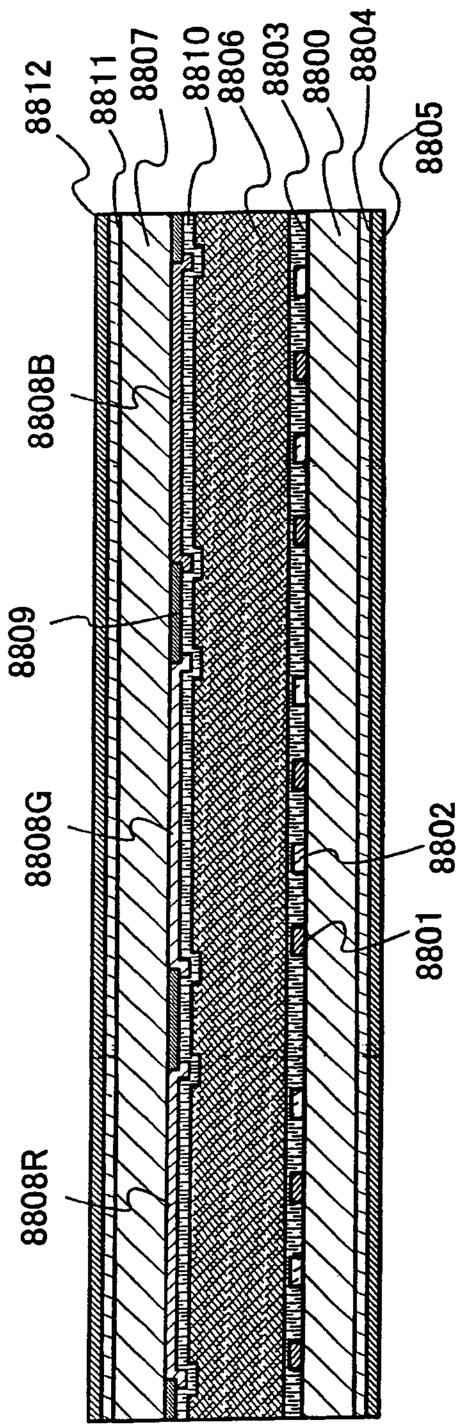
FIG. 88 is a diagram showing a liquid crystal display panel of the present invention.

Description is made of a structure of the circuit substrate of the liquid crystal display panel shown in FIG. 88. A first electrode 8801 and a second electrode 8802 are provided over a substrate 8800. One of the first electrode 8801 and the second electrode 8802 is a pixel electrode of a liquid crystal element and the other is a common electrode thereof. Then, the first electrode 8801 or the second electrode 8802 is formed in the same step as the semiconductor layer of the transistor formed over the substrate 8800.

An orientation film 8803 is formed over the first electrode 8801 and the second electrode 8802. Then, a retardation film 8804 is provided on a surface of the substrate 8800, on which the first electrode 8801 and the second electrode 8802 are not formed, and a polarizing plate is provided outside the retardation film 8804.

Next, description is made of a structure of the counter substrate of the liquid crystal display panel shown in FIG. 88. On one surface of the substrate 8807, a light-shielding film 8809 and color filters (a red color filter 8808R, a green color filter 8808G and a blue color filter 8808B) are formed, and an orientation film 8810 is provided outside the light-shielding film 8809 and the color filters. Meanwhile, on the other surface of the substrate 8807, a retardation film 8811 and a polarizing plate 8812 are provided.

Note that color filters and a light-shielding layer (black matrix), or any of them may be provided for an insulating film formed over a circuit substrate, or for a part of the insulating film. By provision of the color filter or the light-shielding layer over the circuit substrate, a margin of alignment with the counter substrate can be improved.

In the liquid crystal display panel shown in FIG. 88, a surface on which the orientation film 8803 is formed and a surface on which the orientation film 8810 is formed are attached to each other with the liquid crystal layer 8806 interposed therebetween.

Figure 89:
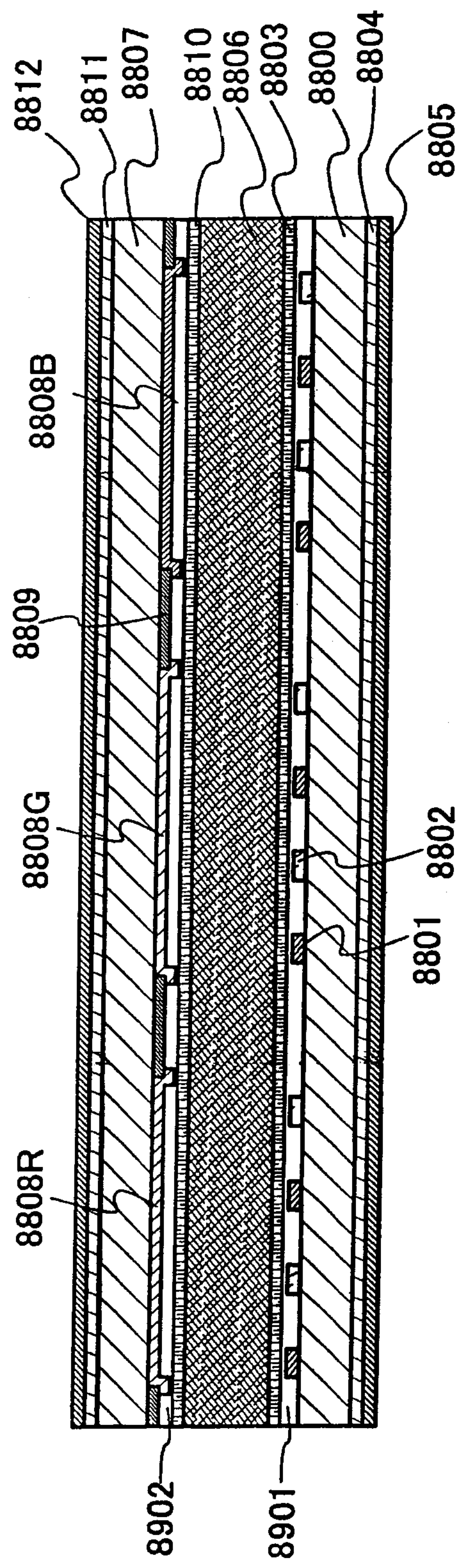
FIG. 89 is a diagram showing a liquid crystal display panel of the present invention.

Note that like the display panel shown in FIG. 89, an insulating film 8901 functioning as a planarization film may be formed over the first electrode 8801 and the second electrode 8802 of the circuit substrate in the structure of FIG. 88. Further, an insulating film 8902 functioning as a planarization film may be formed on an outer side of the light-shielding film 8809 and the color filters of the counter substrate.

Figure 90:
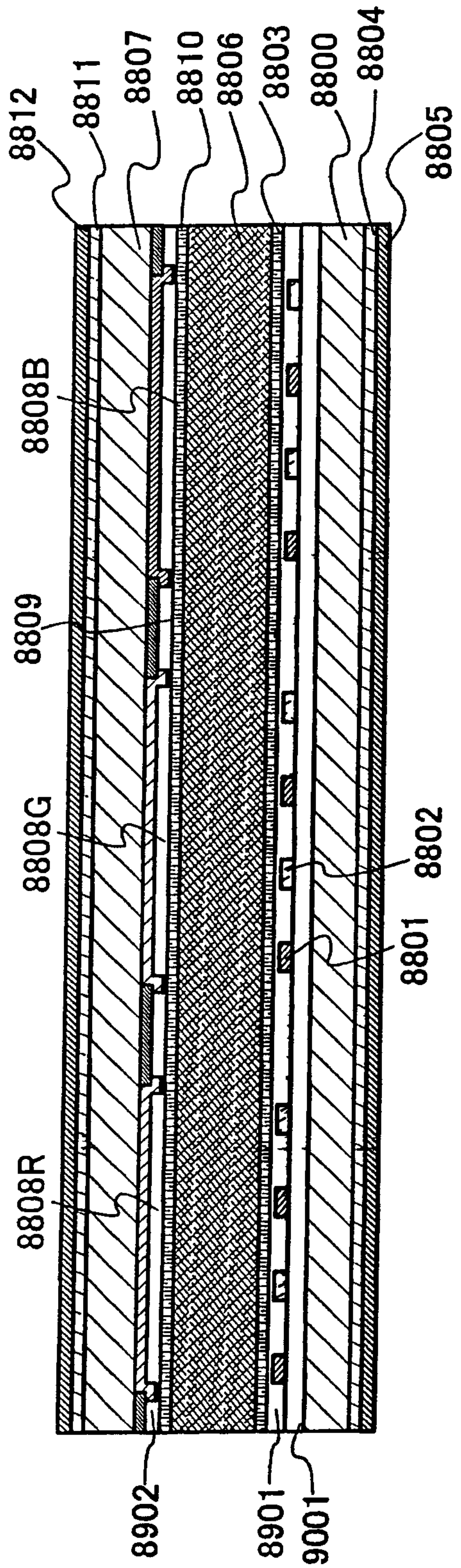
FIG. 90 is a diagram showing a liquid crystal display panel of the present invention.

Needless to say that the first electrode 8801 and the second electrode 8802 are not necessary to be formed directly on the substrate 8800. As shown in FIG. 90, the first electrode 8801 and the second electrode 8802 may be formed over an insulating film 9001 formed over the substrate 8800.

Figure 91:
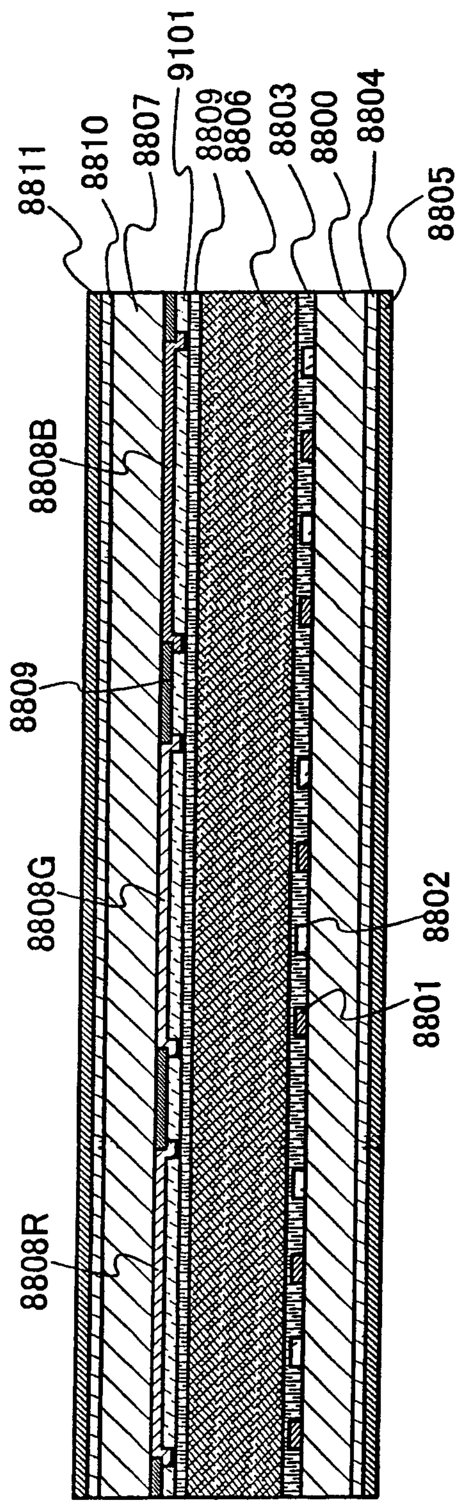
FIG. 91 is a diagram showing a liquid crystal display panel of the present invention.

Further, as shown in FIG. 91, a conductive film 9101 having a light-transmitting property may be formed outside the light-shielding film 8809 and the color filters of the counter substrate. Thus, prevention of static electricity or removal of a residual image can be achieved.

Embodiment Mode 2

Description is made of a structure of a liquid crystal display panel of Embodiment Mode 2 of the present invention.

In the liquid crystal display panel of Embodiment Mode 2, a first insulating film is provided over a first substrate; a semiconductor layer of a transistor, and a first electrode and a second electrode of a liquid crystal element are provided over the first insulating film; a second insulating film is provided so as to cover the semiconductor layer of the transistor, and the first electrode and the second electrode of the liquid crystal element; a gate electrode is provided over the semiconductor layer of the transistor with the second insulating film interposed therebetween; a third insulating film is provided so as to cover the gate electrode and the second insulating film; a hole (contact hole) is formed in the third insulating film and the second insulating film; and a wiring formed over the third insulating film is connected to the semiconductor layer of the transistor through the hole. A surface of the first substrate, which is provided with the transistor, is attached to the second substrate. A liquid crystal layer is provided between the first substrate and the second substrate.

Note that the semiconductor layer of the transistor is a film formed in the same layer as the first electrode and the second electrode of the liquid crystal element.

Further, each of the first electrode and the second electrode of the liquid crystal element is an electrode having a slit or a comb-shaped electrode.

Figure 1:
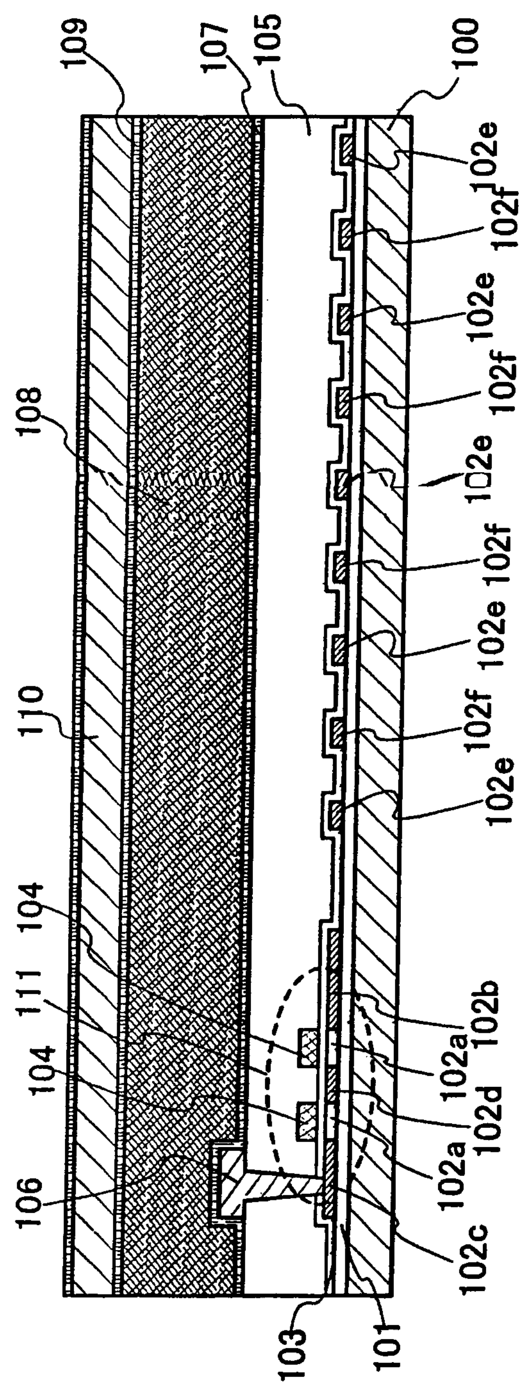
FIG. 1 is a diagram showing a liquid crystal display panel of the present invention.

FIG. 1 is a cross sectional view showing one structure example of the liquid crystal display panel of Embodiment Mode 2 of the present invention.

FIG. 1 shows a part of a pixel in order to explain a cross section of the pixel in detail.

A base insulating film (the first insulating film 101) is formed over a substrate 100 in order to prevent impurities from diffusing from the substrate 100. The substrate 100 can be formed of an insulating substrate such as a glass substrate, a quartz substrate, a plastic substrate, or a ceramic substrate, or of a metal substrate, a semiconductor substrate, or the like. The first insulating film 101 can be formed by a CVD method or a sputtering method. For example, a silicon oxide film, a silicon nitride film, a silicon oxynitride film, or the like formed by a CVD method using $SiH_4$, $N_2O$, and $NH_3$ as a source material can be applied. Alternatively, a stacked layer of them may be used. It is to be noted that the first insulating film 101 is provided to prevent impurities from diffusing from the substrate 100 into the semiconductor layer. In the case where the substrate 100 is formed of a glass substrate or a quartz substrate, it is not necessary to provide the first insulating film 101.

A semiconductor layer (channel formation regions 102*a*, an impurity region 102*b*, an impurity region 102*c* and an impurity region 102*d*) of a transistor 111, and a pixel electrode (first electrode 102*e*) and a common electrode (second electrode 102*f*) that control molecular orientation of the liquid crystal molecules are formed over the first insulating film 101. The channel formation regions 102*a*, the impurity region 102*b*, the impurity region 102*c*, the impurity region 102*d*, the first electrode 102*e* and the second electrode 102*f* are non-single crystalline semiconductor films (for example, polysilicon films), which are formed in the same step.

In the case where the transistor 111 is an n-channel transistor, an impurity element such as phosphorus or arsenic is introduced into the impurity region 102*b*, the impurity region 102*c* and the impurity region 102*d*, whereas in the case where the transistor 111 is a p-channel transistor, an impurity element such as boron is introduced into the impurity region 102*b*, the impurity region 102*c*, and the impurity region 102*d*.

Further, the impurity element introduced into the impurity region 102*b*, the impurity region 102*c*, and the impurity region 102*d* may also be introduced into the first electrode 102*e* and the second electrode 102*f*. The resistance of the first electrode 102*e* and the second electrode 102*f* is lowered when an impurity is introduced thereto, which is preferable for each of the first electrode 102*e* and the second electrode 102*f* to function as an electrode.

The first electrode 102*e* and the second electrode 102*f* each have thickness of, for example, 45 nm to 60 nm, and have sufficiently high light transmittance. In order to further improve the light transmittance, it is desirable to set thickness of the first electrode 102*e* and the second electrode 102*f* to be 40 nm or less.

The semiconductor layer (the channel formation region 102*a*, the impurity region 102*b*, the impurity region 102*c*, and the impurity region 102*d*) of the transistor 111, and the first electrode 102*e* and the second electrode 102*f* that control molecular orientation of the liquid crystal molecules are formed in the same step. In this case, the number of steps can be reduced, so that the manufacturing cost can be reduced. In addition, it is desirable that impurity elements of the same type be introduced into the impurity region 102*b*, the impurity region 102*c*, and the impurity region 102*d*; and the first electrode 102*e* and the second electrode 102*f*. This is because when the impurity elements of the same type are introduced, the impurity elements can be introduced without a problem even if the impurity region 102*b*, the impurity region 102*c*, and the impurity region 102*d*; and the first electrode 102*e* and the second electrode 102*f* are located close to each other, so that dense layout becomes possible. It is desirable to add impurity elements of only one of a p type and an n type because the manufacturing cost can be low compared with the case in which impurity elements of different types are introduced.

A gate insulating film (second insulating film 103) is formed over the semiconductor layer of the transistor 111, and the first electrode 102*e* and the second electrode 102*f*. In FIG. 1, the insulating film is formed so as to cover the semiconductor layer of the transistor 111, and the first electrode 102*e* and the second electrode 102*f*; however, the present invention is not limited to this. It is only necessary to form the second insulating film 103 over the semiconductor layer of the transistor 111. As the second insulating film 103, a silicon oxide film, a silicon nitride film, a silicon oxynitride film or the like formed by a CVD method or a sputtering method can be used.

Two gate electrodes 104 are formed over the channel formation region 102*a* of the transistor 111 with the second insulating film 103 interposed therebetween. For the gate electrodes 104, an aluminum (Al) film, a copper (Cu) film, a thin film containing aluminum or copper as a main component, a chromium (Cr) film, a tantalum (Ta) film, a tantalum nitride (TaN) film, a titanium (Ti) film, a tungsten (W) film, a molybdenum (Mo) film, or the like can be used.

An interlayer insulating film (third insulating film 105) is formed over the second insulating film 103 and the gate electrodes 104. The third insulating film 105 preferably has a stacked-layer structure. For example, a protective film and a planarization film may be stacked in this order. For the protective film, an inorganic insulating film is suitable. As an inorganic insulating film, a silicon nitride film, a silicon oxide film, a silicon oxynitride film, or a film formed by stacking these layers can be used. For a planarization film, a resin film is suitable. As a resin film, polyimide, polyamide, acrylic, polyimide amide, epoxy or the like can be used.

A signal line (wiring 106) is formed over the third insulating film 105. The wiring 106 is connected to the impurity region 102*c* through a hole (contact hole) formed in the third insulating film 105. As the wiring 106, a titanium (Ti) film, an aluminum (Al) film, a copper (Cu) film, an aluminum film containing Ti, or the like can be used. Preferably, copper having low resistance is used.

A first orientation film 107 is formed over the wiring 106 and the third insulating film 105. Then, a liquid crystal layer 108, a second orientation film 109 and a substrate 110 are provided over the first orientation film 107. That is, the liquid crystal layer 108 is interposed between the first orientation film 107 and the second orientation film 109. That is, the second orientation film 109 is formed over the substrate 110, and a surface of the substrate 110, on which the second orientation film 109 is formed, and a surface of the substrate 100, on which the first orientation film 107 is formed, are attached to each other. The liquid crystal layer 108 is provided between the first orientation film 107 and the second orientation film 109.

Embodiment Mode 3

Description is made of a structure of a liquid crystal display panel of Embodiment Mode 3 of the present invention.

In the liquid crystal display panel of Embodiment Mode 3, a second electrode of a liquid crystal element is provided over a first substrate; a first insulating film is provided so as to cover the second electrode of the liquid crystal element; a semiconductor layer of a transistor, and a first electrode of the liquid crystal element are provided over the first insulating film; a second insulating film is provided so as to cover the semiconductor layer of the transistor, and the first electrode of the liquid crystal element; a gate electrode is provided over the semiconductor layer of the transistor with the second insulating film interposed therebetween; a third insulating film is provided so as to cover the gate electrode and the second insulating film; a hole (contact hole) is formed in the third insulating film and the second insulating film; and a wiring formed over the third insulating film is connected to the semiconductor layer of the transistor through the hole. A surface of the first substrate, which is provided with the transistor, is attached to the second substrate. A liquid crystal layer is provided between the first substrate and the second substrate.

Note that the semiconductor layer of the transistor is a film formed in the same layer as the first electrode of the liquid crystal element.

Further, the first electrode of the liquid crystal element is an electrode having a slit or a comb-shaped electrode, and the second electrode of the liquid crystal element is a plate-like electrode.

Figure 3:
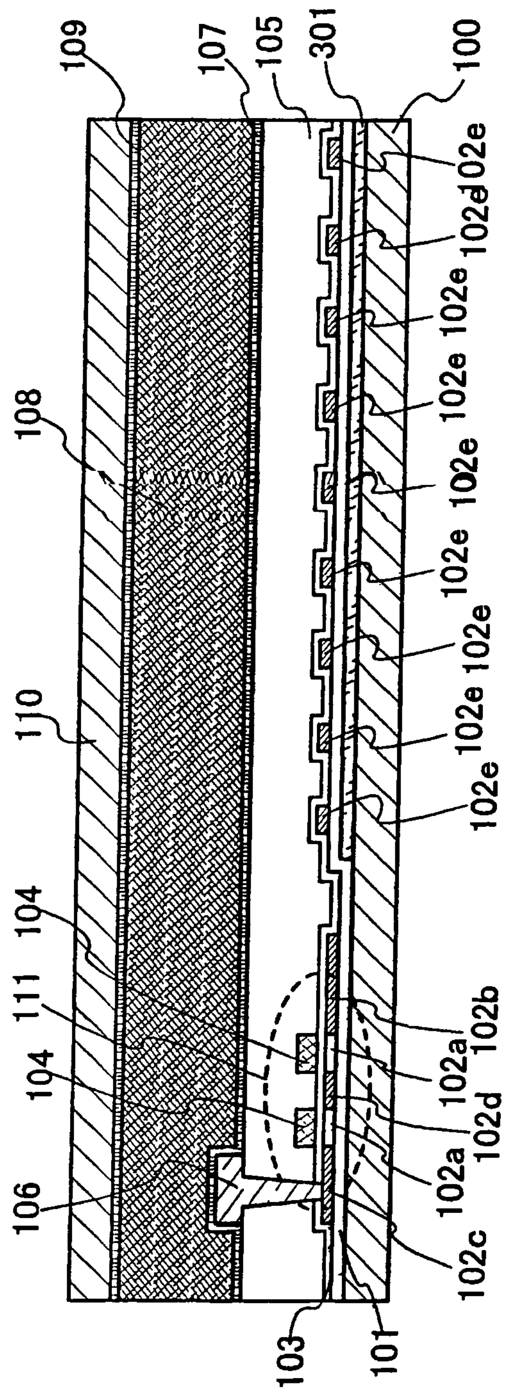
FIG. 3 is a diagram showing a liquid crystal display panel of the present invention.

FIG. 3 is a cross sectional view showing one structure example of the liquid crystal display panel of Embodiment Mode 3 of the present invention.

FIG. 3 shows a part of a pixel in order to explain a structure of the pixel in detail. Note that the structure of the liquid crystal display panel of Embodiment Mode 3 is different from the structure of the liquid crystal display panel described in Embodiment Mode 2 with reference to FIG. 1 in that a second electrode 301 is provided instead of the second electrode 102*f*.

For the common electrode (second electrode 102*f*) in FIG. 1, a film formed in the same step as the pixel electrode (first electrode 102*e*) is used. On the other hand, the common electrode (second electrode 301) is formed over the substrate 100 and below the first insulating film 101.

The second electrode 301 may be either a conductive film having reflectivity or a conductive film having a light-transmitting property. As a conductive film having reflectivity, a metal film such as an aluminum (Al) film, a copper (Cu) film, a thin film containing aluminum or copper as a main component, a chromium (Cr) film, a tantalum (Ta) film, a tantalum nitride (TaN) film, a titanium (Ti) film, a tungsten (W) film, and a molybdenum (Mo) film are given. As a conductive film having a light-transmitting property, a transparent conductive film such as an indium tin oxide (ITO) film, an indium zinc oxide (IZO) film, an indium tin oxide containing silicon oxide (ITSO) film, a zinc oxide (ZnO) film, and a cadmium tin oxide (CTO) film are given. In the case where the second electrode 301 is a conductive film having reflectivity, the liquid crystal display panel of Embodiment Mode 3 of the present invention is a reflective liquid crystal display panel, whereas in the case where the second electrode 301 is a conductive film having a light-transmitting property, the liquid crystal display panel of Embodiment Mode 3 of the present invention is a light-transmissive liquid crystal display panel.

Embodiment Mode 4

Description is made of a structure of a liquid crystal display panel of Embodiment Mode 4 of the present invention.

In the liquid crystal display panel of Embodiment Mode 4, a second electrode of a liquid crystal element is provided over a first substrate; a conductive film having reflectivity, which has smaller area than the second electrode, is provided over the second electrode of the liquid crystal element; a first insulating film is provided so as to overlap the second electrode of the liquid crystal element and the conductive film; a semiconductor layer of a transistor, and a first electrode of the liquid crystal element are provided over the first insulating film; a second insulating film is provided so as to cover the semiconductor layer of the transistor, and the first electrode of the liquid crystal element; a gate electrode is provided over the semiconductor layer of the transistor with the second insulating film interposed therebetween; a third insulating film is provided so as to cover the gate electrode and the second insulating film; a hole (contact hole) is formed in the third insulating film and the second insulating film; and a wiring formed over the third insulating film is connected to the semiconductor layer of the transistor through the hole. A surface of the first substrate, which is provided with the transistor, is attached to the second substrate. A liquid crystal layer is provided between the first substrate and the second substrate.

Note that the semiconductor layer of the transistor is a film formed in the same layer as the first electrode of the liquid crystal element.

Further, the first electrode of the liquid crystal element is an electrode having a slit or a comb-shaped electrode, and the second electrode of the liquid crystal element is a plate-like electrode.

Figure 4:
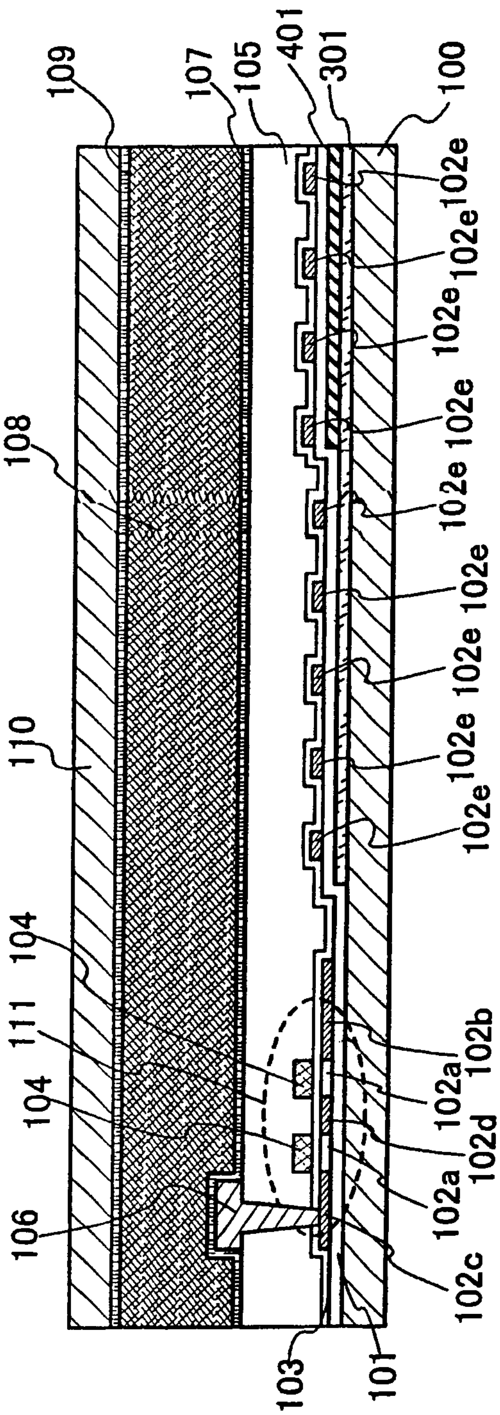
FIG. 4 is a diagram showing a liquid crystal display panel of the present invention.

FIG. 4 is a cross sectional view showing one structure example of the liquid crystal display panel of Embodiment Mode 4 of the present invention.

FIG. 4 shows a part of a pixel in order to explain a structure of the pixel in detail. Note that the structure of the liquid crystal display panel of Embodiment Mode 4 is different from the structure of the liquid crystal display panel described in Embodiment Mode 3 with reference to FIG. 3 in that a conductive film 401 is provided directly on the second electrode 301. In the liquid crystal display panel of Embodiment Mode 4 of the present invention, the second electrode 301 and the conductive film 401 function as common electrodes.

In the liquid crystal display panel of Embodiment Mode 4 of the present invention, the second electrode 301 is preferably a conductive film having a light-transmitting property. As a conductive film having a light-transmitting property, a transparent conductive film such as an indium tin oxide (ITO) film, an indium zinc oxide (IZO) film, an indium tin oxide containing silicon oxide (ITSO) film, a zinc oxide (ZnO) film, and a cadmium tin oxide (CTO) film are given. The conductive film 401 is preferably a conductive film having reflectivity. As a conductive film having reflectivity, a metal film such as an aluminum (Al) film, a copper (Cu) film, a thin film containing aluminum or copper as a main component; a chromium (Cr) film, a tantalum (Ta) film, a tantalum nitride (TaN) film, a titanium (Ti) film, a tungsten (W) film, and a molybdenum (Mo) film are given.

The liquid crystal display panel of Embodiment Mode 4 of the present invention is suitable for a semi-transmissive liquid crystal display panel.

Embodiment Mode 5

Description is made of a structure of a liquid crystal display panel of Embodiment Mode 5 of the present invention.

In the liquid crystal display panel of Embodiment Mode 5, a second electrode of a liquid crystal element is provided over a first substrate; a first insulating film is provided so as to overlap the second electrode of the liquid crystal element; a semiconductor layer of a transistor, and a first electrode of the liquid crystal element are provided over the first insulating film; a second insulating film is provided so as to overlap the semiconductor layer of the transistor, and the first electrode the liquid crystal element; a gate electrode is provided over the semiconductor layer of the transistor with the second insulating film interposed therebetween; a third insulating film is provided so as to overlap the gate electrode and the second insulating film; a hole (contact hole) is formed in the third insulating film and the second insulating film; and a wiring formed over the third insulating film is connected to the semiconductor layer of the transistor through the hole. A surface of the first substrate, which is provided with the transistor, is attached to the second substrate. A liquid crystal layer is provided between the first substrate and the second substrate.

Note that the semiconductor layer of the transistor is a film formed in the same layer as the first electrode of the liquid crystal element.

Further, each of the first electrode and the second electrode of the liquid crystal element is an electrode having a slit or a comb-shaped electrode, and branch portions thereof are provided alternately.

Figure 5:
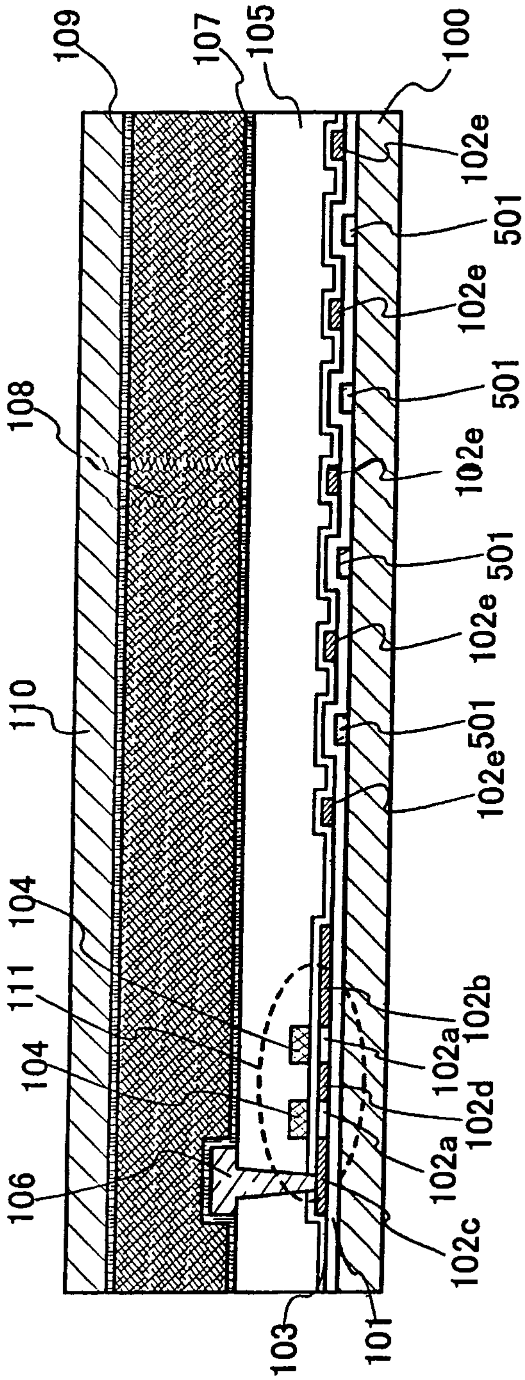
FIG. 5 is a diagram showing a liquid crystal display panel of the present invention.

FIG. 5 is a cross sectional view showing one structure example of the liquid crystal display panel of Embodiment Mode 5 of the present invention.

FIG. 5 shows a part of a pixel in order to explain a structure of the pixel in detail. Note that the structure of the liquid crystal display panel of Embodiment Mode 5 is different from the structure of the liquid crystal display panel shown in Embodiment Mode 2 with reference to FIG. 1 in that a second electrode 501 is provided instead of the second electrode 102*f*.

For the common electrode (second electrode 1020 in FIG. 1, a film formed in the same step as the pixel electrode (first electrode 102*e*) is used. On the other hand, the common electrode (second electrode 501) in FIG. 5 is formed over the substrate 100 and below the first insulating film 101.

The second electrode 501 may be either a conductive film having reflectivity or a conductive film having a light-transmitting property. As a conductive film having reflectivity, a metal film such as an aluminum (Al) film, a copper (Cu) film, a thin film containing aluminum or copper as a main component, a chromium (Cr) film, a tantalum (Ta) film, a tantalum nitride (TaN) film, a titanium (Ti) film, a tungsten (W) film, or a molybdenum (Mo) film is given. As a conductive film having a light-transmitting property, a transparent conductive film such as an indium tin oxide (ITO) film, indium zinc oxide (IZO) film, an indium tin oxide containing silicon oxide (ITSO) film, a zinc oxide (ZnO) film, or a cadmium tin oxide (CTO) film is given. The liquid crystal display panel of Embodiment Mode 3 of the present invention is either a reflective liquid crystal display panel or a light-transmissive liquid crystal display panel. In the case where the second electrode 301 is a conductive film having reflectivity, a reflective liquid crystal display panel is preferable, whereas in the case where the second electrode 301 is a conductive film having a light-transmitting property, a light-transmissive liquid crystal display panel is preferable.

Embodiment Mode 6

In Embodiment Modes 2 to 5, description is made of a structure of the liquid crystal display panel, in which a gate electrode is provided over the semiconductor layer of the transistor in the transistor formed over the substrate, that is, a structure of a liquid crystal display panel having a so-called top-gate transistor. In this embodiment mode, description is made of a structure of a liquid crystal display panel, in which a gate electrode is provided below the semiconductor layer of the transistor in the transistor formed over the substrate, that is, a structure of a liquid crystal display panel having a so-called bottom-gate transistor.

In the liquid crystal display panel of Embodiment Mode 6, a gate electrode is provided over a first substrate; a first insulating film is provided so as to cover, the gate electrode; a semiconductor layer of a transistor is provided over the gate electrode with the first insulating film interposed therebetween, and a first electrode and a second electrode of a liquid crystal element are provided over the substrate with the first insulating film interposed therebetween; a second insulating film is provided so as to cover the semiconductor layer of the transistor, and the first electrode and the second electrode of the liquid crystal element; a hole (contact hole) is formed in the second insulating film; and a wiring formed over the second insulating film is connected to the semiconductor layer of the transistor through the hole. A surface of the first substrate, which is provided with the transistor, is attached to the second substrate. A liquid crystal layer is provided between the first substrate and the second substrate.

Note that the semiconductor layer of the transistor is a film formed in the same layer as the first electrode and the second electrode of the liquid crystal element.

Further, each of the first electrode and the second electrode of the liquid crystal element is an electrode having a slit or a comb-shaped electrode, and branch portions thereof are provided alternately.

Figure 2:
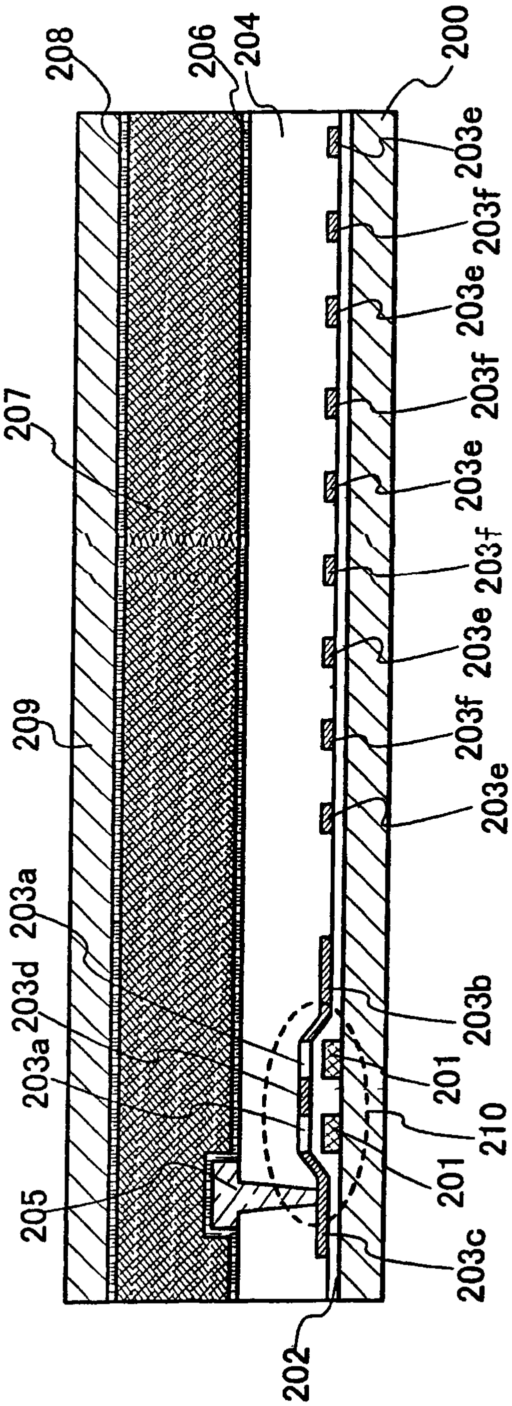
FIG. 2 is a diagram showing a liquid crystal display panel of the present invention.

FIG. 2 is a cross sectional view showing one structure example of the liquid crystal display panel of Embodiment Mode 3 of the present invention.

FIG. 2 shows a part of a pixel in order to explain a structure of the pixel in detail.

Two gate electrodes 201 are formed over a substrate 200. As the substrate 200, an insulating substrate such as a glass substrate, a quartz substrate, a plastic substrate; or a ceramic substrate, a metal substrate, a semiconductor substrate, or the like can be used. As the gate electrodes 201, an aluminum (Al) film, a copper (Cu) film, a thin film containing aluminum or copper as a main component, a chromium (Cr) film, a tantalum (Ta) film, a tantalum nitride (TaN) film, a titanium (Ti) film, a tungsten (W) film, a molybdenum (Mo) film, or the like can be used.

A gate insulating film (first insulating film 202) is formed so as to cover the gate electrodes 201. As the first insulating film 202, a silicon oxide film, a silicon nitride film, a silicon oxynitride film, or the like formed by a CVD method or a sputtering method can be used.

A semiconductor layer (channel formation regions 203*a*, an impurity region 203*b*, an impurity region 203*c*, and an impurity region 203*d*) of a transistor 210, and a first electrode 203*e* and a second electrode 203*f* that control molecular orientation of the liquid crystal molecules are formed over the first insulating film 202. The channel formation regions 203*a*, the impurity region 203*b*, the impurity region 203*c*, the impurity region 203*d*, the first electrode 203*e*, and the second electrode 203*f* are non-single crystalline semiconductor films (for example, polysilicon films), which are formed in the same step.

In the case where the transistor 210 is an n-channel transistor, an impurity element such as phosphorus or arsenic is introduced into the impurity region 203*b*, the impurity region 203*c* and the impurity region 203*d*, whereas in the case where the transistor 210 is a p-channel transistor, an impurity element such as boron is introduced into the impurity region 203*b*, the impurity region 203*c*, and the impurity region 203*d*.

Further, the impurity element introduced into the impurity region 203*b*, the impurity region 203*c*, and the impurity region 203*d* may also be introduced into the first electrode 203*e* and the second electrode 203*f*. The resistance of the first electrode 203*e* and the second electrode 203*f* is lowered when an impurity is introduced thereto, which is preferable for each of the first electrode 203*e* and the second electrode 203*f* to function as an electrode.

The first electrode 203*e* and the second electrode 2031 each have thickness of, for example, 45 nm to 60 nm, and have sufficiently high light transmittance. In order to further improve the light transmittance, it is desirable to make thickness of the first electrode 203*e* and the second electrode 203*f* be 40 nm or less.

The semiconductor layer (the channel formation region 203*a*, the impurity region 203*b*, the impurity region 203*c*, and the impurity region 203*d*) of the transistor 210, and the first electrode 203*e* and the second electrode 203*f* that control molecular orientation of the liquid crystal molecules are formed in the same step. Thus, the number of steps can be reduced, so that the manufacturing cost can be reduced. In addition, it is desirable that impurity elements of the same type be introduced into the impurity region 203*b*, the impurity region 203*c*, and the impurity region 203*d*; and the first electrode 203*e* and the second electrode 203*f*. This is because when the impurity elements of the same type are introduced, the impurity elements can be introduced without a problem even if the impurity region 203*b*, the impurity region 203*c*, and the impurity region 203*d*; and the first electrode 203*e* and the second electrode 203*f* are located close to each other, so that dense layout becomes possible. It is desirable to add impurity elements of either p-type or n-type because the manufacturing cost can be low compared with the case in which impurity elements of different types are introduced.

An interlayer insulating film (second insulating film 204) is formed over the first insulating film 202 and the semiconductor layer (the channel formation region 203*a*, the impurity region 203*b*, the impurity region 203*c*, and the impurity region 203*d*) of the transistor 210, and the first electrode 203*e* and the second electrode 2031 that control molecular orientation of the liquid crystal molecules. The second insulating film 204 preferably has a stacked-layer structure. For example, a protective film and a planarization film may be stacked in this order. For the protective film, an inorganic insulating film is suitable. As an inorganic insulating film, a silicon nitride film, a silicon oxide film, a silicon oxynitride film, or a film formed by stacking these layers can be used. For a planarization film, a resin film is suitable. As a resin film, polyimide, polyamide, acrylic, polyimide amide, epoxy, or the like can be used.

A signal line (wiring 205) is formed over the second insulating film 204. The wiring 205 is connected to the impurity region 203*c* through a hole (contact hole) formed in the second insulating film 204. As the wiring 205, a titanium (Ti) film, an aluminum (Al) film, a copper (Cu) film, an aluminum film containing Ti, or the like can be used. Preferably, copper which has low resistance may be used.

A first orientation film 206 is formed over the wiring 205 and the second insulating film 204. Then, a liquid crystal layer 207, a second orientation film 208, and a substrate 209 are provided over the first orientation film 206. That is, the liquid crystal layer 207 is interposed between the first orientation film 206 and the second orientation film 208. That is, the second orientation film 208 is formed over the substrate 209, and a surface of the substrate 209, on which the second orientation film 208 is formed, and a surface of the substrate 200, on which the first orientation film 206 is formed, are attached, to each other. The liquid crystal layer 207 is provided between the first orientation film 206 and the second orientation film 208.

Embodiment Mode 7

Description is made of a structure of a liquid crystal display panel of Embodiment Mode 7 of the present invention.

In the liquid crystal display panel of Embodiment Mode 7 of the present invention, a gate electrode and a second electrode of a liquid crystal element are provided over a first substrate; a first insulating film is provided so as to cover the gate electrode and the second electrode of the liquid crystal element; a semiconductor layer of a transistor is provided over the gate electrode with the first insulating film interposed therebetween, and a first electrode of the liquid crystal element is provided over the second electrode of the liquid crystal element with the first insulating film interposed therebetween; a second insulating film is provided so as to cover the semiconductor layer of the transistor, and the first electrode of the liquid crystal element; a hole (contact hole) is formed in the second insulating film; and a wiring formed over the second insulating film is connected to the semiconductor layer of the transistor through the hole. A surface of the first substrate, which is provided with the transistor, is attached to the second substrate. A liquid crystal layer is provided between the first substrate and the second substrate.

Note that the semiconductor layer of the transistor is a film formed in the same layer as the first electrode of the liquid crystal element.

Further, the first electrode of the liquid crystal element is an electrode having a slit or a comb-shaped electrode, and the second electrode of the liquid crystal element is a plate-like electrode.

Figure 6:
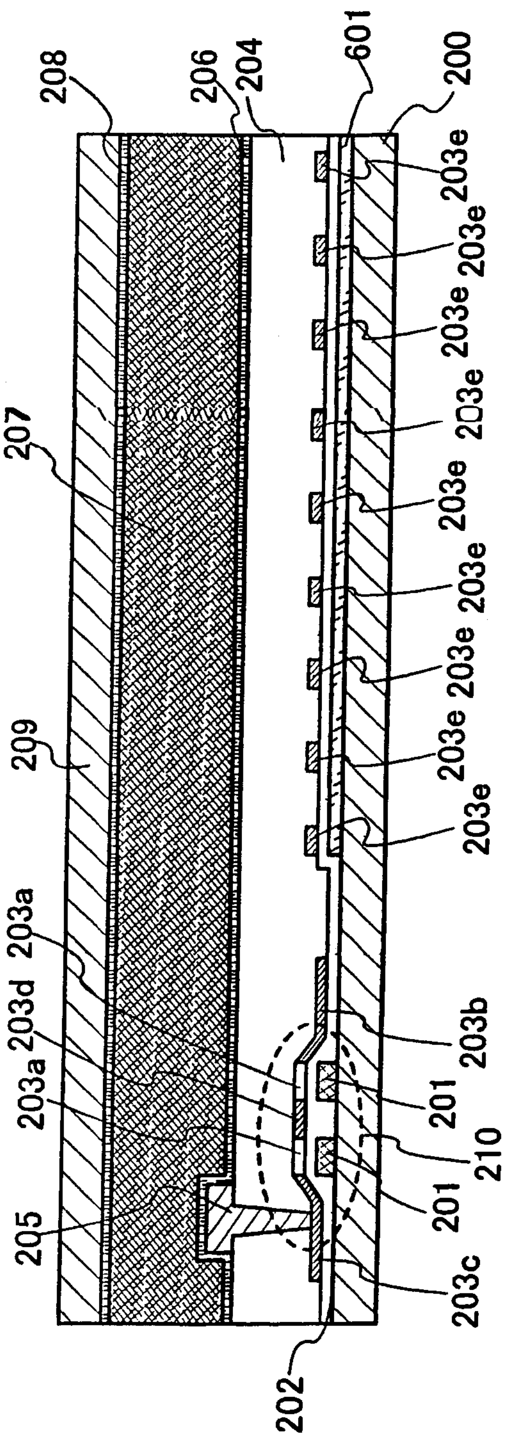
FIG. 6 is a diagram showing a liquid crystal display panel of the present invention.

FIG. 6 is a cross sectional view showing one structure example of the liquid crystal display panel of Embodiment Mode 7 of the present invention.

FIG. 6 shows a part of a pixel in order to explain a structure of the pixel in detail. Note that the structure of the liquid crystal display panel of Embodiment Mode 7 is different from the structure of the liquid crystal display panel shown in Embodiment Mode 6 with reference to FIG. 2 in that a second electrode 601 is provided instead of the second electrode 203*f*.

For the common electrode (second electrode 203*f*) in FIG. 2, a film formed in the same step as the pixel electrode (first electrode 203*e*) is used. However, the common electrode (second electrode 601) of FIG. 6 is formed over the substrate 200 and below the first insulating film 202.

The second electrode 601 may be either a conductive film having reflectivity or a conductive film having a light-transmitting property. As a conductive film having reflectivity, a metal film such as an aluminum (Al) film, a copper (Cu) film, a thin film containing aluminum or copper as a main component, a chromium (Cr) film, a tantalum (Ta) film, a tantalum nitride (TaN) film, a titanium (Ti) film, a tungsten (W) film, or a molybdenum (Mo) film is given. As a conductive film having a light-transmitting property, a transparent conductive film such as an indium tin oxide (ITO) film, indium zinc oxide (IZO) film, an indium tin oxide containing silicon oxide (ITSO) film, a zinc oxide (ZnO) film, or a cadmium tin oxide (CTO) film is given. In the case where the second electrode 601 is a conductive film having reflectivity, the liquid crystal display panel of Embodiment Mode 7 of the present invention is a reflective liquid crystal display panel, whereas in the case where the second electrode 601 is a conductive film having a light-transmitting property, the liquid crystal display panel of Embodiment Mode 7 of the present invention is a light-transmissive liquid crystal display panel.

Embodiment Mode 8

Description is made of a structure of a liquid crystal display panel of Embodiment Mode 8 of the present invention.

In the liquid crystal display panel of Embodiment Mode 8 of the present invention, a gate electrode and a second electrode of a liquid crystal element are provided over a first substrate; a conductive film having reflectivity, which has smaller area than the second electrode of the liquid crystal element, is provided over the second electrode of the liquid crystal element; a first insulating film is provided so as to cover the gate electrode, the second electrode of the liquid crystal element, and the conducive film; a semiconductor layer of a transistor is provided over the gate electrode with the first insulating film interposed therebetween, and a first electrode of the liquid crystal element is provided over the second electrode of the liquid crystal element with the first insulating film interposed therebetween; a second insulating film is provided so as to cover the semiconductor layer of the transistor, and the first electrode of the liquid crystal element; a hole (contact hole) is formed in the second insulating film; and a wiring formed over the second insulating film is connected to the semiconductor layer of the transistor through the hole. A surface of the first substrate, which is provided with the transistor, is attached to the second substrate. A liquid crystal layer is provided between the first substrate and the second substrate.

Note that the semiconductor layer of the transistor is a film formed in the same layer as the first electrode of the liquid crystal element.

Further, the first electrode of the liquid crystal element is an electrode having a slit or a comb-shaped electrode, and the second electrode of the liquid crystal element is a plate-like electrode.

Figure 7:
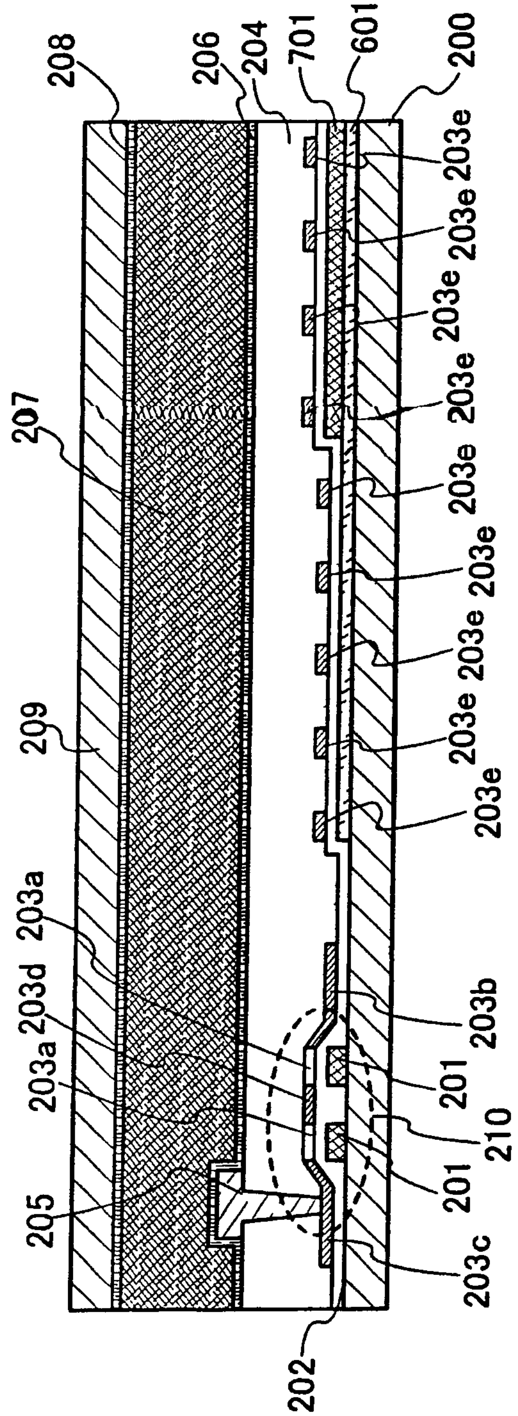
FIG. 7 is a diagram showing a liquid crystal display panel of the present invention.

FIG. 7 is a cross sectional view showing one structure example of the liquid crystal display panel of Embodiment Mode 8 of the present invention.

FIG. 7 shows a part of a pixel in order to explain a structure of the pixel in detail. Note that the structure of the liquid crystal display panel of Embodiment Mode 8 is different from the structure of the liquid crystal display panel described in Embodiment Mode 7 with reference to FIG. 6 in that a conductive film 701 is provided directly on the second electrode 601. In the liquid crystal display panel of Embodiment Mode 8 of the present invention, the second electrode 601 and the conductive film 701 function as common electrodes.

In the liquid crystal display panel of Embodiment Mode 8 of the present invention, the second electrode 601 is preferably a conductive film having a light-transmitting property. As a conductive film having a light-transmitting property, a transparent conductive film such as an indium tin oxide (ITO) film, an indium zinc oxide (IZO) film, an indium tin oxide containing silicon oxide (ITSO) film, a zinc oxide (ZnO) film, or a cadmium tin oxide (CTO) film is given. The conductive film 401 is preferably a conductive film having reflectivity. As a conductive film having reflectivity, a metal film such as an aluminum (Al) film, a copper (Cu) film, a thin film containing aluminum or copper as a main component, a chromium (Cr) film, a tantalum (Ta) film, a tantalum nitride (TaN) film, a titanium (Ti) film, a tungsten (W) film, or a molybdenum (Mo) film is given.

The liquid crystal display panel of Embodiment Mode 8 of the present invention is suitable for a semi-transmissive liquid crystal display panel.

Embodiment Mode 9

Description is made of a structure of a liquid crystal display panel of Embodiment Mode 9 of the present invention.

The liquid crystal display panel of Embodiment Mode 9 of the present invention has a structure in which the second electrode 601 and the conductive film 701 are formed using one mask. Specifically, the second electrode 601 and the conductive film 701 are formed with use of a mask called halftone or gray tone, in which thickness of a resist is varied depending on a region. Accordingly, a manufacturing process can be simplified, and the number of masks (the number of reticles) can be reduced.

In the liquid crystal display panel of Embodiment Mode 9 of the present invention, a first conductive film and a second electrode of a liquid crystal element are provided over a first substrate; a gate electrode is provided over the first conductive film; a second conductive film having reflectivity, which has smaller area than the second electrode of the liquid crystal element, is provided over the second electrode of the liquid crystal element; a first insulating film is provided so as to cover the gate electrode, the second electrode of the liquid crystal element, and a second conducive film; a semiconductor layer of a transistor is provided over the gate electrode with the first insulating film interposed therebetween, and a first electrode of the liquid crystal element is provided over the second electrode of the liquid crystal element with the first insulating film interposed therebetween; a second insulating film is provided so as to cover the semiconductor layer of the transistor, and the first electrode of the liquid crystal element; a hole (contact hole) is formed in the second insulating film; and a wiring formed over the second insulating film is connected to the semiconductor layer of the transistor through the hole. A surface of the first substrate, which is provided with the transistor, is attached to the second substrate. A liquid crystal layer is provided between the first substrate and the second substrate.

Note that the semiconductor layer of the transistor is a film formed in the same layer as the first electrode of the liquid crystal element.

Further, the first conductive film is a film formed in the same layer as the second electrode of the liquid crystal element, and the gate electrode is a film formed in the same layer as the second conductive film.

Further, the first electrode of the liquid crystal element is an electrode having a slit or a comb-shaped electrode, and the second electrode of the liquid crystal element is a plate-like electrode.

Figure 8:
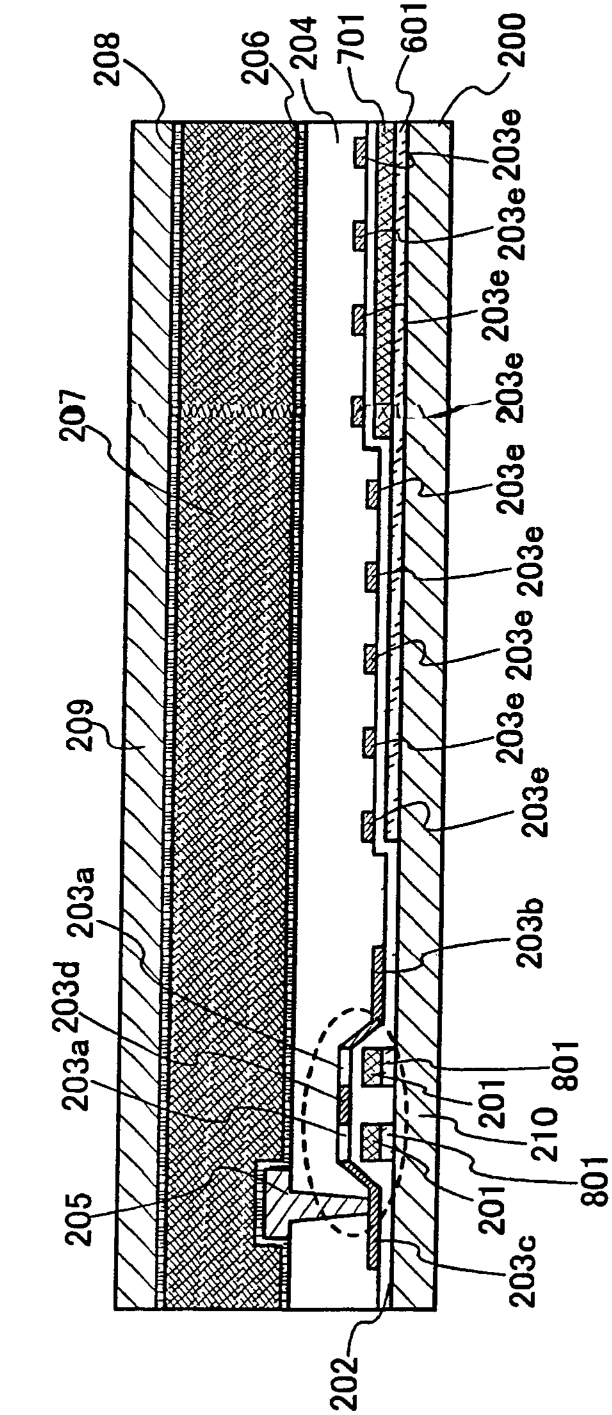
FIG. 8 is a diagram showing a liquid crystal display panel of the present invention.

FIG. 8 is a cross sectional view showing one structure example of the liquid crystal display panel of Embodiment Mode 9 of the present invention.

FIG. 8 shows a part of a pixel in order to explain a structure of the pixel in detail. Note that the structure of the liquid crystal display panel of Embodiment Mode 9 is different from the structure of the liquid crystal display panel described in Embodiment Mode 8 with reference to FIG. 7 in that a conductive film 801 is provided directly under the gate electrode 201. In the liquid crystal display panel of Embodiment Mode 9 of the present invention, the conductive film 801 also functions as a part of the gate electrode 201.

In the liquid crystal display panel of Embodiment Mode 9 of the present invention, it is preferable that the second electrode 601 and the conductive film 801 be formed in the same step, and the conductive film 701 and the gate electrode 201 be formed in the same step.

As for formation of them, a first conductive film to be the second electrode 601 and the conductive film 801 is formed first, and a second conductive film to be the gate electrode 201 and the conductive film 701 is formed thereover. Then, a resist film is formed over the second conductive film, and the resist film is exposed to light using a exposure mask having a light-shielding portion by which exposure light is shielded and a semi-transmissive portion through which exposure light partially passes. Subsequently, development is performed to form a first resist pattern having two film thicknesses and a second resist pattern having an almost uniform thickness. The first conductive film and the second conductive film are etched using the first resist pattern and the second resist pattern to be separated to be almost the same patterns as the first resist pattern and the second resist pattern. The first resist pattern and the second resist pattern are ashed or etched to form a third resist pattern and a fourth resist pattern respectively.

The separated second conductive film is etched using the third resist pattern and the fourth resist pattern as masks. Accordingly, a pattern of the second conductive film etched using the third resist pattern becomes smaller than a pattern of the first conductive film. That is, the second conductive film etched using the third resist pattern can be used as the conductive film 701.

Embodiment Mode 10

Description is made of a structure of a liquid crystal display panel of Embodiment Mode 10 of the present invention.

In the liquid crystal display panel of Embodiment Mode 10 of the present invention, a gate electrode and a second electrode of a liquid crystal element are provided over a first substrate; a first insulating film is provided so as to cover the gate electrode, the second electrode of the liquid crystal element, and the conducive film; a semiconductor layer of a transistor is provided over the gate electrode with the first insulating film interposed therebetween, and a first electrode of the liquid crystal element is provided over the second electrode of the liquid crystal element with the first insulating film interposed therebetween; a second insulating film is provided so as to cover the semiconductor layer of the transistor, and the first electrode of the liquid crystal element; a hole (contact hole) is formed in the second insulating film; and a wiring formed over the second insulating film is connected to the semiconductor layer of the transistor through the hole. A surface of the first substrate, which is provided with the transistor, is attached to the second substrate. A liquid crystal layer is provided between the first substrate and the second substrate.

Note that the semiconductor layer of the transistor is a film formed in the same layer as the first electrode of the liquid crystal element.

Further, each of the first electrode and the second electrode of the liquid crystal element is an electrode having a slit or a comb-shaped electrode.

Figure 9:
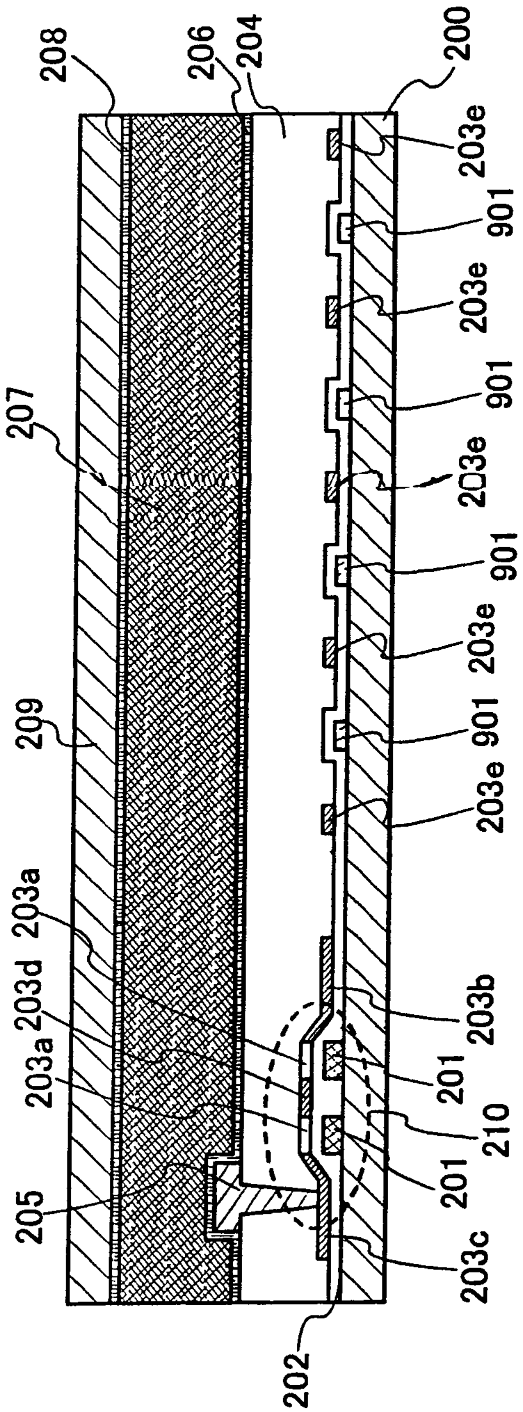
FIG. 9 is a diagram showing a liquid crystal display panel of the present invention.

FIG. 9 is a cross sectional view showing one structure example of the liquid crystal display panel of Embodiment Mode 10 of the present invention.

FIG. 9 shows, a part of a pixel in order to explain a structure of the pixel in detail. Note that the structure of the liquid crystal display panel of Embodiment Mode 10 is different from the structure of the liquid crystal display panel shown in Embodiment Mode 6 with reference to FIG. 2 in that a second electrode 901 is provided instead of the second electrode **203*f***.

For the common electrode (second electrode **102*f*) in FIG. 1, a film formed in the same step as the pixel electrode (first electrode 102*e*) is used. However, the common electrode (second electrode 901) is formed over the substrate 100 and below the first insulating film 202**.

The second electrode 901 may be either a conductive film having reflectivity or a conductive film having a light-transmitting property. As a conductive film having reflectivity, a metal film such as an aluminum (Al) film, a copper (Cu) film, a thin film containing aluminum or copper as a main component, a chromium (Cr) film, a tantalum (Ta) film, a tantalum nitride (TaN) film, a titanium (Ti) film, a tungsten (W) film, or a molybdenum (Mo) film is given. As a conductive film having a light-transmitting property, a transparent conductive film such as an indium tin oxide (ITO) film, indium zinc oxide (IZO) film, an indium tin oxide containing silicon oxide (ITSO) film, a zinc oxide (ZnO) film, or a cadmium tin oxide (CTO) film is given. The liquid crystal display panel of Embodiment Mode 10 of the present invention is either a reflective liquid crystal display panel or a light-transmissive liquid crystal display panel. In the case where the second electrode 901 is a conductive film having reflectivity, a reflective liquid crystal display panel is preferable, whereas in the case where the second electrode 901 is a conductive film having a light-transmitting property, a light-transmissive liquid crystal display panel is preferable.

Embodiment Mode 11

Description is made of a structure of a liquid crystal display panel of Embodiment Mode 11 of the present invention.

In this embodiment mode, description is made of a structure in which the liquid crystal display panel is provided with a polarizing plate or a polarizing film.

In a first structure of the liquid crystal display panel of Embodiment Mode 11, which corresponds to a liquid crystal display panel of Embodiment Mode 2 using a polarizing plate, a first insulating film is provided over a first substrate; a semiconductor layer of a transistor, and a first electrode and a second electrode of a liquid crystal element are provided over the first insulating film; a second insulating film is provided so as to cover the semiconductor layer of the transistor, and the first electrode and the second electrode of the liquid crystal element; a gate electrode is provided over the semiconductor layer of the transistor with the second insulating film interposed therebetween; a third insulating film is provided so as to cover the gate electrode and the second insulating film; a hole (contact hole) is formed in the third insulating film and the second insulating film; and a wiring formed over the third insulating film is connected to the semiconductor layer of the transistor through the hole. A surface of the first substrate, which is provided with the transistor, is attached to a second substrate. A liquid crystal layer is provided between the first substrate and the second substrate.

Note that the semiconductor layer of the transistor is a film formed in the same layer as the first electrode and the second electrode of the liquid crystal element.

Further, each of the first electrode and the second electrode of the liquid crystal element is an electrode having a slit or a comb-shaped electrode.

Here, the liquid crystal display panel of Embodiment Mode 11 of the present invention has a polarizing plate or a polarizing film. The polarizing plate may be provided on an outer surface (a surface on which the liquid crystal layer is not provided) of the first substrate and an outer surface (a surface on which the liquid crystal layer is not provided) of the second substrate, or the polarizing film may be provided over or below the third insulating film or an inner surface (a surface on which the liquid crystal layer is provided) of the second substrate.

In a second structure of the liquid crystal display panel of Embodiment Mode 11 of the present invention, which corresponds to the liquid crystal display panel of Embodiment Mode 3 of the present invention using a polarizing plate, a second electrode of a liquid crystal element is provided over a first substrate; a first insulating film is provided so as to cover the second electrode of the liquid crystal element; a semiconductor layer of a transistor, and a first electrode of the liquid crystal element are provided over the first insulating film; a second insulating film is provided so as to cover the semiconductor layer of the transistor, and the first electrode the liquid crystal element; a gate electrode is provided over the semiconductor layer of the transistor with the second insulating film interposed therebetween; a third insulating film is provided so as to cover the gate electrode and the second insulating film; a hole (contact hole) is formed in the third insulating film and the second insulating film; and a wiring formed over the third insulating film is connected to the semiconductor layer of the transistor through the hole. A surface of the first substrate, which is provided with the transistor, is attached to a second substrate. A liquid crystal layer is provided between the first substrate and the second substrate.

Note that the semiconductor layer of the transistor is a film formed in the same layer as the first electrode of the liquid crystal element.

Further, the first electrode of the liquid crystal element is an electrode having a slit or a comb-shaped electrode, and the second electrode of the liquid crystal element is a plate-like electrode.

Here, the liquid crystal display panel of Embodiment Mode 11 of the present invention has a polarizing plate or a polarizing film. The polarizing plate may be provided on an outer surface (a surface on which the liquid crystal layer is not provided) of the first substrate and an outer surface (a surface on which the liquid crystal layer is not provided) of the second substrate, or the polarizing film may be provided over or below the third insulating film or an inner surface (a surface on which the liquid crystal layer is provided) of the second substrate.

In a third structure of the liquid crystal display panel of Embodiment Mode 11 of the present invention, which corresponds to the liquid crystal display panel of Embodiment Mode 4 of the present invention using a polarizing plate, a second electrode of a liquid crystal element is provided over a first substrate; a conductive film having reflectivity, which has smaller area than the second electrode of the liquid crystal element, is provided over the second electrode of the liquid crystal element; a first insulating film is provided so as to cover the second electrode of the liquid crystal element and the conductive film; a semiconductor layer of a transistor, and a first electrode of the liquid crystal element are provided over the first insulating film; a second insulating film is provided so as to cover the semiconductor layer of the transistor, and the first electrode of the liquid crystal element; a gate electrode is provided over the semiconductor layer of the transistor with the second insulating film interposed therebetween; a third insulating film is provided so as to cover the gate electrode and the second insulating film; a hole (contact hole) is formed in the third insulating film and the second insulating film; and a wiring formed over the third insulating film is connected to the semiconductor layer of the transistor through the hole. A surface of the first substrate, which is provided with the transistor, is attached to a second substrate. A liquid crystal layer is provided between the first substrate and the second substrate.

Note that the semiconductor layer of the transistor is a film formed in the same layer as the first electrode of the liquid crystal element.

Further, the first electrode of the liquid crystal element is an electrode having a slit or a comb-shaped electrode, and the second electrode of the liquid crystal element is a plate-like electrode.

Here, the liquid crystal display panel of Embodiment Mode 11 of the present invention has a polarizing plate or a polarizing film. The polarizing plate may be provided on an outer surface (a surface on which the liquid crystal layer is not provided) of the first substrate and an outer surface (a surface on which the liquid crystal layer is not provided) of the second substrate, or the polarizing film may be provided over or below the third insulating film or an inner surface (a surface on which the liquid crystal layer is provided) of the second substrate.

In a fourth structure of the liquid crystal display panel of Embodiment Mode 11, which corresponds to the liquid crystal display panel of Embodiment Mode 5 using a polarizing plate, a second electrode of a liquid crystal element is provided over a first substrate; a first insulating film is provided so as to cover the second electrode of the liquid crystal element; a semiconductor layer of a transistor, and a first electrode of the liquid crystal element are provided over the first insulating film; a second insulating film is provided so as to cover the semiconductor layer of the transistor, and the first electrode of the liquid crystal element; a gate electrode is provided over the semiconductor layer of the transistor with the second insulating film interposed therebetween; a third insulating film is provided so as to cover the gate electrode and the second insulating film; a hole (contact hole) is formed in the third insulating film and the second insulating film; and a wiring formed over the third insulating film is connected to the semiconductor layer of the transistor through the hole. A surface of the first substrate, which is provided with the transistor, is attached to the second substrate. A liquid crystal layer is provided between the first substrate and the second substrate.

Note that the semiconductor layer of the transistor is a film formed in the same layer as the first electrode of the liquid crystal element.

Further, each of the first electrode and the second electrode of the liquid crystal element is an electrode having a slit or a comb-shaped electrode, and branch portions thereof are provided alternately.

Here, the liquid crystal display panel of Embodiment Mode 11 of the present invention has a polarizing plate or a polarizing film. The polarizing plate may be provided on an outer surface (a surface on which the liquid crystal layer is not provided) of the first substrate and an outer surface (a surface on which the liquid crystal layer is not provided) of the second substrate, or the polarizing film may be provided over or below the third insulating film or an inner surface (a surface on which the liquid crystal layer is provided) of the second substrate.

In a fifth structure of the liquid crystal display panel of Embodiment Mode 11, which corresponds to the liquid crystal display panel of Embodiment Mode 6 using a polarizing plate, a gate electrode is provided over a first substrate; a first insulating film is provided so as to cover the gate electrode; a semiconductor layer of a transistor is provided over the gate electrode with the first insulating film interposed therebetween, and a first electrode and a second electrode of a liquid crystal element are provided over the first substrate with the first insulating film interposed therebetween; a second insulating film is provided so as to cover the semiconductor layer of the transistor, and the first electrode and the second electrode of the liquid crystal element; a hole (contact hole) is formed in the second insulating film; and a wiring formed over the second insulating film is connected to the semiconductor layer of the transistor through the hole. A surface of the first substrate, which is provided with the transistor, is attached to a second substrate. A liquid crystal layer is provided between the first substrate and the second substrate.

Note that the semiconductor layer of the transistor is a film formed in the same layer as the first electrode and the second electrode of the liquid crystal element.

Further, each of the first electrode and the second electrode of the liquid crystal element is an electrode having a slit or a comb-shaped electrode, and branch portions thereof are provided alternately.

Here, the liquid crystal display panel of Embodiment Mode 11 of the present invention has a polarizing plate or a polarizing film. The polarizing plate may be provided on an outer surface (a surface on which the liquid crystal layer is not provided) of the first substrate and an outer surface (a surface on which the liquid crystal layer is not provided) of the second substrate, or the polarizing film may be provided over or below the second insulating film or an inner surface (a surface on which the liquid crystal layer is provided) of the second substrate.

In a sixth structure of the liquid crystal display panel of Embodiment Mode 11 of the present invention, which corresponds to the liquid crystal display panel of Embodiment Mode 7 of the present invention using a polarizing plate, a gate electrode and a second electrode of a liquid crystal element are provided over a first substrate; a first insulating film is provided so as to cover the gate electrode and the second electrode of the liquid crystal element; a semiconductor layer of a transistor is provided over the gate electrode with the first insulating film interposed therebetween, and a first electrode of the liquid crystal element is provided over the second electrode of the liquid crystal element with the first insulating film interposed therebetween; a second insulating film is provided so as to cover the semiconductor layer of the transistor, and the first electrode of the liquid crystal element; a hole (contact hole) is formed in the second insulating film; and a wiring formed over the second insulating film is connected to the semiconductor layer of the transistor through the hole. A surface of the first substrate, which is provided with the transistor, is attached to a second substrate. A liquid crystal layer is provided between the first substrate and the second substrate.

Note that the semiconductor layer of the transistor is a film formed in the same layer as the first electrode of the liquid crystal element.

Further, the first electrode of the liquid crystal element is an electrode having a slit or a comb-shaped electrode, and the second electrode of the liquid crystal element is a plate-like electrode.

Here, the liquid crystal display panel of Embodiment Mode 11 of the present invention has a polarizing plate or a polarizing film. The polarizing plate may be provided on an outer surface (a surface on which the liquid crystal layer is not provided) of the first substrate and an outer surface (a surface on which the liquid crystal layer is not provided) of the second substrate, or the polarizing film may be provided over or below the second insulating film or an inner surface (a surface on which the liquid crystal layer is provided) of the second substrate.

In a seventh structure of the liquid crystal display panel of Embodiment Mode 11 of the present invention, which corresponds to the liquid crystal display panel of Embodiment Mode 8 of the present invention using a polarizing plate, a gate electrode and a second electrode of a liquid crystal element are provided over a first substrate; a conductive film having reflectivity, which has smaller area than the second electrode of the liquid crystal element, is provided over the second electrode of the liquid crystal element; a first insulating film is provided so as to cover the gate electrode, the second electrode of the liquid crystal element, and the conducive film; a semiconductor layer of a transistor is provided over the gate electrode with the first insulating film interposed therebetween, and a first electrode of the liquid crystal element is provided over the second electrode of the liquid crystal element with the first insulating film interposed therebetween; a second insulating film is provided so as to cover the semiconductor layer of the transistor, and the first electrode of the liquid crystal element; a hole (contact hole) is formed in the second insulating film; and a wiring formed over the second insulating film is connected to the semiconductor layer of the transistor through the hole. A surface of the first substrate, which is provided with the transistor, is attached to a second substrate. A liquid crystal layer is provided between the first substrate and the second substrate.

Note that the semiconductor layer of the transistor is a film formed in the same layer as the first electrode of the liquid crystal element.

Further, the first electrode of the liquid crystal element is an electrode having a slit or a comb-shaped electrode, and the second electrode of the liquid crystal element is a plate-like electrode.

Here, the liquid crystal display panel of Embodiment Mode 11 of the present invention has a polarizing plate or a polarizing film. The polarizing plate may be provided on an outer surface (a surface on which the liquid crystal layer is not provided) of the first substrate and an outer surface (a surface on which the liquid crystal layer is not provided) of the second substrate, or the polarizing film may be provided over or below the second insulating film or an inner surface (a surface on which the liquid crystal layer is provided) of the second substrate.

In an eighth structure of the liquid crystal display panel of Embodiment Mode 11 of the present invention, which corresponds to the liquid crystal display panel of Embodiment Mode 9 of the present invention using a polarizing plate, a first conductive film and a second electrode of a liquid crystal element are provided over a first substrate; a gate electrode is provided over the first conductive film; a second conductive film having reflectivity, which has smaller area than the second electrode of the liquid crystal element, is provided over the second electrode of the liquid crystal element; a first insulating film is provided so as to cover the gate electrode, the second electrode of the liquid crystal element, and the second conducive film; a semiconductor layer of a transistor is provided over the gate electrode with the first insulating film interposed therebetween, and a first electrode of the liquid crystal element is provided over the second electrode of the liquid crystal element with the first insulating, interposed therebetween; a second insulating film is provided so as to cover the semiconductor layer of the transistor, and the first electrode of the liquid crystal element; a hole (contact hole) is formed in the second insulating film; and a wiring formed over the second insulating film is connected to the semiconductor layer of the transistor through the hole. A surface of the first substrate, which is provided with the transistor, is attached to the second substrate. A liquid crystal layer is provided between the first substrate and the second substrate.

Note that the semiconductor layer of the transistor is a film formed in the same layer as the first electrode of the liquid crystal element.

Further, the first conductive film is a film formed in the same layer as the second electrode of the liquid crystal element, and the gate electrode is a film formed in the same layer as the second conductive film.

Further, the first electrode of the liquid crystal element is an electrode having a slit or a comb-shaped electrode, and the second electrode of the liquid crystal element is a plate-like electrode.

Here, the liquid crystal display panel of Embodiment Mode 11 of the present invention has a polarizing plate or a polarizing film. The polarizing plate may be provided on an outer surface (a surface on which the liquid crystal layer is not provided) of the first substrate and an outer surface (a surface on which the liquid crystal layer is not provided) of the second substrate, or the polarizing film may be provided over or below the second insulating film or an inner surface (a surface on which the liquid crystal layer is provided) of the second substrate.

In a ninth structure of the liquid crystal display panel of Embodiment Mode 11 of the present invention, which corresponds to the liquid crystal display panel of Embodiment Mode 10 of the present invention using a polarizing plate, a gate electrode and a second electrode of a liquid crystal element are provided over a first substrate; a first insulating film is provided so as to cover the gate electrode and the second electrode of the liquid crystal element; a semiconductor layer of a transistor is provided over the gate electrode with the first insulating film interposed therebetween, and a first electrode of the liquid crystal element is provided over the second electrode of the liquid crystal element with the first insulating film interposed therebetween; a second insulating film is provided so as to cover the semiconductor layer of the transistor, and the first electrode of the liquid crystal element; a hole (contact hole) is formed in the second insulating film; and a wiring formed over the second insulating film is connected to the semiconductor layer of the transistor through the hole. A surface of the first substrate, which is provided with the transistor, is attached to the second substrate. A liquid crystal layer is provided between the first substrate and the second substrate.

Note that the semiconductor layer of the transistor is a film formed in the same layer as the first electrode of the liquid crystal element.

Further, each of the first electrode and the second electrode of the liquid crystal element is an electrode having a slit or a comb-shaped electrode.

Here, the liquid crystal display panel of Embodiment Mode 11 of the present invention has a polarizing plate or a polarizing film. The polarizing plate may be provided on an outer surface (a surface on which the liquid crystal layer is not provided) of the first substrate and an outer surface (a surface on which the liquid crystal layer is not provided) of the second substrate, or the polarizing film may be provided over or below the second insulating film or an inner surface (a surface on which the liquid crystal layer is provided) of the second substrate.

First, a structure in which a polarizing plate is provided on an outer side of a substrate is described in detail. That is, the polarizing plate is provided on a surface opposite to a surface over which an orientation film is formed. The liquid crystal display panels described in Embodiment Modes 1 to 10 each can be provided with a polarizing plate; however, in this embodiment mode, specific description is made taking as examples the case where a polarizing plate is provided in the structure of FIG. 1 of Embodiment mode 2 and the case where a polarizing plate is provided in the structure of FIG. 2 of Embodiment mode 6.

Figure 10:
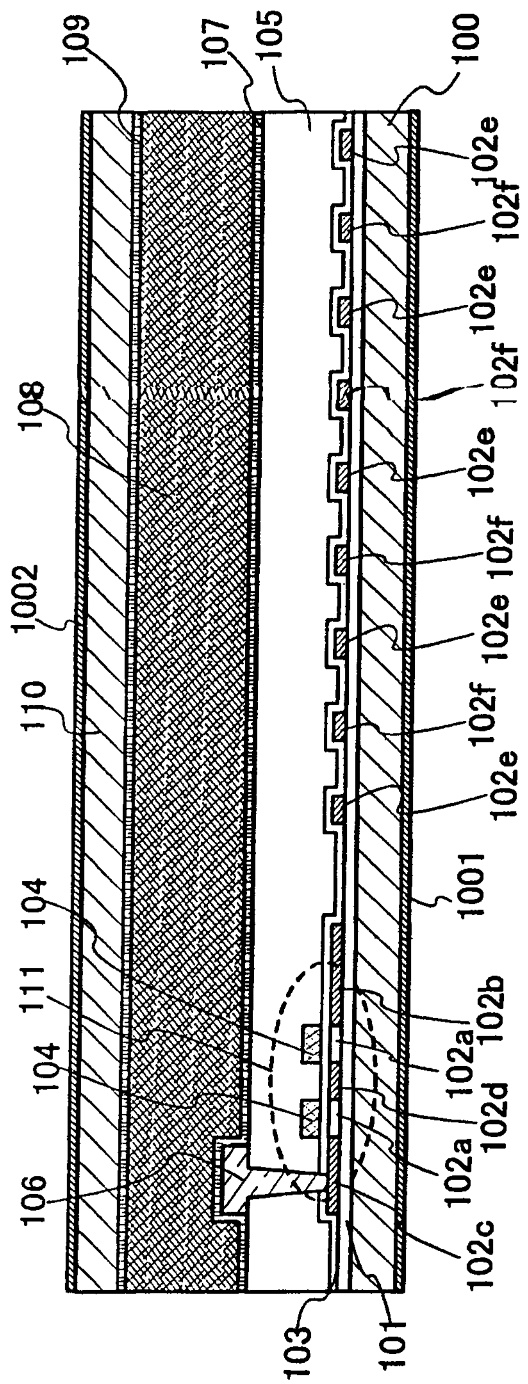
FIG. 10 is a diagram showing a liquid crystal display panel of the present invention.

FIG. 10 shows a structure in which a polarizing plate is provided on an outer side of the substrate of the structure in FIG. 1. In FIG. 10, a polarizing plate 1001 is provided on a surface opposite to a surface of the substrate 100 over which the orientation film 107 is formed. In addition, a polarizing plate 1002 is provided on a surface opposite to a surface of the substrate 110 on which the orientation film 109 is formed. The polarizing plate 1001 and the polarizing plate 1002 are provided so that light absorption axes thereof are perpendicular to each other.

Figure 15:
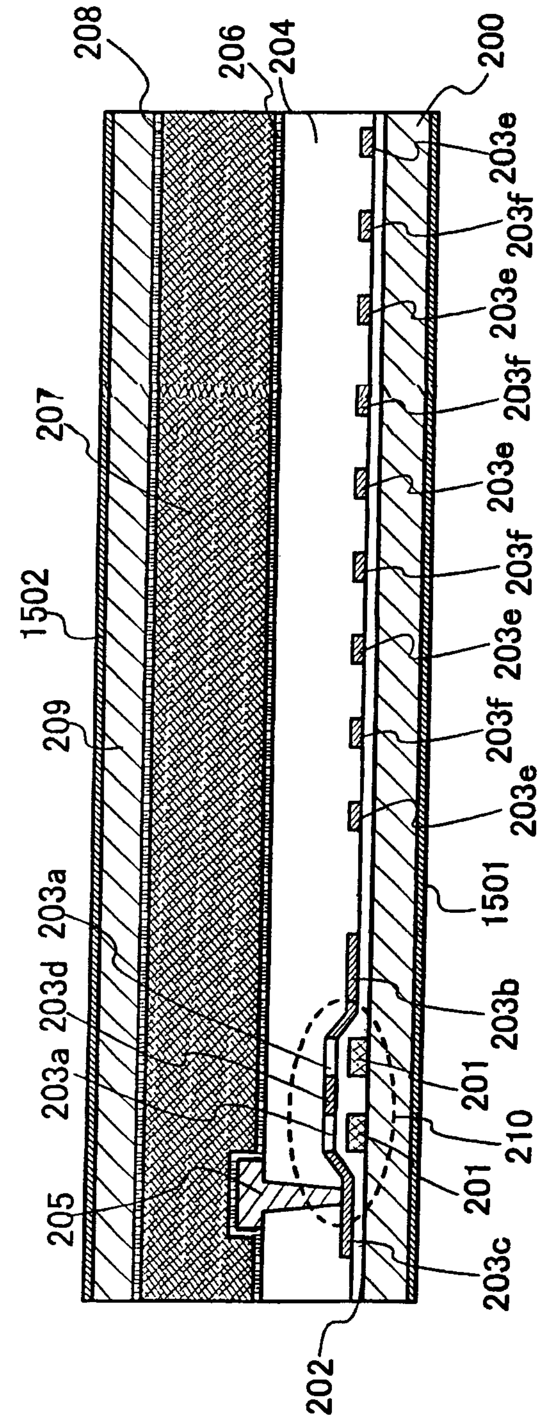
FIG. 15 is a diagram showing a liquid crystal display panel of the present invention.

FIG. 15 shows a structure in which a polarizing plate is provided on an outer side of the substrate of the structure in FIG. 2. In FIG. 15, a polarizing plate 1501 is provided on a surface opposite to a surface of the substrate 200 over which the orientation film 206 is formed. In addition, a polarizing plate 1502 is provided on a surface opposite to a surface of the substrate 209 on which the orientation film 208 is formed. The polarizing plate 1501 and the polarizing plate 1502 are provided so that light absorption axes thereof are perpendicular to each other.

Next, a structure in which a polarizing film is provided on an inner side of a substrate is described in detail. That is, the polarizing film is provided on a surface over which an orientation film is formed. The liquid crystal display panels described in Embodiment Modes 1 to 10 each can be provided with a polarizing film; however, in this embodiment mode, specific description is made taking as examples the case where a polarizing film is provided in the structure of FIG. 1 of Embodiment mode 2 and the case where a polarizing film is provided in the structure of FIG. 2 of Embodiment mode 6.

Figure 11:
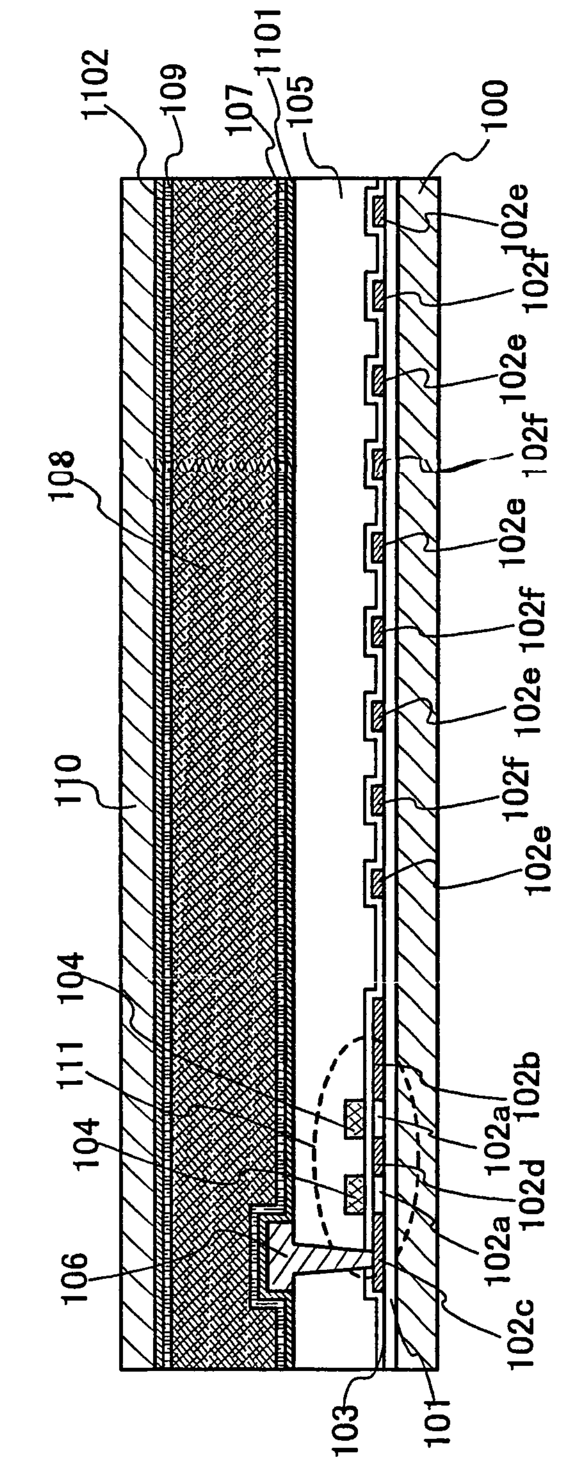
FIG. 11 is a diagram showing a liquid crystal display panel of the present invention.

FIG. 11 shows a structure in which a polarizing film is provided on an inner side of the substrate of the structure of FIG. 1. In FIG. 11, a polarizing film 1101 is provided on a surface of the substrate 100 over which the orientation film 107 is formed. In other words, the polarizing film 1101 is formed over the wiring 106 and the third insulating film 105. In addition, a polarizing film 1102 is provided on a surface of the substrate 110 on which the orientation film 109 is formed. In other words, the polarizing film 1102 is provided between the substrate 110 and the second orientation film 109. The polarizing film 1101 and the polarizing film 1102 are provided so that light absorption axes thereof are perpendicular to each other. The polarizing film 1101 and the polarizing film 1102 can be formed by direct printing with use of a solution of dichroic dye as ink. When an apparatus such as a slot die coater is used, printing can be performed even on a concave-convex surface.

Figure 12:
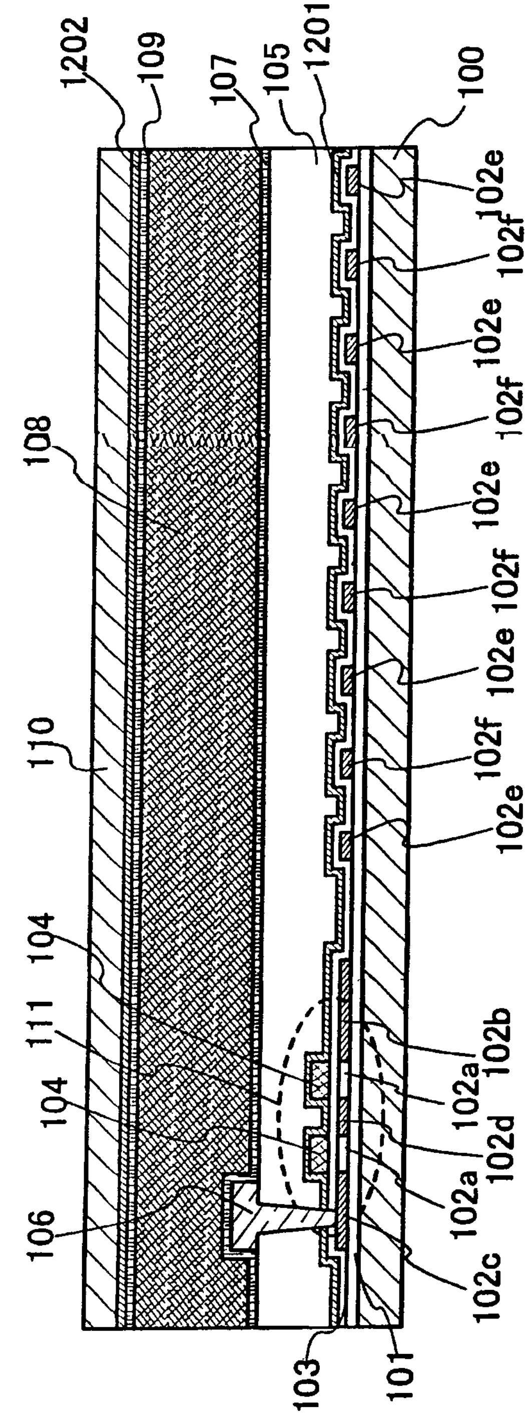
FIG. 12 is a diagram showing a liquid crystal display panel of the present invention.

FIG. 12 shows another structure in which a polarizing film is provided on an inner side of the substrate of the structure in FIG. 1. A polarizing film 1201 is formed over the second insulating film 103 and the gate electrode 104. In addition, a polarizing film 1202 is formed between the substrate 110 and the second orientation film 109. The polarizing film 1201 and the polarizing film 1202 are provided so that light absorption axes thereof are perpendicular to each other. The polarizing film 1201 and the polarizing film 1202 can be formed by direct printing with use of a solution of dichroic dye as ink. When an apparatus such as a slot die coater is used, printing can be performed even on a concave-convex surface.

Figure 16:
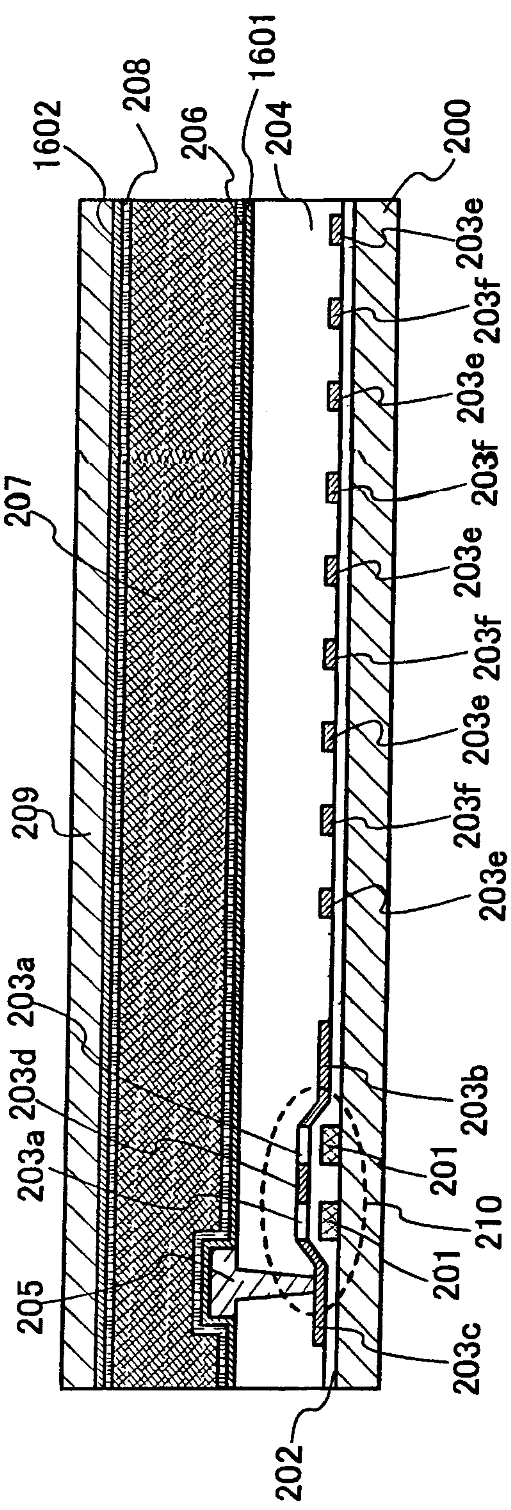
FIG. 16 is a diagram showing a liquid crystal display panel of the present invention.

FIG. 16 shows a structure in which a polarizing film is provided on an inner side of the substrate of the structure in FIG. 2. In FIG. 16, a polarizing film 1601 is provided on a surface of the substrate 200 over which the orientation film 206 is formed. In other words, the polarizing film 1601 is formed over the wiring 205 and the second insulating film 204. In addition, a polarizing film 1602 is provided on a surface of the substrate 209 on which the orientation film 208 is formed. In other words, the polarizing film 1602 is provided between the substrate 209 and the second orientation film 208. The polarizing film 1601 and the polarizing film 1602 are provided so that light absorption axes thereof are perpendicular to each other. The polarizing film 1601 and the polarizing film 1602 can be formed by direct printing with use of a solution of dichroic dye as ink. When an apparatus such as a slot die coater is used, printing can be performed even on a concave-convex surface.

Figure 17:
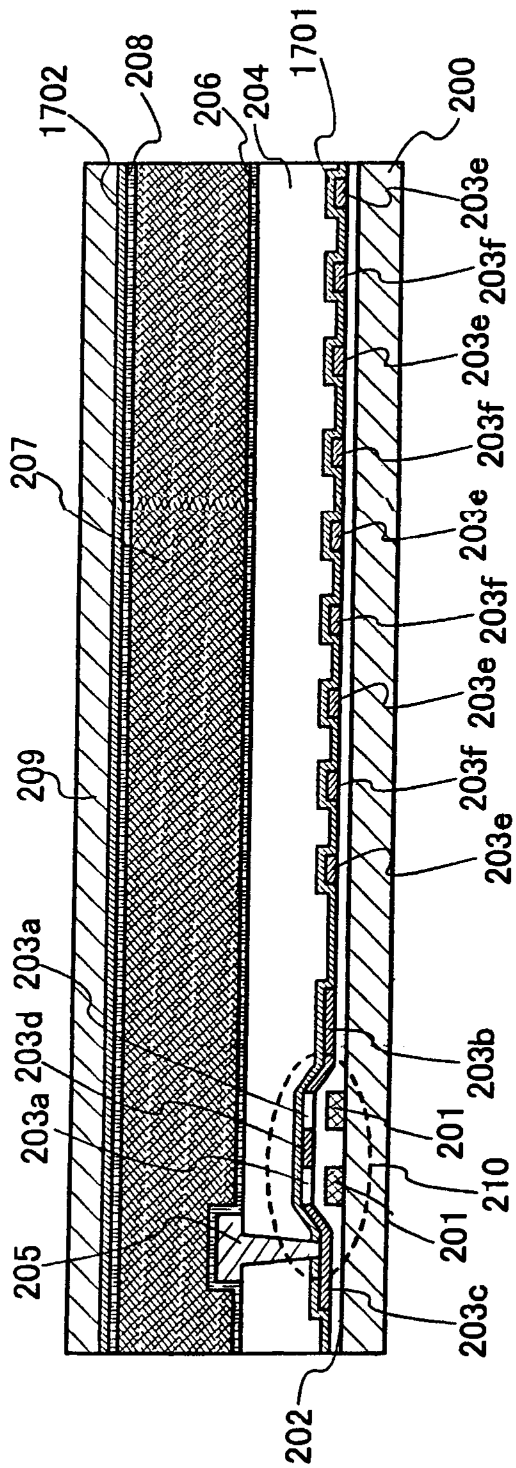
FIG. 17 is a diagram showing a liquid crystal display panel of the present invention.

FIG. 17 shows a structure in which a polarizing film is provided on an inner side of the substrate of the structure in FIG. 2. A polarizing film 1701 is provided over the first insulating film 202, the semiconductor layer (the channel formation region 203*a*, the impurity region 203*b*, the impurity region 203*c*, and an impurity region 203*d*) of the transistor 210, the first electrode 203*e*, and the second electrode 203*f*. In addition, a polarizing film 1702 is provided between the substrate 209 and the second orientation film 208. The polarizing film 1701 and the polarizing film 1702 are provided so that light absorption axes thereof are perpendicular to each other. The polarizing film 1701 and the polarizing film 1702 can be formed by direct printing with use of a solution of dichroic dye as ink. When an apparatus such as a slot die coater is used, printing can be performed even on a concave-convex surface.

Next, description is made of a structure in which a polarizing film is provided on an inner side of a substrate, and a polarizing plate is provided on an outer side of the substrate. Specifically, the polarizing film is provided on a surface over which an orientation film is formed, and the polarizing plate is provided on a surface opposite to a surface over which the orientation film is formed. The liquid crystal display panels described in Embodiment Modes 1 to 10 each can be provided with a polarizing plate; however, in this embodiment mode, description is made taking as examples the case where a polarizing plate is provided in the structure of FIG. 1 of Embodiment mode 2 and the case where a polarizing plate is provided in the structure of FIG. 2 of Embodiment mode 6.

Figure 13:
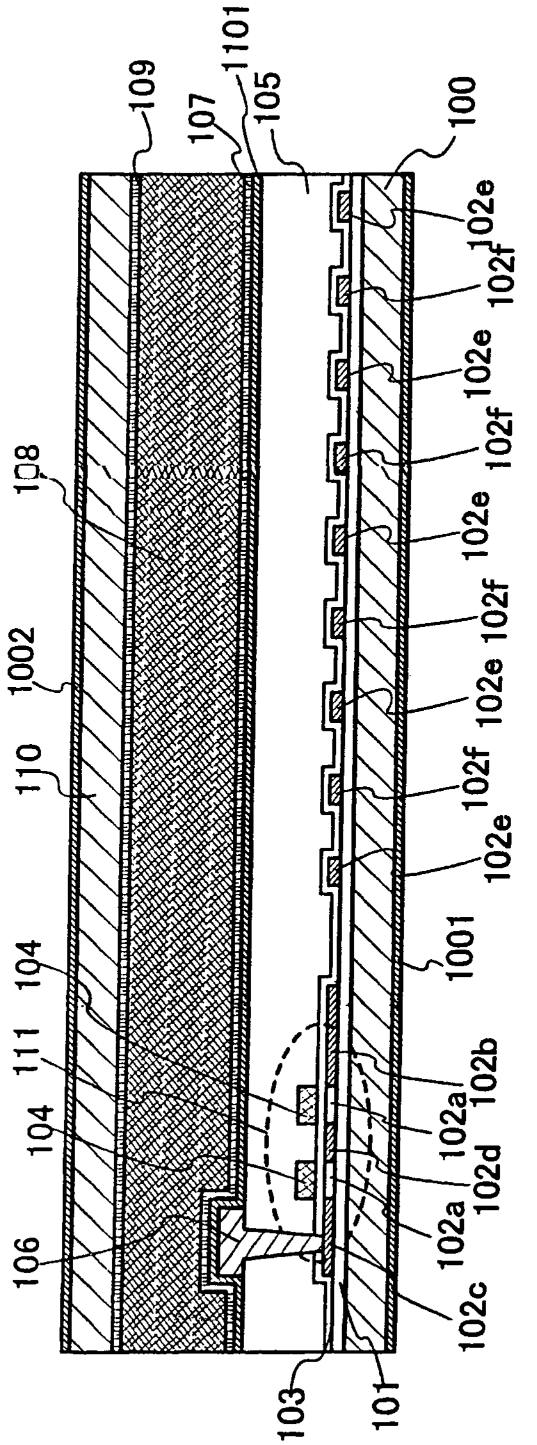
FIG. 13 is a diagram showing a liquid crystal display panel of the present invention.

FIG. 13 shows a structure in which a polarizing film and a polarizing plate are provided on an inner side and on an outer side of the substrate of the structure in FIG. 1, respectively. In FIG. 13, the polarizing film 1101 is provided on a surface of the substrate 100 over which the first orientation film 107 is formed, and the polarizing plate 1001 is provided on a surface opposite to a surface over which the first orientation film 107 is formed. In addition, a polarizing plate 1002 is provided on a surface opposite to a surface of the substrate 110 on which the second orientation film 109 is formed. The polarizing plate 1001 and the polarizing plate 1002 are provided so that light absorption axes thereof are perpendicular to each other.

Figure 14:
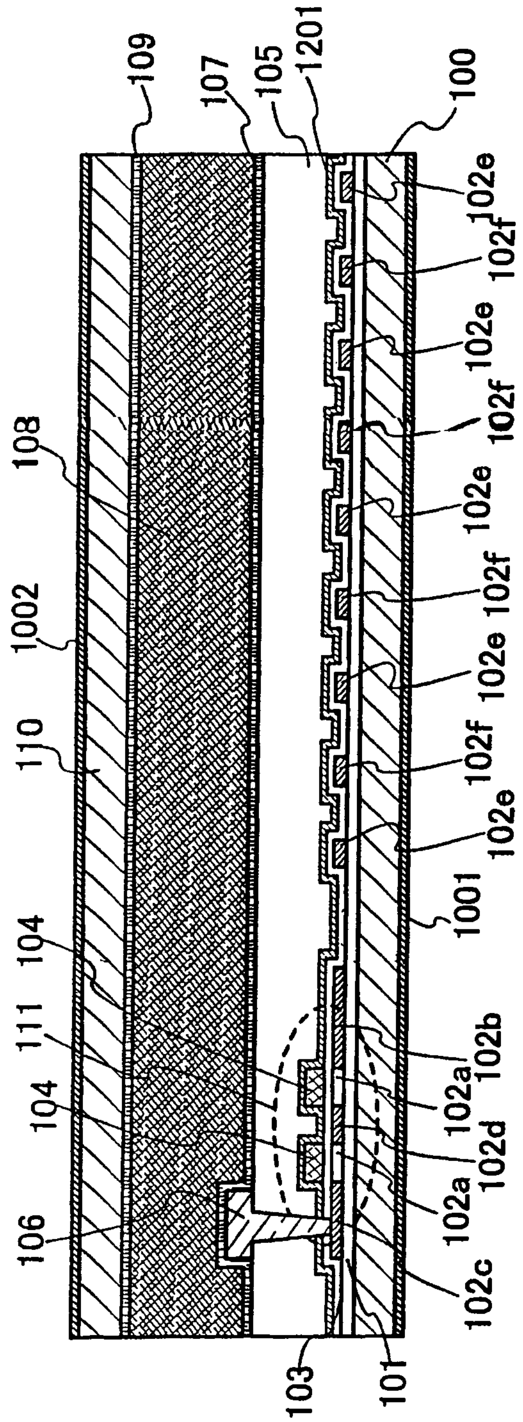
FIG. 14 is a diagram showing a liquid crystal display panel of the present invention.

FIG. 14 shows another structure in which a polarizing film and a polarizing plate are provided on an inner side and on an outer side of the substrate of the structure of FIG. 1, respectively. In FIG. 14, the polarizing film 1201 is provided on a surface of the substrate 100 over which the first orientation film 107 is formed, and the polarizing plate 1001 is provided on a surface opposite to a surface over which the first orientation film 107 is formed. In addition, a polarizing plate 1002 is provided on a surface opposite to a surface of the substrate 110 on which the second orientation film 109 is formed. The polarizing plate 1001 and the polarizing plate 1002 are provided so that light absorption axes thereof are perpendicular to each other.

Figure 18:
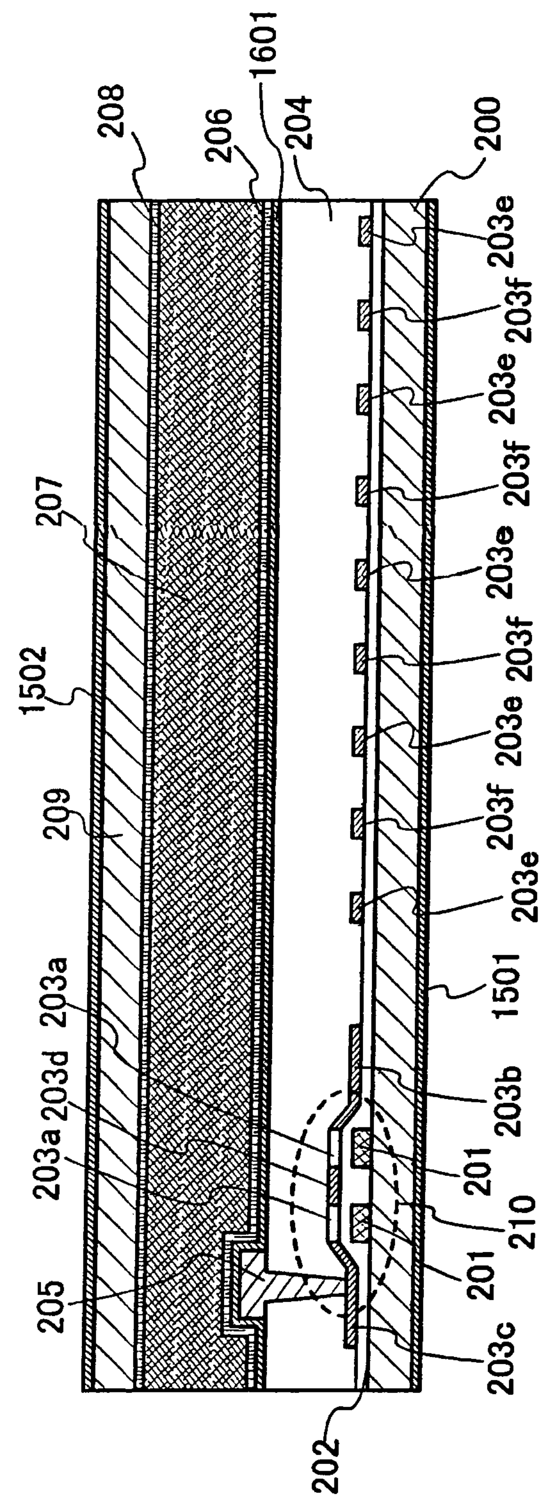
FIG. 18 is a diagram showing a liquid crystal display panel of the present invention.

FIG. 18 shows a structure in which a polarizing film and a polarizing plate are provided on an inner side and on an outer side of the substrate of the structure in FIG. 2, respectively. In FIG. 18, the polarizing film 1601 is provided on a surface of the substrate 200 over which the first orientation film 206 is formed, and the polarizing plate 1501 is provided on a surface opposite to a surface over which the first orientation film 206 is formed. In addition, a polarizing plate 1502 is provided on a surface opposite to a surface of the substrate 209 on which the second orientation film 208 is formed. The polarizing plate 1501 and the polarizing plate 1502 are provided so that light absorption axes thereof are perpendicular to each other.

Figure 19:
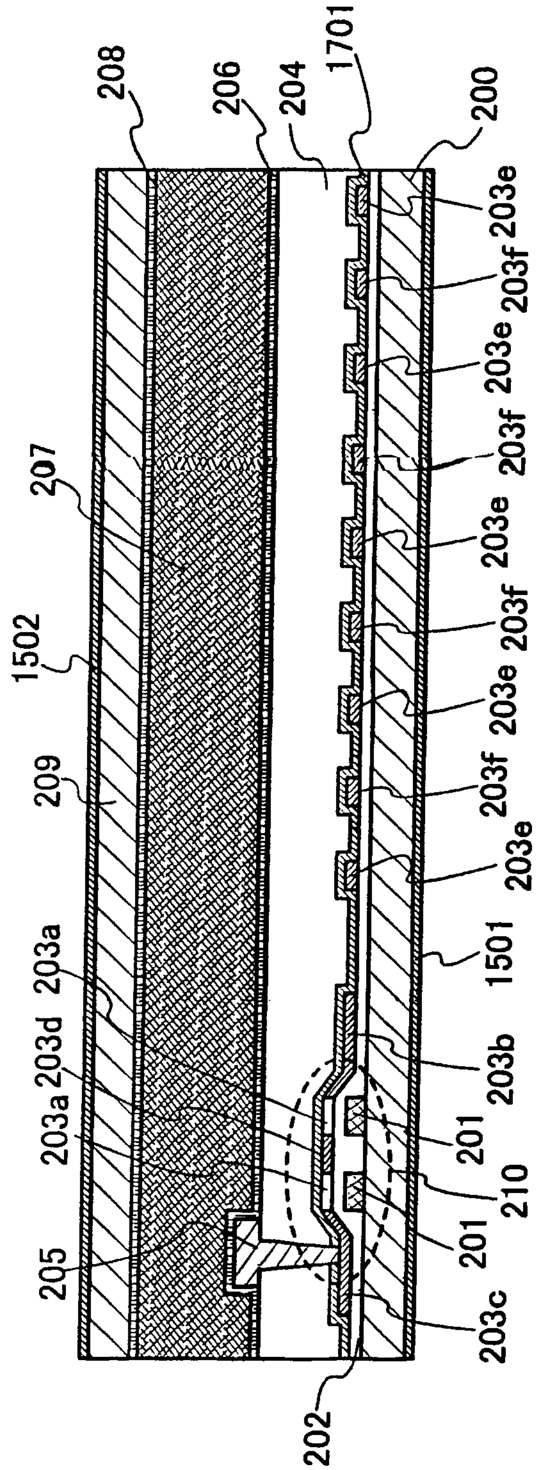
FIG. 19 is, a diagram showing a liquid crystal display panel of the present invention.

FIG. 19 shows another structure in which a polarizing film and a polarizing plate are provided on an inner side and on an outer side of the substrate of the structure in FIG. 2, respectively. In FIG. 19, the polarizing film 1701 is provided on a surface of the substrate 200 over which the first orientation film 206 is formed, and the polarizing plate 1501 is provided on a surface opposite to a surface over which the first orientation film 206 is formed. In addition, a polarizing plate 1502 is provided on a surface opposite to a surface of the substrate 209 on which the second orientation film 208 is formed. The polarizing plate 1501 and the polarizing plate 1502 are provided so that light absorption axes thereof are perpendicular to each other.

Embodiment Mode 12

Description is made of a structure of a liquid crystal display panel of Embodiment Mode 12 of the present invention.

In this embodiment mode, description is made of a structure of a liquid crystal display panel provided with a reflective electrode including a concave-convex shape. The liquid crystal display panel of this embodiment mode can reflect outside light diffusely; therefore, luminance of display can be improved and at the same time, mirroring reflection can be prevented. Note that the structure described in this embodiment mode can be appropriately applied to the liquid crystal display panels described in Embodiment Modes 1 to 11 as long as the structure includes a reflective electrode.

Figure 20:
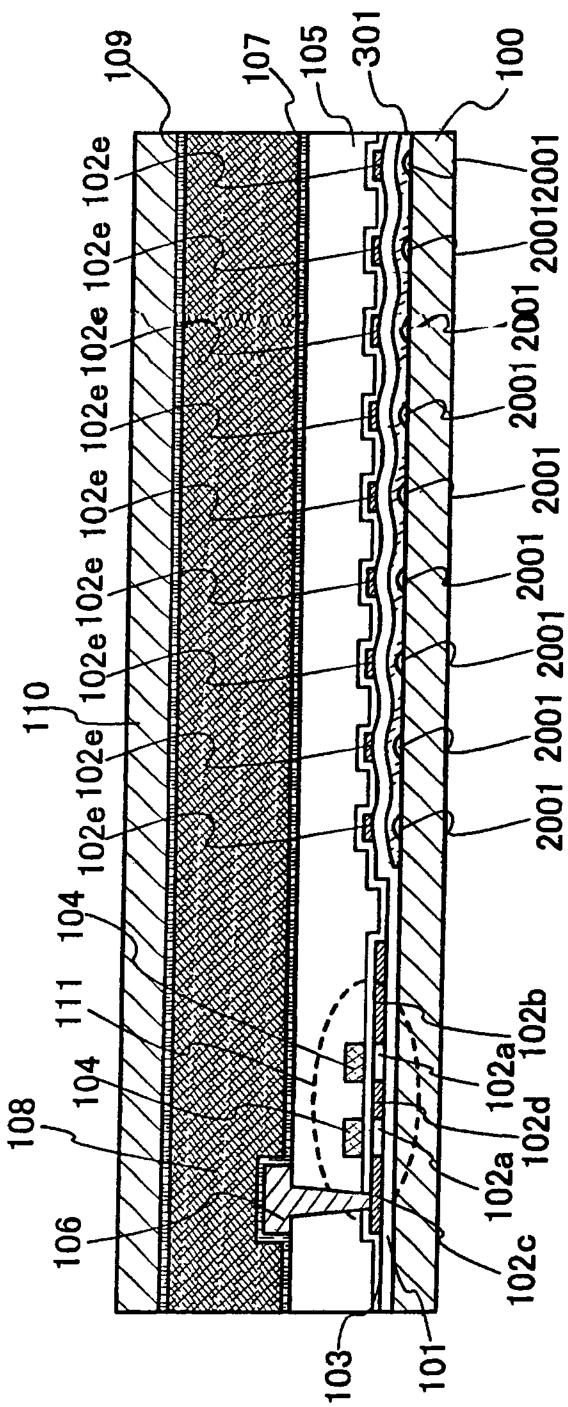
FIG. 20 is a diagram showing a liquid crystal display panel of the present invention.

FIG. 20 shows a structure in which the second electrode 301 of the structure in FIG. 3 includes a concave-convex shape. In FIG. 20, an insulator 2001 is formed over the substrate 100. The insulator 2001 may be provided with a plurality of projections or may be a stretch of film including a concave-convex shape. Then, the second electrode 301 is formed so as to cover the insulator 2001. The second electrode 301 has concavity and convexity derived from the concave-convex shape of the insulator 2001. Accordingly, in the case where the second electrode 301 is a conductive film having reflectivity, outside light can be reflected diffusely; therefore, luminance of display can be improved and at the same time, mirroring reflection can be prevented.

Figure 21:
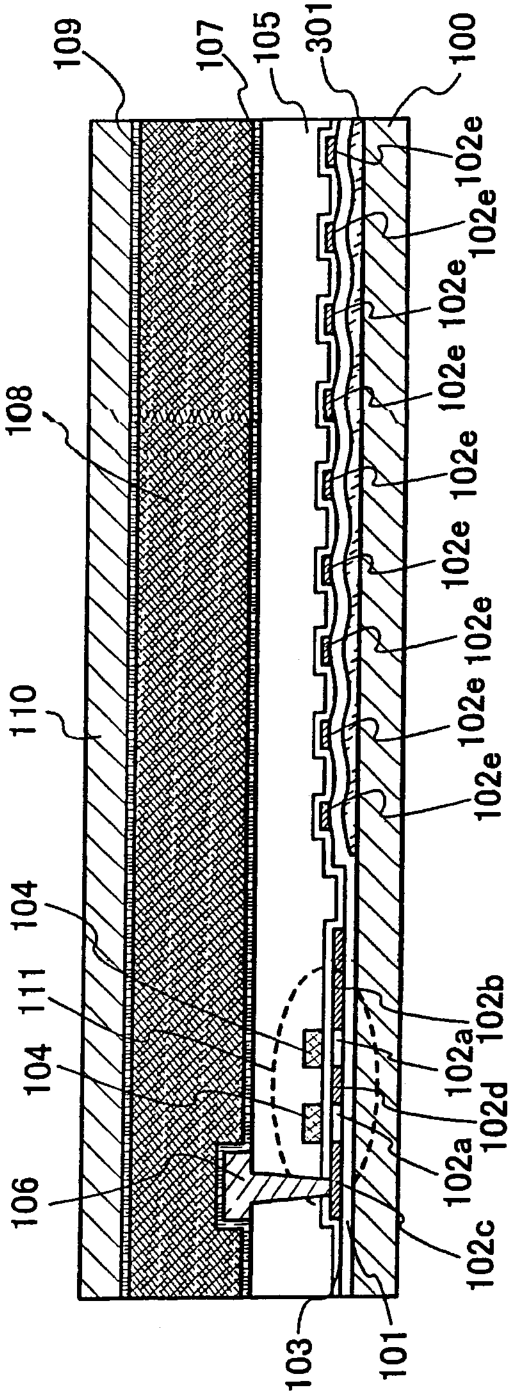
FIG. 21 is a diagram showing a liquid crystal display panel of the present invention.

Alternatively, as shown in FIG. 21, the liquid crystal display panel may have a structure in which the second electrode 301 has a concave-convex shape and the insulator 2001 is not included.

Figure 22:
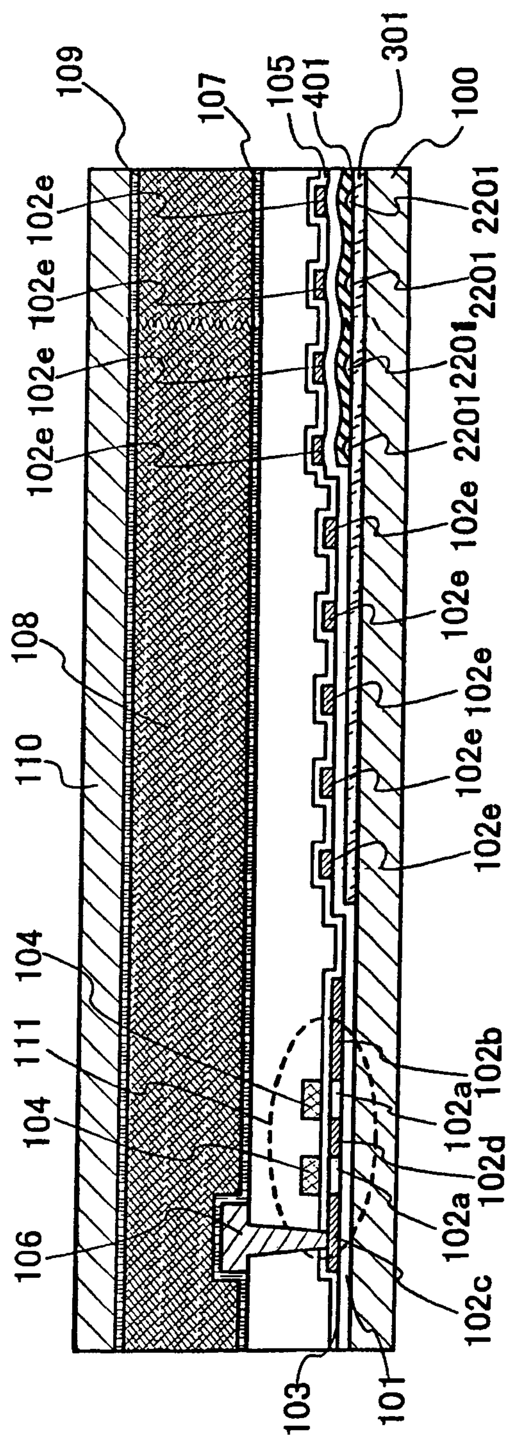
FIG. 22 is a diagram showing a liquid crystal display panel of the present invention.

FIG. 22 shows a structure in which the conductive film 401 of the structure in FIG. 4 includes a concave-convex shape. In FIG. 22, an insulator 2201 is formed over the second electrode 301. The insulator 2201 may be provided with a plurality of projections or may be a stretch of film including a concave-convex shape. Then, the conductive film 401 is formed so as to cover the insulator 2201. The conductive film 401 has concavity and convexity derived from the concave-convex shape of the insulator 2201. Accordingly, in the case where the conductive film 401 is a conductive film having reflectivity, outside light can be reflected diffusely; therefore, luminance of display can be improved and at the same time, mirroring reflection can be prevented.

Figure 23:
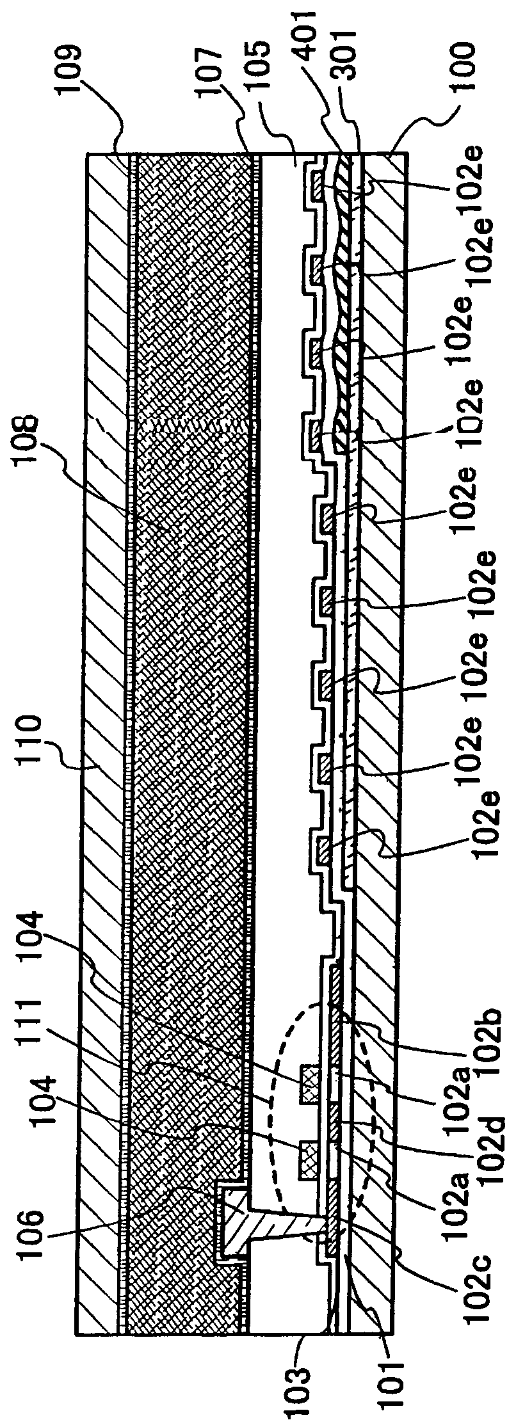
FIG. 23 is a diagram showing a liquid crystal display panel of the present invention.

Alternatively, as shown in FIG. 23, the liquid crystal display panel may have a structure in which the conductive film 401 has a concave-convex shape and the insulator 2201 is not included.

Figure 24:
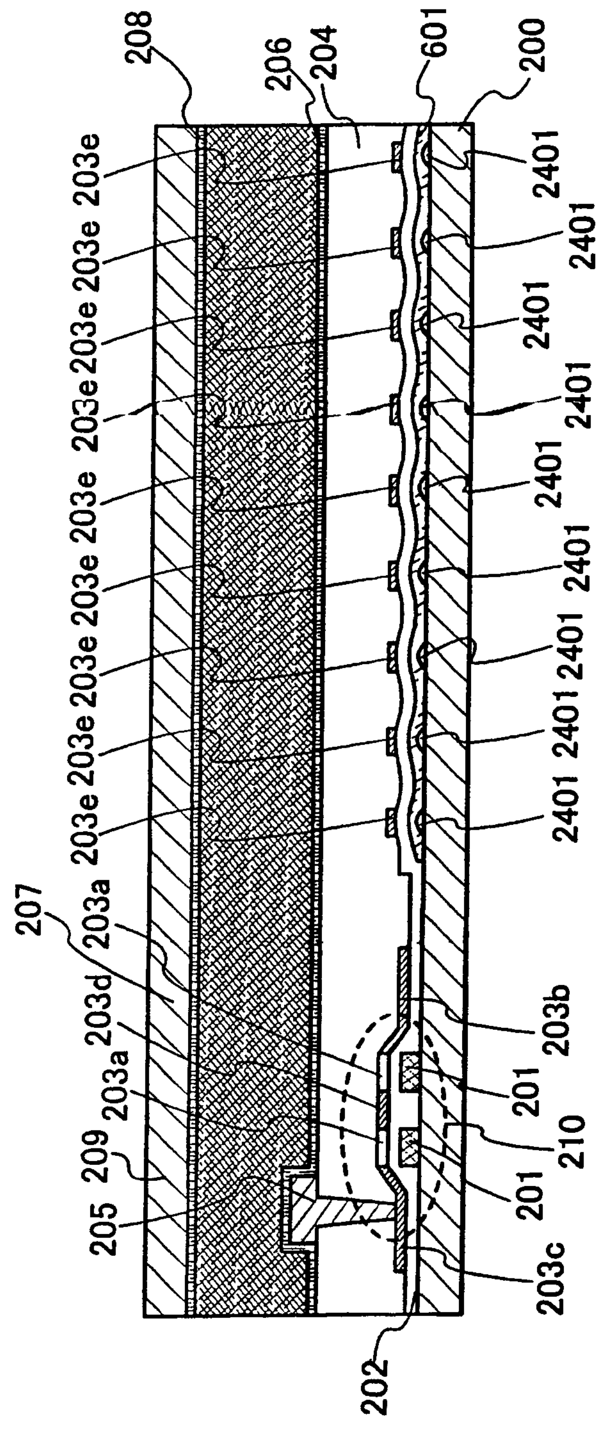
FIG. 24 is a diagram showing a liquid crystal display panel of the present invention.

FIG. 24 shows a structure in which the second electrode 601 of the structure in FIG. 6 includes a concave-convex shape. In FIG. 24, an insulator 2401 is formed over the substrate 200. The insulator 2401 may be provided with a plurality of projections or may be a stretch of film including a concave-convex shape. Then, the second electrode 601 is formed so as to cover the insulator 2401. The second electrode 601 has concavity and convexity derived from the concave-convex shape of the insulator 2401. Accordingly, in the case where the second electrode 601 is a conductive film having reflectivity, outside light can be reflected diffusely; therefore, luminance of display can be improved and at the same time, mirroring reflection can be prevented.

Figure 25:
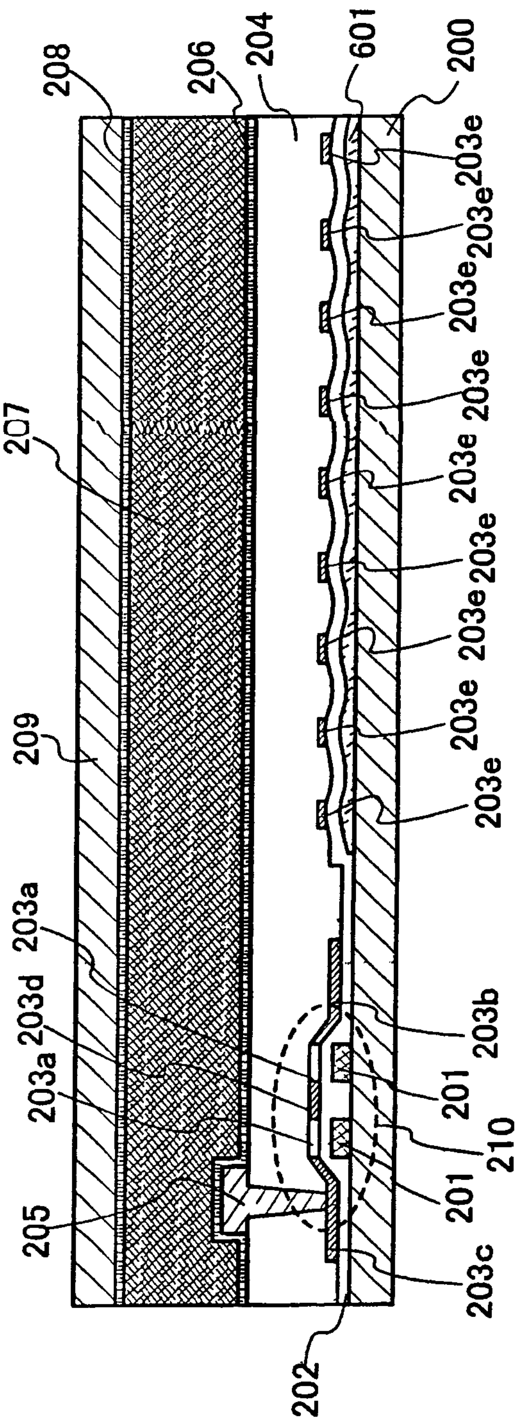
FIG. 25 is a diagram showing a liquid crystal display panel of the present invention.

Alternatively, as shown in FIG. 25, the liquid crystal display panel may have a structure in which the second electrode 601 has a concave-convex shape and the insulator 2401 is not included.

Figure 26:
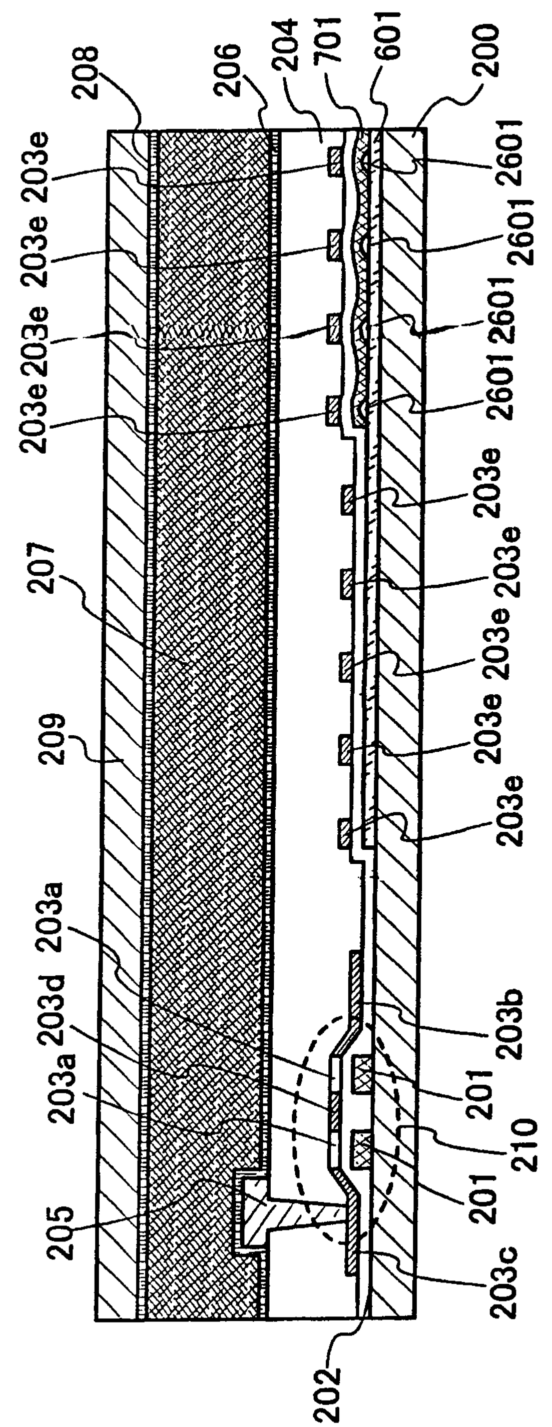
FIG. 26 is a diagram showing a liquid crystal display panel of the present invention.

FIG. 26 shows a structure in which the conductive film 701 of the structure in FIG. 7 includes a concave-convex shape. In FIG. 26, an insulator 2601 is formed over the second electrode 601. The insulator 2601 may be provided with a plurality of projections or may be a stretch of film including a concave-convex shape. Then, the conductive film 701 is formed so as to cover the insulator 2601. The conductive film 701 has concavity and convexity derived from the concave-convex shape of the insulator 2601. Accordingly, in the case where the conductive film 701 is a conductive film having reflectivity, outside light can be reflected diffusely; therefore, luminance of display can be improved and at the same time, mirroring reflection can be prevented.

Figure 27:
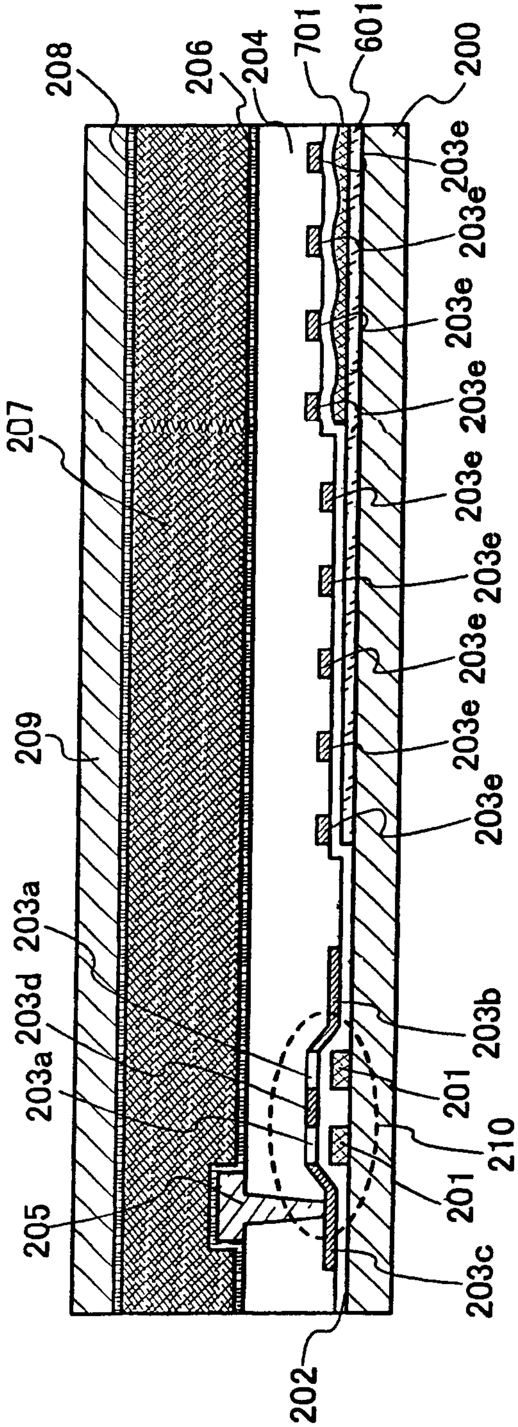
FIG. 27 is a diagram showing a liquid crystal display panel of the present invention.

Alternatively, as shown in FIG. 27, the liquid crystal display panel may have a structure in which the conductive film 701 has a concave-convex shape and the insulator 2601 is not included.

Embodiment Mode 13

Description is made of a structure of a liquid crystal display panel of Embodiment Mode 13 of the present invention.

In this embodiment mode, description is made of a structure of a liquid crystal display panel in which thickness of a liquid crystal layer is not uniform but is partially varied. In the case of the liquid crystal display panel of this embodiment mode, visibility can be improved by adjustment of thickness of the liquid crystal layer.

That is because the liquid crystal layer has refractive index anisotropy so that a polarization state of light is changed depending on a traveling distance of light in the liquid crystal layer. Accordingly, an image cannot be displayed correctly. Therefore, it is necessary to adjust the polarization state of light. As a method for adjusting the polarization state, thickness of the liquid crystal layer (a so-called cell gap) in a portion where display is performed by reflection of light (reflection region) may be thinned so that the distance becomes not too long when light passes through the reflection region twice as compared to a transmission region.

It is preferable that thickness of the liquid crystal layer in the reflection region be half of thickness of the liquid crystal layer in the transmission region. Here, description "to be half" also includes the amount of discrepancy that cannot be recognized by human eyes.

It is to be noted that light does not enter only from a direction vertical to the substrate, that is, a normal direction, and light also enters obliquely in many cases. Therefore, with all cases considered, traveling distances of light may be almost the same in both the reflection region and the transmission region. Therefore, thickness of the liquid crystal layer in the reflection region is preferably almost greater than or equal to one-third and less than or equal to two-thirds of thickness of the liquid crystal layer in the transmission region.

In order to thin thickness of the liquid crystal layer (so-called cell gap), a film for adjusting thickness may be arranged.

The film can be easily formed when the film for adjusting thickness is arranged on a substrate side provided with an electrode of a liquid crystal element. In other words, various films are formed on the substrate side provided with the electrode of the liquid crystal element. Therefore, the film for adjusting thickness may be formed using these films, and thus there are few difficulties when a film is formed. In addition, it becomes also possible to form the film for adjusting thickness in the same step as a film having another function. Therefore, a process can be simplified and the cost can be reduced.

Note that the film for adjusting thickness of the liquid crystal layer may be provided on a counter substrate side.

When the film for adjusting thickness of the liquid crystal layer is arranged on the counter substrate side, the electrodes of the liquid crystal element can be arranged in the same plane (even when slight deviation is caused due to a wiring of a lower layer and an electrode, if the deviation is extremely smaller than that caused due to thickness of the film for adjusting thickness of the liquid crystal layer described in this embodiment mode, the deviation is included in the same plane) in both the reflection region and the transmission region. Therefore, distances between the pixel electrode and the common electrode can be almost the same in the transmission region and in the reflection region. A direction, a distribution, intensity, and the like of an electric field are changed depending on a distance between electrodes. Therefore, when the distances between the electrodes are almost the same, electric fields applied to the liquid crystal layer can be almost the same in the reflection region and the transmission region; thus, it is possible to precisely control the liquid crystal molecule. In addition, since degrees of liquid crystal molecule rotation are almost the same in the reflection region and the transmission region, an image can be displayed with almost the same gray scale in the case of display as a transmission type and in the case of display as a reflection type.

In addition, the film for adjusting thickness of the liquid crystal layer can cause a disordered orientation mode of the liquid crystal molecule in the vicinity thereof, and a defect such as disinclination is possibly generated. However, when the film for adjusting thickness of the liquid crystal layer is arranged over the counter substrate, the film for adjusting thickness can be apart from the electrode of the liquid crystal element. Accordingly, a low electric field is applied, thereby preventing a disordered orientation mode of the liquid crystal molecule and a hard-to-see screen.

Further, only a color filter, a black matrix, and the like are formed over the counter electrode; thus, the number of steps is small. Accordingly, even when the film for adjusting thickness of the liquid crystal layer is formed over the counter substrate, the yield is not easily reduced. Even if a defect is generated, not so much manufacturing cost is wasted because of the small number of steps and inexpensive cost.

It is to be noted that in the case where the film for adjusting thickness of the liquid crystal layer is formed over the counter substrate, the film for adjusting thickness of the liquid crystal layer may contain a particle which serves as a scattering material so as to improve luminance by diffusing light. The particle is formed using a light-transmissive resin material which has a different refractive index from a base material forming a gap-adjusting film (for example, an acrylic resin). When the film for adjusting thickness of the liquid crystal layer contains the particle as described above, light can be scattered, and contrast and luminance of a display image can be improved.

In a liquid crystal display device of the present invention having the above structure, a viewing angle is wide, a color is not often changed depending on an angle at which a display screen is seen, and an image that is favorably recognized both outdoors in sunlight and dark indoors (or outdoors at night) can be provided.

Figure 28:
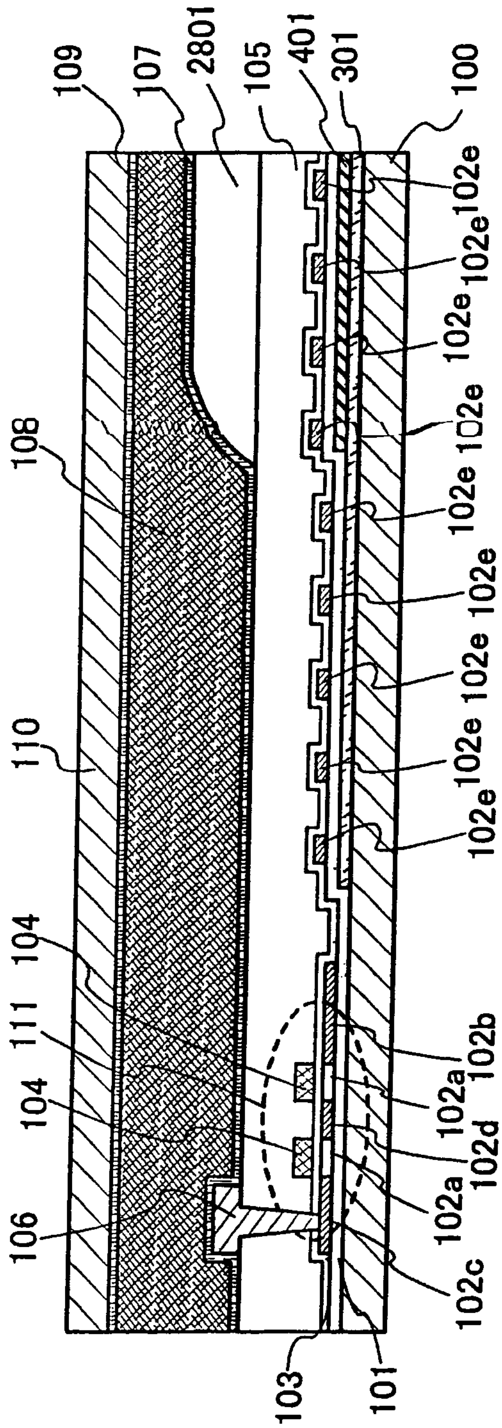
FIG. 28 is a diagram showing a liquid crystal display panel of the present invention.

FIG. 28 shows a structure in which thickness of the liquid crystal layer on an upper side (reflection region) of the conductive film 401 of the structure in FIG. 4. In FIG. 28, a fourth insulating film 2801 is provided over the third insulating film 105. The fourth insulating film 2801 is formed so as to almost overlap the conductive film 401.

In a region where display is performed by reflection of light (reflection region), the fourth insulating film 2801 is provided to adjust thickness of the liquid crystal layer 108. By provision of the fourth insulating film 2801, thickness of the liquid crystal layer 108 in the reflection region can be thinned as compared to thickness of the liquid crystal layer 108 in a transmission region. In other words, the liquid crystal layer on an upper side of the fourth insulating film 2801, that is, the liquid crystal layer on an upper side of the conductive film 401, has a thinner film thickness out of the liquid crystal layer 108 on an upper side of the second electrode 301.

Note that since the fourth insulating film 2801 scarcely has refractive index anisotropy, a polarization state is not changed even when light passes therethrough. Therefore, the presence or absence, thickness, or the like of the fourth insulating film 2801 does not have a significant effect.

Figure 31:
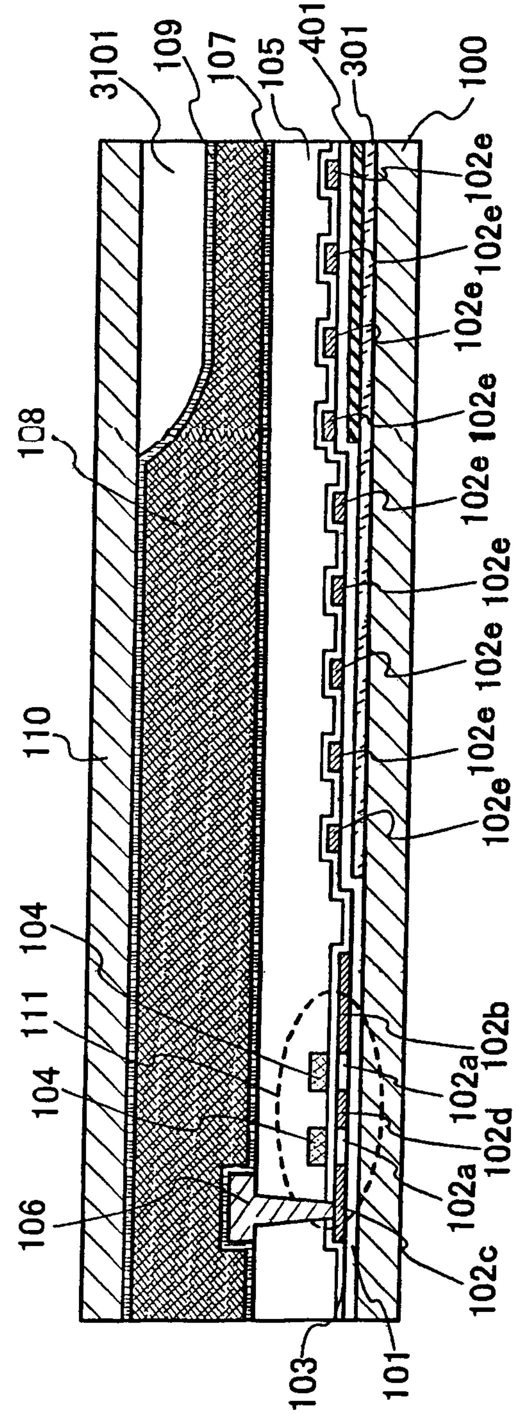
FIG. 31 is a diagram showing a liquid crystal display panel of the present invention.

Note that even if the fourth insulating film 2801 is not formed over the third insulating film 105, it is only necessary that thickness of the liquid crystal layer 108 on an upper side of the conductive film 401 be thinner out of the liquid crystal layer on an upper side of the second electrode 301. Therefore, as shown in FIG. 31, a fourth insulating film 3101 may be formed on a surface of the substrate 110 on which the second orientation film 109 is formed.

Figure 29:
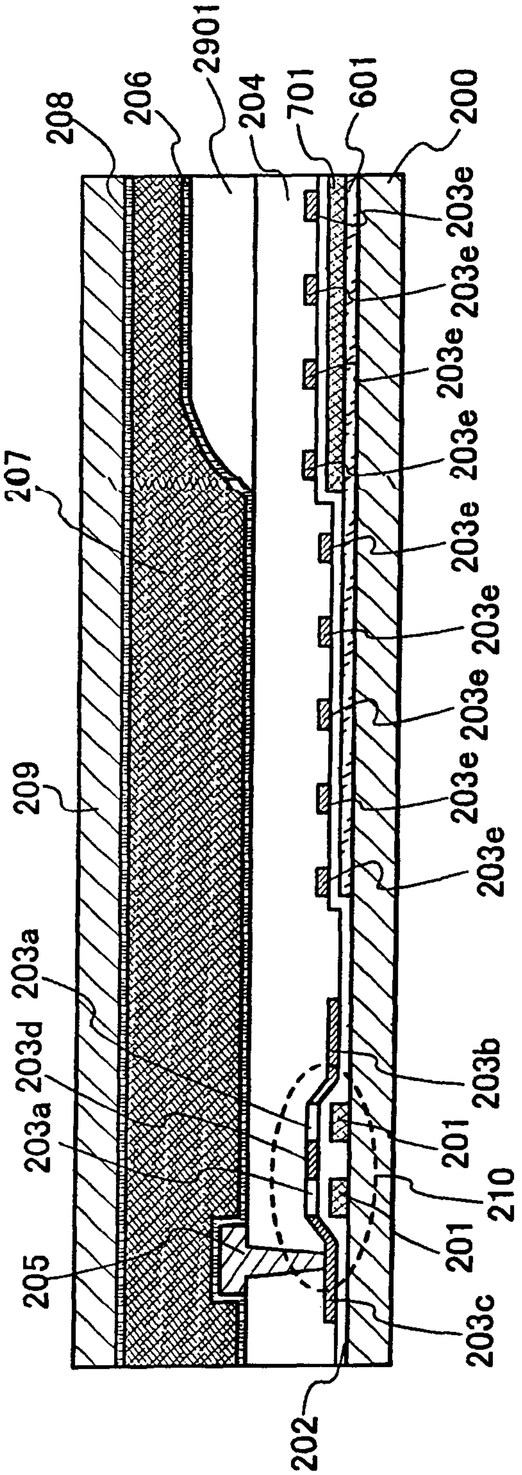
FIG. 29 is a diagram showing a liquid crystal display panel of the present invention.

Next, FIG. 29 shows a structure in which thickness of the liquid crystal layer on an upper side of the conductive film 701 of the structure in FIG. 7. In FIG. 29, a third insulating film 2901 is provided over the second insulating film 204. The third insulating film 2901 is formed so as to almost overlap the conductive film 701.

In a region where display is performed by reflection of light (reflection region), the third insulating film 2901 is provided to adjust thickness of the liquid crystal layer 207. By provision of the third insulating film 2901, thickness of the liquid crystal layer 207 in the reflection region can be thinned as compared to thickness of the liquid crystal layer 207 in a transmission region. In other words, the liquid crystal layer on an upper side of the third insulating film 2901, that is, the liquid crystal layer on an upper side of the conductive film 701, has a thinner film thickness out of the liquid crystal layer 207 on an upper side of the second electrode 601.

Note that since the third insulating film 2901 scarcely has refractive index anisotropy, a polarization state is not changed even when light passes therethrough. Therefore, the presence or absence, thickness, or the like of the third insulating film 2901 does not have a significant effect.

Figure 32:
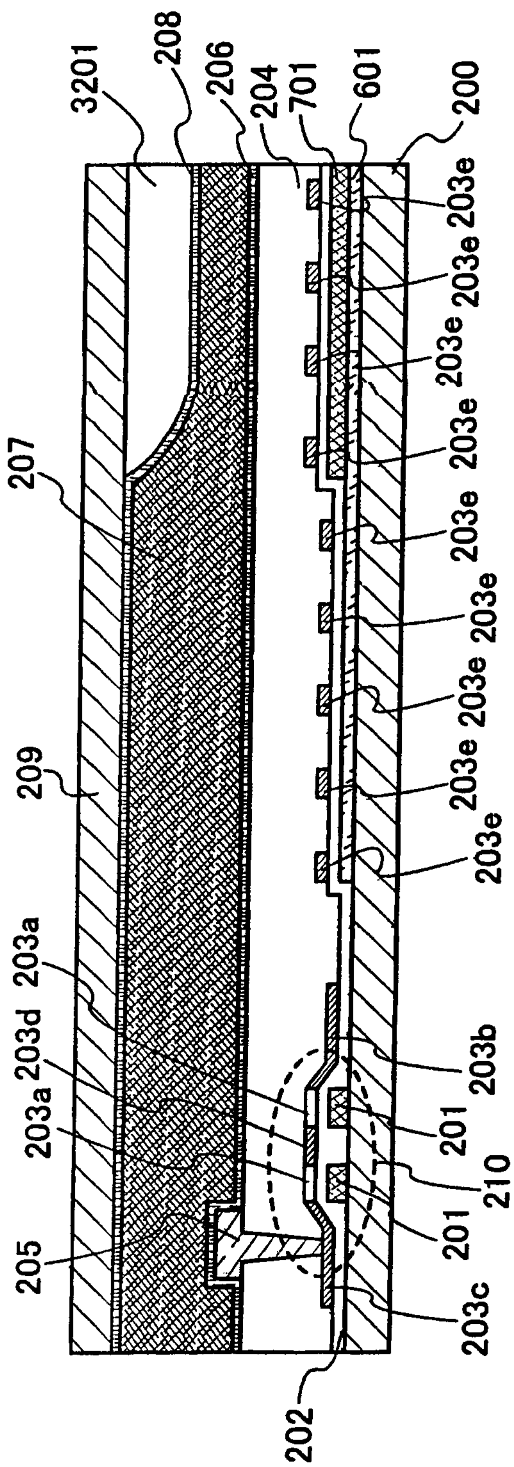
FIG. 32 is a diagram showing a liquid crystal display panel of the present invention.

Note that even if the third insulating film 2901 is not formed over the second insulating film 204, it is only necessary that thickness of the liquid crystal layer 207 on an upper side of the conductive film 701 be thinner out of the liquid crystal layer 207 on an upper side of the second electrode 601. Therefore, as shown in FIG. 32, a third insulating film 3201 may be formed on a surface of the substrate 209 on which the second orientation film 208 is formed.

Figure 30:
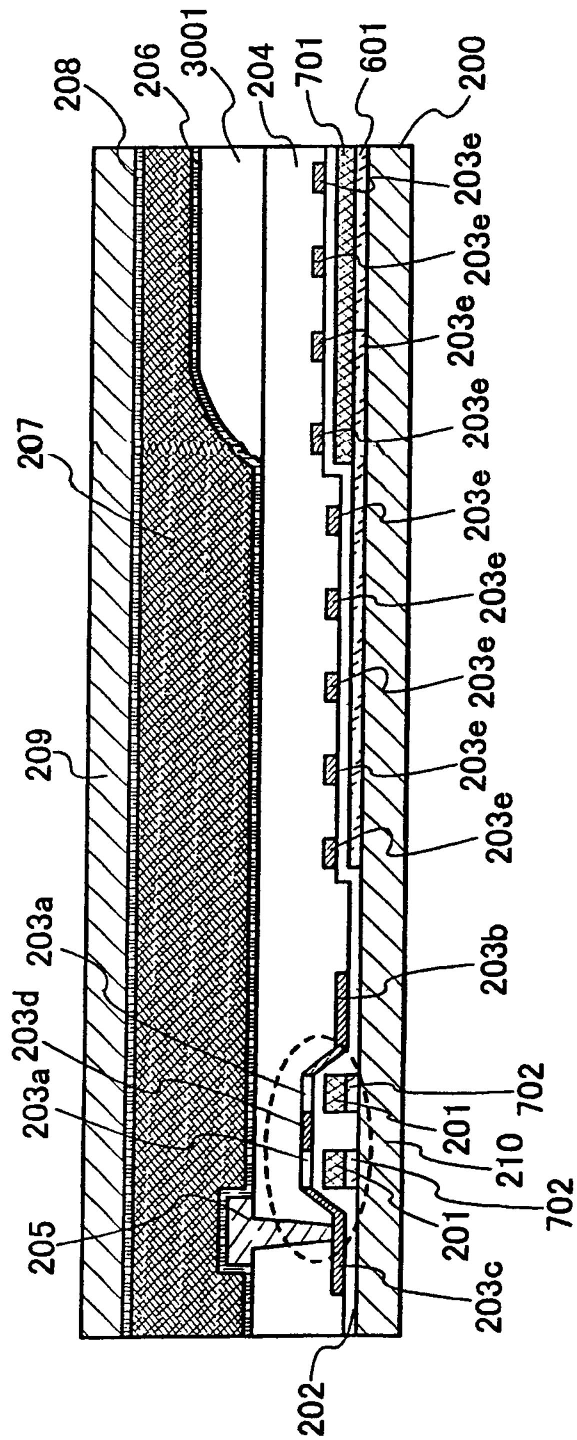
FIG. 30 is a diagram showing a liquid crystal display panel of the present invention.

Next, FIG. 30 shows a structure in which thickness of the liquid crystal layer on an upper side of the conductive film 701 of the structure in FIG. 8 is thinned. In FIG. 30, a third insulating film 3001 is provided over the second insulating film 204. The third insulating film 3001 is formed so as to almost overlap the conductive film 701.

In a region where display is performed by reflection of light (reflection region), the third insulating film 3001 is provided to adjust thickness of the liquid crystal layer 207. By provision of the third insulating film 3001, thickness of the liquid crystal layer 207 in the reflection region can be thinned as compared to thickness of the liquid crystal layer 207 in a transmission region. In other words, the liquid crystal layer 207 on an upper side of the third insulating film 3001, that is, the liquid crystal layer 207 on an upper side of the conductive film 701, has a thinner film thickness out of the liquid crystal layer 207 on an upper side of the second electrode 601.

Note that since the third insulating film 3001 scarcely has refractive index anisotropy, a polarization state is not changed even when light passes therethrough. Therefore, the presence or absence, thickness, or the like of the third insulating film 3001 does not have a significant effect.

Figure 33:
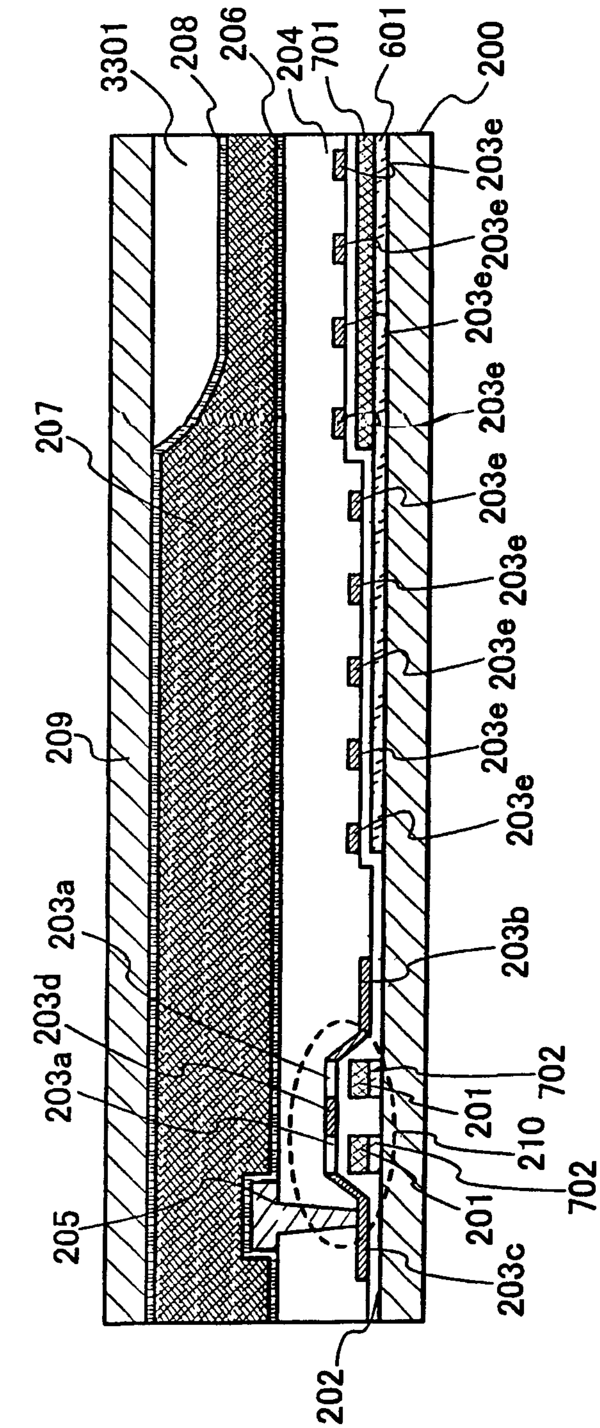
FIG. 33 is a diagram showing a liquid crystal display panel of the present invention.

Note that even if the third insulating film 3001 is not formed over the second insulating film 204, it is only necessary that thickness of the liquid crystal layer on an upper side of the conductive film 701 be thinner out of the liquid crystal layer on an upper side of the second electrode 601. Therefore, as shown in FIG. 33, a third insulating film 3301 may be formed on a surface of the substrate 209 on which the second orientation film 208 is formed.

Embodiment Mode 14

Description is made of a structure of a liquid crystal display panel of Embodiment Mode 14 of the present invention.

In this embodiment mode, description is made of a structure in which the liquid crystal display panel is provided with a retardation film.

First, a structure in which a retardation film is provided on an outer side of a substrate. Specifically, the retardation film is provided on a surface opposite to a surface on which an orientation film is formed. The liquid crystal display panels described in Embodiment Modes 1 to 13 each can be provided with a retardation film; however, description is made taking as examples the case where a retardation film is provided in the structure of FIG. 10 of Embodiment mode 11 and the case where a retardation film is provided in the structure of FIG. 15 of Embodiment mode 11.

Figure 34:
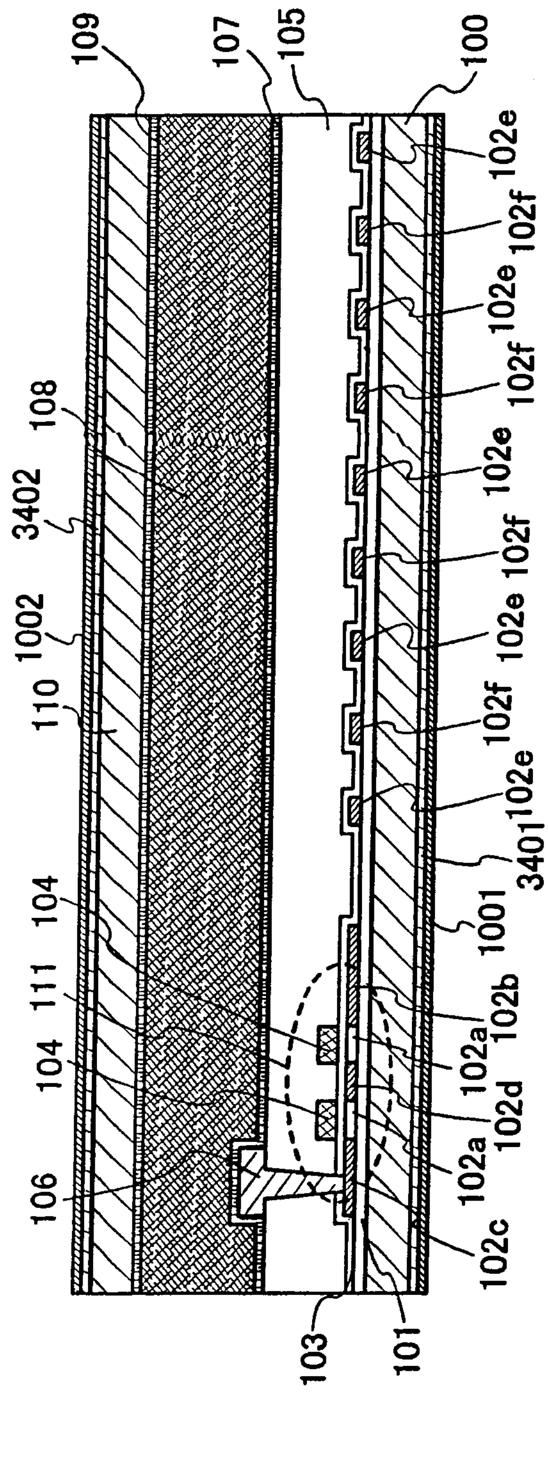
FIG. 34 is a diagram showing a liquid crystal display panel of the present invention.

FIG. 34 shows a structure in which a retardation film is provided on an outer side of the substrate of the structure in FIG. 10. In FIG. 34, the polarizing plate 1001 is provided on a surface opposite to a surface of the substrate 100 over which the first orientation film 107 is formed, and a retardation film 3401 is provided between the polarizing plate 1001 and the substrate 100. In addition, the polarizing plate 1002 is provided on a surface opposite to a surface of the substrate 110 on which the orientation film 109 is formed, and a retardation film 3402 is provided between the polarizing plate 1002 and the substrate 110.

Figure 36:
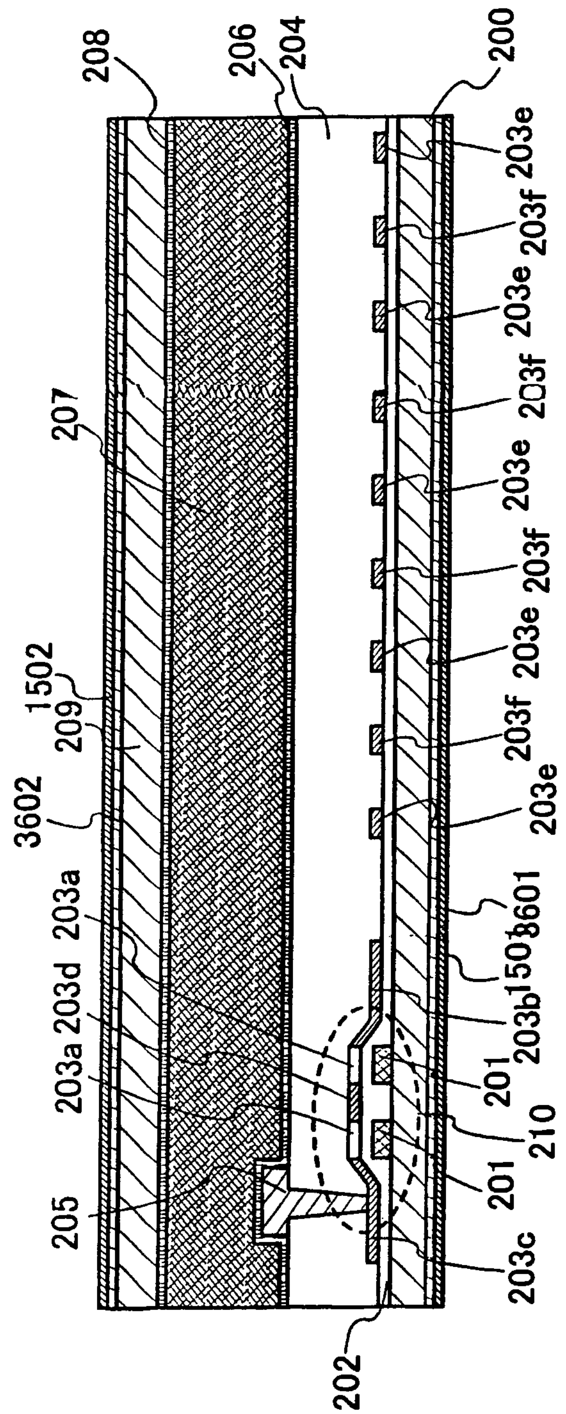
FIG. 36 is a diagram showing a liquid crystal display panel of the present invention.

FIG. 36 shows a structure in which a retardation film is provided on an outer side of the substrate of the structure in FIG. 15. In FIG. 36, the polarizing plate 1501 is provided on a surface opposite to a surface of the substrate 200 over which the first orientation film 206 is formed, and a retardation film 3601 is provided between the polarizing plate 1501 and the substrate 200. In addition, the polarizing plate 1502 is provided on a surface opposite to a surface of the substrate 209 on which the second orientation film 208 is formed, and a retardation film 3602 is provided between the polarizing plate 1502 and the substrate 209. The polarizing film 1501 and the polarizing plate 1502 are provided so that light absorption axes thereof are perpendicular to each other.

Next, a structure is described, in which a retardation film is provided on an inner side of a substrate. Specifically, the retardation film is provided on a surface opposite to a surface on which an orientation film is formed. In a semi-transmissive liquid crystal display panel, the retardation film has a phase difference in a portion on the reflection region, and the retardation film has approximately zero phase difference in a portion on the transmission region.

Figure 35:
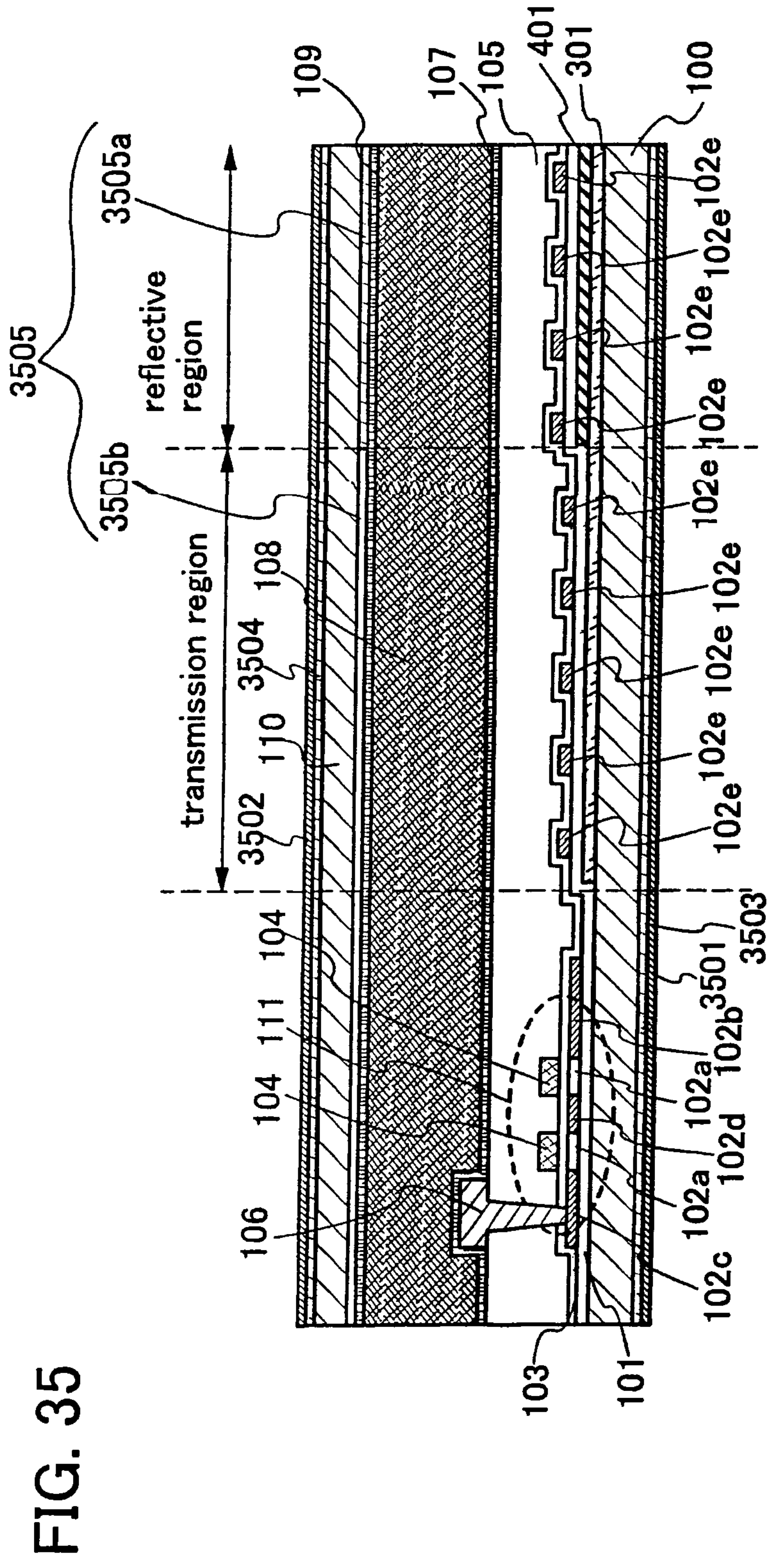
FIG. 35 is a diagram showing a liquid crystal display panel of the present invention.

FIG. 35 shows a structure in which a retardation film is provided on an inner side of the substrate of the structure of FIG. 4. In FIG. 35, a polarizing plate 3501 is provided on a surface opposite to a surface of the substrate 100 over which the first orientation film 107 is formed, and a retardation film 3503 is provided between the polarizing plate 3501 and the substrate 100. In addition, the polarizing plate 3502 is provided on a surface opposite to a surface of the substrate 110 on which the second orientation film 109 is formed, and a retardation film 3504 is provided between the polarizing plate 3502 and the substrate 110. Furthermore, a retardation film 3505 is provided on a surface of the substrate 110 on which the second orientation film 109 is formed. The retardation film 3505 has a phase difference in a portion 3505*a* on the reflection region, and the retardation film 3505 has approximately zero phase difference in a portion 3505*b* on the transmission region.

Figure 37:
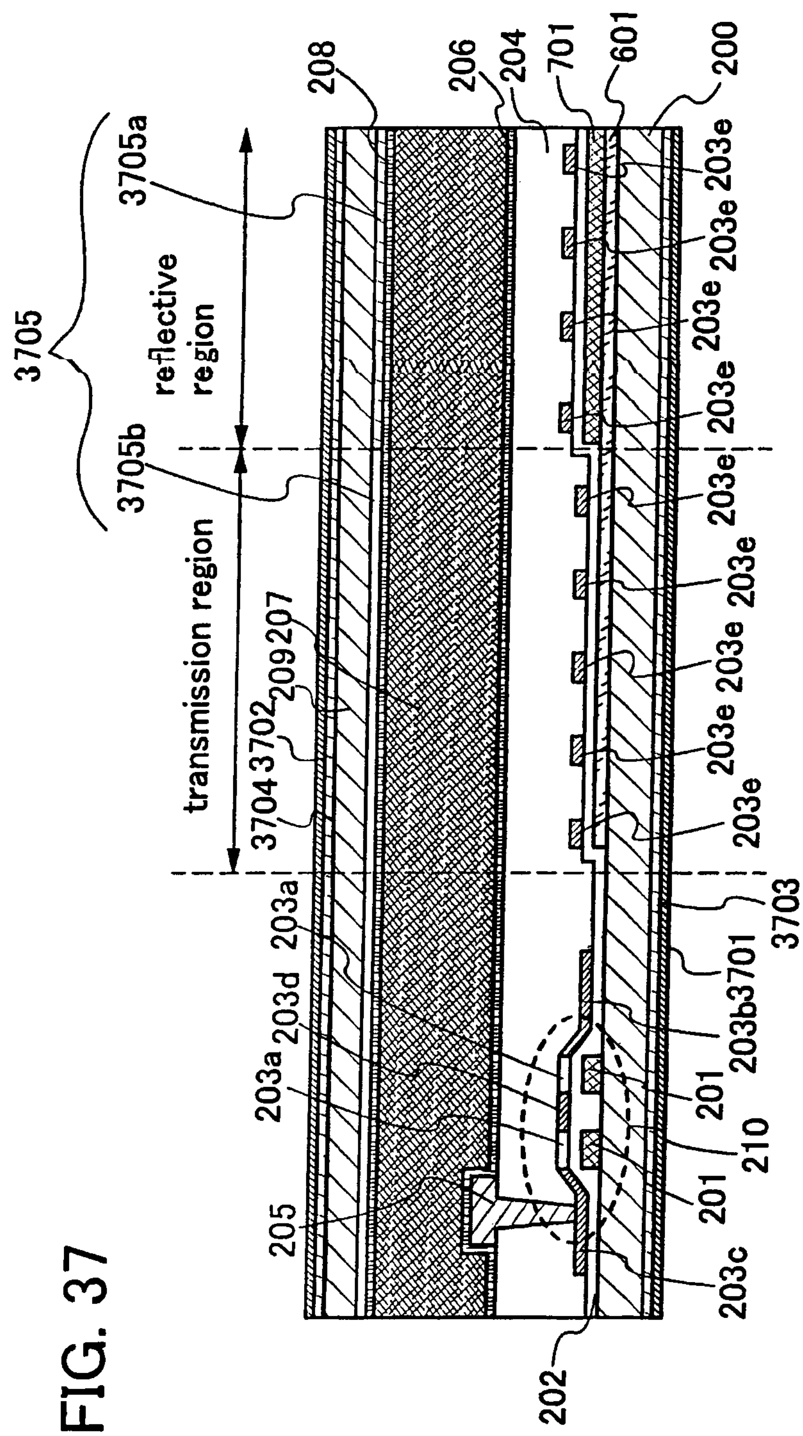
FIG. 37 is a diagram showing a liquid crystal display panel of the present invention.

FIG. 37 shows a structure in which a retardation film is provided on an inner side of the substrate of the structure in FIG. 7. In FIG. 37, a polarizing plate 3701 is provided on a surface opposite to a surface of the substrate 200 over which the first orientation film 206 is formed, and a retardation film 3703 is provided between the polarizing plate 3701 and the substrate 200. In addition, the polarizing plate 3702 is provided on a surface opposite to a surface of the substrate 209 on which the second orientation film 208 is formed, and a retardation film 3704 is provided between the polarizing plate 3702 and the substrate 209. Furthermore, a retardation film 3705 is provided on a surface of the substrate 209 on which the second orientation film 208 is formed. The retardation film 3705 has a phase difference in a portion 3705*a* on the reflection region, and the retardation film 3705 has approximately zero phase difference in a portion 3705*b* on the transmission region.

Figure 38:
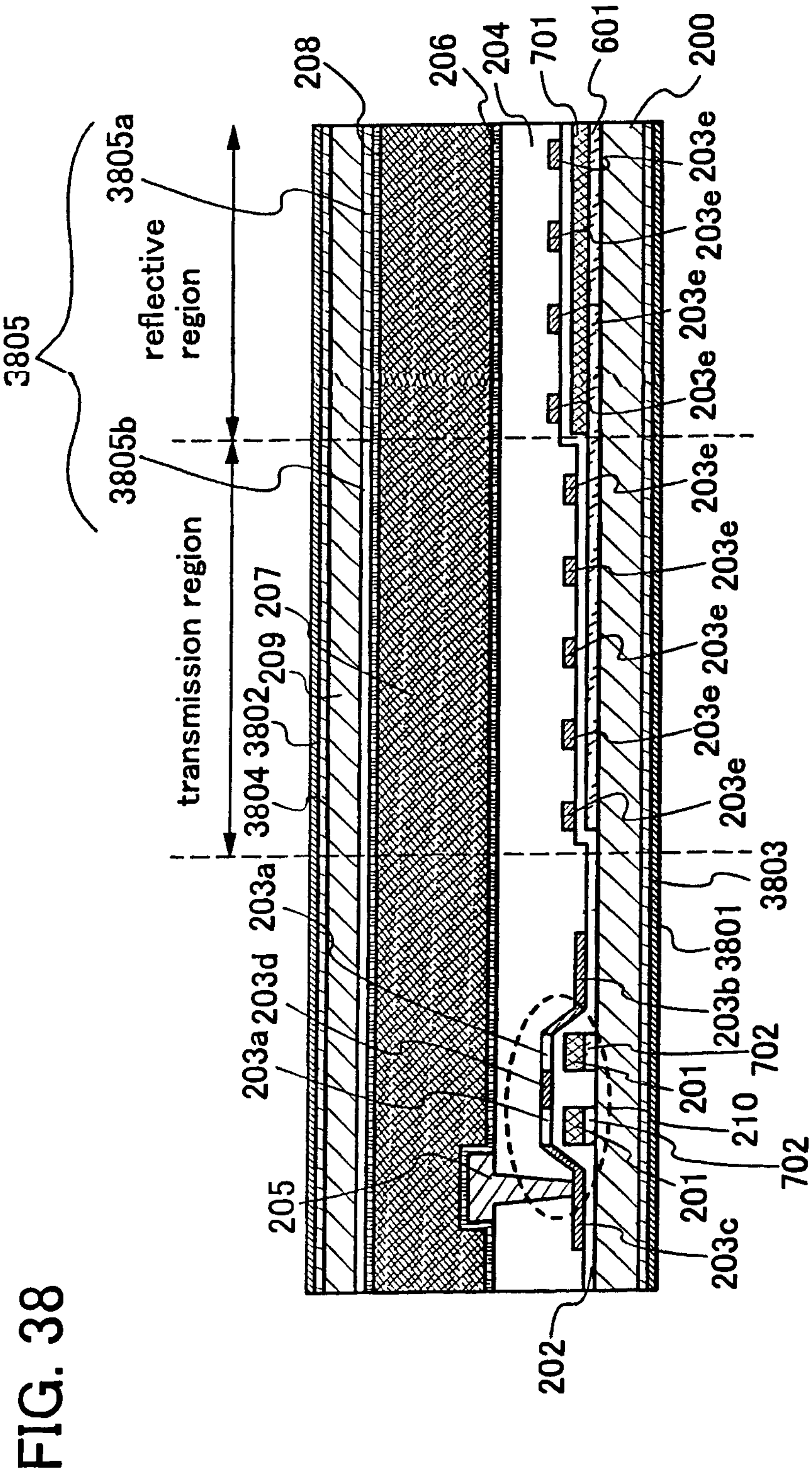
FIG. 38 is a diagram showing a liquid crystal display panel of the present invention.

FIG. 38 shows a structure in which a retardation film is provided on an inner side of the substrate of the structure in FIG. 8. In FIG. 38, a polarizing plate 3801 is provided on a surface opposite to a surface of the substrate 200 over which the first orientation film 206 is formed, and a retardation film 3803 is provided between the polarizing plate 3801 and the substrate 200. In addition, the polarizing plate 3802 is provided on a surface opposite to a surface of the substrate 209 on which the second orientation film 208 is formed, and a retardation film 3804 is provided between the polarizing plate 3802 and the substrate 209. Furthermore, a retardation film 3805 is provided on a surface of the substrate 209 on which the second orientation film 208 is formed. The retardation film 3805 has a phase difference in a portion 3805*a* on the reflection region, and the retardation film 3805 has approximately zero phase difference in a portion 3805*b* on the transmission region.

Embodiment Mode 15

Description is made of a structure of a liquid crystal display panel of Embodiment Mode 15 of the present invention.

In Embodiment Modes 1 to 14, in the case where the pixel electrode and the common electrode are not formed from conductive films in the same layer, the pixel electrode is provided nearer the liquid crystal layer than the common electrode; however, in this embodiment mode, description is made of a structure of a liquid crystal display panel in which the common electrode is provided nearer the liquid crystal layer than the pixel electrode.

Figure 39:
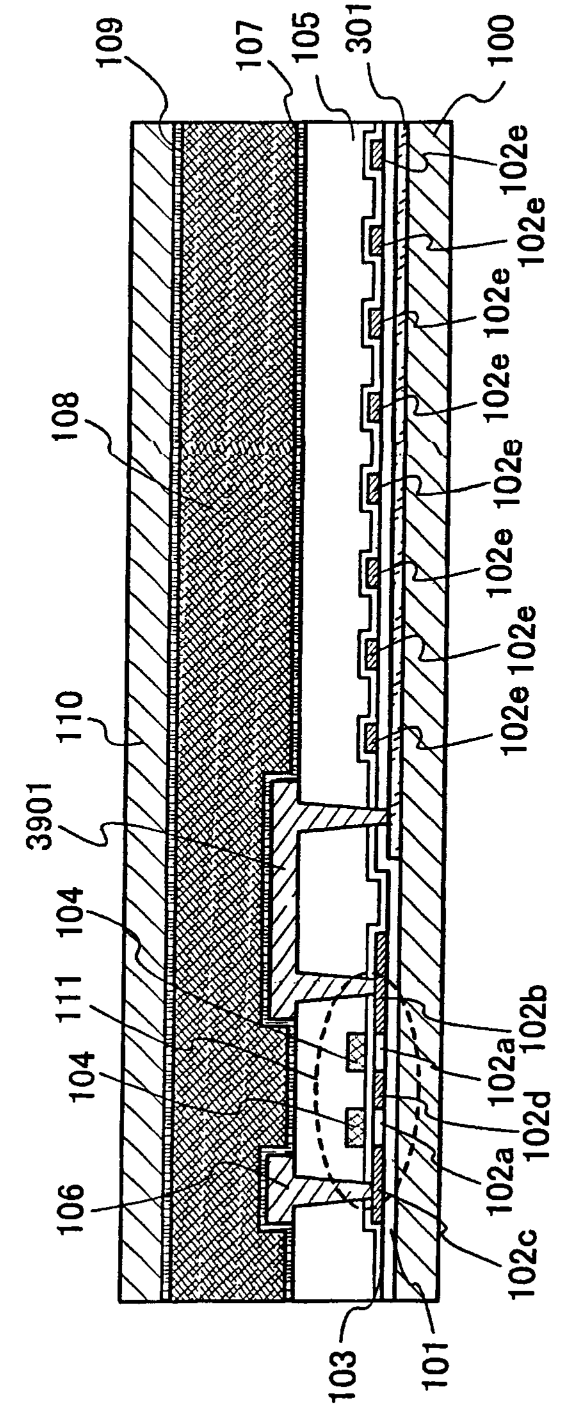
FIG. 39 is a diagram showing a liquid crystal display panel of the present invention.

FIG. 39 shows a structure in which the first electrode 102*e* is a common electrode and the second electrode 301 is a pixel electrode in the structure of FIG. 3. The impurity region 102*b* of the transistor 111 is connected to the second electrode 301 through a contact hole by a wiring 3901. Thus, the transistor 111 is turned on by a change in a potential, of the gate electrode 104, so that a signal supplied to the wiring 106 is inputted to the second electrode 301. Specifically, transmission information of the signal is a potential, and a potential in accordance with the signal is inputted to the second electrode 301 by accumulation of charges in the second electrode 301. Further, a common potential is inputted to the first electrode 102*e* of each of a plurality of pixels. Accordingly, an orientation of liquid crystal molecules in the liquid crystal layer 108 is changed by an electrical field generated due to a potential difference between the first electrode 102*e* and the second electrode 301.

Figure 41:
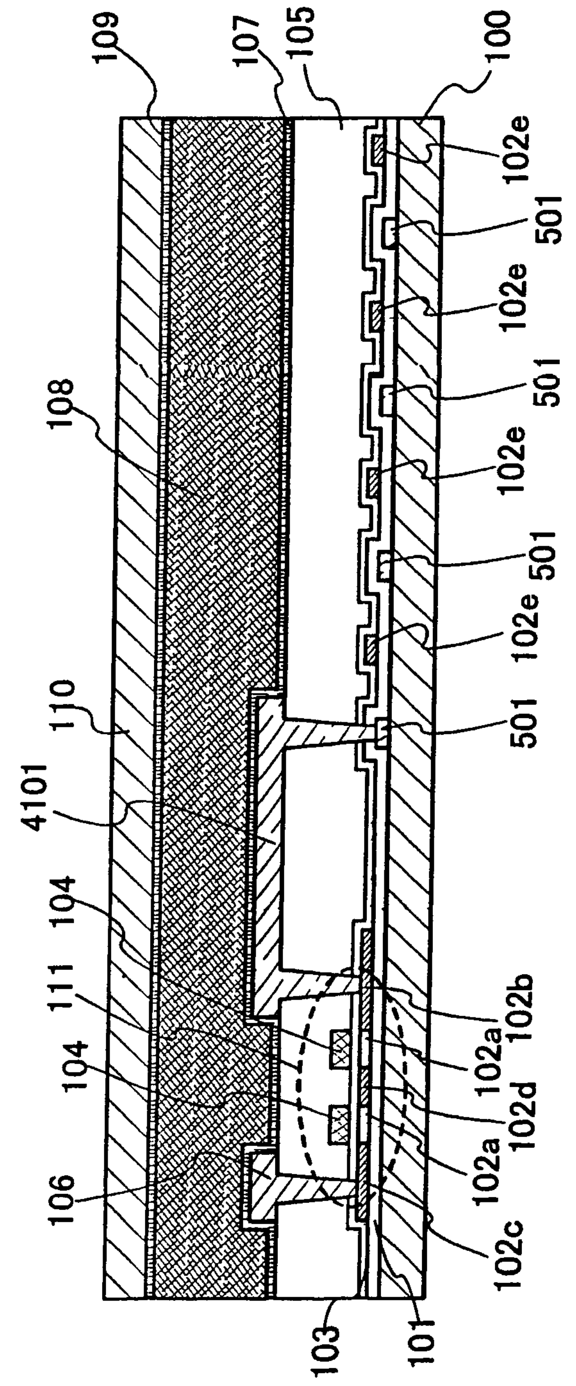
FIG. 41 is a diagram showing a liquid crystal display panel of the present invention.

FIG. 41 shows a structure in which the first electrode 102*e* is a common electrode and the second electrode 501 is a pixel electrode in the structure of FIG. 5. The impurity region 102*b* of the transistor 111 is connected to the second electrode 501 through a contact hole by a wiring 4101. Thus, the transistor 111 is turned on by a change in a potential of the gate electrode 104, so that a signal supplied to the wiring 106 is inputted to the second electrode 501. Specifically, transmission information of the signal is a potential, and a potential in accordance with the signal is inputted to the second electrode 501 by accumulation of charges in the second electrode 501. Further, a common potential is inputted to the first electrode 102*e* of each of a plurality of pixels. Accordingly, an orientation of liquid crystal molecules in the liquid crystal layer 108 is changed by an electrical field generated due to a potential difference between the first electrode 102*e* and the second electrode 501.

Figure 40:
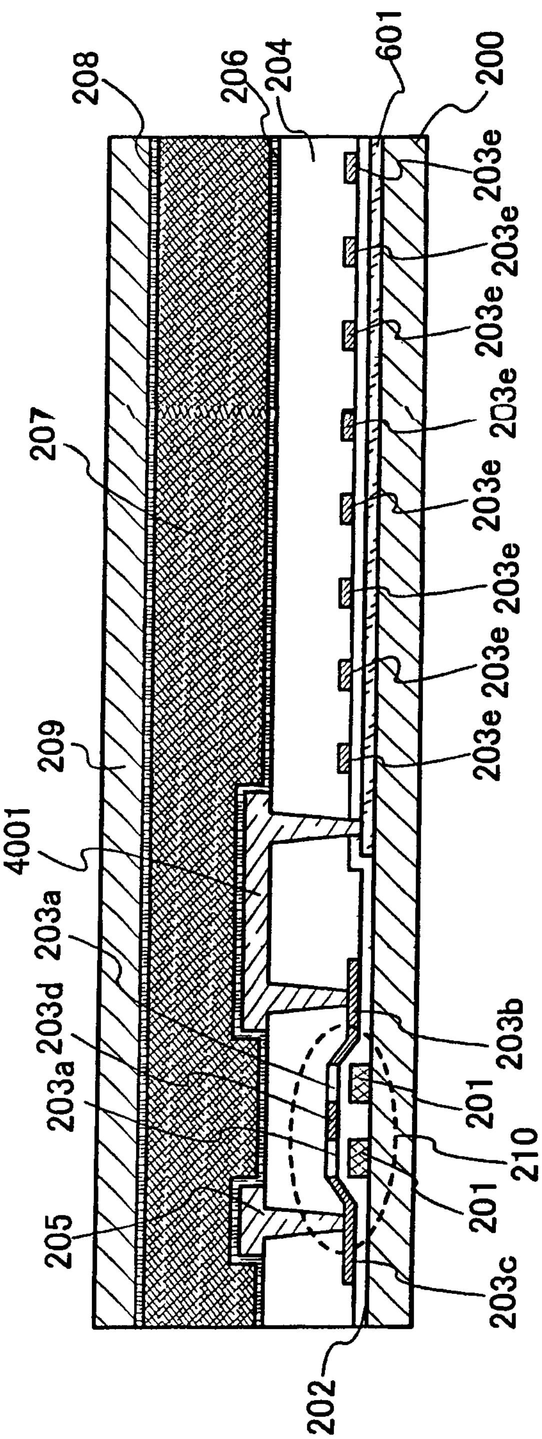
FIG. 40 is a diagram showing a liquid crystal display panel of the present invention.

FIG. 40 shows a structure in which the first electrode 203*e* is a common electrode and the second electrode 601 is a pixel electrode in the structure of FIG. 6. The impurity region 203*b* of the transistor 210 is connected to the second electrode 601 through a contact hole by a wiring 4001. Thus, the transistor 210 is turned on by a change in a potential of the gate electrode 201, so that a signal supplied to the wiring 205 is inputted to the second electrode 601. Specifically, transmission information of the signal is a potential, and a potential in accordance with the signal is inputted to the second electrode 601 by accumulation of charges in the second electrode 601. Further, a common potential is inputted to the first electrode 203*e* of each of a plurality of pixels. Accordingly, an orientation of liquid crystal molecules in the liquid crystal layer 207 is changed by an electrical field generated due to a potential difference between the first electrode 203*e* and the second electrode 601.

Figure 42:
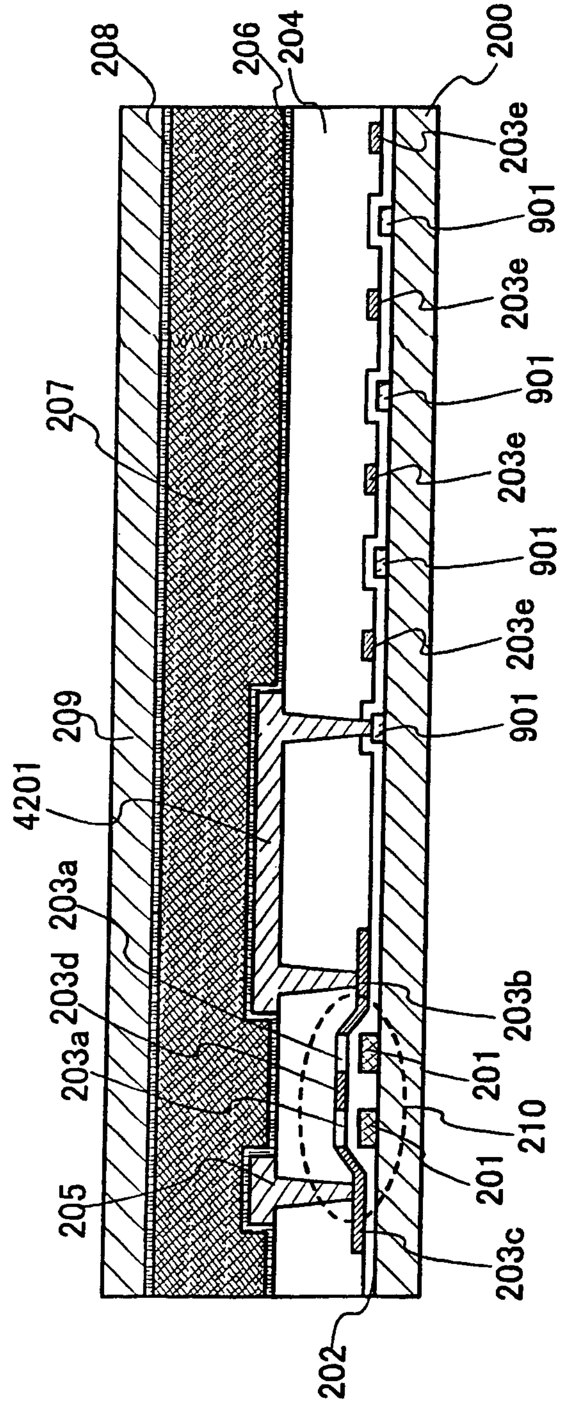
FIG. 42 is a diagram showing a liquid crystal display panel of the present invention.

FIG. 42 shows a structure in which the first electrode 203*e* is a common electrode and the second electrode 901 is a pixel electrode in the structure of FIG. 9. The impurity region 203*b* of the transistor 210 is connected to the second electrode 901 through a contact hole by a wiring 4201. Thus, the transistor 210 is turned on by a change in a potential of the gate electrode 201, so that a signal supplied to the wiring 205 is inputted to the second electrode 901. Specifically, transmission information of the signal is a potential, and a potential in accordance with the signal is inputted to the second electrode 901 by accumulation of charges in the second electrode 901. Further, a common potential is inputted to the first electrode 203*e* of each of a plurality of pixels. Accordingly, an orientation of liquid crystal molecules in the liquid crystal layer 207 is changed by an electrical field generated due to a potential difference between the first electrode 203*e* and the second electrode 901.

Embodiment Mode 16

Description is made of a structure of a liquid crystal display panel of Embodiment Mode 16 of the present invention.

In this embodiment mode, description is made of a structure of a liquid crystal display panel for which a so-called IPS mode and a so-called FFS mode are combined.

In the case of the IPS mode, an electrical field almost parallel to a substrate surface is generated due to a potential difference between electrodes, so that liquid crystal molecules are rotated almost parallel to the substrate surface. In the case of the FFS mode, a width between electrodes is reduced as compared to in the IPS mode, and an oblique electrical field is utilized to control an orientation of liquid crystal molecules. Then, in the liquid crystal display panel of Embodiment Mode 16 of the present invention, one pixel includes a display region of the IPS mode and a display region of the FFS mode.

Figure 43:
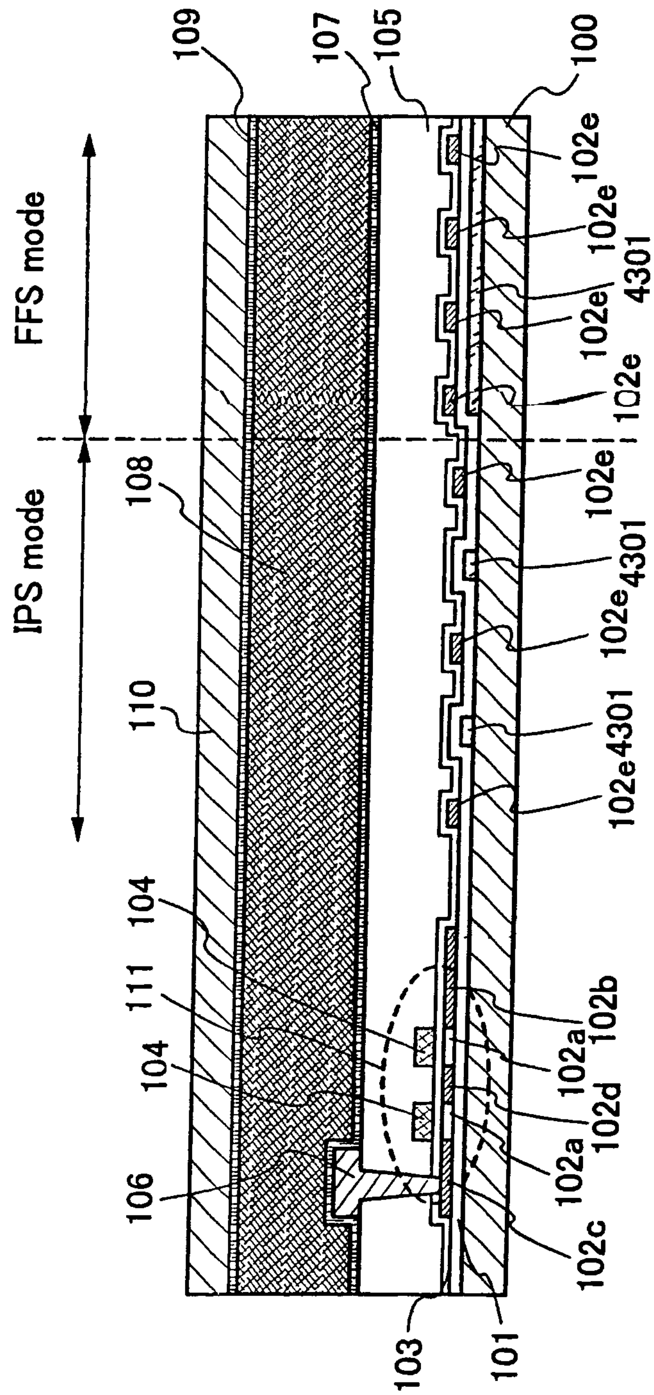
FIG. 43 is a diagram showing a liquid crystal display panel of the present invention.

FIG. 43 shows a part of a pixel in order to explain a structure of the pixel in detail. Note that the structure of the liquid crystal display panel of Embodiment Mode 16 is different from the structure of the liquid crystal display panel described in Embodiment Mode 5 with reference to FIG. 5 in that a second electrode 4301 is provided instead of the second electrode 501.

The common electrode (second electrode 4301) in FIG. 43 is formed over the substrate 100 and below the first insulating film 101. In the display region of the IPS mode, the second electrodes 4301 are provided so as not to overlap the first electrodes 102*e*, and in the display region of the FFS mode, the first electrodes 102*e* are provided over the second electrode 4301 at closer intervals than in the region of the IPS mode.

Figure 44:
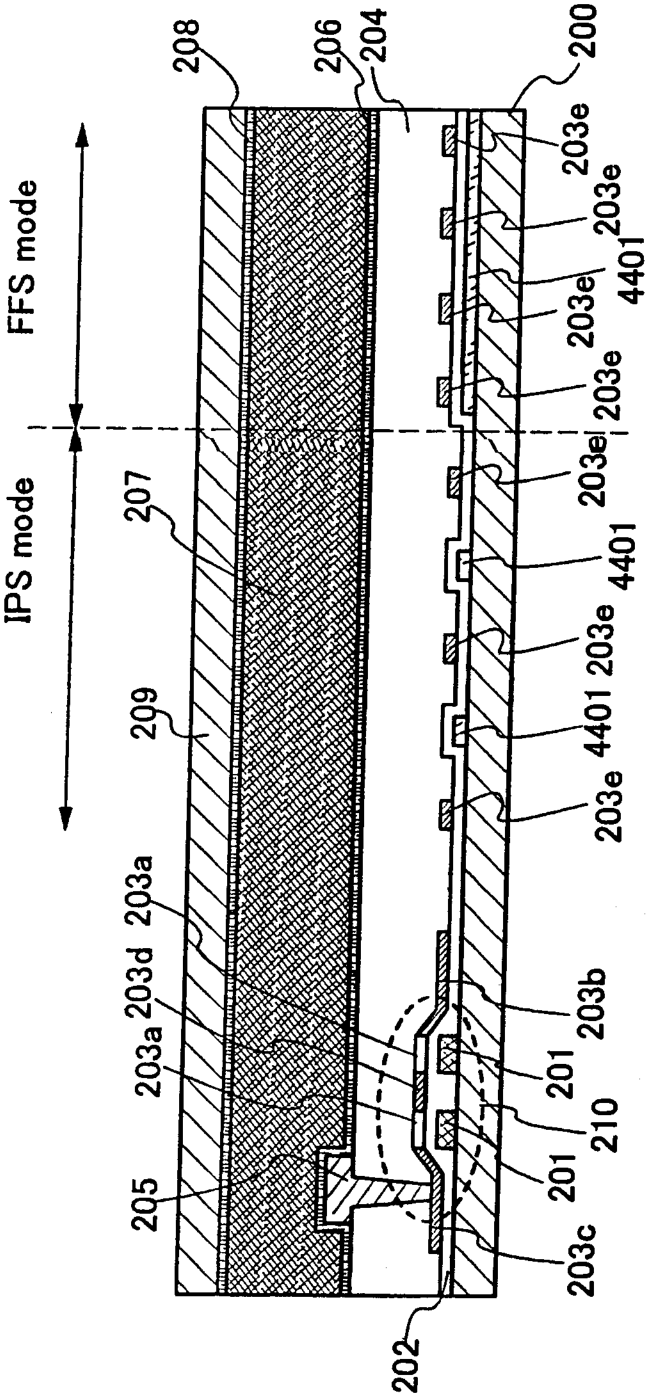
FIG. 44 is a diagram showing a liquid crystal display panel of the present invention.

FIG. 44 shows a part of a pixel in order to explain a structure of the pixel in detail. Note that the structure of the liquid crystal display panel of Embodiment Mode 16 is different from the structure of the liquid crystal display panel described in Embodiment Mode 10 with reference to FIG. 9 in that a second electrode 4401 is provided instead of the second electrode 901.

The common electrode (second electrode 4401) in FIG. 44 is formed over the substrate 200 and below the first insulating film 202. In the display region of the IPS mode, the second electrodes 4401 are provided so as not to overlap the first electrodes 203*e*, and in the display region of the FFS mode, the first electrodes 203*e* are provided over the second electrode 4401 at closer intervals than in the region of the IPS mode.

Embodiment 1

Figure 45A:
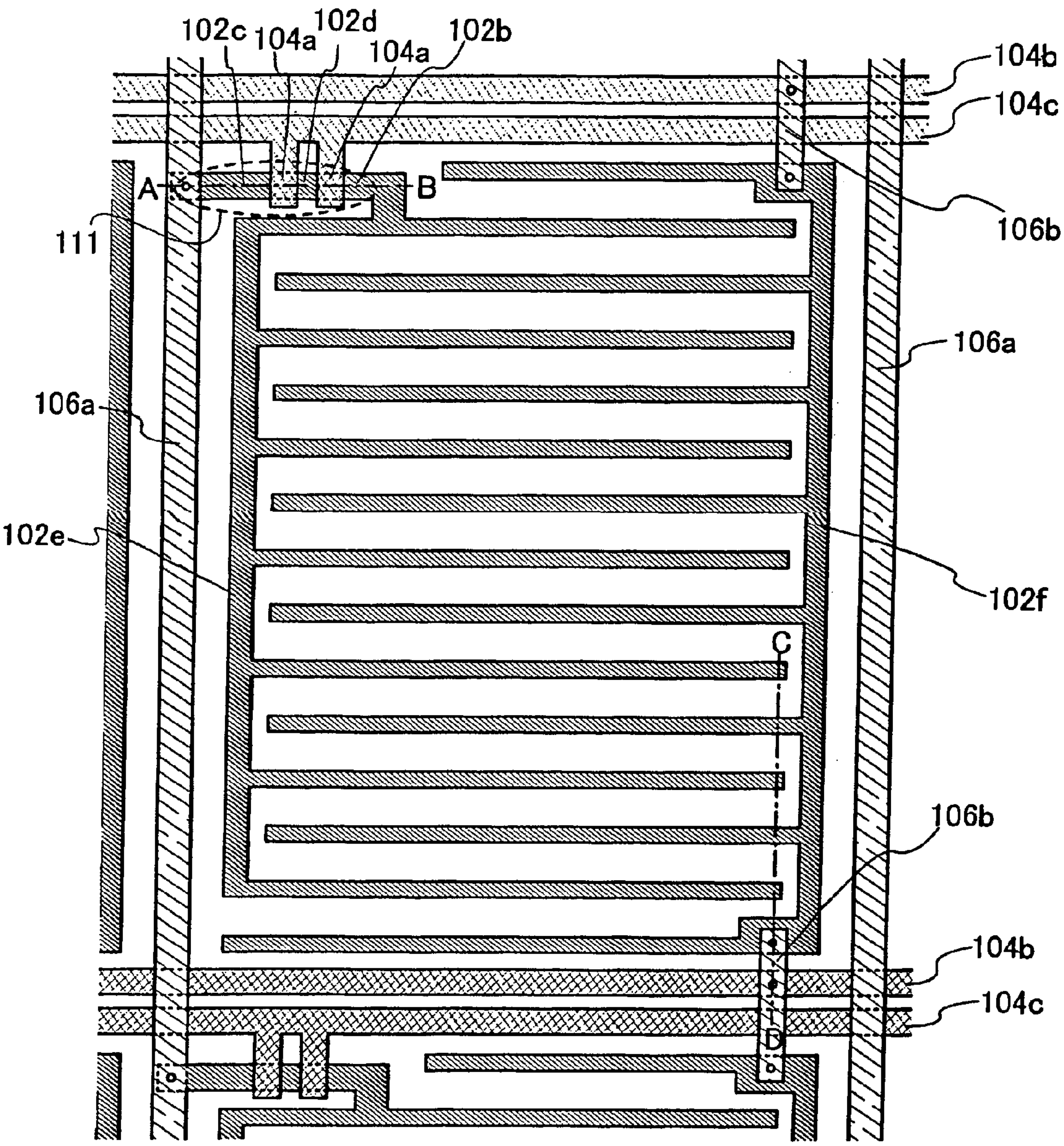
FIG. 45A is a diagram showing a pixel layout of a liquid crystal display panel of the present invention.

Description is made of a pixel layout to which a basic structure of the liquid crystal display panel of Embodiment Mode 1 of the present invention is applied. FIG. 45A is a plan view showing a pixel layout of the liquid crystal display panel of Embodiment 1 of the present invention. This liquid crystal display panel is used for a display device which controls an orientation of liquid crystals by an IPS (In-Plane Switching) mode.

Note that FIG. 45A shows only one pixel in order to explain a structure of the pixel in detail; however, in a pixel portion of a display panel, a plurality of pixels are arranged in matrix.

The pixel portion of the display panel of Embodiment 1 of the present invention includes a plurality of signal lines (first wirings 106*a* in the pixel of FIG. 45A) and a plurality of scan lines (second wirings 104*c* in the pixel of FIG. 45A). Then, in the pixel portion, the plurality of scan lines are arranged in parallel with each other and are separate from each other. In addition, in the pixel portion, the plurality of signal lines are arranged in parallel with each other in a direction perpendicular to the plurality of scan lines (in a horizontal direction in the drawing) and are separate from each other.

Further, in the pixel portion, a plurality of pixels are arranged in matrix corresponding to the scan lines and the signal lines, and each pixel is connected to any one of the scan lines and any one of the signal lines.

Each pixel includes at least one transistor (the transistor 111 in the pixel of FIG. 45A), a pixel electrode (the first electrode 102*e* in the pixel of FIG. 45A), and a common electrode (the second electrode 102*f* in the pixel of FIG. 45A).

The semiconductor layer (a semiconductor film functioning as a channel formation region, a source region, and a drain region) of the transistor 111 and the first electrode 102*e* of each pixel are a stretch of film.

A region projecting from the second wiring 104*c* functions as the gate electrode 104*a*, and the semiconductor layer overlapping with the gate electrode 104 includes the channel formation region of the transistor 111. Further, one of the impurity region 102*b* and the impurity region 102*c* functions as a source of the transistor 111, and the other functions as a drain thereof. Note that the transistor 111 has a so-called dual-gate structure (in which two gate electrodes are arranged alongside over the semiconductor layer); however, the present invention is not limited to this. Alternatively, a multi-gate structure in which three or more gate electrodes are arranged alongside over the semiconductor layer or a so-called single-gate structure (in which one gate electrode is provided for one transistor) may be employed. In the case of the single-gate structure, the impurity region 102*d* is omitted.

In the transistor 111, the impurity region 102*c* to be one of a source and a drain is connected to the first wiring 106*a* through a contact hole, and the first electrode 102*e* and the impurity region 102*b* to be the other of the source and the drain are a stretch of film.

In FIG. 45A, the semiconductor layer of the transistor 111 and the first electrode 102*e* are a stretch of film; however, the liquid crystal display panel of Embodiment 1 of the present invention is not limited to this. The semiconductor layer of the transistor 111 and the first electrode 102*e* are only necessary to be formed in the same step, and the semiconductor layer of the transistor 111 and the first electrode 102*e* may be electrically connected through a multilayer wiring.

Further, the second electrode 102*f* is a film formed in the same step as the semiconductor layer of the transistor 111 and the first electrode 102*e*. The second electrode 102*f* is provided to electrically connect between pixels of a plurality of pixels through the third wiring 106*b*, at the same time, electrically connected to the fourth wiring 104*b* that is arranged in parallel with and separate from the second wiring 104*c*.

Note that in FIG. 45A, the second electrode 102*f* is provided to electrically connect between pixels of a plurality of pixels through the third wiring 106*b*; however, the liquid crystal display panel of the display device of Embodiment 1 of the present invention is not limited to this. The second electrode 102*f* may be a stretch of film across the plurality of pixels. It is to be noted that since the second electrode 102*f* is patterned separately for each pixel so that electrical field concentration to the second electrode 102*f* in a manufacturing process can be relieved, electrostatic discharge (ESD) can be prevented.

The liquid crystal display panel of Embodiment 1 of the present invention is allowed as long as the semiconductor layer of the transistor 111, the first electrode 102*e*, and the second electrode 102*f* are films formed in the same step.

Further, shapes of the first electrode 102*e* and the second electrode 102*f* are not limited to the shapes shown in FIG. 45A.

Note that although FIG. 45A does not show a liquid crystal layer so that the pixel layout can be understood easily, the liquid crystal display panel of Embodiment 1 of the present invention has a liquid crystal layer. Then, in each pixel, a liquid crystal element in which molecular orientation of liquid crystal molecules is changed depending on a potential difference between the first electrode 102*e* provided independently for each pixel and the second electrode 102*f* provided to connect between pixels of a plurality of pixels in the pixel portion.

Figure 45B:
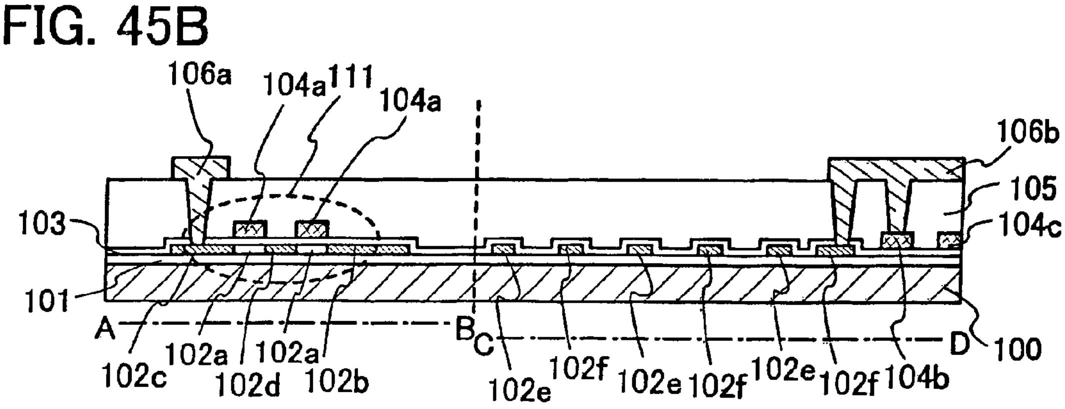
FIG. 45B is a diagram showing a cross section of a pixel of the liquid crystal display panel of the present invention.

Next, more specific description is made of the structure of the liquid crystal display panel of Embodiment 1 of the present invention with reference to FIG. 45B showing cross sections taken along dashed-dotted lines A-B and C-D in FIG. 45A.

A base insulating film (the first insulating film 101) is formed over the substrate 100 in order to prevent impurities from diffusing from the substrate 100. The substrate 100 can be formed of an insulating substrate such as a glass substrate, a quartz substrate, a plastic substrate, or a ceramic substrate, or of a metal substrate, a semiconductor substrate, or the like. The first insulating film 101 can be formed by a CVD method or a sputtering method. For example, a silicon oxide film, a silicon nitride film, a silicon oxynitride film, or the like formed by a CVD method using $SiH_4$, $N_2O$, and $NH_3$ as a source material can be applied. Alternatively, a stacked layer of them may be used. It is to be noted that the first insulating film 101 is provided to prevent impurities from diffusing from the substrate 100 into the semiconductor layer. In the case where the substrate 100 is formed of a glass substrate or a quartz substrate, the first insulating film 101 is not necessary to be provided. It is also to be noted that when a silicon nitride film is used as the first insulating film 101, the entry of the impurities is prevented effectively. On the other hand, when a silicon oxide film is used as the first insulating film 101, trapping of an electric charge or hysteresis of electric characteristics is not caused even if the first insulating film 101 is in direct contact with the semiconductor layer. Therefore, it is more preferable that a stacked-layer film in which a silicon nitride film and a silicon oxide film are stacked in this order over the substrate 100 be used as the first insulating film 101.

The semiconductor layer (the channel formation region 102*a*, the impurity region 102*b*, the impurity region 102*c*, and the impurity region 102*d*) of the transistor 111, and the first electrode 102*e* and the second electrode 102*f* that control molecular orientation of the liquid crystal molecules are formed over the first insulating film 101. The channel formation region 102*a*, the impurity region 102*b*, the impurity region 102*c*, the impurity region 102*d*, the first electrode 102*e*, and the second electrode 102*f* are, for example, polysilicon films, which are formed in the same step.

In the case where the transistor 111 is an n-channel transistor, an impurity element such as phosphorus or arsenic is introduced into the impurity region 102*b*, the impurity region 102*c* and the impurity region 102*d*, whereas in the case where the transistor 111 is a p-channel transistor, an impurity element such as boron is introduced into the impurity region 102*b*, the impurity region 102*c* and the impurity region 102*d*.

Further, the impurity element introduced into the impurity region 102*b*, the impurity region 102*c* and the impurity region 102*d* may also be introduced into the first electrode 102*e* and the second electrode 102*f*. The resistance of the first electrode 102*e* and the second electrode 102*f* is lowered since an impurity is introduced thereto, which is preferable for each of the first electrode 102*e* and the second electrode 102*f* to function as an electrode.

The first electrode 102*e* and the second electrode 102*f* each have thickness of, for example, 45 nm to 60 nm, and have sufficiently high light transmittance. In order to further improve the light transmittance, it is desirable to set thickness of the first electrode 102*e* and the second electrode 102*f* to be 40 nm or less.

Each of the first electrode 102*e* and the second electrode 102*f* may be an amorphous silicon film or an organic semiconductor film. In that case, an amorphous silicon film or an organic semiconductor film is used for the semiconductor layer of the transistor 111.

The semiconductor layer (the channel formation region 102*a*, the impurity region 102*b*, the impurity region 102*c* and the impurity region 102*d*) of the transistor 111, and the first electrode 102*e* and the second electrode 102*f* that control molecular orientation of the liquid crystal molecules are formed in the same step. In this case, the number of steps can be reduced, so that the manufacturing cost can be reduced. In addition, it is desirable that impurity elements of the same type be introduced into the impurity region 102*b*, the impurity region 102*c*, the impurity region 102*d*, the first electrode 102*e* and the second electrode 102*f*. This is because when the impurity elements of the same type are introduced, the impurity elements can be introduced without a problem even if the impurity region 102*b*, the impurity region 102*c*, the impurity region 102*d*, the first electrode 102*e* and the second electrode 102*f* are located close to each other, so that dense layout becomes possible. It is desirable to add impurity elements of either P-type or N-type because the manufacturing cost can be low compared with the case in which impurity elements of different types are introduced.

A gate insulating film (second insulating film 103) is formed over the semiconductor layer of the transistor 111, the first electrode 102*e*, and the second electrode 102*f*. In FIG. 45B, the second insulating film 103 is formed so as to cover the semiconductor layer of the transistor 111, the first electrode 102*e*, and the second electrode 102*f*; however, the present invention is not limited to this. It is only necessary to form the second insulating film 103 over the semiconductor layer of the transistor 111. As the second insulating film 103, a silicon oxide film, a silicon nitride film, a silicon oxynitride film, or the like formed by a CVD method or a sputtering method can be used.

Two gate electrodes 104*a* are formed over the channel formation region 102*a* of the transistor 111 with the second insulating film 103 interposed therebetween. In addition, a gate wiring (the first wiring 104*b*) and an auxiliary wiring (the second wiring 104*c*) are formed over the second insulating film 103. The second wiring 104*c* and the gate electrode 104*a* are a stretch of film, and the second wiring 104*c* is formed in the same step as the first wiring 104*b* and the gate electrode 104*a*. Also, for each of the gate electrode 104*a*, the first wiring 104*b*, and the second wiring 104*c*, an aluminum (Al) film, a copper (Cu) film, a thin film containing aluminum or copper as a main component, a chromium (Cr) film, a tantalum (Ta) film, a tantalum nitride (TaN) film, a titanium (Ti) film, a tungsten (W) film, a molybdenum (Mo) film, or the like can be used.

An interlayer insulating film (third insulating film 105) is formed over the second insulating film 103, the gate electrodes 104*a*, the first wiring 104*b*, and the second wiring 104*c*. The third insulating film 105 preferably has a stacked-layer structure in which a protective film and a planarization film may be stacked in this order. For the protective film, an inorganic insulating film is suitable. As an inorganic insulating film, a silicon nitride film, a silicon oxide film, a silicon oxynitride film, or a film formed by stacking these films can be used. For a planarization film, a resin film is suitable. As a resin film, polyimide, polyamide, acrylic, polyimide amide, epoxy or the like can be used.

A signal line (a third wiring 106*a*) and a connection wiring (a fourth wiring 106*b*) are formed over the third insulating film 105. The third wiring 106*a* is connected to the impurity region 102*c* through holes (contact holes) formed in the third insulating film 105 and the second insulating film 103, and the fourth wiring 106*b* is connected to the second electrode 102*f* through holes formed in the third insulating film 105 and the second insulating film 103 and also connected to the first wiring 104*b* through the hole formed in the third insulating film 105. For each of the third wiring 106*a* and the fourth wiring 106*b*, a titanium (Ti) film, an aluminum (Al) film, a copper (Cu) film, an aluminum film containing Ti, or the like can be used. Preferably, copper having low resistance may be used.

The first orientation film is formed over the third wiring 106*a*, the fourth wring 106*b*, and the third insulating film 105. Then, a surface of the substrate 100, on which the first orientation film is formed, and a surface of the counter substrate, on which the second orientation film is formed, are provided so as face each other, and the liquid crystal layer is provided between the substrate 100 and the counter substrate. Thus, the liquid crystal display panel of Embodiment 1 of the present invention is completed.

A manufacturing method of a liquid crystal display device of Embodiment 1 of the present invention is described. First, the first insulating film 101 is formed over the substrate 100. Subsequently, a semiconductor film such as a polysilicon film or an amorphous silicon film is formed over the first insulating film 101. A resist pattern (not shown) is formed over the semiconductor film. Then, the semiconductor film is selectively etched with use of the resist pattern as a mask. In such a manner, the semiconductor film (the channel formation region 102*a*, the impurity region 102*b*, the impurity region 102*c*, and the impurity region 102*d*), the first electrode 102*e*, and the second electrode 102*f* are formed in the same step. After that, the resist pattern is removed thereafter.

The second insulating film 103 is formed over the semiconductor film (the channel formation region 102*a*, the impurity region 102*b*, the impurity region 102*c*, and the impurity region 102*d*), the first electrode 102*e*, the second electrode 102*f*, and the first insulating film 101. The second insulating film 103 is, for example, a silicon oxynitride film or a silicon oxide film, and formed by a plasma CVD method. Note that the second insulating film 103 may be formed of a silicon nitride film, or a multilayer film containing silicon nitride and silicon oxide. Then, a conductive film is formed over the second insulating film 103 and is patterned. Thus, two gate electrodes 104*a* are formed over the channel formation region 102*a* with the second insulating film 103 interposed therebetween. In addition, the first wiring 104*b* and the second wiring 104*c* are formed at the same time as the gate electrode 104*a*.

Note that as the conductive film, a film formed of aluminum (Al), nickel (Ni), tungsten (W), molybdenum (Mo), titanium (Ti), tantalum (Ta), neodymium (Nd), platinum (Pt), gold (Au), silver (Ag), or the like; a film formed of an alloy thereof; or a stacked-layer film thereof can be used. Alternatively, a silicon (Si) film to which an N-type impurity is introduced may be used.

Subsequently, impurities are added to the impurity region 102*b*, the impurity region 102*c*, and the impurity region 102*d* with use of the gate electrode 104*a*, a resist pattern (not shown), and the like as masks. Accordingly, impurities are included in the impurity region 102*b*, the impurity region 102*c*, and the impurity region 102*d*. Note that an N-type impurity element and a P-type impurity element may be added individually, or an N-type impurity element and a P-type impurity element may be added concurrently in a specific region. It is to be noted that in the latter case, an additive amount of one of an N-type impurity element and a P-type impurity element is set to be larger than that of the other.

Further, an impurity element may be added to the first electrode 102*e* and the second electrode 102*f* in a step of forming the impurity regions. Thus, the first electrode 102*e* and the second electrode 102*f* can be formed concurrently with the impurity region 102*b*, the impurity region 102*c*, and the impurity region 102*d*. Therefore, the number of steps can be prevented from being increased, so that the manufacturing cost can be reduced.

Note that an impurity elements may be added to the impurity regions before formation of the gate electrode 104*a*, for example, before or after formation of the second insulating film 103. At that time, the impurity element may be added to the first electrode 102*e*. Also in this case, addition of the impurity element to the impurity region 102*b*, the impurity region 102*c*, and the impurity region 102*d* can be conducted at the same time as addition of the impurity element to the first electrode 102*e* and the second electrode 102*f*. Accordingly, the manufacturing cost of the liquid crystal display panel can be reduced.

The third insulating film 105 is formed. Contact holes are formed in the third insulating film 105 and the second insulating film 103. Subsequently, a conductive film (such as a metal film) is formed over the third insulating film 105 and in the contact holes. Then, the conductive film is patterned, in other words, selectively removed. Thus, the third wiring 106*a* and the fourth wiring 106*b* are formed. Note that as the conductive film, a film formed of aluminum (Al), nickel (Ni), tungsten (W), molybdenum (Mo), titanium (Ti), tantalum (Ta), neodymium (Nd), platinum (Pt), gold (Au), silver (Ag), or the like; a film formed of an alloy thereof; or a stacked-layer film thereof can be used. Alternatively, a silicon (Si) film to which an N-type impurity is introduced may be used.

Subsequently, the first orientation film is formed, and liquid crystal is sealed between the first orientation film and a counter substrate on which the second orientation film is formed. Thus, the liquid crystal display panel is formed.

According to Embodiment 1 in the present invention, in the liquid crystal display panel in which the alignment orientation of the liquid crystal is controlled by the IPS mode, the first electrode 102*e* and the second electrode 102*f* are formed of a polysilicon film to which an impurity is introduced, and formed in the same step as the semiconductor layer (the source, the drain, and the channel formation region) of the transistor. Therefore, the number of manufacturing steps and the manufacturing cost can be reduced compared with the case in which the common electrode is formed of ITO.

Although the fourth wiring 106*b* is provided in the same layer as the third wiring 106*a* in this embodiment, the fourth wiring 106*b* may be provided in another wiring layer (for example, in the same layer as the first wiring 104*b* or the second wiring 104*c*). In addition, the second insulating film 103 is not necessarily formed over the whole surface.

The first wiring 104*b* may be formed in the same layer as the third wiring 106*a*. In this case, the first wiring 104*b* may be arranged parallel to the second wiring 104*c*, and the first wiring 104*b* and the second wiring 104*c* may be formed in the same layer only in a portion in which the third wiring 106*a* and the first wiring 104*b* are intersected.

Although a so-called top gate transistor in which a gate electrode is provided above a channel formation region is described in this embodiment, the present invention is not particularly limited thereto. A so-called bottom gate transistor in which the gate electrode is provided below the channel formation region or a transistor having a structure in which gate electrodes are provided over and below a channel formation region may be formed.

Note that a capacitor for holding a potential difference between the first electrode 102*e* and the second electrode 102*f* may be provided.

Figure 46A:
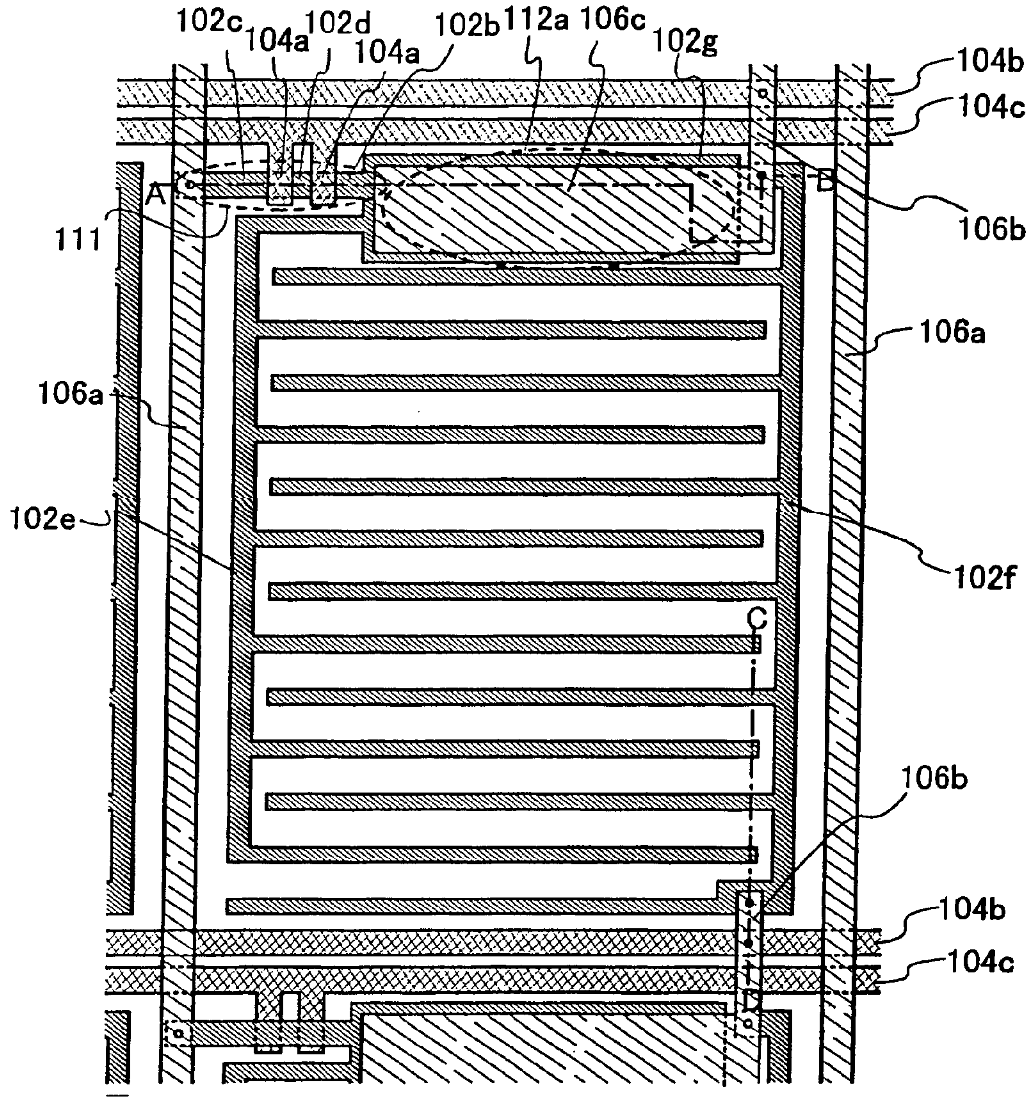
FIG. 46A is a diagram showing a pixel layout of a liquid crystal display panel of the present invention.
Figure 46B:
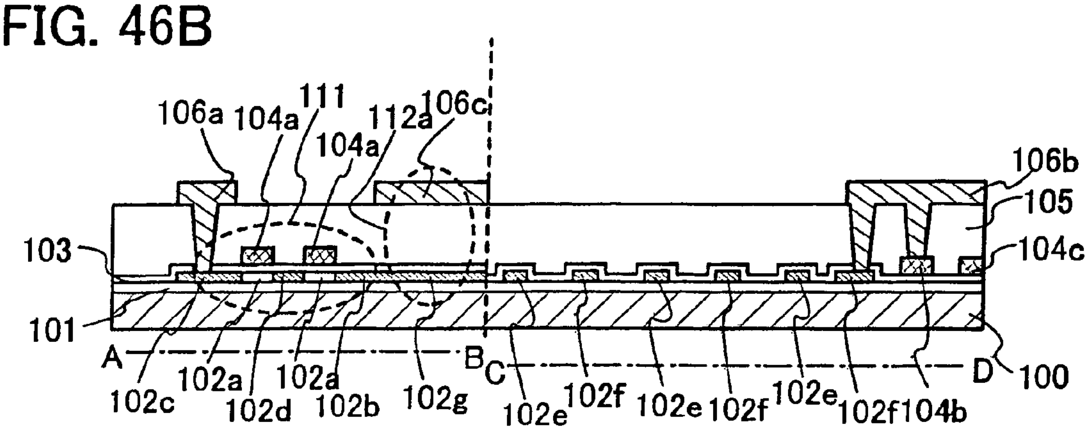
FIG. 46B is a diagram showing a cross section of a pixel of the liquid crystal display panel of the present invention.

For example, as shown in FIGS. 46A and 46B, a capacitor 112*a*, which has as one electrode a lower electrode 102*g* formed by extension of the impurity region 102*b*, and has as the other electrode the electrode 106*c* formed by extension of the fourth wiring 106*b* may be provided.

Figure 47A:
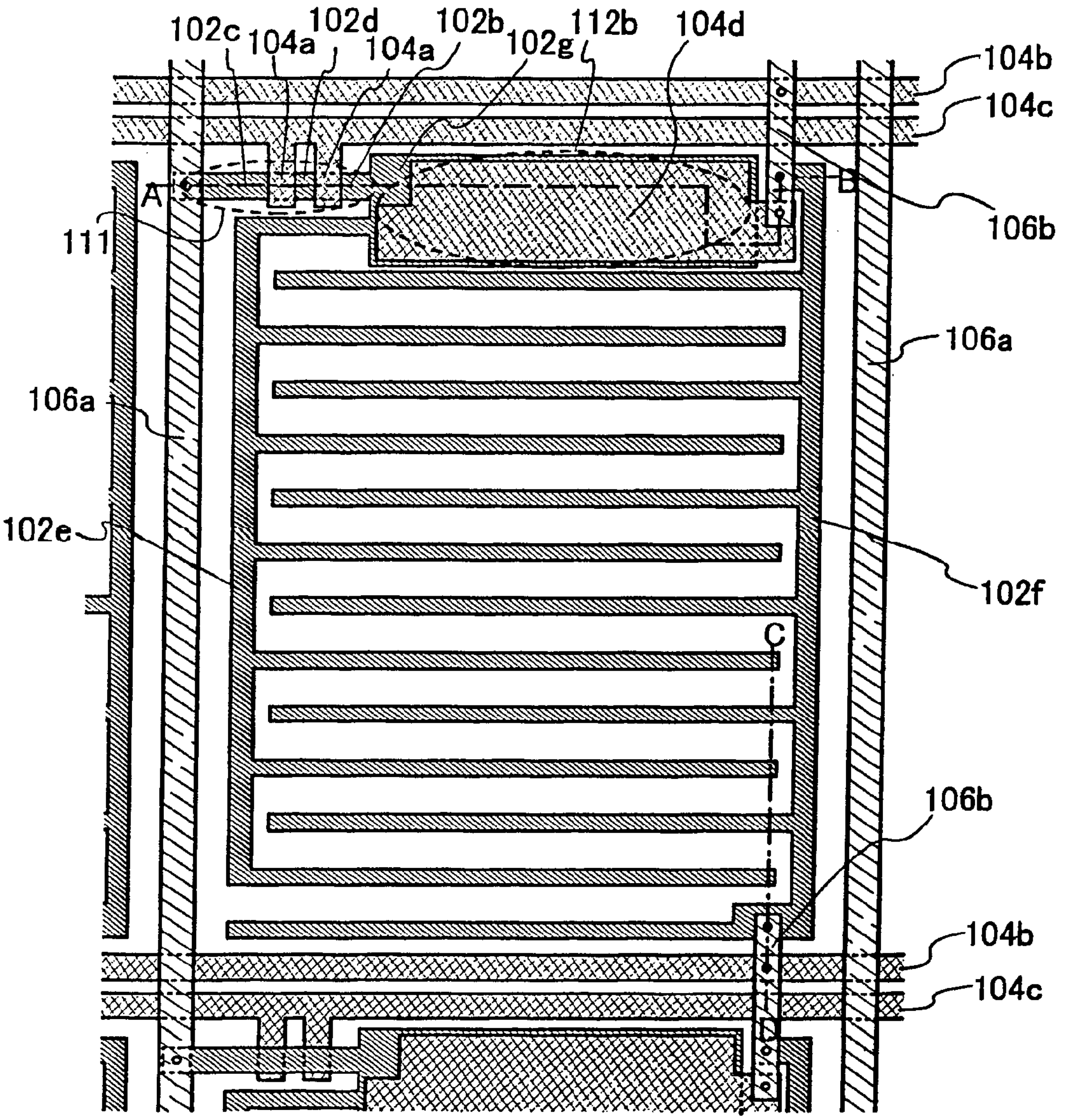
FIG. 47A is a diagram showing a pixel layout of a liquid crystal display panel of the present invention.
Figure 47B:
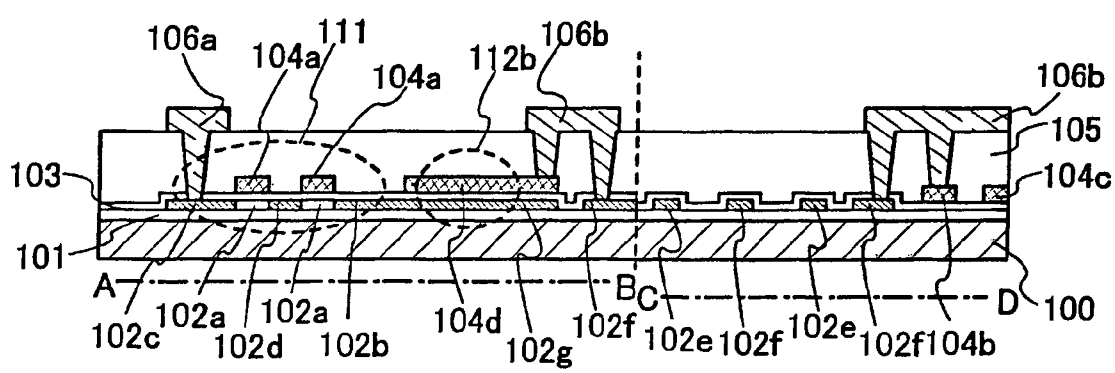
FIG. 47B is a diagram showing a cross section of a pixel of the liquid crystal display panel of the present invention.

Further, as shown in FIGS. 47A and 47B, a capacitor 112*b* may be provided, which has as one electrode a lower electrode 102*g* formed by extension of the impurity region 102*b* of the transistor 111, and has as the other electrode the electrode 104*d* formed from a conductive film that is formed in the same step as the gate electrode 104*a*, the first wiring 104*b*, and the second wiring 104*c* may be provided. In that case, the electrode 104*d* is connected to the second electrode 102*f* through a contact hole by the fourth wiring 106*b*.

Figure 48A:
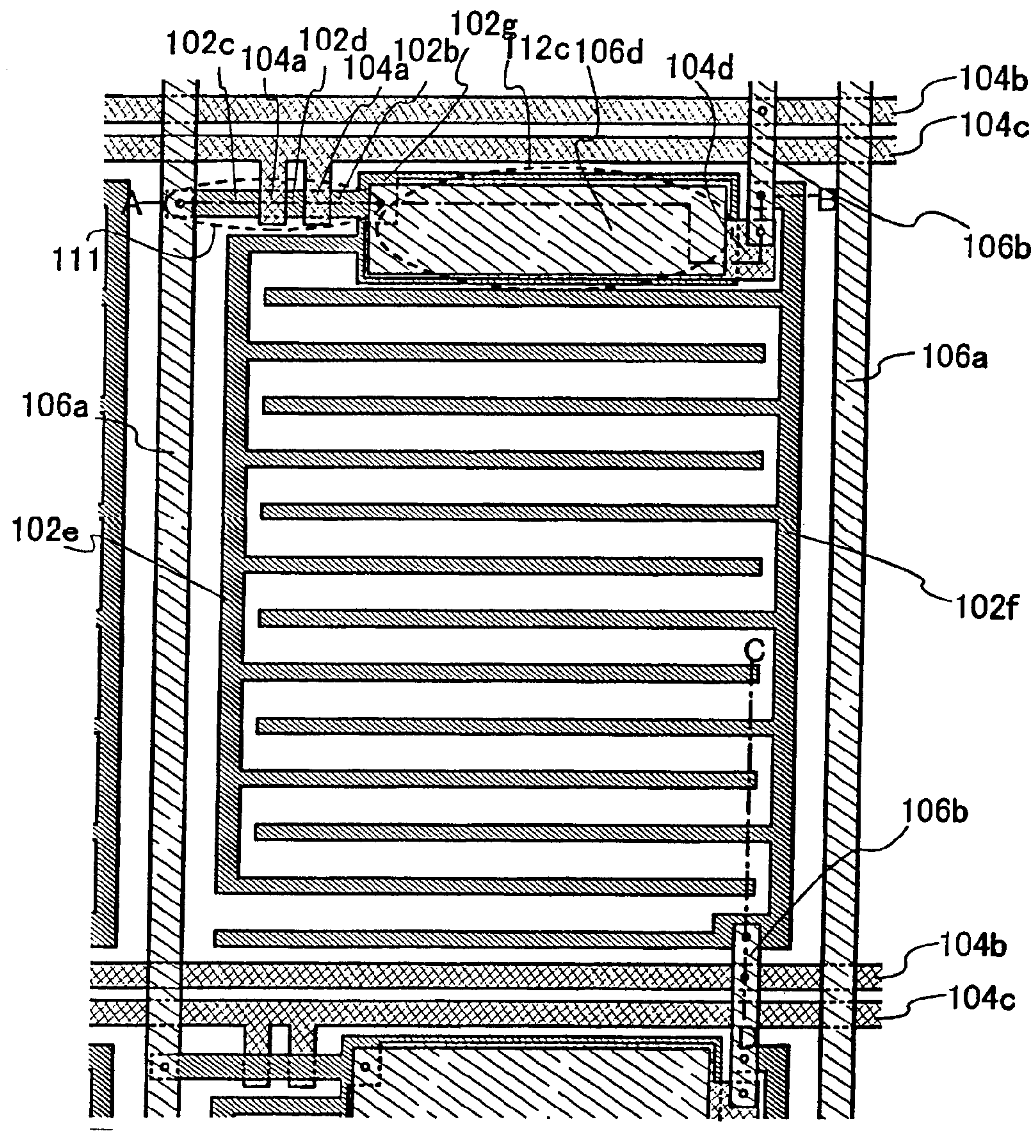
FIG. 48A is a diagram showing a pixel layout of a liquid crystal display panel of the present invention.
Figure 48B:
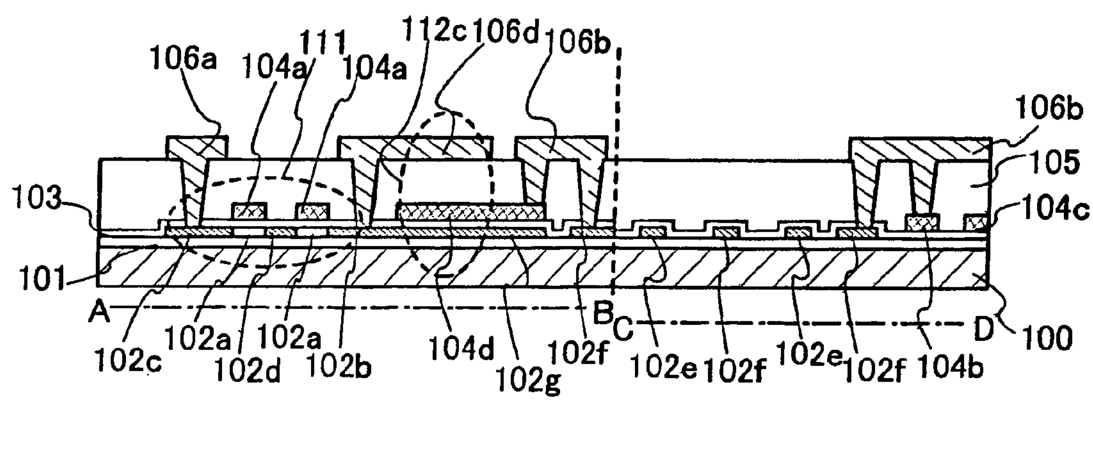
FIG. 48B is a diagram showing a cross section of a pixel of the liquid crystal display panel of the present invention.

Further, as shown in FIGS. 48A and 48B, a capacitor 112*c* may be provided, which has as one electrode the electrode 102*g* formed by extension of the impurity region 102*b* of the transistor 111, and an electrode 106*d* formed from a conductive film that is formed in the same step as the fourth wiring 106*b*, and has as the other electrode the electrode 104*d* formed from a conductive film that is formed in the same step as the gate electrode 104*a*, the first wiring 104*b*, and the second wiring 104*c* may be provided. In that case, the electrode 106*d* and the electrode 102*g* are connected through a contact hole, and the electrode 104*d* and the second electrode 102*f* are connected through a contact hole by the fourth wiring 106*b*.

Figure 53A:
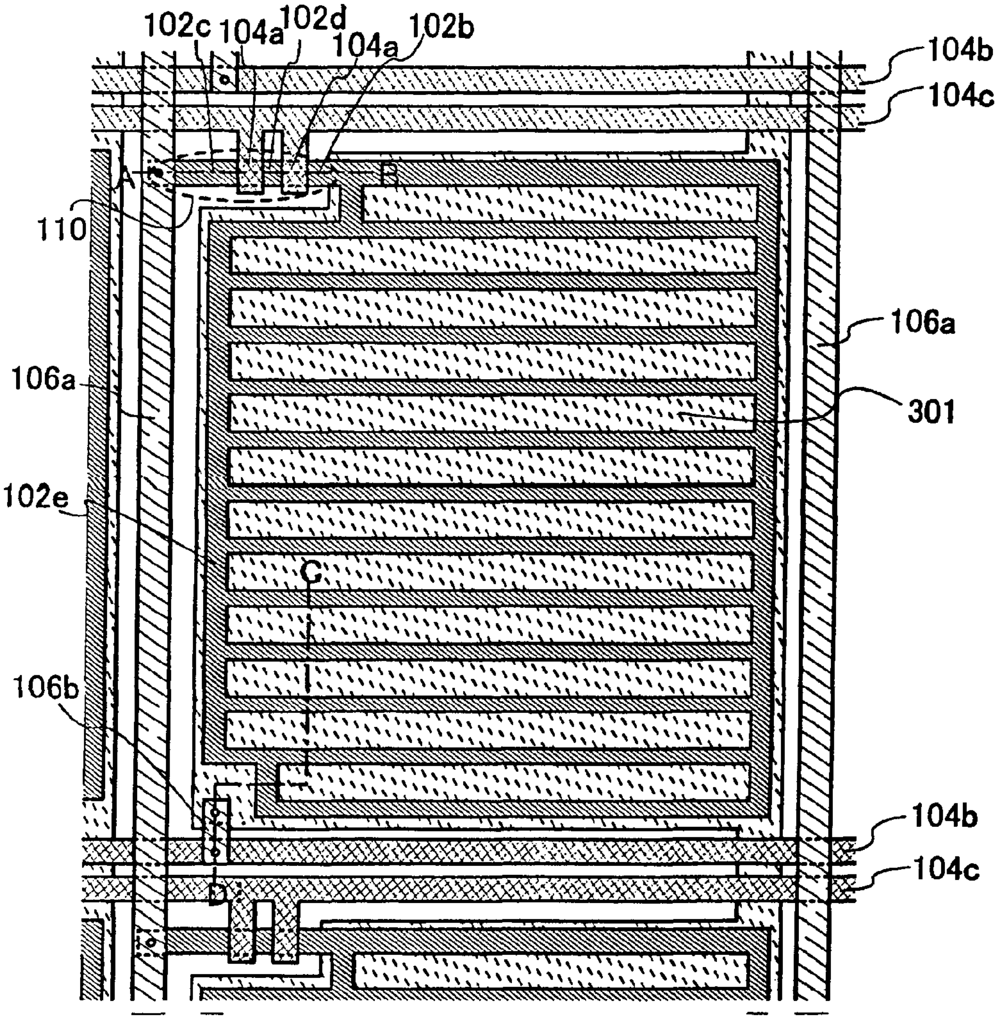
FIG. 53A is a diagram showing a pixel layout of a liquid crystal display panel of the present invention.

FIG. 53A shows a pixel layout of a liquid crystal display panel to which a basic structure of the liquid crystal display panel in FIG. 3, which is described in Embodiment Mode 3, is applied. In FIG. 53A, the first electrode 102*e* which is a stretch of film with the impurity region 102*b* is provided with a slit. Then, the second electrode 301 is provided between the substrate 100 and the first insulating film 101 so as to cover an entire surface of a lower region of the first electrode 102*e* of each pixel. Further, the second electrode 301 is a stretch of film across pixels in a column direction. The second electrode 301 is connected to the first wiring 104*b* through a contact hole by the fourth wiring 106*b*. Thus, the second electrode 301 is provided to connect between pixels in a row direction by the first wiring 104*b* and the fourth wiring 106*b*.

Figure 53B:
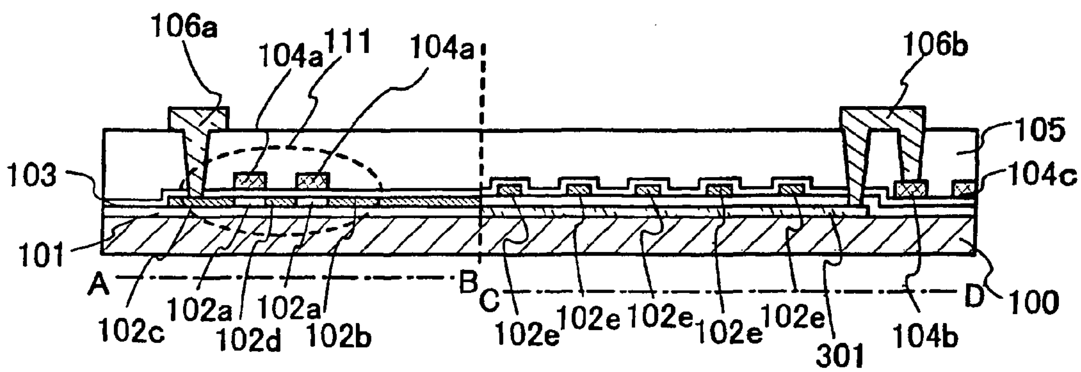
FIG. 53B is a diagram showing a cross section of a pixel of the liquid crystal display panel of the present invention.
Figure 54A:
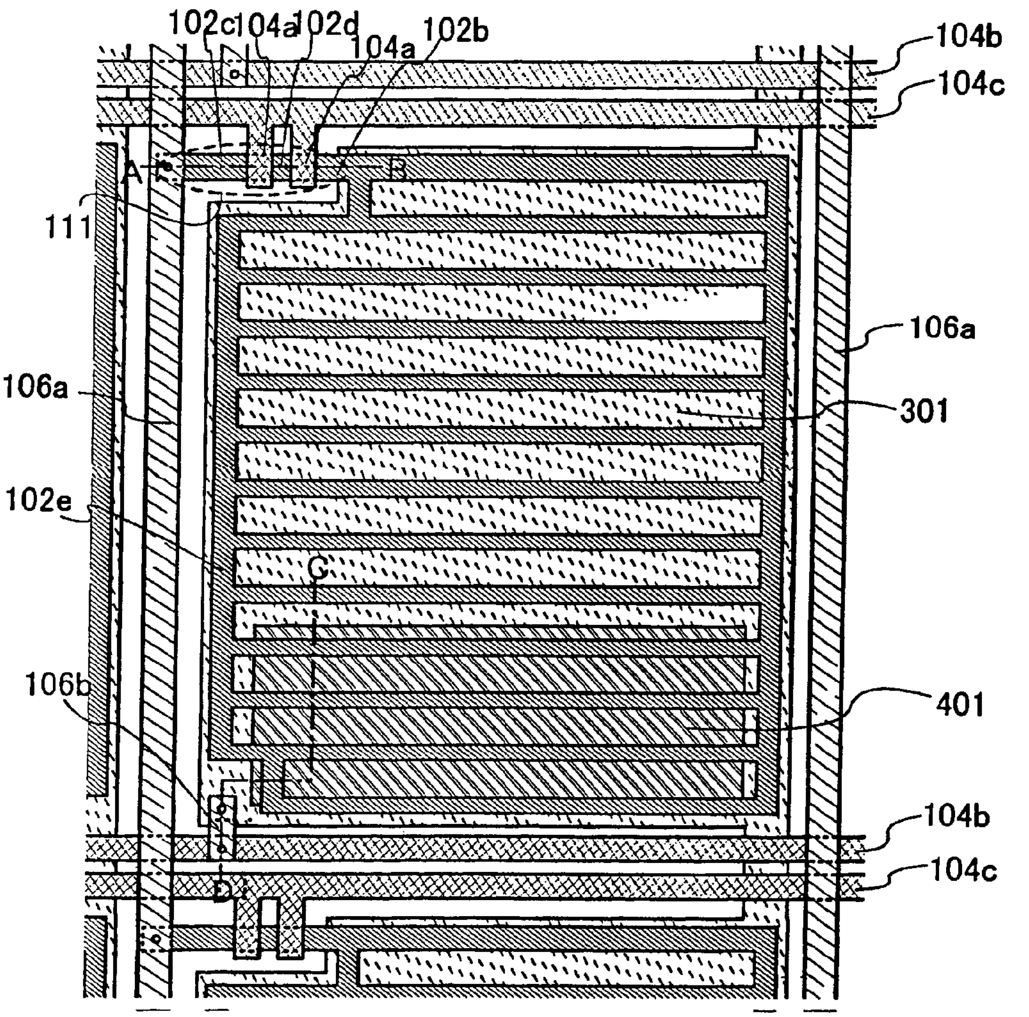
FIG. 54A is a diagram showing a pixel layout of a liquid crystal display panel of the present invention.
Figure 54B:
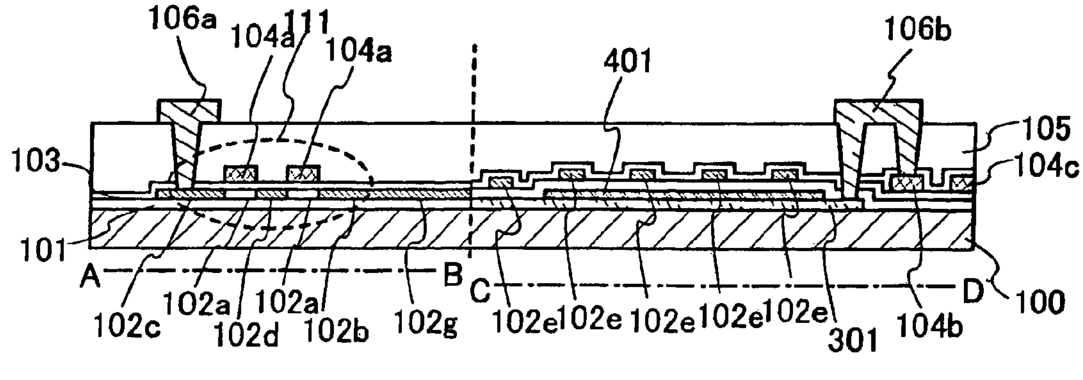
FIG. 54B is a diagram showing a cross section of a pixel of the liquid crystal display panel of the present invention.

FIG. 54A shows a pixel layout of a liquid crystal display panel to which a basic structure of the liquid crystal display panel in FIG. 4, which is described in Embodiment Mode 4, is applied. In FIG. 54A, the conductive film 401 is provided over the second electrode 301 in FIGS. 53A and 53B. In the case of using a reflective metal film as the conductive film 401, an upper portion of the conductive film 401 is a reflection region, and an upper portion of the second electrode 301, which is not provided with the conductive film 401, is a transmission region. Thus, by adjustment of an area ratio of the second electrode 301 to the conductive film 401, whether a light source from a backlight is mainly used or a light source by reflection of outside light is mainly used as light that contributes to display can be selected.

Figure 55A:
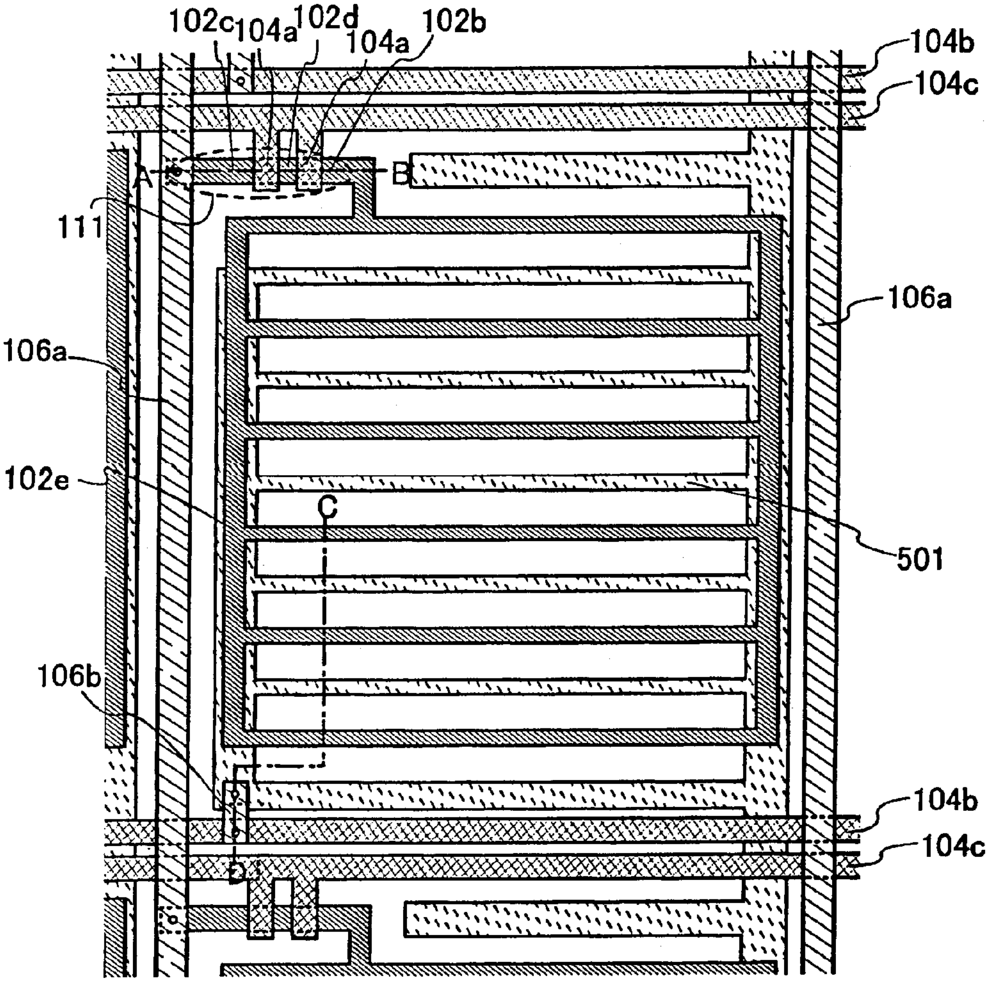
FIG. 55A is a diagram showing a pixel layout of a liquid crystal display panel of the present invention.
Figure 55B:
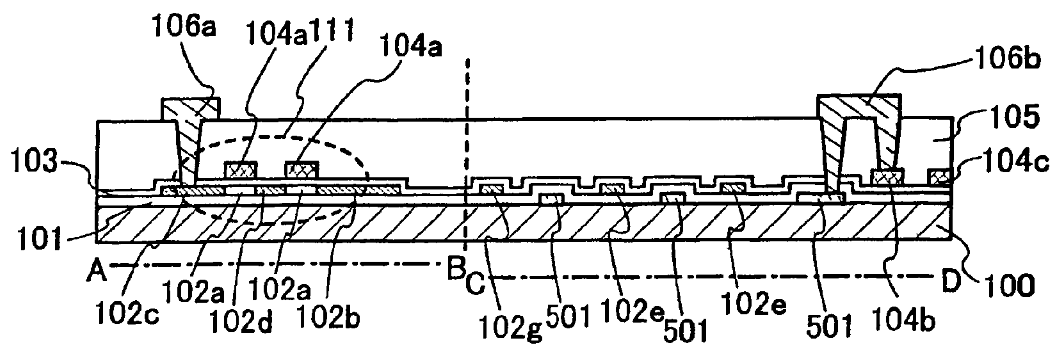
FIG. 55B is a diagram showing a cross section of a pixel of the liquid crystal display panel of the present invention.

FIG. 55A shows a pixel layout of a liquid crystal display panel to which a basic structure of the liquid crystal display panel in FIG. 5, which is described in Embodiment Mode 5, is applied. In FIG. 55A, the first electrode 102*e* which is a stretch of film with the impurity region 102*b* is provided with a rectangular slit. Then, the second electrode 501 is also provided with a rectangular slit. The slit of the first electrode 102*e* and the slit of the second electrode 501 are provided so as to deviate from each other in a short side direction. Further, the second electrode 501 is a stretch of film across pixels in a column direction. The second electrode 501 is connected to the first wiring 104*h* by the fourth wiring 106*b* through a contact hole. Thus, the second electrode 501 is provided to connect between pixels in a row direction by the first wiring 104*b* and the fourth wiring 106*b*.

Figure 56A:
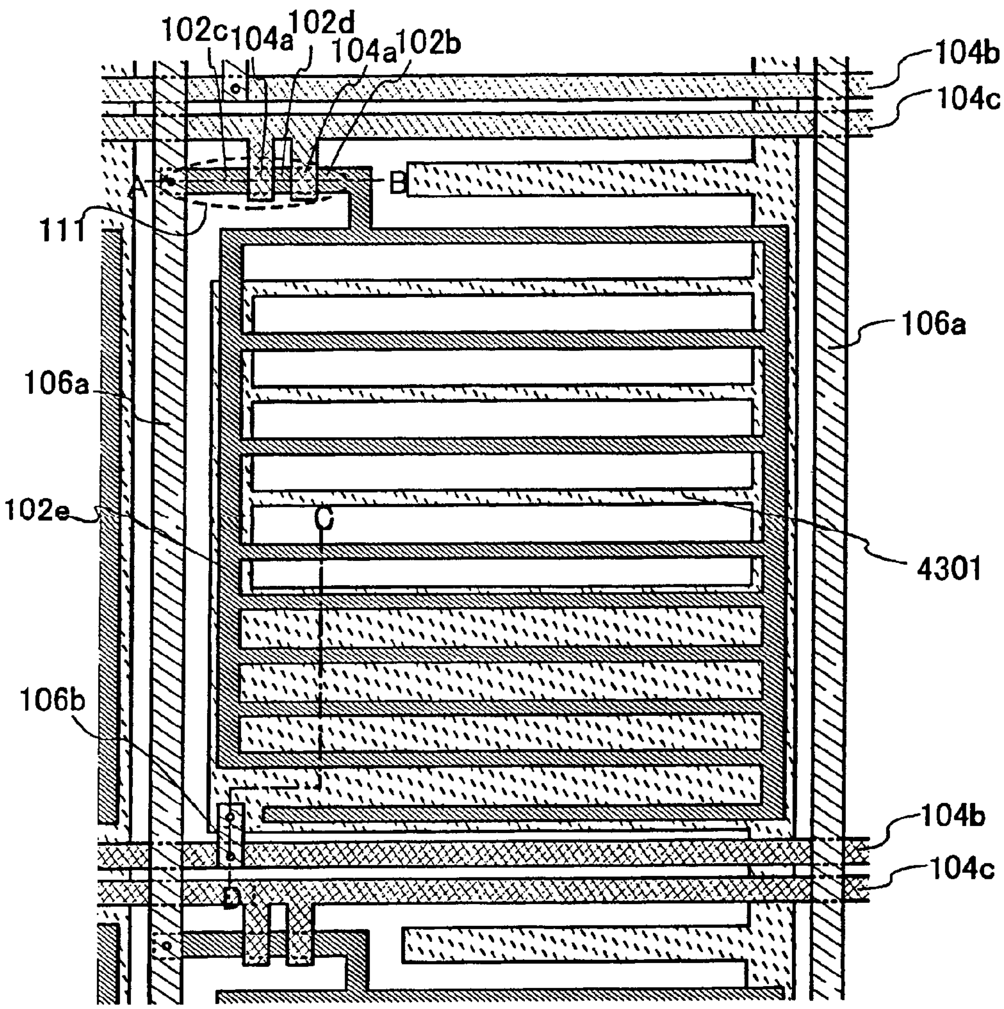
FIG. 56A is a diagram showing a pixel layout of a liquid crystal display panel of the present invention.
Figure 56B:
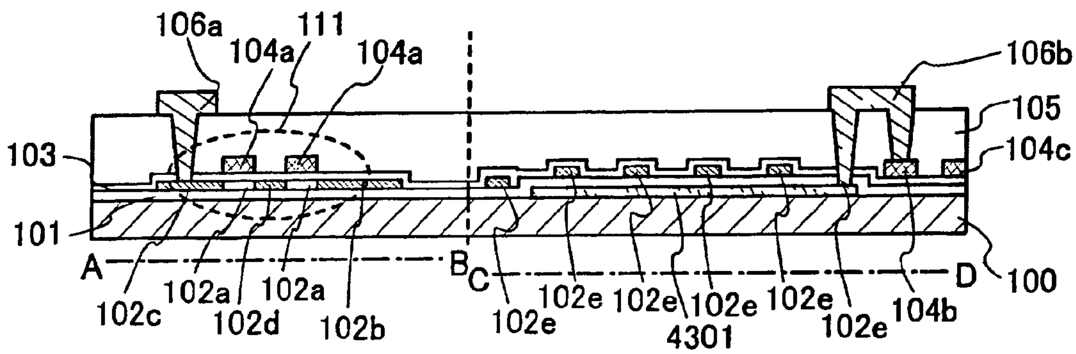
FIG. 56B is a diagram showing a cross section of a pixel of the liquid crystal display panel of the present invention.

FIG. 56A shows a pixel layout of a liquid crystal display panel to which a basic structure of the liquid crystal display panel in FIG. 43, which is described in Embodiment Mode 16, is applied. In FIG. 56A, the first electrode 102*e* which is a stretch of film with the impurity region 102*b* is provided with a rectangular slit. Then, the second electrode 4301 includes a plate-like (a shape covering an entire surface) region and a region provided with a rectangular slit. The slit of the first electrode 102*e* and the slit of the second electrode 4301 are provided so as to deviate from each other in a short side direction. The plate-like (the shape covering an entire surface) region is provided between the substrate 100 and the first insulating film 101, so as to cover an entire surface of a lower region of a plurality of slits of the first electrode 102*e*. Further, the second electrode 4301 is a stretch of film across pixels in a column direction. The second electrode 4301 is connected to the first wiring 104*b* by the fourth wiring 106*b* through a contact hole. Thus, the second electrode 4301 is provided to connect between pixels in a row direction by the first wiring 104*b* and the fourth wiring 106*b*.

Note that each of the first wiring 106*a*, the second wiring 104*c*, the third wiring 106*b*, and the fourth wiring 104*b* is formed to have one element or a plurality of elements selected from a group of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O), a compound or an alloy material including one or a plurality of the elements selected from the group as a component (for example, Indium Tin Oxide (ITO), Indium Zinc Oxide (IZO), Indium Tin Oxide containing silicon oxide (ITSO), zinc oxide (ZnO), aluminum neodymium (Al—Nd), or magnesium silver (Mg—Ag)), a substance in which these compounds are combined, or the like. Alternatively, each of the first wiring 106*a*, the second wiring 104*c*, the third wiring 106*b*, and the fourth wiring 104*b* is formed to have a compound of silicon and the above-described material (silicide) (for example, aluminum silicon, molybdenum silicon, or nickel silicide) or a compound of nitrogen and the above-described material (for example, titanium nitride, tantalum nitride, or molybdenum nitride). Note that a large amount of n-type impurities (for example, phosphorus) or p-type impurities (for example, boron) may be included in silicon (Si). The impurities are included, thereby conductivity is improved and behavior similar to a normal conductor is exhibited. Accordingly, each of the first wiring 106*a*, the second wiring 104*c*, the third wiring 106*b*, and the fourth wiring 104*b* can be easily utilized as a wiring or an electrode. Silicon may be single crystalline silicon, polycrystalline silicon (polysilicon), or amorphous silicon. With use of single crystalline silicon or polycrystalline silicon, resistance can be reduced. With use of amorphous silicon, it can be manufactured with a simple manufacturing process. Since aluminum or silver has high conductivity, signal delay can be reduced. In addition, aluminum or silver is easily etched and patterned, so that minute processing can be performed. Since copper has high conductivity, signal delay can be reduced. Molybdenum is preferable because it can be manufactured without generation of a problem that a material causes a defect even when molybdenum is in contact with semiconductor oxide such as ITO or IZO or silicon, patterning and etching are easily performed, and heat resistance is high. Titanium is preferable because it can be manufactured without generation of a problem that a material causes a defect even when titanium is in contact with semiconductor oxide such as ITO or IZO or silicon, and heat resistance is high. Tungsten is preferable because heat resistance is high. Neodymium is preferable because heat resistance is high. In particular, it is preferable to use an alloy of neodymium and aluminum because heat resistance is improved and a hillock is hardly generated in aluminum. Silicon is preferable because it can be formed at the same time as a semiconductor film included in a transistor, and heat resistance is high. Indium Tin Oxide (ITO), Indium Zinc Oxide (IZO), Indium Tin Oxide containing silicon oxide (ITSO), zinc oxide (ZnO), and silicon (Si) are preferable because these materials have light-transmitting properties and can be used for a portion which transmits light. For example, these materials can be used for a pixel electrode or a common electrode.

Note that a wiring or an electrode may be formed of the above-described material with a single-layer structure or a multi-layer structure. By formation of the wiring or the electrode with a single-layer structure, a manufacturing process can be simplified; the number of days for a process can be reduced; and cost can be reduced. Alternatively, by formation of the wiring or the electrode with a multi-layer structure, an advantage of each material is taken and a disadvantage thereof is reduced so that a wiring or an electrode with high performance can be formed. For example, by inclusion of a material with low resistance (for example, aluminum) in a multi-layer structure, resistance in the wiring can be reduced. In addition, by inclusion of a material with high heat resistance, for example, by employment of a stacked-layer structure in which a material with low heat resistance and having a different advantage is sandwiched with materials with high heat resistance, heat resistance in the wiring or the electrode as a whole can be improved. For example, it is preferable that a stacked-layer structure be employed in which a layer containing aluminum is sandwiched with layers including molybdenum or titanium. Further, when there is a portion which is in direct contact with a wiring, an electrode, or the like formed of another material, they may be adversely affected each other. For example, in some cases, one material enters the other material and changes property thereof, so that an original purpose cannot be achieved; there occurs a problem in manufacturing, so that normal manufacturing cannot be performed. In such the case, a certain layer is sandwiched or covered with different layers, thereby the problem can be solved. For example, when Indium Tin Oxide (ITO) is to be in contact with aluminum, it is preferable to interpose titanium or molybdenum therebetween. Moreover, when silicon is to be in contact with aluminum, it is preferable to interpose titanium or molybdenum therebetween.

It is preferable that a material with heat resistance higher than that of a material used for the first wiring 106*a* be used for the second wiring 104*c*. This is because the second wiring 104*c* is often disposed in a higher-temperature state in a manufacturing process.

It is preferable that a material with resistance lower than that of a material used for the second wiring 104*c* be used for the first wiring 106*a*. This is because although only a signal of a binary value of an H signal and an L signal is supplied to the second wiring 104*c*, an analog signal is supplied to the first wiring 106*a* to contribute to display. Therefore, it is preferable to use a material with low resistance for the first wiring 106*a* so as to supply an accurate signal.

Although the fourth wiring 104*b* is not necessarily provided, a potential of a common electrode in each pixel can be stabilized by provision of the fourth wiring 104*b*. Note that although the fourth wiring 104*b* is provided in almost parallel to the second wiring 104*b* in FIG. 45A, the present invention is not limited to this. The fourth wiring 104*b* may be provided in almost parallel to the first wiring 106*a*. In that case, the fourth wiring 104*b* is preferably formed of the same material as the first wiring 106*a*.

Note that the fourth wiring 104*b* is preferably provided in almost parallel to a gate line because an aperture ratio can be increased and layout can be efficiently performed.

Embodiment 2

Figure 49A:
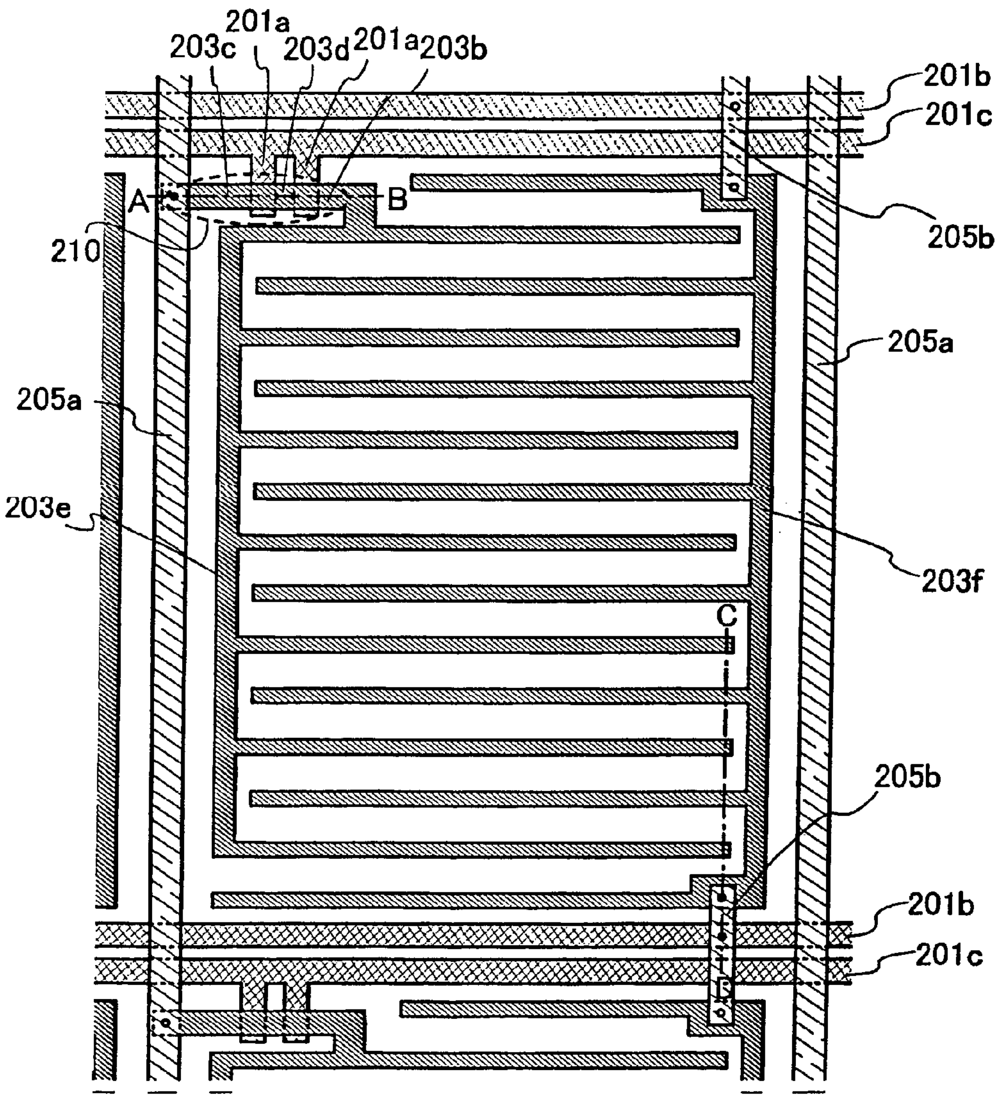
FIG. 49A is a diagram showing a pixel layout of a liquid crystal display panel of the present invention.

Next, description is made of a pixel layout to which a basic structure of the liquid crystal display panel of Embodiment Mode 1 of the present invention is applied. FIG. 49A is a plan view showing a pixel layout of the liquid crystal display panel of Embodiment 2 of the present invention. This liquid crystal display panel is used for a display device which controls an orientation of liquid crystals by an IPS (In-Plane Switching) mode.

Note that FIG. 49A shows only one pixel in order to explain a structure of the pixel in detail; however, in a pixel portion of a display panel, a plurality of pixels are arranged in matrix.

The pixel portion of the display panel of Embodiment 2 of the present invention includes a plurality of signal lines (first wirings 205*a* in the pixel of FIG. 49A) and a plurality of scan lines (second wirings 201*c* in the pixel of FIG. 49A). Then, in the pixel portion, the plurality of scan lines are arranged in parallel with each other and are separate from each other. In addition, in the pixel portion, the plurality of signal lines are arranged in parallel with each other in a direction perpendicular to the plurality of scan lines and separated from each other.

Further, in the pixel portion, a plurality of pixels are arranged in matrix corresponding to the scan lines and the signal lines, and each pixel is connected to any one of the scan lines and any one of the signal lines.

Each pixel includes at least one transistor (the transistor 210 in the pixel of FIG. 49A), a pixel electrode (the first electrode 203*e* in the pixel of FIG. 49A), and a common electrode (the second electrode 203*f* in the pixel of FIG. 49A).

The semiconductor layer (a semiconductor layer functioning as a channel formation region, a source region, and a drain region) of the transistor 210 and the first electrode 203*e* of each pixel are a stretch of film.

A region projecting from the second wiring 201*c* functions as the gate electrode 201*a*, and the semiconductor layer overlapping with the gate electrode 201*a* includes the channel formation region of the transistor 210. Further, one of the impurity region 203*b* and the impurity region 203*c* functions as a source of the transistor 210, and the other functions as a drain thereof. Note that the transistor 210 has a so-called dual-gate structure (in which two gate electrodes are arranged alongside over the semiconductor layer); however, the present invention is not limited thereto. Alternatively, a multi-gate structure in which three or more gate electrodes are arranged alongside over the semiconductor layer or a so-called single-gate structure (in which one gate electrode is provided for one transistor) may be employed. In the case of the single gate structure, the impurity region 203*d* is omitted.

In the transistor 210, the impurity region 203*c* to be one of a source and a drain is connected to the first wiring 205*a* through a contact hole, and the first electrode 203*e* and the impurity region 203*b* to be the other of the source and the drain are a stretch of film.

In FIG. 49A, the semiconductor layer of the transistor 210 and the first electrode 203*e* are a stretch of film; however, the liquid crystal display panel of Embodiment 1 of the present invention is not limited thereto. The semiconductor layer of the transistor 210 and the first electrode 203*e* are only necessary to be formed in the same step, and the semiconductor layer of the transistor 210 and the first electrode 203*e* may be electrically connected through a multilayer wiring.

Further, the second electrode 203*f* is a film formed in the same step as the semiconductor layer of the transistor 210 and the first electrode 203*e*. The second electrode 203*f* is provided to electrically connect between pixels of a plurality of pixels through the third wiring 201*b*, at the same time, electrically connected to the fourth wiring 205*b* that is arranged in parallel with and separate from the second wiring 201*c*.

Note that in FIG. 49A, the second electrode 203*f* is provided to electrically connect between pixels of a plurality of pixels through the third wiring 205*b*; however, the display panel of the liquid crystal display device of Embodiment Mode 2 of the present invention is not limited thereto. The second electrode 203*f* may be a stretch of film across the plurality of pixels. It is to be noted that since the second electrode 203*f* is patterned separately for each pixel so that electrical field concentration to the second electrode 203*f* in a manufacturing process can be relieved, electrostatic discharge (ESD) can be prevented.

The liquid crystal display panel of Embodiment 2 of the present invention is allowed as long as the semiconductor layer of the transistor 210, the first electrode 203*e*, and the second electrode 203*f* are films formed in the same step.

Further, shapes of the first electrode 203*e* and the second electrode 203*f* are not limited to the shapes shown in FIG. 49A.

Note that although FIG. 49A does not show a liquid crystal layer so that the pixel layout can be understood easily, the liquid crystal display panel of Embodiment 2 of the present invention has a liquid crystal layer. Then, in each pixel, a liquid crystal element in which molecular orientation of liquid crystal molecules is changed depending on a potential difference between the first electrode 203*e* provided independently for each pixel and the second electrode 203*f* provided to connect between pixels of a plurality of pixels in the pixel portion.

Figure 49B:
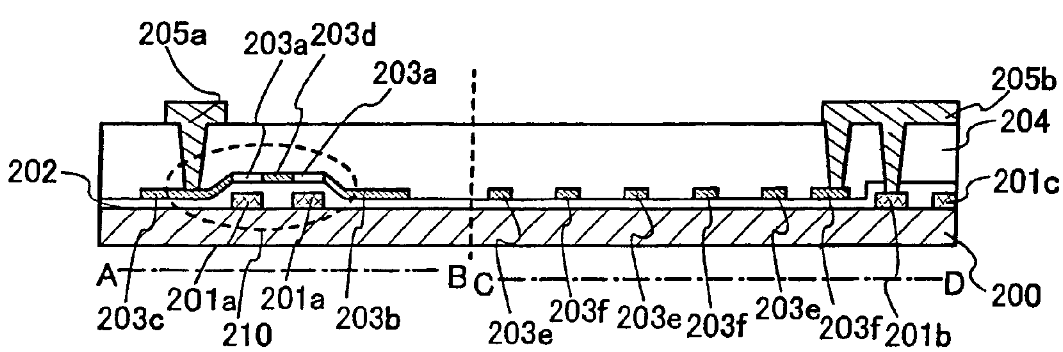
FIG. 49B is a diagram showing a cross section of a pixel of the liquid crystal display panel of the present invention.

Next, more specific description is made of the structure of the liquid crystal display panel of Embodiment 2 of the present invention with reference to FIG. 49B showing cross sections taken along dashed-dotted lines A-B and C-D in FIG. 49A.

A gate electrode 201*a*, a gate wiring (the third wiring 201*b*) and an auxiliary wiring (the second wiring 201*c*) are formed over the substrate 200. The second wiring 201*c* and the gate electrode 201*a* are a stretch of film, and the second wiring 201*c* is formed in the same step as the first wiring 201*b* and the gate electrode 201*a*. Also, for each of the gate electrode 201*a*, the first wiring 201*b*, and the second wiring 201*c*, an aluminum (Al) film, a copper (Cu) film, a thin film containing aluminum or copper as a main component, a chromium (Cr) film, a tantalum (Ta) film, a tantalum nitride (TaN) film, a titanium (Ti) film, a tungsten (W) film, a molybdenum (Mo) film, or the like can be used.

A gate insulating film (first insulating film 202) is formed over the gate electrode 201*a*, the first wiring 201*b*, and the second wiring 201*c*. In FIG. 49B, the first insulating film 202 is formed so as to cover the gate electrode 201*a*, the first wiring 201*b*, and the second wiring 201*c*; however, the present invention is not limited thereto. It is only necessary to form the first insulating film 202 over the gate electrode 201*a*. As the first insulating film 202, a silicon oxide film, a silicon nitride film, a silicon oxynitride film, or the like formed by a CVD method or a sputtering method can be used.

A semiconductor layer (a channel formation region 203*a*, an impurity region 203*b*, an impurity region 203*c*, and an impurity region 203*d*) of a transistor 210, and a first electrode 203*e* and a second electrode 203*f* that control molecular orientation of the liquid crystal molecules are formed over the first insulating film 202. The channel formation region 203*a*, the impurity region 203*b*, the impurity region 203*c*, the impurity region 203*d*, the first electrode 203*e*, and the second electrode 203*f* are, for example, polysilicon films, which are formed in the same step. The substrate 200 can be formed of an insulating substrate such as a glass substrate, a quartz substrate, a plastic substrate, or a ceramic substrate, or of a metal substrate, a semiconductor substrate, or the like.

In the case where the transistor 210 is an n-channel transistor, an impurity element such as phosphorus or arsenic is introduced into the impurity region 203*b*, the impurity region 203*c*, and the impurity region 203*d*. In the case where the transistor 210 is a p-channel transistor, an impurity element such as boron is introduced into the impurity region 203*b*, the impurity region 203*c* and the impurity region 203*d*.

Further, the impurity element introduced into the impurity region 203*b*, the impurity region 203*c*, and the impurity region 203*d* may also be introduced into the first electrode 203*e* and the second electrode 203*f*. The resistance of the first electrode 203*e* and the second electrode 203*f* is lowered, since an impurity is introduced thereto, which is preferable for each of the first electrode 203*e* and the second electrode 203*f* to function as an electrode.

The first electrode 203*e* and the second electrode 203*f* each have thickness of, for example, 45 nm to 60 nm, and have sufficiently high light transmittance. In order to further improve the light transmittance, it is desirable to set thickness of the first electrode 203*e* and the second electrode 203*f* to be 40 nm or less.

Each of the first electrode 203*e* and the second electrode 203*f* may be an amorphous silicon film or an organic semiconductor film. In that case, an amorphous silicon film or an organic semiconductor film is used for the semiconductor layer of the transistor 210.

The semiconductor layer (the channel formation region 203*a*, the impurity region 203*b*, the impurity region 203*c*, and the impurity region 203*d*) of the transistor 210, and the first electrode 203*e* and the second electrode 203*f* that control molecular orientation of the liquid crystal molecules are formed in the same step. In this case, the number of steps can be reduced, so that the manufacturing cost can be reduced. In addition, it is desirable that impurity elements of the same type be introduced into the impurity region 203*b*, the impurity region 203*c*, the impurity region 203*d*, the first electrode 203*e*, and the second electrode 203*f*. This is because when the impurity elements of the same type are introduced, the impurity elements can be introduced without a problem even if the impurity region 203*b*, the impurity region 203*c*, the impurity region 203*d*, the first electrode 203*e*, and the second electrode 203*f* are provided close to each other, so that dense layout becomes possible. It is desirable to add impurity elements of either P-type or N-type because the manufacturing cost can be low compared with the case in which impurity elements of different types are introduced.

An interlayer insulating film (second insulating film 204) is formed over the first insulating film 202, the semiconductor layer (the channel formation region 203*a*, the impurity region 203*b*, the impurity region 203*c*, and the impurity region 203*d*) of the transistor 210, and the first electrode 203*e* and the second electrode 203*f*. The second insulating film 204 preferably has a stacked-layer structure in which a protective film and a planarization film are stacked in this order. For the protective film, an inorganic insulating film is suitable. As an inorganic insulating film, a silicon nitride film, a silicon oxide film, a silicon oxynitride film, or a film formed by stacking these films can be used. As a planarization film, a resin film is suitable. For a resin film, polyimide, polyamide, acrylic, polyimide amide, epoxy, or the like can be used.

A signal line (a third wiring 205*a*) and a connection wiring (a fourth wiring 205*b*) are formed over the second insulating film 204. The third wiring 205*a* is connected to the impurity region 203*c* through holes (contact holes) formed in the second insulating film 204 and the first insulating film 202. The fourth wiring 205*b* is connected to the first wiring 201*b* through a hole formed in the second insulating film 204 and the first insulating film 202, and also connected to the second wiring 203*f* through the hole formed in the second insulating film 204. For each of the third wiring 205*a* and the fourth wiring 205*b*, a titanium (Ti) film, an aluminum (Al) film, a copper (Cu) film, an aluminum film containing Ti, or the like can be used. Preferably, copper having low resistance may be used.

The first orientation film is formed over the third wiring 205*a*, the fourth wring 205*b*, and the second insulating film 204. Then, a surface of the substrate 200, on which the first orientation film is formed, and a surface of the counter substrate, on which the second orientation film is formed, are provided so as face each other, and the liquid crystal layer is provided between the substrate 200 and the counter substrate. Thus, the liquid crystal display panel of Embodiment 2 of the present invention is completed.

Next, a manufacturing method of a liquid crystal display device of Embodiment 2 of the present invention is described. First, a conductive film is formed over the substrate 200, and is patterned. Thus, two gate electrodes 201*a* are formed. In addition, the first wiring 201*b* and the second wiring 201*c* are formed at the same time as the gate electrode 201*a*.

Note that as the conductive film, a film formed of aluminum (Al), nickel (Ni), tungsten (W), molybdenum (Mo), titanium (Ti), tantalum (Ta), neodymium (Nd), platinum (Pt), gold (Au), silver (Ag), or the like; a film formed of an alloy thereof; or a stacked-layer film thereof can be used. Alternatively, a silicon (Si) film to which an N-type impurity is introduced may be used.

The gate insulating film (first insulating film 202) is formed so as to cover the gate electrode 201*a*, the first wiring 201*b*, and the second wiring 201*c*. The first insulating film 202 is, for example, a silicon oxynitride film or a silicon oxide film, and formed by a plasma CVD method. Note that the first insulating film 202 may be formed of a silicon nitride film, or a multilayer film containing silicon nitride and silicon oxide.

Subsequently, a semiconductor film such as a polysilicon film or an amorphous silicon film is formed over the first insulating film 202, and a resist pattern (not shown) is formed over this semiconductor film. With use of this resist pattern as a mask, the semiconductor film is selectively etched. Thus, the semiconductor film (the channel formation region 203*a*, the impurity region 203*b*, the impurity region 203*c*, and the impurity region 203*d*), the first electrode 203*e*, and the second electrode 203*f* are formed in the same step. After that, the resist pattern is removed.

Subsequently, impurities are added to the impurity region 203*b*, the impurity region 203*c*, and the impurity region 203*d*. Accordingly, impurities are included in the impurity region 203*b*, the impurity region 203*c*, and the impurity region 203*d*. Note that an N-type impurity element and a P-type impurity element may be added individually, or an N-type impurity element and a P-type impurity element may be added concurrently in a specific region. It is to be noted that in the latter case, an additive amount of one of an N-type impurity element and a P-type impurity element is set to be larger than that of the other.

Further, an impurity element may be added to the first electrode 203*e* and the second electrode 203*f* in a step of forming the impurity regions. Thus, the first electrode 203*e* and the second electrode 203*f* can be formed concurrently with the impurity region 203*b*, the impurity region 203*c*, and the impurity region 203*d*. Therefore, the number of steps can be prevented from being increased, so that the manufacturing cost can be reduced.

The second insulating film 204 is formed over the semiconductor film (the channel formation region 203*a*, the impurity region 203*b*, the impurity region 203*c*, and the impurity region 203*d*), the first electrode 203*e*, the second electrode 203*f*, and the first insulating film 202. The second insulating film 204 is, for example, a silicon oxynitride film or a silicon oxide film, and formed by a plasma CVD method. Note that the second insulating film 204 may be formed of a silicon nitride film, or a multilayer film containing silicon nitride and silicon oxide.

Holes (contact holes) are formed in the second insulating film 204. Subsequently, a conductive film (such as a metal film) is formed over the second insulating film 204 and in the contact holes. Then, the metal film is patterned. Thus, the third wiring 205*a* and the fourth wiring 205*b* are formed. Note that as the conductive film, a film formed of aluminum (Al), nickel (Ni), tungsten (W), molybdenum (Mo), titanium (Ti), tantalum (Ta), neodymium (Nd), platinum (Pt), gold (Au), silver (Ag), or the like; a film formed of an alloy thereof; or a stacked-layer film thereof can be used. Alternatively, silicon (Si) into which an N-type impurity is introduced may be used.

Subsequently, the first orientation film is formed, and liquid crystal is sealed between the first orientation film and a counter substrate on which the second orientation film is formed. Thus, the liquid crystal display panel is formed.

According to Embodiment 2 in the present invention, in the liquid crystal display device in which the orientation of the liquid crystal is controlled by the IPS mode, the first electrode 203*e* and the second electrode 203*f* are formed of a polysilicon film to which an impurity is introduced, and formed in the same step as the semiconductor layer (the source, the drain, and the channel formation region) of the transistor. Therefore, the number of manufacturing steps and the manufacturing cost can be reduced compared with the case in which the common electrode is formed of ITO.

Although a so-called top gate transistor in which the gate electrode is provided above the channel formation region is described in this embodiment, the present invention is not particularly limited thereto. A so-called bottom gate transistor in which the gate electrode is provided below the channel formation region or a transistor having a structure in which the gate electrodes are provided over and below the channel formation region may be formed.

Note that a capacitor for holding a potential difference between the first electrode 203*e* and the second electrode 203*f* may be provided.

Figure 50A:
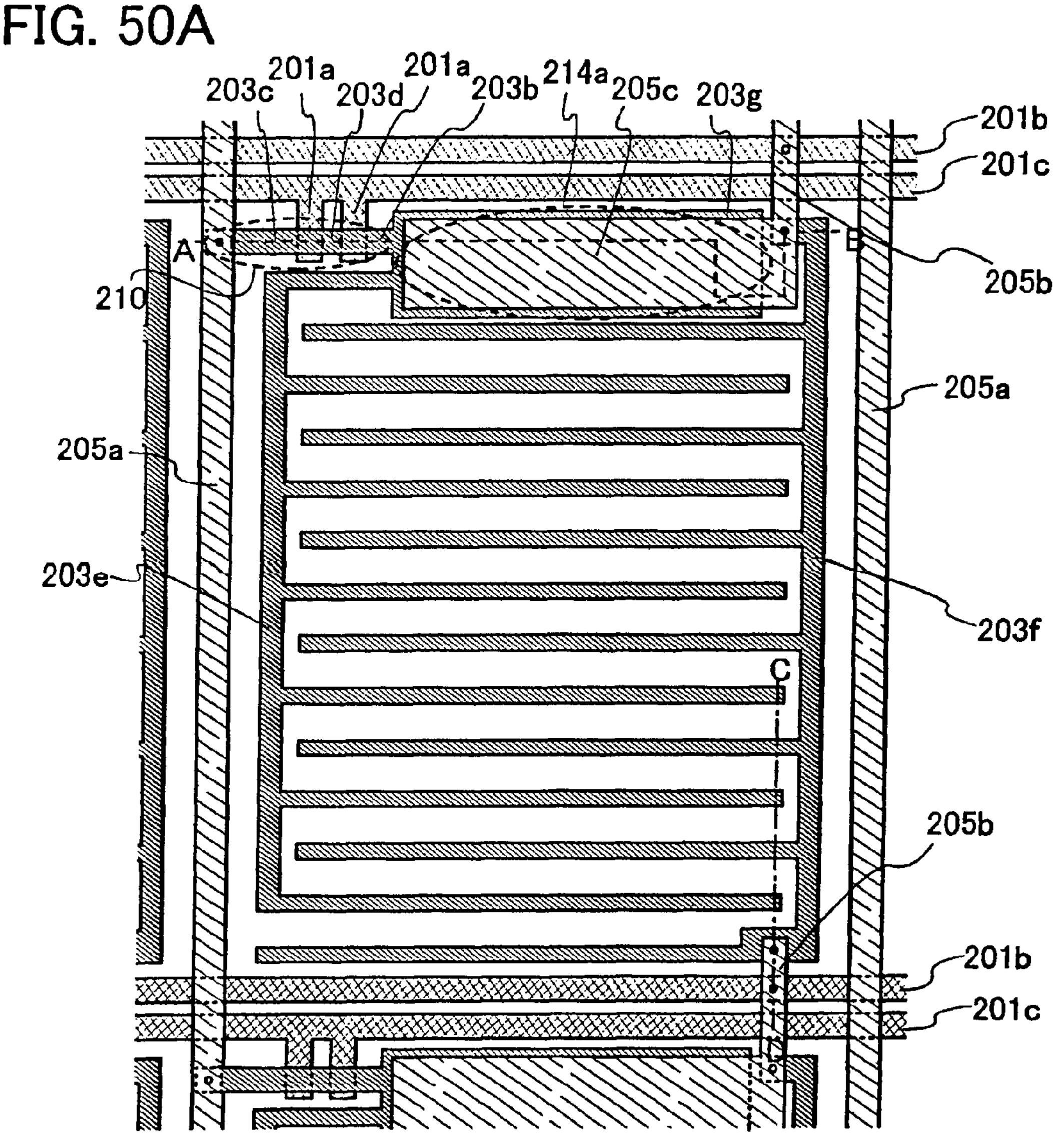
FIG. 50A is a diagram showing a pixel layout of a liquid crystal display panel of the present invention.
Figure 50B:
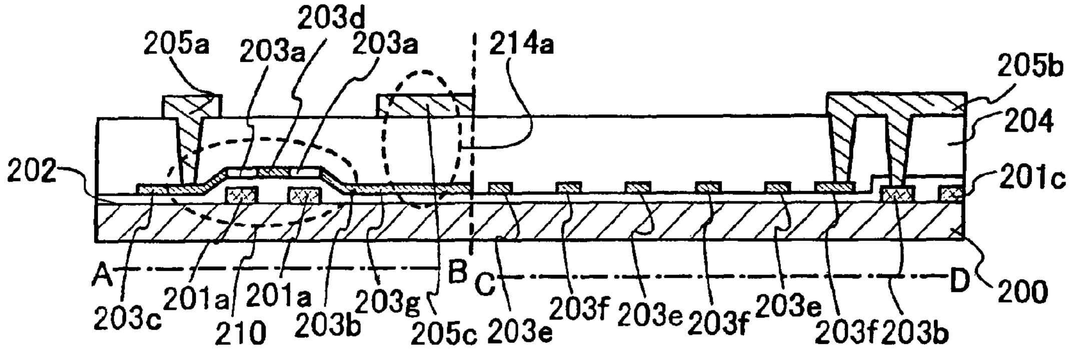
FIG. 50B is a diagram showing a cross section of a pixel of the liquid crystal display panel of the present invention.

For example, as shown in FIGS. 50A and 50B, a capacitor 214*a*, which has as one electrode an electrode 203*g* formed by extension of the impurity region 203*b*, and has as the other electrode the electrode 205*c* formed by extension of the fourth wiring 205*b* may be provided.

Figure 51A:
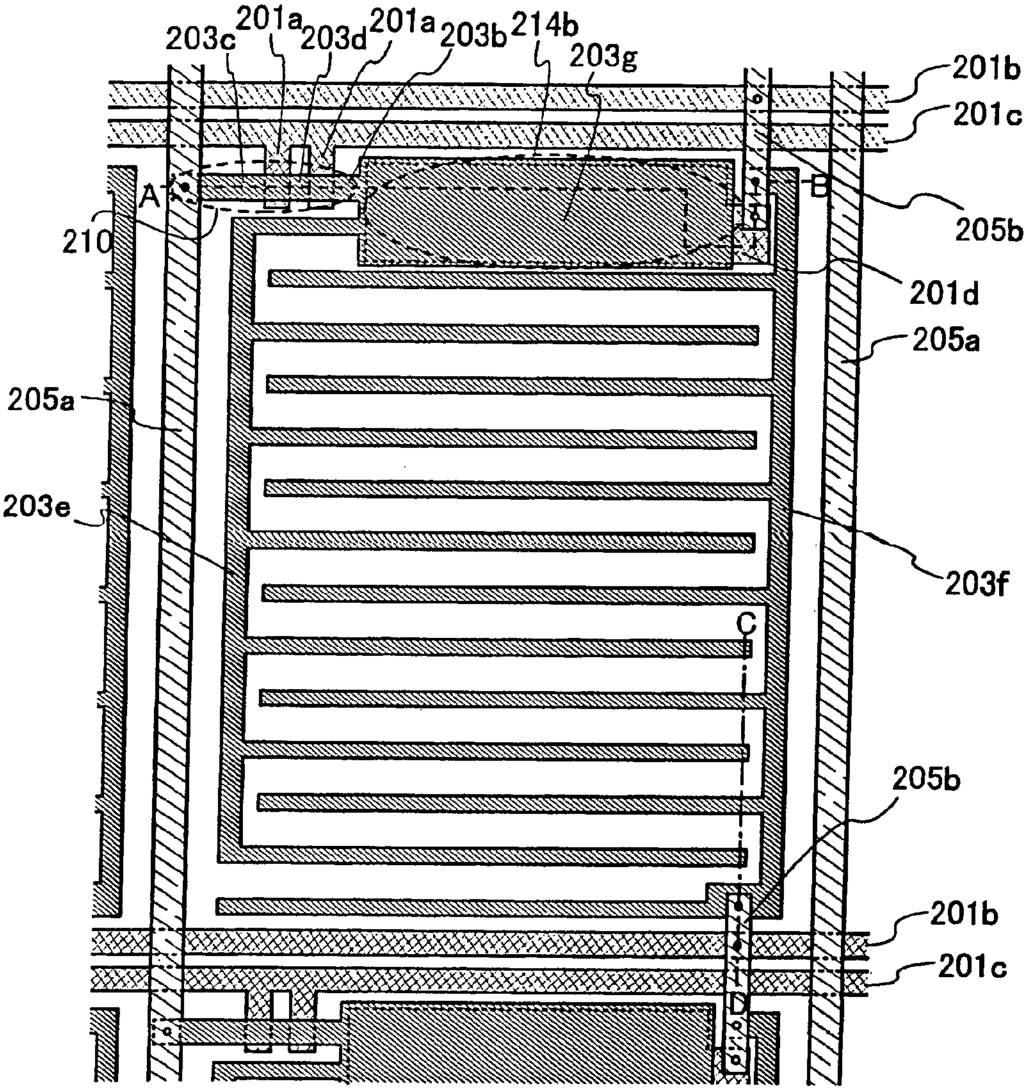
FIG. 51A is a diagram showing a pixel layout of a liquid crystal display panel of the present invention.
Figure 51B:
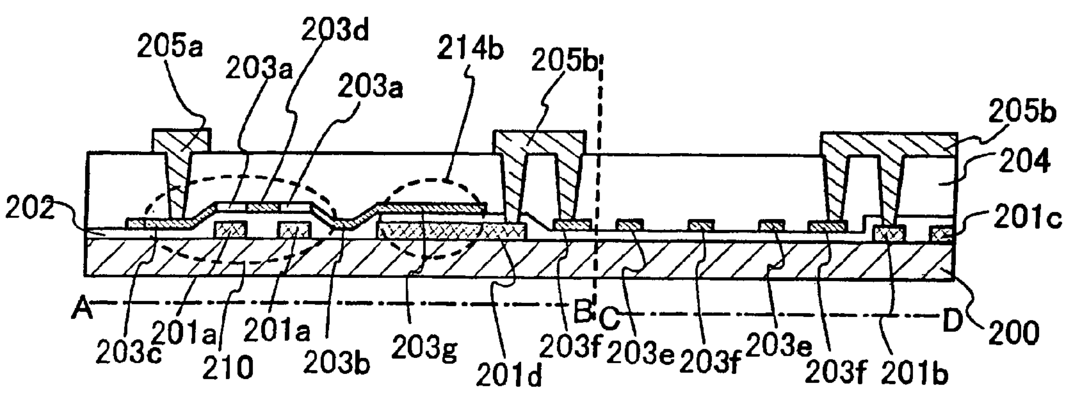
FIG. 51B is a diagram showing a cross section of a pixel of the liquid crystal display panel of the present invention.

Further, as shown in FIGS. 51A and 51B, a capacitor 214*b* may be provided, which has as one electrode the electrode 203*g* formed by extension of the impurity region 203*b* of the transistor 210, and has as the other electrode the electrode 201*d* formed from a conductive film that is formed in the same step as the gate electrode 201*a*, the first wiring 201*b*, and the second wiring 201*c* may be provided. In that case, the electrode 201*d* is connected to the second electrode 203*f* through a contact hole by the fourth wiring 205*b*.

Figure 52A:
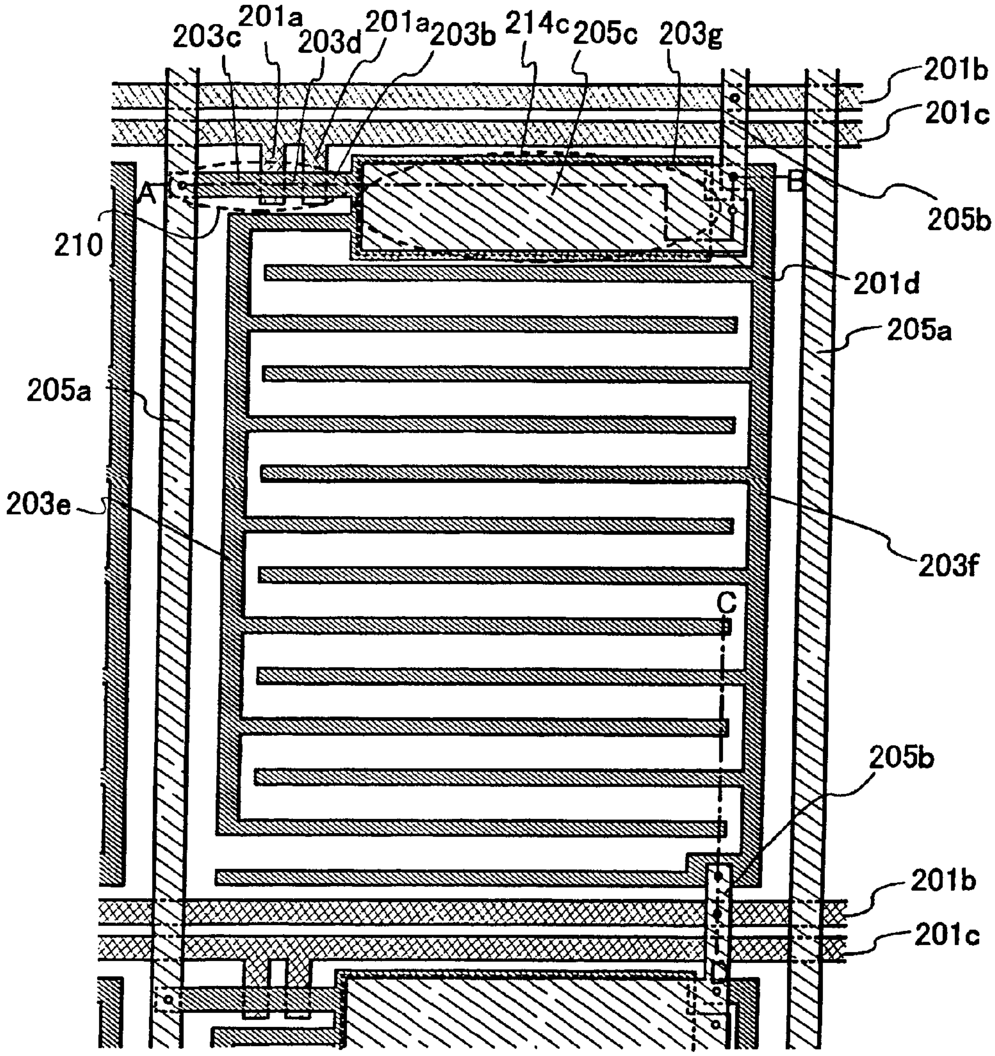
FIG. 52A is a diagram showing a pixel layout of a liquid crystal display panel of the present invention.
Figure 52B:
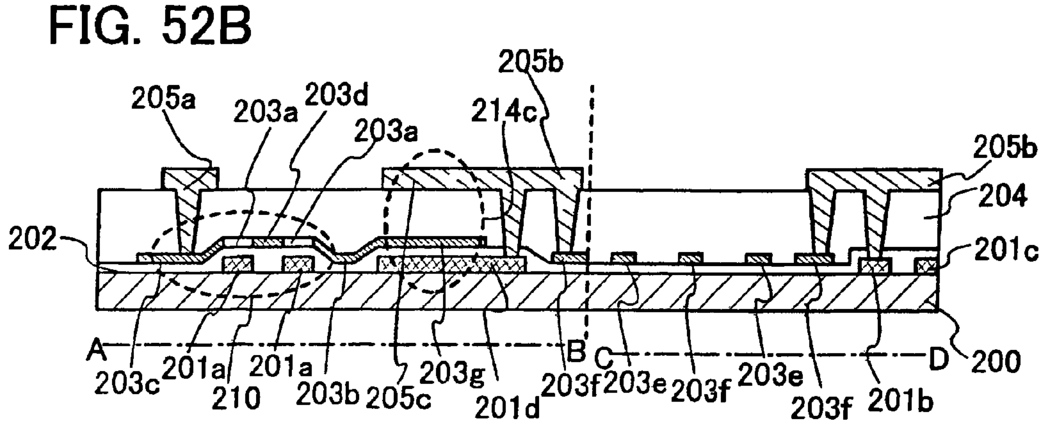
FIG. 52B is a diagram showing a cross section of a pixel of the liquid crystal display panel of the present invention.

Further, as shown in FIGS. 52A and 52B, a capacitor 214*c* may be provided, which has as one electrode an electrode 205*c* formed by extension of the fourth wiring 205*b*, and the electrode 201*d* formed from a conductive film that is formed in the same step as the gate electrode 201*a*, the first wiring 201*b*, and the second wiring 201*c*, and has as the other electrode the electrode 203*g* formed by extension of the impurity region 203*b* of the transistor 210 may be provided. In that case, the electrode 205*c* and the electrode 201*d* are connected through a contact hole, and the electrode 205*c* and the second electrode 203*f* are connected by the fourth wiring 205*b* through a contact hole.

Figure 57A:
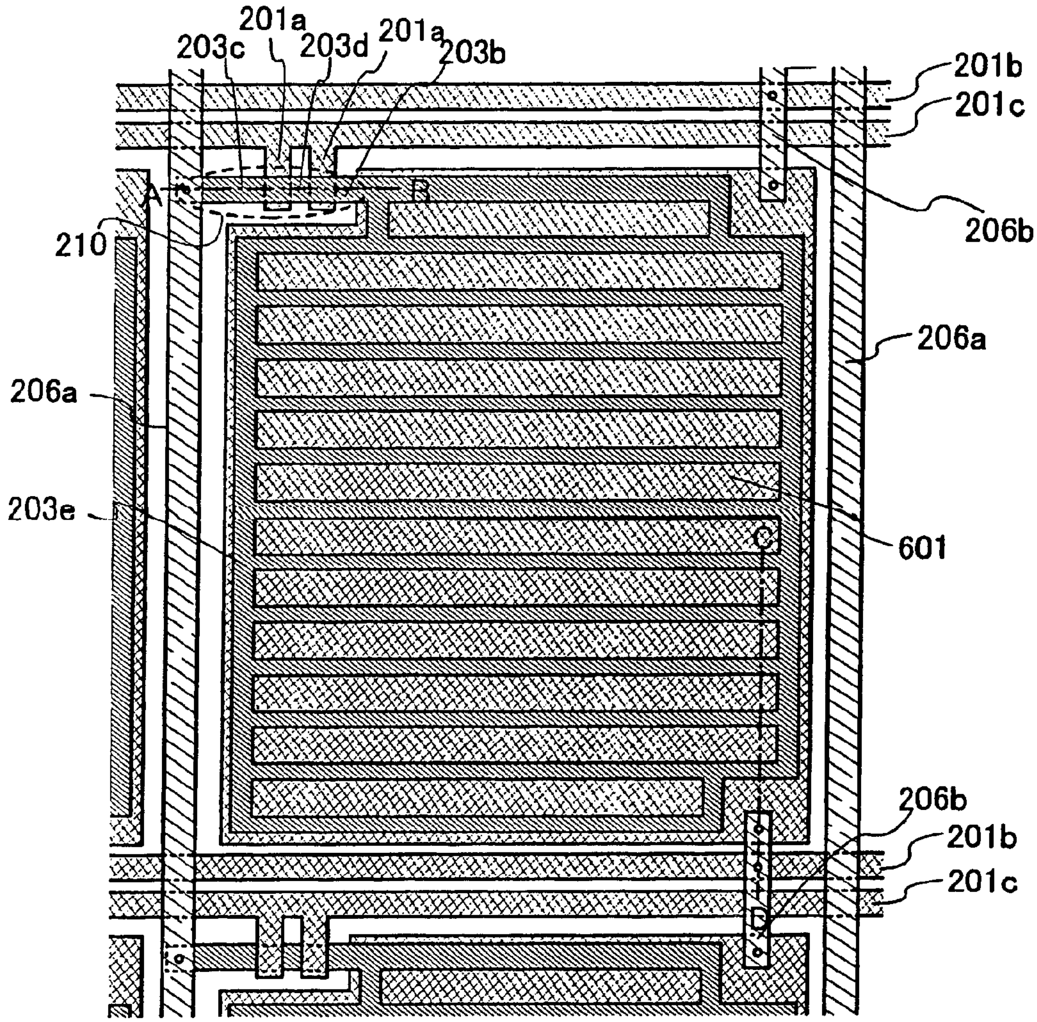
FIG. 57A is a diagram showing a pixel layout of a liquid crystal display panel of the present invention.

FIG. 57A shows a pixel layout of a liquid crystal display panel to which a basic structure of the liquid crystal display panel in FIG. 6, which is described in Embodiment Mode 7, is applied. In FIG. 57A, the first electrode 203*e* which is a stretch of film with the impurity region 203*b* is provided with a slit. Then, the second electrode 601 is provided between the substrate 500 and the first insulating film 202, so as to cover an entire surface of a lower region of the first electrode 203*e* of each pixel. The second electrode 601 is connected to another second electrode 601 of each of adjacent pixels provided in a column direction by the fourth wiring 206*b* through a contact hole. Thus, the second electrode 601 is provided to connect between pixels in a row direction by the first wiring 201*b* and the fourth wiring 206*b*.

Figure 57B:
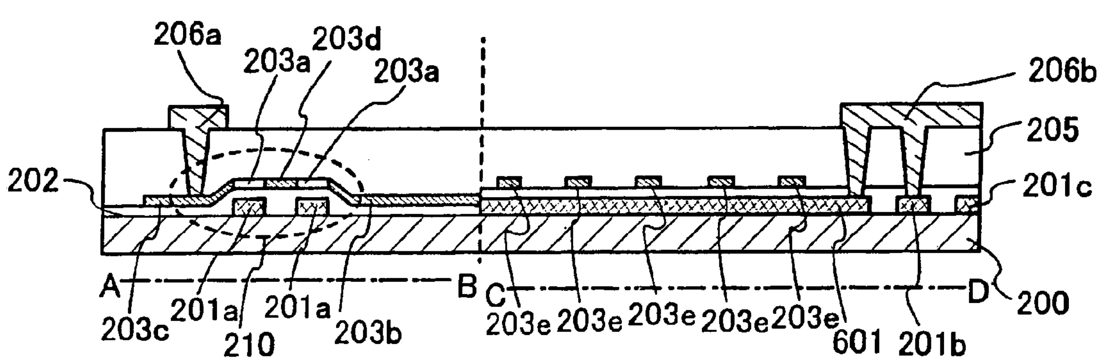
FIG. 57B is a diagram showing a cross section of a pixel of the liquid crystal display panel of the present invention.
Figure 58A:
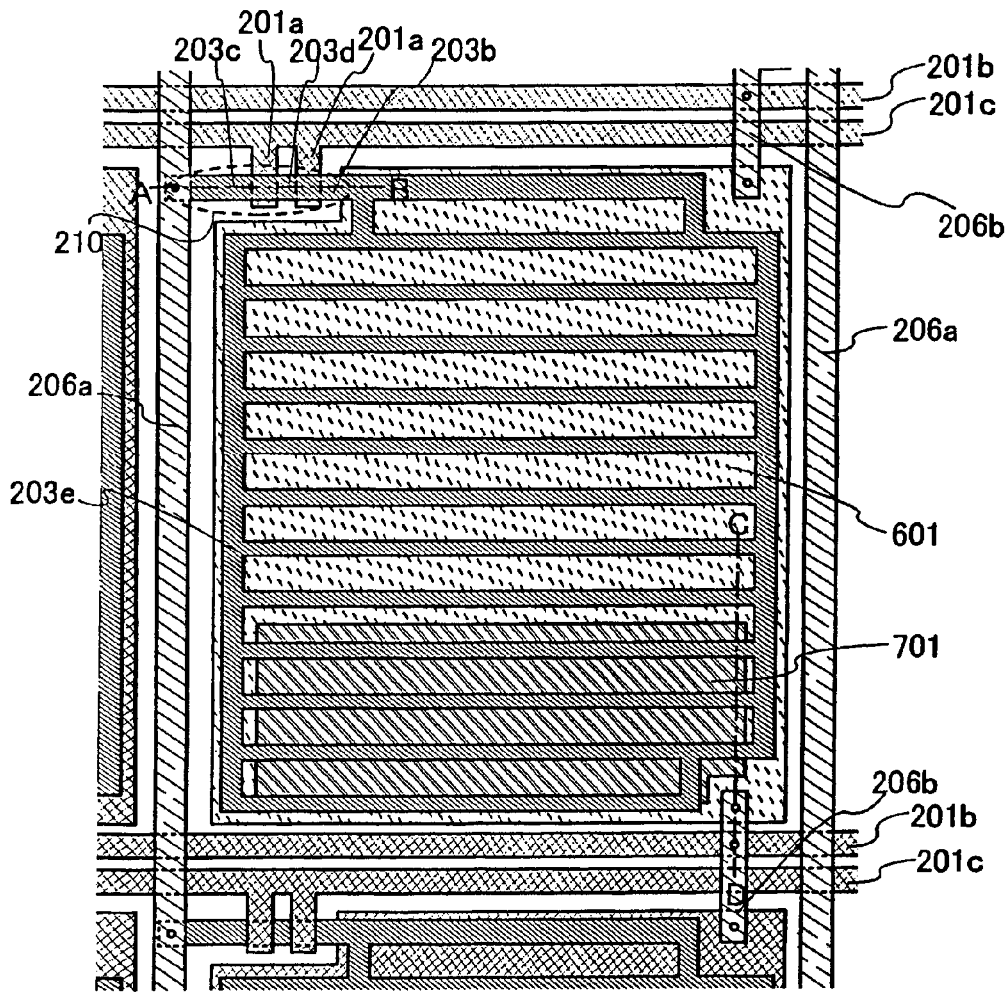
FIG. 58A is a diagram showing a pixel layout of a liquid crystal display panel of the present invention.
Figure 58B:
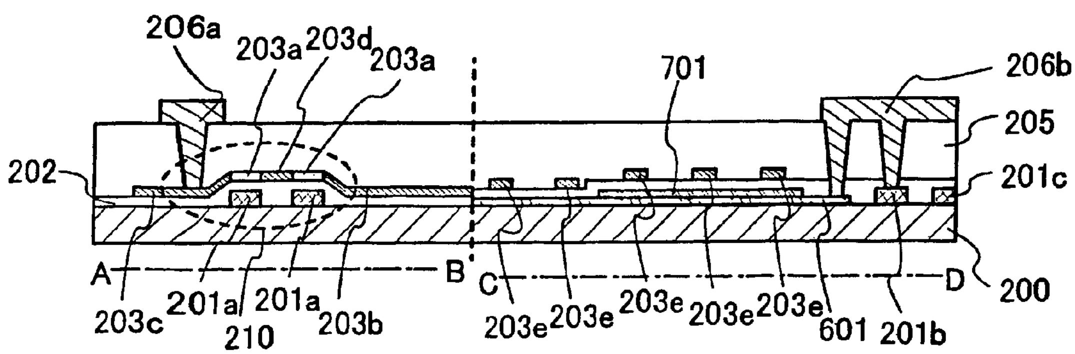
FIG. 58B is a diagram showing a cross section of a pixel of the liquid crystal display panel of the present invention.

FIG. 58A shows a pixel layout of a liquid crystal display panel to which a basic structure of the liquid crystal display panel in FIG. 7, which is described in Embodiment Mode 8, is applied. In FIG. 58A, the conductive film 701 is provided over the second electrode 601 in FIGS. 57A and 57B. In the case of using a reflective metal film as the conductive film 701, an upper portion of the conductive film 701 is a reflection region, and an upper portion of the second electrode 601, which is not provided with the conductive film 701, is a transmission region. Thus, by adjustment of an area ratio of the second electrode 601 to the conductive film 701, whether a light source from a backlight is mainly used or a light source by reflection of outside light is mainly used as light that contributes to display can be selected.

Figure 59A:
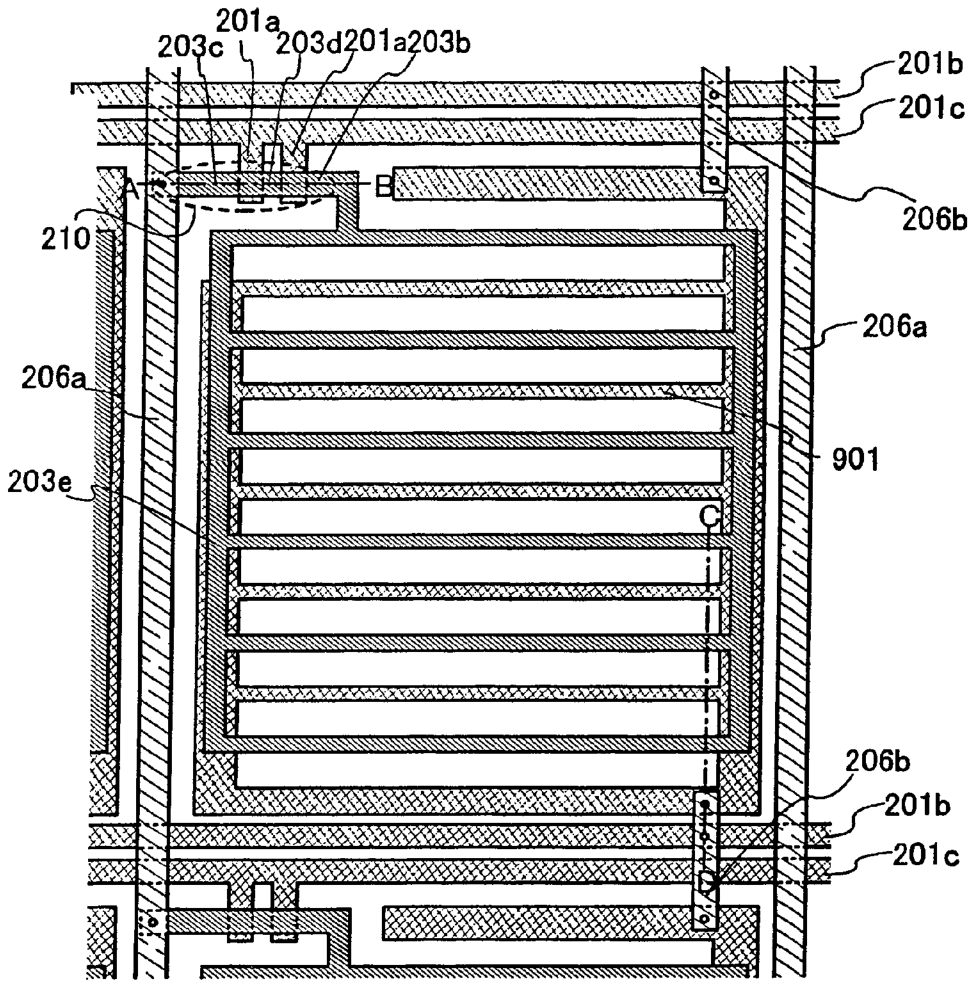
FIG. 59A is a diagram showing a pixel layout of a liquid crystal display panel of the present invention.
Figure 59B:
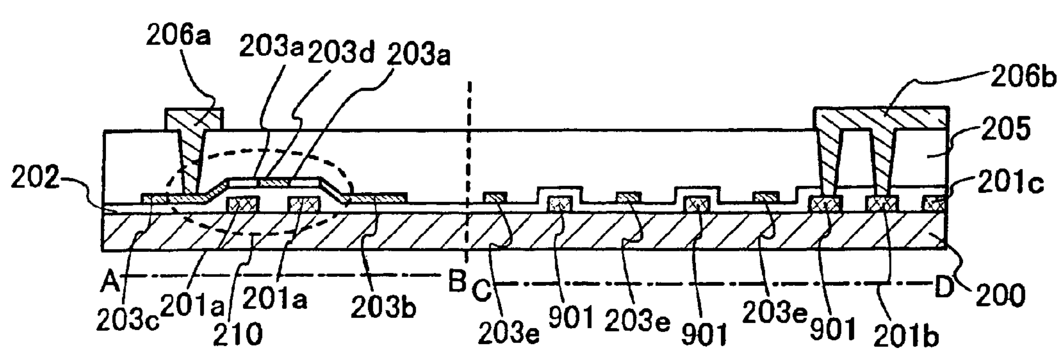
FIG. 59B is a diagram showing a cross section of a pixel of the liquid crystal display panel of the present invention.

FIG. 59A shows a pixel layout of a liquid crystal display panel to which a basic structure of the liquid crystal display panel in FIG. 9, which is described in Embodiment Mode 10, is applied. In FIG. 59A, the first electrode 203*e* which is a stretch of film with the impurity region 203*b* is provided with a rectangular slit. Then, the second electrode 901 is also provided with a rectangular slit. The slit of the first electrode 203*e* and the slit of the second electrode 901 are provided so as to deviate from each other in a short side direction. The second electrode 901 is connected to another second electrode 901 of each of adjacent pixels provided in a column direction through a contact hole by the fourth wiring 206*b*. Further, the second electrode 901 is connected to the first wiring 201*b* through a contact hole by the fourth wiring 206*b*. Thus, the second electrode 901 is provided to connect between pixels in a row direction by the first wiring 201*b* and the fourth wiring 206*b*.

Figure 60A:
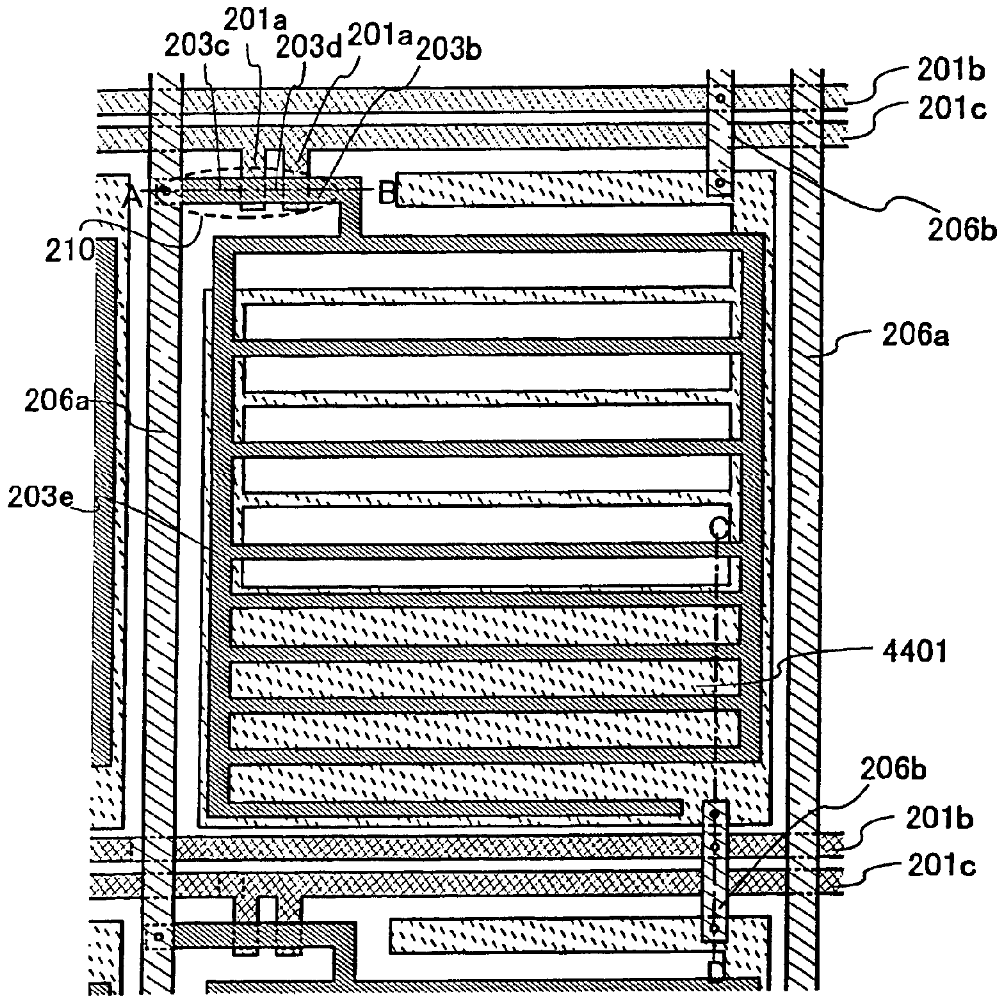
FIG. 60A is a diagram showing a pixel layout of a liquid crystal display panel of the present invention.
Figure 60B:
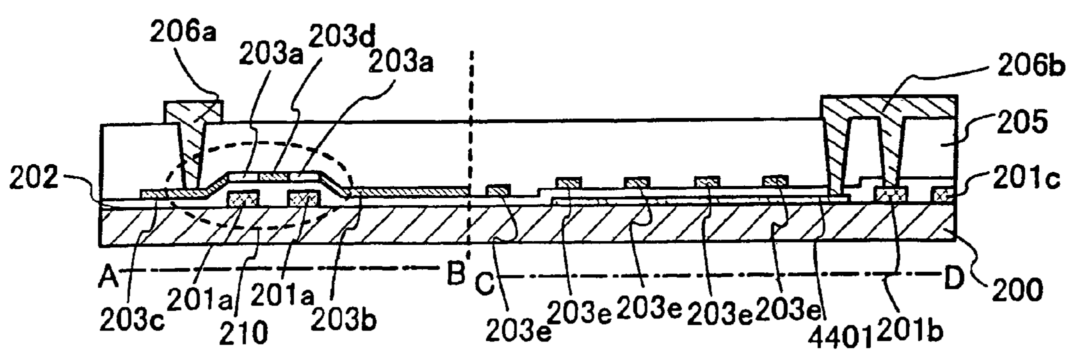
FIG. 60B is a diagram showing a cross section of a pixel of the liquid crystal display panel of the present invention.

FIG. 60A shows a pixel layout of a liquid crystal display panel to which a basic structure of the liquid crystal display panel in FIG. 44, which is described in Embodiment Mode 16, is applied. In FIG. 60A, the first electrode 203*e* which is a stretch of film with the impurity region 202*b* is provided with a rectangular slit. Then, the second electrode 4401 includes a plate-like (the shape covering the entire surface) region and a region provided with a rectangular slit. The slit of the first electrode 203*e* and the slit of the second electrode 4401 are provided so as to deviate from each other in a short side direction. The plate-like (a, shape covering an entire surface) region is provided between the substrate 200 and the first insulating film 201, so as to cover an entire surface of a lower region of a plurality of slits of the first electrode 203*e*. The second electrode 4401 is connected to the second electrode 4401 of each of adjacent pixels provided in a column direction through a contact hole by the fourth wiring 206*b*. Further, the second electrode 4401 is connected to the first wiring 201*b* through a contact hole by the fourth wiring 206*b*. Thus, the second electrode 4401 is provided to connect between pixels in a row direction by the first wiring 201*b* and the fourth wiring 206*b*.

Note that each of the first wiring 205*a*, the second wiring 201*c*, the third wiring 201*b*, and the fourth wiring 205*b* is formed to have one element or a plurality of elements selected from a group of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O), a compound or an alloy material including one or a plurality of the elements selected from the group as a component (for example, Indium Tin Oxide (ITO), Indium Zinc Oxide (IZO), Indium Tin Oxide containing silicon oxide (ITSO), zinc oxide (ZnO), aluminum neodymium (Al—Nd), or magnesium silver (Mg—Ag)), a substance in which these compounds are combined, or the like. Alternatively, each of the first wiring 205*a*, the second wiring 201*c*, the third wiring 201*b*, and the fourth wiring 205*b* is formed to have a compound of silicon and the above-described material (silicide) (for example, aluminum silicon, molybdenum silicon, or nickel silicide) or a compound of nitrogen and the above-described material (for example, titanium nitride, tantalum nitride, or molybdenum nitride). Note that a large amount of n-type impurities (for example, phosphorus) or p-type impurities (for example, boron) may be included in silicon (Si).

The impurities are included, thereby conductivity is improved and behavior similar to a normal conductor is exhibited. Accordingly, each of the first wiring 205*a*, the second wiring 201*c*, the third wiring 201*b*, and the fourth wiring 205*b* can be easily utilized as a wiring or an electrode. Silicon may be single crystalline silicon, polycrystalline silicon (polysilicon), or amorphous silicon. With use of single crystalline silicon or polycrystalline silicon, resistance can be reduced. With use of amorphous silicon, it can be manufactured with a simple manufacturing process. Since aluminum or silver has high conductivity, signal delay can be reduced. In addition, aluminum or silver is easily etched and patterned, so that minute processing can be performed. Since copper has high conductivity, signal delay can be reduced. Molybdenum is preferable because it can be manufactured without generation of a problem that a material causes a defect even when molybdenum is in contact with semiconductor oxide such as ITO or IZO or silicon, patterning and etching are easily performed, and heat resistance is high. Titanium is preferable because it can be manufactured without generation of a problem that a material causes a defect even when titanium is in contact with semiconductor oxide such as ITO or IZO or silicon, and heat resistance is high. Tungsten is preferable because heat resistance is high. Neodymium is preferable because heat resistance is high. In particular, it is preferable to use an alloy of neodymium and aluminum because heat resistance is improved and a hillock is hardly generated in aluminum. Silicon is preferable because it can be formed at the same time as a semiconductor film included in a transistor, and heat resistance is high. Indium Tin Oxide (ITO), Indium Zinc Oxide (IZO), Indium Tin Oxide containing silicon oxide (ITSO), zinc oxide (ZnO), and silicon (Si) are preferable because these materials have light-transmitting properties and can be used for a portion which transmits light. For example, these materials can be used for a pixel electrode or a common electrode.

Note that a wiring or an electrode may be formed of the above-described material with a single-layer structure or a multi-layer structure. By formation of the wiring or the electrode with a single-layer structure, a manufacturing process can be simplified; the number of days for a process can be reduced; and cost can be reduced. Alternatively, by formation of the wiring or the electrode with a multi-layer structure, an advantage of each material is taken and a disadvantage thereof is reduced so that a wiring or an electrode with high performance can be formed. For example, by inclusion of a material with low resistance (for example, aluminum) in a multi-layer structure, resistance in the wiring can be reduced. In addition, by inclusion of a material with high heat resistance, for example, by employment of a stacked-layer structure in which a material with low heat resistance and having a different advantage is sandwiched with materials with high heat resistance, heat resistance in the wiring or the electrode as a whole can be improved. For example, it is preferable that a stacked-layer structure be employed in which a layer containing aluminum is sandwiched with layers including molybdenum or titanium. Further, when there is a portion which is in direct contact with a wiring, an electrode, or the like formed of another material, they may be adversely affected each other. For example, in some cases, one material enters the other material and changes property thereof, so that an original purpose cannot be achieved; there occurs a problem in manufacturing, so that normal manufacturing cannot be performed. In such the case, a certain layer is sandwiched or covered with different layers, thereby the problem can be solved. For example, when Indium Tin Oxide (ITO) is to be in contact with aluminum, it is preferable to interpose titanium or molybdenum therebetween. Moreover, when silicon is to be in contact with aluminum, it is preferable to interpose titanium or molybdenum therebetween.

It is preferable that a material with heat resistance higher than that of a material used for the first wiring 205*a* be used for the second wiring 201*c*. This is because the second wiring 201*c* is often disposed in a higher-temperature state in a manufacturing process.

It is preferable that a material with resistance lower than that of a material used for the second wiring 201*c* be used for the first wiring 205*a*. This is because although only a signal of a binary value of an H signal and an L signal is supplied to the second wiring 201*c*, an analog signal is supplied to the first wiring 205*a* to contribute to display. Therefore, it is preferable to use a material with low resistance for the first wiring 205*a* so as to supply an accurate signal.

Although the third wiring 201*b* is not necessarily provided, a potential of a common electrode in each pixel can be stabilized by provision of the third wiring 201*b*. Note that although the third wiring 201*b* is provided in almost parallel to the second wiring 201*c* in FIG. 49A, the present invention is not limited to this. The fourth wiring 104*b* may be provided in almost parallel to the rust wiring 106*a*. In that case, the third wiring 201*b* is preferably formed of the same material as the rust wiring 205*a*.

Note that the third wiring 201*b* is preferably provided in almost parallel to the second wiring 201*c* because an aperture ratio can be increased and layout can be efficiently performed.

Embodiment 3

Figure 99A:
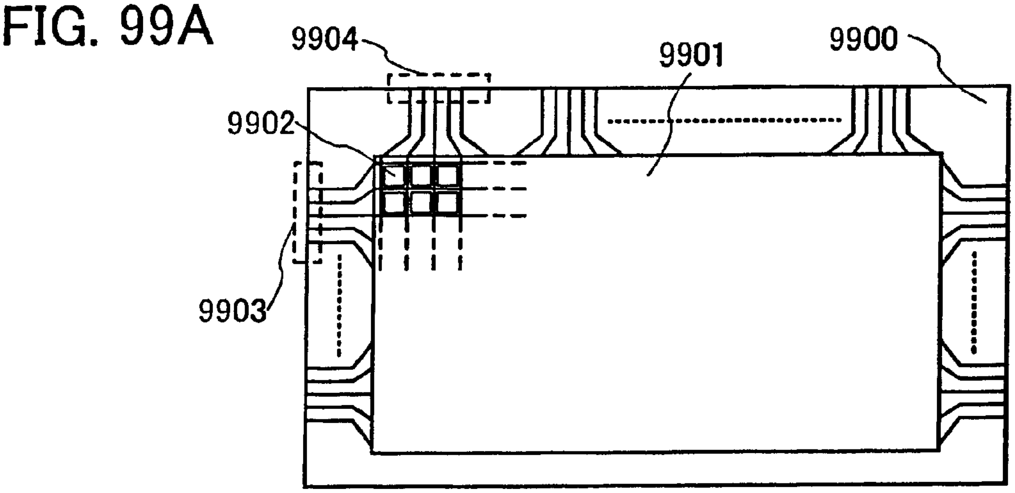
FIGS. 99A to 99C are diagrams each showing a liquid crystal display panel.

First, a brief structure of a liquid crystal panel is described with reference to FIG. 99A. FIG. 99A is a top plan view of the liquid crystal panel.

In the liquid crystal panel shown in FIG. 99A, a pixel portion 9901, scan line input terminals 9903, and signal line input terminals 9904 are formed over a substrate 9900. Scan lines are formed over the substrate 9900 so as to extend from the scan line input terminal 9903, and signal lines are formed over the substrate 9900 so as to extend from the signal line input terminal 9904. In the pixel portion 9901, pixels 9902 are arranged in matrix at intersections of the scan lines and the signal lines. Also, each of the pixels 9902 is provided with a switching element and a pixel electrode layer.

As shown by the liquid crystal panel in FIG. 99A, the scan line input terminals 9903 are formed on both a right side and a left side of the substrate 9900. The signal line input terminals 9904 are formed on either an up side or a bottom side of the substrate 9900. In addition, the scan line extended from one scan line input terminal 9903 and the scan line extended from the other scan line input terminal 9903 are formed alternately.

Note that by provision of the scan line input terminals 9903 on both the right side and the left side of the substrate 9900, the pixels 9902 can be arranged in a highly dense state.

In addition, by provision of the signal line input terminal 9904 on one of the up side and the bottom side of the substrate 9900, a frame of the liquid crystal panel can be small, or a region of the pixel portion 9901 can be large.

For each of the pixels 9902 in the pixel portion 9901, a first terminal of the switching element is connected to the signal line, and a second terminal thereof is connected to the pixel electrode layer, whereby each of the pixels 9902 can be independently controlled by a signal inputted externally. Note that on and off of the switching element are controlled by a signal supplied to the scan line.

Note that as described above, a single crystalline substrate, an SOI substrate, a glass substrate, a quartz substrate, a plastic substrate, a paper substrate, a cellophane substrate, a stone substrate, a stainless steel substrate, a substrate made of a stainless steel foil, or the like can be used as the substrate 9900.

Also, as described above, a transistor, a diode (such as a PN diode, a PIN diode, a Schottky diode, or a diode-connected transistor), a thyristor, a logic circuit configured with them, or the like can be used for the switching element.

In the case where a TFT is used for the switching element, a gate of the TFT is connected to the scan line, the first terminal thereof is connected to the signal line, and the second terminal thereof is connected to the pixel electrode layer. Therefore, each of the pixels 9902 can be independently controlled by a signal inputted externally.

Note that the scan line input terminal 9903 may be provided on one of the right side and the left side of the substrate 9900. By provision of the scan line input terminal 9903 on one of the right side and the left side of the substrate 9900, the frame of the liquid crystal panel can be small, or the region of the pixel portion 9901 can be large.

The scan lines extended from the one scan line input terminal 9903 and the scan lines extended from the other scan line input terminal 9903 may be common.

Note that the signal line input terminals 9904 may be provided on both the up side and the bottom side of the substrate 9900. By provision of the signal line input terminals 9904 on both the up side and the bottom side of the substrate 9900, the pixels 9902 can be arranged in a highly dense state.

Further, a capacitor may be further formed for the pixel 9902. In the case where a capacitor is formed for the pixel 9902, a capacitor line may be formed over the substrate 9900. In the case where a capacitor line is formed over the substrate 9900, it is set that a first electrode of the capacitor is connected to the capacitor line, and a second electrode thereof is connected to the pixel electrode layer. Meanwhile, in the case where the capacitor line is not formed over the substrate 9900, it is set that the first electrode of the capacitor is connected to the scan line of another pixel 9902 than the pixel 9902 for which the capacitor is provided, and the second electrode thereof is connected to the pixel electrode layer.

Figure 100A:
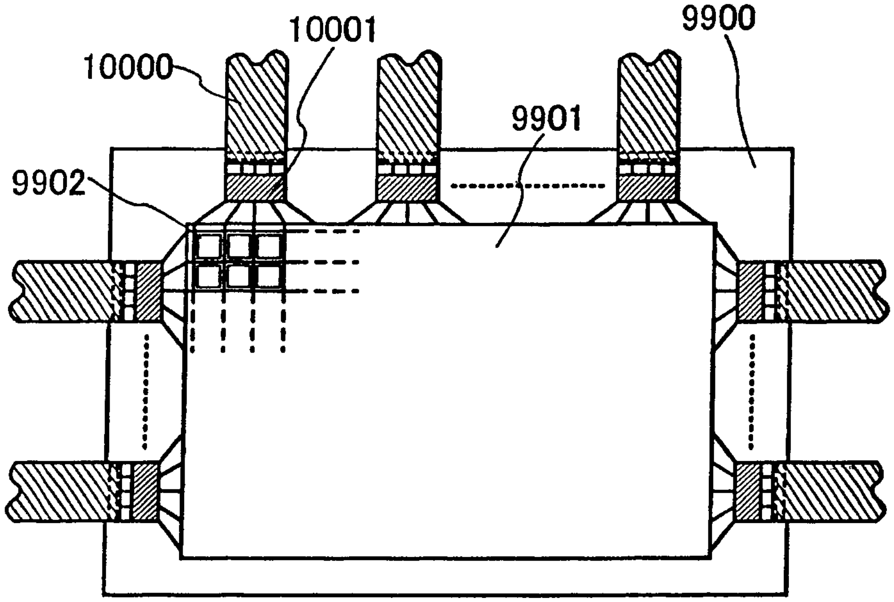
FIGS. 100A and 100B are diagrams each showing a liquid crystal display panel.
Figure 100B:
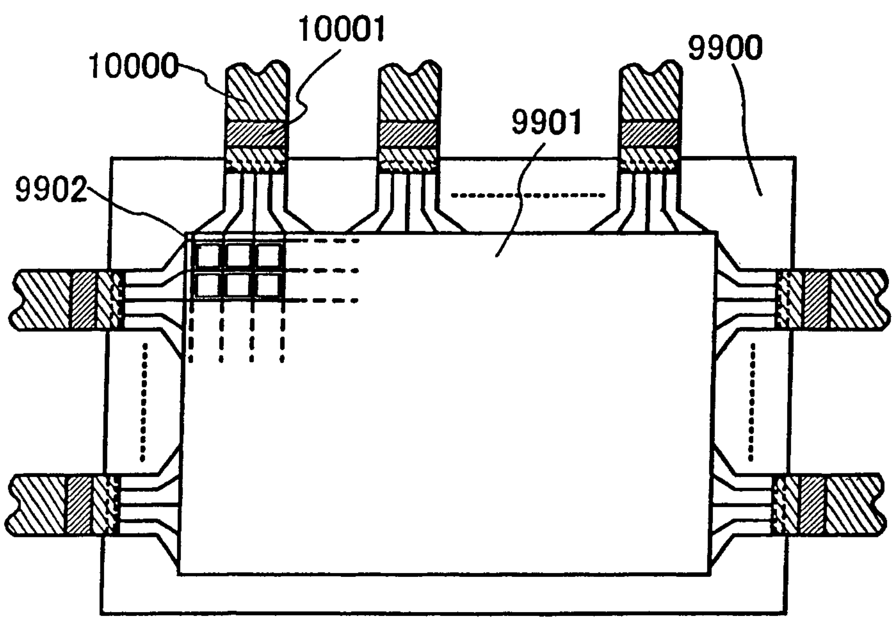

Although the liquid crystal panel shown in FIG. 99A shows a structure in which a signal that is supplied to the scan line and the signal line is controlled by an external driver circuit, a driver IC 10001 may be mounted on the substrate 9900 by a COG (Chip On Glass) method as shown in FIG. 100A. Also, as another structure, the driver IC 10001 may be mounted on an FPC (Flexible Printed Circuit) 10000 by a TAB (Tape Automated Bonding) method as shown in FIG. 100B. In FIGS. 100A and 100B, the driver IC 10001 is connected to the FPC 10000.

Note that the driver IC 10001 may be formed over a single-crystalline semiconductor substrate, or may have a circuit formed of a TFT over a glass substrate.

Figure 99B:
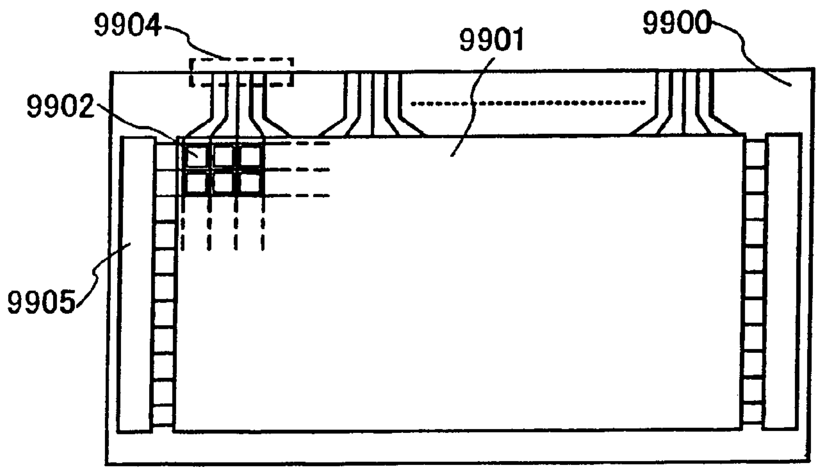

Note that for the liquid crystal panel shown in FIG. 99A, a scan line driver circuit 9905 may be formed over the substrate 9900 as shown in FIG. 99B.

Figure 99C:
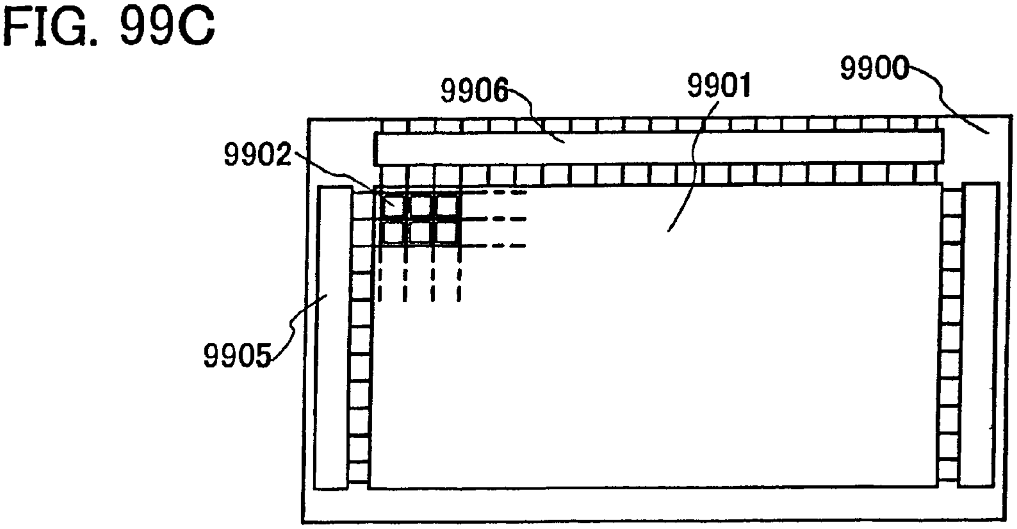

Also, as shown in FIG. 99C, the scan line driver circuit 9905 and a signal line driver circuit 9906 may be formed over the substrate 9900.

The scan line driver circuit 9905 and the signal line driver circuit 9906 are formed of a plurality of n-channel transistors and p-channel transistors. It is to be noted that they may be formed of only n-channel transistors or p-channel transistors.

Subsequently, specific description is made of the pixel 9902 with reference to circuit diagrams of FIGS. 101A to 102.

Figure 101A:
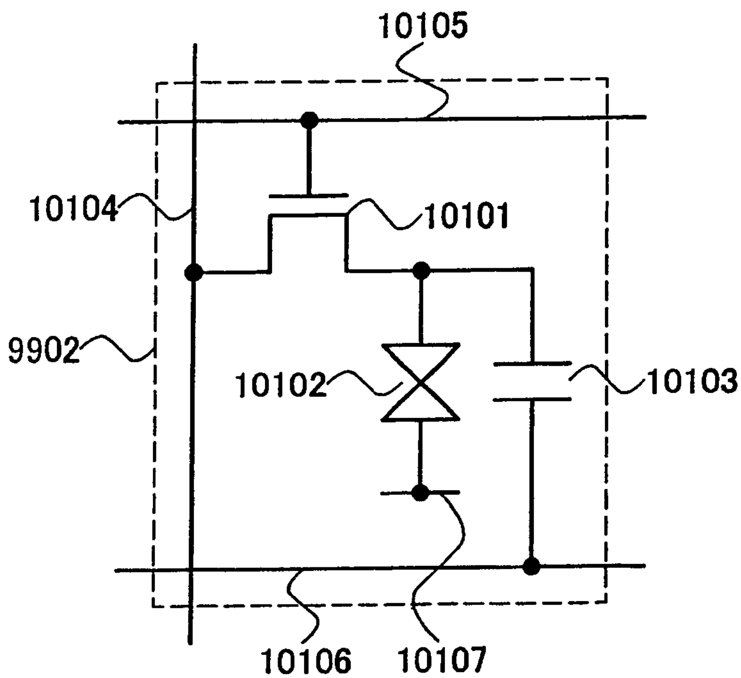
FIGS. 101A and 101B are diagrams each showing a pixel circuit.

A pixel 9902 of FIG. 101A includes a transistor 10101, a liquid crystal element 10102, and a capacitor 10103. A gate and a first terminal of the transistor 10101 are connected to a wiring 10105 and a wiring 10104, respectively. A first electrode and a second electrode of the liquid crystal element 10102 are connected to a counter electrode 10107 and a second terminal of the transistor 10101, respectively. A first electrode and a second electrode of the liquid crystal element 10103 are connected to a wiring 10106 and the second terminal of the transistor 10101, respectively.

Note that the wiring 10104, the wiring 10105, and the wiring 10106 are a signal line, a scan line, and a capacitor line, respectively.

The wiring 10104 is supplied with an analog voltage signal (video signal). It is to be noted that the video signal may be a digital voltage signal or a current signal.

The wiring 10105 is supplied with an H-level or L-level voltage signal (scan signal). Note that the H-level voltage signal is a voltage with which the transistor 10101 can be turned on, and the L-level voltage signal is a voltage with which the transistor 10101 can be turned off.

The wiring 10106 is supplied with a certain power source voltage. It is to be noted that a pulse signal may be supplied to the wiring 10106.

Description is made of operation of the pixel 9902 of FIG. 101A. First, when the wiring 10105 is at an H level, the transistor 10101 is turned on, and a video signal is supplied from the wiring 10104 to the second electrode of the liquid crystal element 10102 and the second electrode of the capacitor 10103 through the transistor 10101 that is on. The capacitor 10103 holds a potential difference between the wiring 10106 and the video signal.

Next, when the wiring 10105 is at an L level, the transistor 10101 is turned off, and the wiring 10104, the second electrode of the liquid crystal element 10102, and the second electrode of the capacitor 10103 are electrically disconnected. However, the capacitor 10103 holds the potential difference between the wiring 10106 and the video signal; therefore, the second electrode of the capacitor 10103 can hold a similar potential to the video signal.

Thus, the pixel 9902 of FIG. 101A can hold a potential of the second electrode of the liquid crystal element 10102 at the same potential as the video signal, and can hold transmittance of the liquid crystal element 10102 in accordance with the video signal.

Note that as is not shown, the capacitor 10103 is not always necessary if the liquid crystal element 10102 has a capacitor component with which the video signal can be held.

Figure 101B:
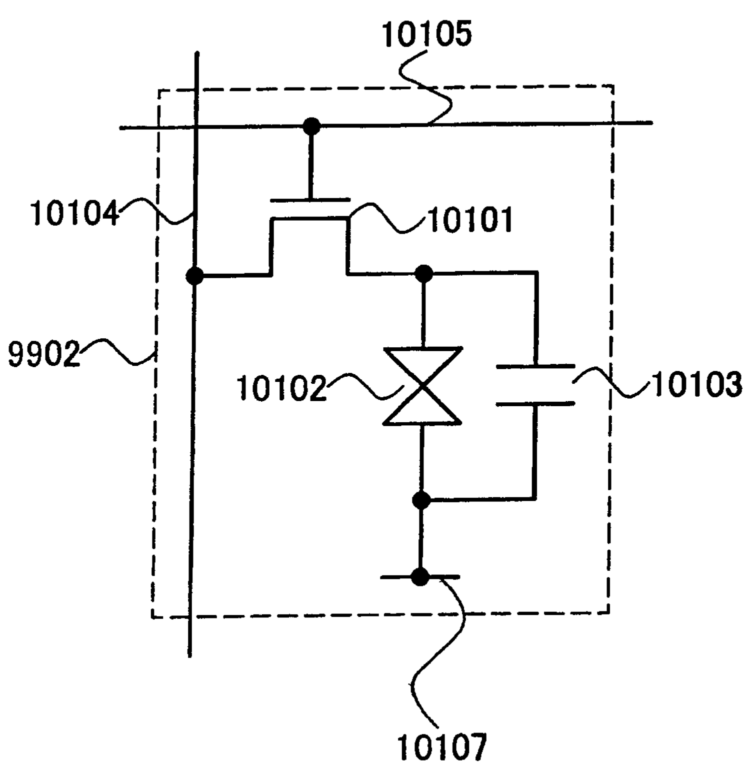

Note that as shown in FIG. 101B, the first electrode of the capacitor 10103 may be connected to the counter electrode 10107. For example, when a liquid crystal mode of the liquid crystal element 10102 is the FFS mode, the capacitor 10103 is connected as shown in FIG. 101B.

Figure 102:
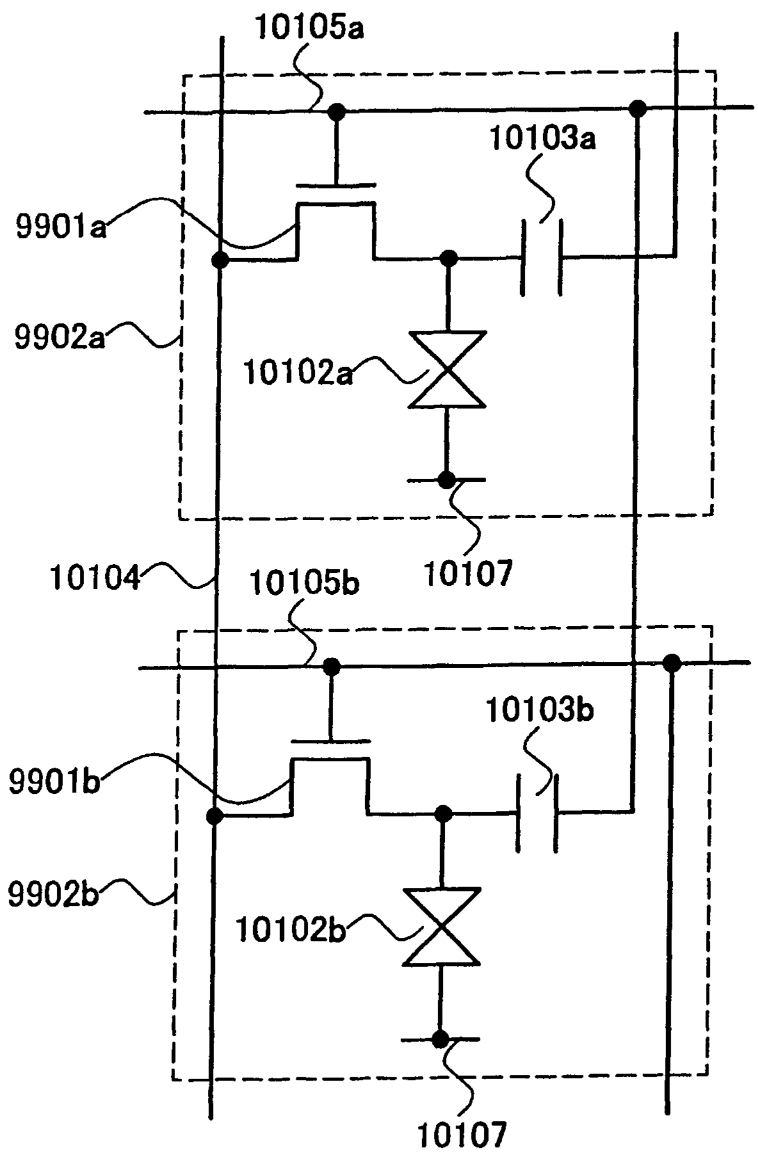
FIG. 102 is a diagram showing a pixel circuit.

As shown in FIG. 102, the first electrode of the capacitor 10103 may be connected to a wiring 10105*a* of a previous row. Note that a scan line of an n-th row is the wiring 10105*a*, and a scan line of an (n+1)-th row is the wiring 10105*b*. The first electrode of the capacitor 10103 is thus connected to the wiring of a previous column; therefore, the wiring 10106 is not necessary. Accordingly, a pixel 9902*a* and a pixel 9902*b* each can have a higher aperture ratio.

Embodiment 4

A liquid crystal display device having a liquid crystal panel is described with reference to FIG. 103.

Figure 103:
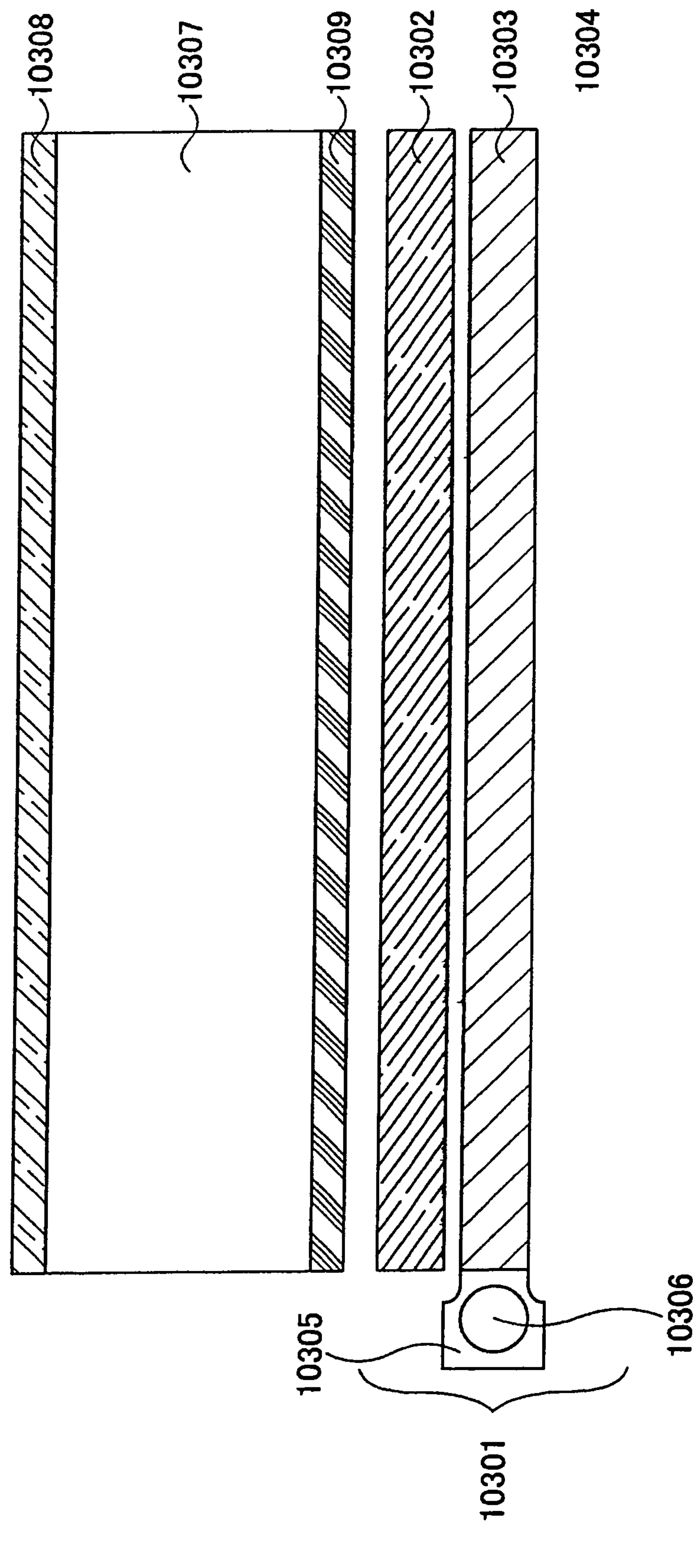
FIG. 103 is a diagram showing a liquid crystal display device.

First, the liquid crystal display device shown in FIG. 103 is provided with a backlight unit 10301, a liquid crystal panel 10307, a first polarizer containing layer 10308, and a second polarizer containing layer 10309.

Note that the liquid crystal panel 10307 can be similar to that described in another embodiment. Further, description is made of the liquid crystal panel of this embodiment having an active-type structure where each pixel is provided with a switching element; however, the liquid crystal display panel of FIG. 103 may have a passive-type structure.

A structure of the backlight unit 10301 is described. The backlight unit 10301 is structured to include a diffuser plate 10302, a light guide plate 10303, a reflector plate 10304, a lamp reflector 10305, and a light source 10306. For the light source 10306, a cold cathode tube, a hot cathode tube, a light-emitting diode, an inorganic EL, an organic EL, or the like is used, and the light source 10306 has a function of emitting light if necessary. The lamp reflector 10305 has a function of effectively leading fluorescence to the light guide plate 10303. The light guide plate 10303 has a function of leading light to the entire surface by total reflection of fluorescence. The diffuser plate 10302 has a function of reducing variations in luminance, and the reflector plate 10304 has a function of reusing light leaked under the light guide plate 10303.

Note that by provision of a prism sheet between the diffuser plate 10302 and the second polarizer containing layer 10309 in the liquid crystal display device of this embodiment, luminance of a screen of the liquid crystal panel can be improved.

A control circuit for adjusting luminance of the light source 10306 is connected to the backlight unit 10301. A signal is supplied from the control circuit, whereby luminance of the light source 10306 can be adjusted.

The second polarizer containing layer 10309 is provided between the liquid crystal panel 10307 and the backlight unit 10301, and the first polarizer containing layer 10308 is provided on an opposite side of the liquid crystal panel 10307, on which the backlight unit 10301 is not provided.

Note that in the case where the liquid crystal element of the liquid crystal panel 10307 is driven in the IPS mode or the FFS mode, the first polarizer containing layer 10308 and the second polarizer containing layer 10309 may be provided so as to be in a cross nicol state or a parallel nicol state.

A retardation film may be provided between the liquid crystal panel 10307 and one or both of the first polarizer containing layer 10308 and the second polarizer containing layer 10309.

Figure 104:
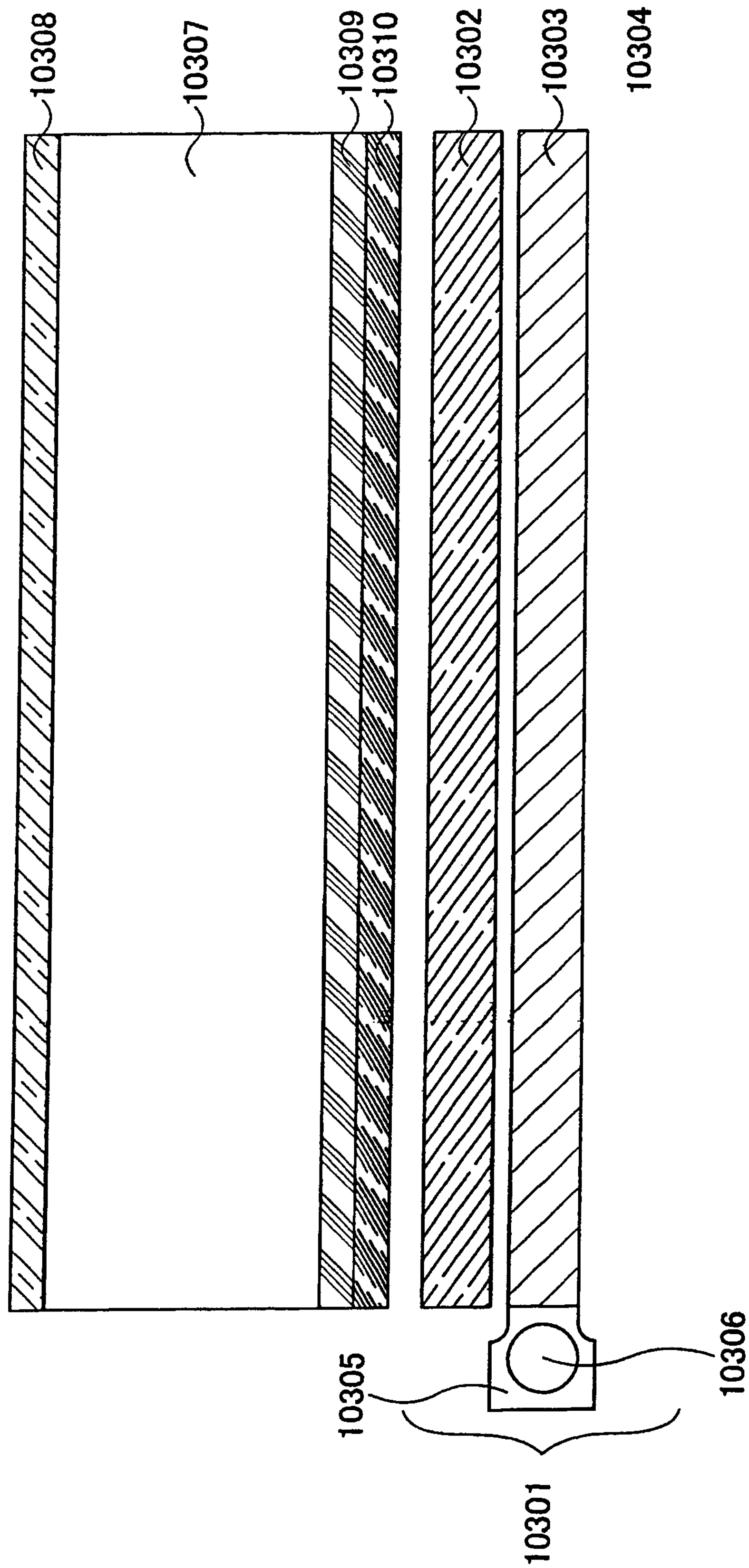
FIG. 104 is a diagram showing a liquid crystal display device.

Note that a slit (lattice) 10310 is provided between the second polarizer containing layer 10309 and the backlight unit 10301 as shown in FIG. 104, whereby the liquid crystal display device of this embodiment can perform three-dimensional display.

The slit 10310 with an opening that is arranged on the backlight unit side transmits light that is incident from the light source to be a striped shape. Then, the light is incident on a display device portion. This slit 10310 can make parallax in both eyes of a viewer who is on the viewing side. The viewer sees only a pixel for the right eye with the right eye and only a pixel for a left eye with the left eye simultaneously. Therefore, the viewer can see three-dimensional display. That is, in the display device portion, light given a specific viewing angle by the slit 10310 passes through each pixel corresponding to an image for the right eye and an image for the left eye, whereby the image for the right eye and the image for the left eye are separated in accordance with different viewing angles, and three-dimensional display is performed.

An electronic appliance such as a television device or a mobile phone is manufactured using a liquid crystal display device of FIG. 104, whereby an electronic appliance with high performance and high image quality, which can perform three-dimension display, can be provided.

Embodiment 5

A specific structure of a backlight is described with reference to FIGS. 105A to 105D. The backlight is mounted on a liquid crystal display device as a backlight unit having a light source, and the backlight unit is surrounded by a reflector plate so that light is scattered efficiently.

Figure 105A:
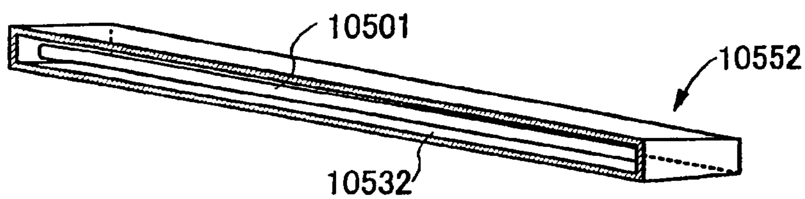
FIGS. 105A to 105D are diagrams each showing a backlight.

As shown in FIG. 105A, a cold cathode tube 10501 can be used for a light source of a backlight unit 10552. In addition, the lamp reflector 10532 can be provided to reflect light from the cold cathode tube 10501 efficiently. The cold cathode tube 10501 is often used for a large display device for intensity of luminance from the cold cathode tube. Therefore, such a backlight unit having a cold cathode tube can be used for a display of a personal computer.

Figure 105B:
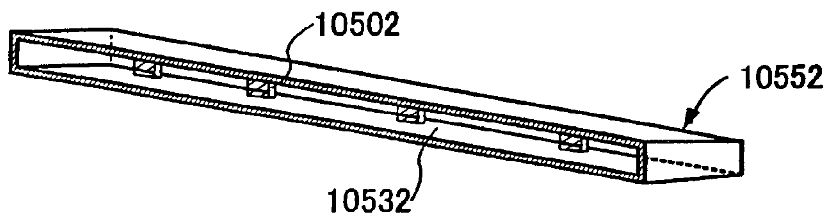

As shown in FIG. 105B, light-emitting diodes (LED) 10502 can be used as light sources of the backlight unit 10552. For example, light-emitting diodes (W) 10502 which emit white light are provided at the predetermined intervals. In addition, the lamp reflector 10532 can be provided to reflect light from the light-emitting diode (W) 10502 efficiently.

Figure 105C:
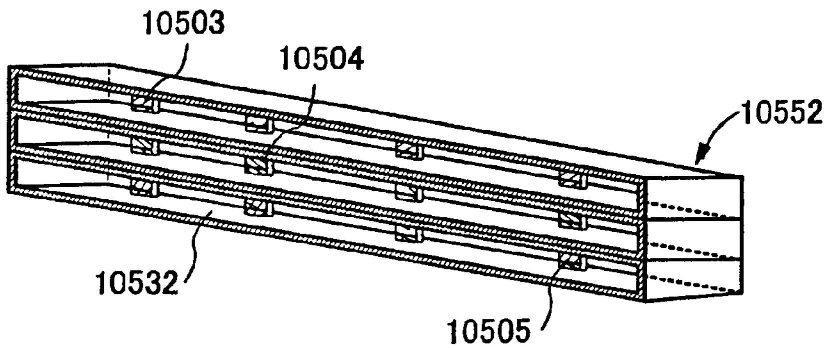

As shown in FIG. 105C, light-emitting diodes (LED) 10503, 10504, and 10505 of RGB colors can be used as light sources of the backlight unit 10552. With use of the diodes (LED) 10503, 10504, and 10505 of RGB colors, higher color reproducibility can be realized in comparison with the case where only the light-emitting diode (W) 10502 which emits white light is used. In addition, the lamp reflector 10532 can be provided to reflect light from the light-emitting diodes (LED) 10503, 10504, and 10505 of RGB colors efficiently.

Figure 105D:
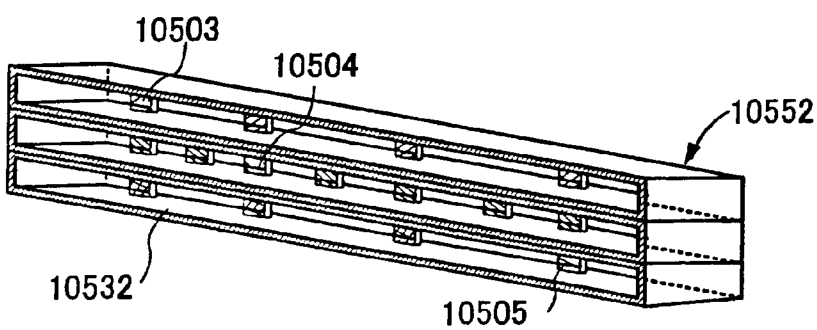

Further, as shown in FIG. 105D, in the case where the light-emitting diodes (LED) 10503, 10504, and 10505 of RGB colors are used as light sources, the number and arrangement of them are not necessarily the same. For example, a plurality of light-emitting diodes of a color having low emission intensity (for example, green) may be arranged.

Further, the light-emitting diode (W) 10502 which emits white light may be used in combination with the light-emitting diodes (LED) 10503, 10504, and 10505 of RGB colors.

Note that in the case of having the light-emitting diodes of RGB colors, the light-emitting diodes sequentially emit light in accordance with time by application of a field sequential mode, thereby color display can be performed.

Using a light-emitting diode is suitable for a large display device since luminance is high. Further, purity of RGB colors is high; therefore, a light-emitting diode has excellent color reproducibility as compared to a cold cathode tube. In addition, an area required for arrangement can be reduced; therefore, a narrower frame can be achieved when a light-emitting diode is applied to a small display device.

Further, a light source is not necessarily provided as the backlight unit shown in FIGS. 105A to 105D. For example, in the case where a backlight having a light-emitting diode is mounted on a large display device, the light-emitting diode can be arranged on a back side of the substrate. In this case, the light-emitting diodes of RGB colors can be sequentially arranged at predetermined intervals. Depending on arrangement of the light-emitting diodes, color reproducibility can be enhanced.

Embodiment 6

An example of a polarizer containing layer (also referred to as a polarizing plate or a polarizing film) is described with reference to FIG. 108.

Figure 108:
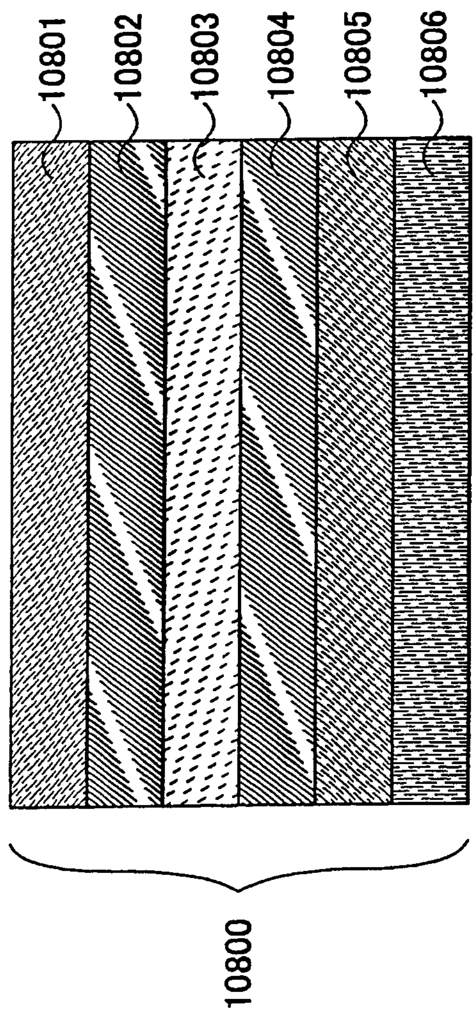
FIG. 108 is a diagram showing a polarizer containing layer.

A polarizing film 10800 of FIG. 108 is structured to include a protective film 10801, a substrate film 10802, a PVA polarizing film 10803, a substrate film 10804, an adhesive layer 10805, and a release film 10806.

The PVA polarizing film 10803 has a function of generating light in only a certain oscillation direction (linear polarized light). In specific, the PVA polarizing film 10803 contains a molecule (polarizer) in which lengthwise electron density and widthwise electron density are greatly different from each other. The direction of the molecules in which lengthwise electron density and widthwise electron density are greatly different from each other is uniformed, thereby the PVA polarizing film 10803 can form linear polarization.

For example, as for the PVA polarizing film 10803, a polymer film of polyvinyl alcohol is doped with an iodine compound and the PVA film is pulled in a certain direction, thereby a film in which iodine molecules are aligned in a certain direction can be obtained. Then, light which is parallel to the major axis of the iodine molecule is absorbed by the iodine molecule. Alternatively, a dichroic dye may be used instead of iodine for high durability use and high heat resistance use. It is desirable that the dye be used for liquid crystal display devices which need to have durability and heat resistance, such as an in-car LCD or an LCD for a projector.

When the PVA polarizing film 10803 is sandwiched by films to be base materials (the first substrate film 10802 and the second substrate film 10804) from the both sides, the reliability can be improved. Alternatively, the PVA polarizing film 10803 may be sandwiched by triacetylcellulose (TAC) films with high transparency and high durability. The substrate film and the TAC film function as protective films of the polarizer contained in the PVA polarizing film 10803.

The adhesive layer 10805 which is to be attached to a glass substrate of a liquid crystal panel may be, attached to one of the substrate films (the substrate film 10804). The adhesive layer 10805 may be formed by application of an adhesive on one of the substrate films (the substrate film 10804). Furthermore, the adhesive layer 10805 may be provided with the mold release film 10806 (separate film).

The other substrate film (substrate film 10802) is provided with a protective film.

A hard coating scattering layer (anti-glare layer) may be provided on the surface of the polarizing film 10800. The surface of the hard coating scattering layer has minute concavity and convexity that is formed by an AG treatment; therefore, the hard coating scattering layer has an anti-glare function of scattering external light and can prevent reflection of external light in the liquid crystal panel and the surface reflection.

Furthermore, a plurality of optical thin layers with different refractive indexes may be layered (referred to as anti-reflection treatment or AR treatment) on the surface of the polarizing film 10800. The plurality of layered optical thin layers with different refractive indexes can reduce reflectivity on the surface by an effect of interference of light.

Embodiment 7

Operation of each circuit included in a liquid crystal display device is described with reference to FIGS. 106A to 106C.

Figure 106A:
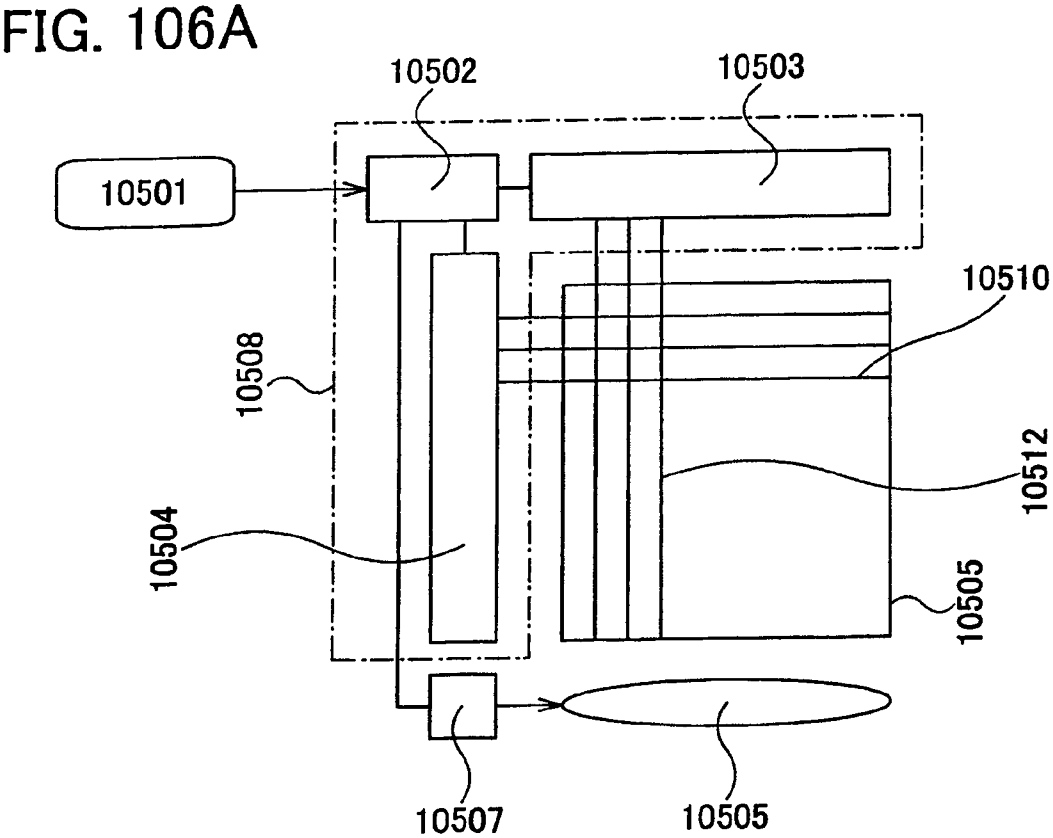
FIGS. 106A to 106C are diagrams each showing circuit operation of a liquid crystal display device.
Figure 106B:
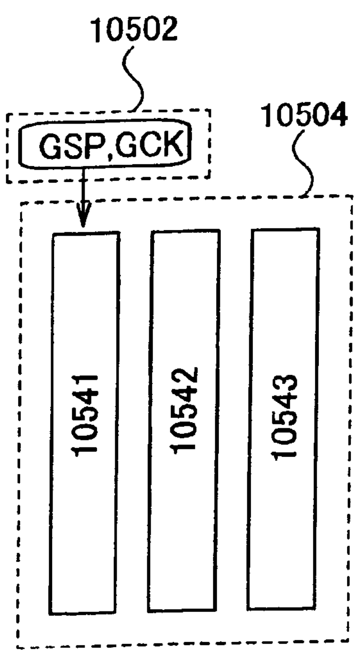
Figure 106C:
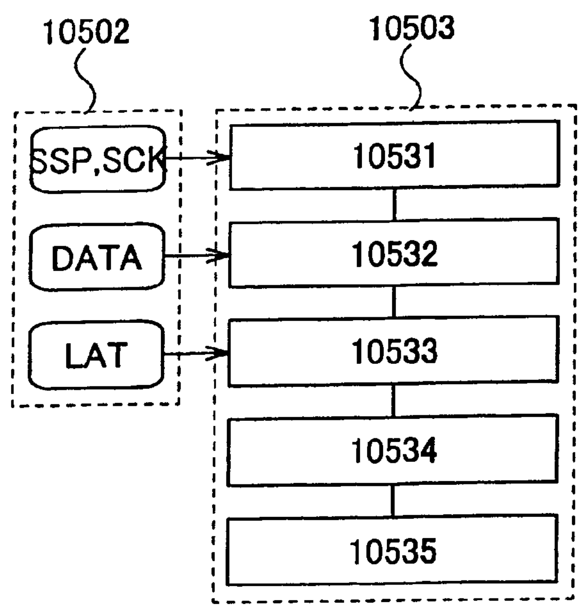

FIGS. 106A to 106C show system block diagrams of a pixel portion 10605 and a driver circuit portion 10608 included in a display device.

In the pixel portion 10605, a plurality of pixels are included and switching elements are provided in an intersecting region of a signal line 10612 and a scan line 10610. By the switching elements, application of a voltage to control tilt of liquid crystal molecules can be controlled. Such a structure where switching elements are provided in respective intersecting regions is referred to as an active type. The pixel portion of the present invention is not limited to such an active type, and may have a passive type structure instead. The passive type can be formed by a simple process, since each pixel does not have a switching element.

The driver circuit portion 10608 includes a control circuit 10602, a signal line driver circuit 10603, and a scan line driver circuit 10604. The control circuit 10602 to which a video signal 10601 is inputted has a function to control a gray scale in accordance with display content of the pixel portion 10605. Therefore, the control circuit 10602 inputs a generated signal to the signal line driver circuit 10603 and the scan line driver circuit 10604. When a switching element is selected through the scan line 10610 in accordance with the scan line driver circuit 10604, a voltage is applied to a pixel electrode in a selected intersecting region. The value of this voltage is determined in accordance with a signal inputted from the signal line driver circuit 10603 through a signal line.

Further, in the control circuit 10602, a signal to control power supplied to a lighting unit 10606 is generated, and the signal is inputted to a power source 10607 of the lighting unit 10606. The backlight unit described in the aforementioned embodiment can be used for the lighting unit. Note that the lighting unit includes a front light besides a backlight. A front light is a platy light unit formed of an illuminant and a light guiding body, which is attached to a front side of a pixel portion and illuminates the whole area. By such a lighting unit, the pixel portion can be evenly illuminated with low power consumption.

Further, as shown in FIG. 106B, the scan line driver circuit 10604 includes circuits which function as a shift register 10641, a level shifter 10642, and a buffer 10643. Signals such as a gate start pulse (GSP) and a gate clock signal (GCK) are inputted to the shift register 10641. It is to be noted that the scan line driver circuit of the present invention is not limited to the structure shown in FIG. 106B.

Further, as shown in FIG. 106C, the signal line driver circuit 10603 includes circuits which function as a shift register 10631, a first latch 10632, a second latch 10633, a level shifter 10634, and a buffer 10635. The circuit functioning as the buffer 10635 is a circuit having a function of amplifying a weak signal and includes an operational amplifier and the like. Signals such as start pulses (SSP) are inputted to the level shifter 10634, and data (DATA) such as video signals is inputted to the first latch 10632. Latch (LAT) signals can be temporarily held in the second latch 10633, and are inputted to the pixel portion 10605 concurrently. This operation is referred to as a line sequential drive. Therefore, a pixel which performs not a line sequential drive but a dot sequential drive does not require the second latch. Thus, the signal line driver circuit of the present invention is not limited to the structure shown in FIG. 106C.

The signal line driver circuit 10603, the scan line driver circuit 10604, and the pixel portion 10605 as described above can be formed of semiconductor elements provided over one substrate. The semiconductor element can be formed using a thin film transistor provided over a glass substrate. In this case, a crystalline semiconductor film may be applied to the semiconductor element. The crystalline semiconductor film can constitute a circuit included in a driver circuit portion, since it has high electrical characteristics, in particular, mobility. Further, the signal line driver circuit 10603 and the scan line driver circuit 10604 may be mounted on a substrate with use of an IC (Integrated Circuit) chip. In this case, an amorphous semiconductor film can be applied to a semiconductor element in a pixel portion.

Embodiment 8

A liquid crystal display module is described with reference to FIG. 107.

Figure 107:
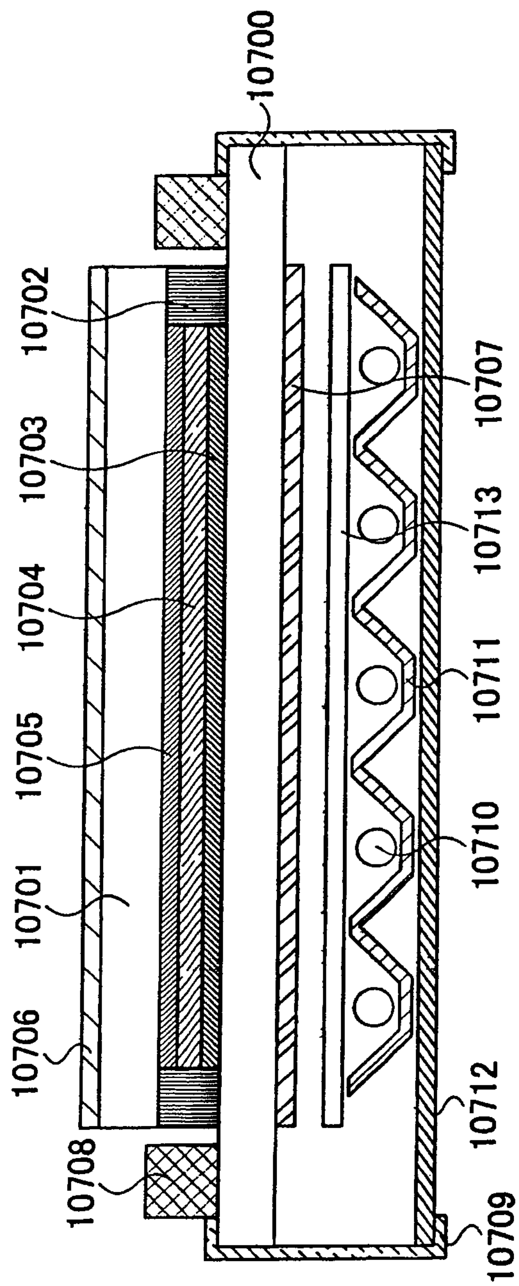
FIG. 107 is a diagram showing a liquid crystal display module.

FIG. 107 shows an example of a liquid crystal display module where a circuit substrate 10700 and an counter substrate 10701 are bonded with a sealant 10702, and a pixel portion 10703 including a TFT or the like and a liquid crystal layer 10704 are provided therebetween so as to form a display region. A colored layer 10705 is necessary for color display. For the case of an RGB method, colored layers corresponding to each color of red, green, and blue are provided so as to correspond to each pixel. A first polarizer containing layer 10706, a second polarizer containing layer 10707, and a diffuser plate 10713 are arranged on an outer side of the circuit substrate 10700 and the counter substrate 10701. A light source includes a cold cathode tube 10710 and a reflector plate 10711. A circuit substrate 10712 is connected to the circuit substrate 10700 through a flexible wiring board 10709. External circuits such as a control circuit and a power supply circuit are incorporated.

The second polarizer containing layer 10707 is provided between the circuit substrate 10700 and a backlight that is a light source. Also, the first polarizer containing layer 10706 is provided over the counter substrate 10701. On the other hand, an absorption axis of the second polarizer containing layer 10707 and an absorption axis of the first polarizer containing layer 10706 provided on the viewing side are arranged to be in a cross nicol state.

The stack of the second polarizer containing layer 10707 and the first polarizer containing layer 10706 is bonded to the circuit substrate 10700 and the counter substrate 10701. In addition, a retardation film may be stacked to be interposed between the stack of polarizer containing layers and the substrate. Furthermore, the first polarizer containing layer 10706 on the viewing side may be subjected to a reflection prevention treatment as necessary.

Moreover, optical response speed of a liquid crystal display module gets higher by reduction of the cell gap of the liquid crystal display module. In addition, the optical response speed can also get higher by decrease of the viscosity of a liquid crystal material. The increase in response speed is particularly advantageous when a pixel pitch in a pixel region of a liquid crystal display module of a TN mode is 30 μm or less. Also, further increase in response speed is possible by an overdrive method in which an applied voltage is increased (or decreased) for a moment.

Embodiment 9

Figure 98A:
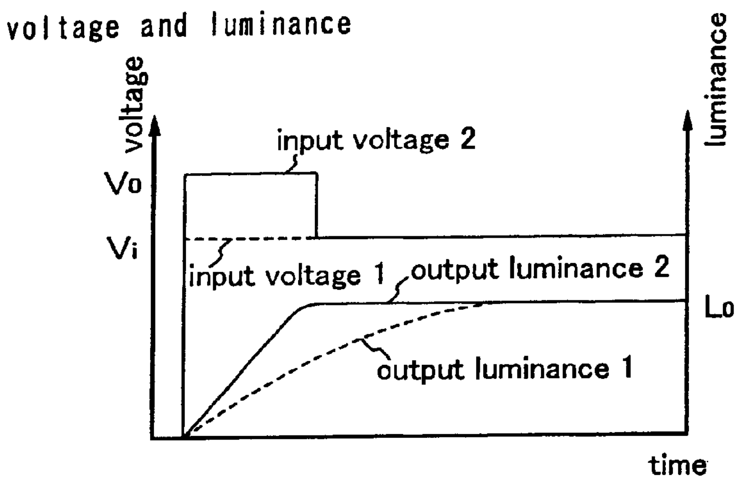
FIG. 98A is a diagram showing overdriving.
Figure 98B:
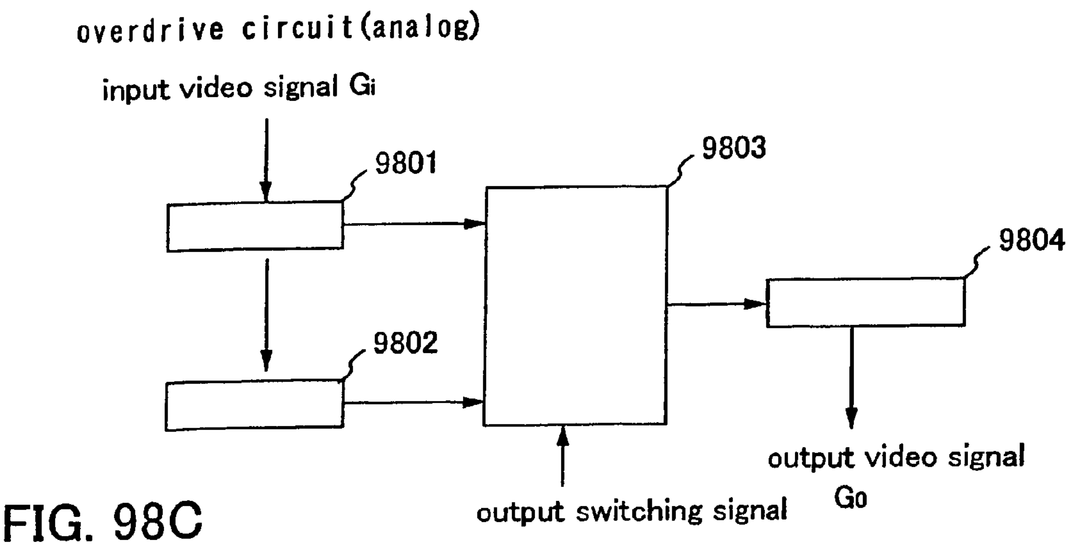
FIGS. 98B and 98C are diagrams each showing an overdrive circuit.
Figure 98C:
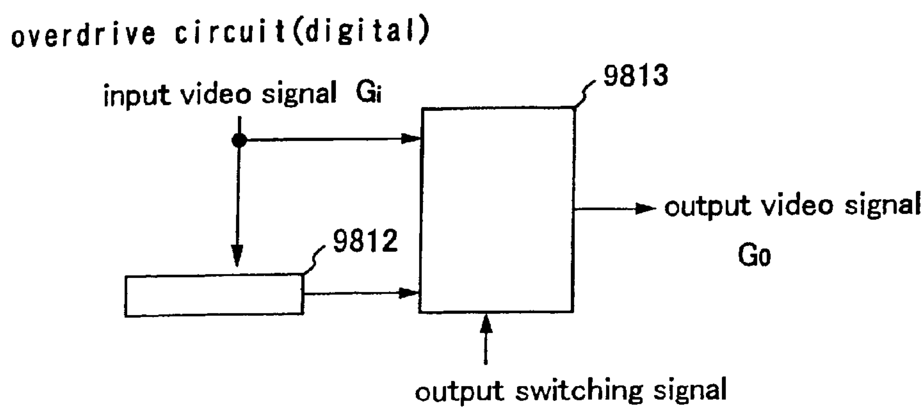

The overdriving is described with reference to FIGS. 98A to 98C. FIG. 98A shows time change of output luminance with respect to an input voltage of a display element. The time change of the output luminance of the display element with respect to an input voltage 1 that is shown by a dashed line is output luminance 1 that is also shown by a dashed line. That is, although a voltage for obtaining an objective output luminance $L_o$ is $G_i$, when $V_i$ is simply inputted as an input voltage, it takes time corresponding to a response speed of the element before reaching the objective output luminance $L_o$.

The overdriving is a technique for increasing this response speed. In specific, this is a method as follows: first, $V_o$ that is a larger voltage than $V_i$ is applied to the element for a certain time to increase the response speed of the output luminance and the luminance is made close to the objective output luminance $L_o$, and then, the input voltage is returned to $V_i$. The input voltage and the output luminance at this time are shown by an input voltage 2 and an output luminance 2, respectively. As seen from the graph, the time which the output luminance 2 takes before reaching the objective luminance $L_o$ is shorter than that of the output luminance 1.

It is to be noted that, although the case where the output luminance changes positively with respect to the input voltage is described with reference to FIG. 98A, the present invention also includes the case where the output luminance changes negatively with respect to the input voltage.

A circuit for realizing the above driving is described with reference to FIGS. 98B and 98C. First, the case where an input video signal $G_i$ is a signal of an analog value (it may be a discrete value) and an output video signal $G_o$ is also a signal of an analog value is described. An overdrive circuit shown in FIG. 98B includes a coding circuit 9801, a frame memory 9802, a correction circuit 9803, and a DA converter circuit 9804.

First, the input video signal $G_i$ is inputted to the coding circuit 9801 and encoded. In other words, the input video signal $G_i$ is converted from an analog signal to a digital signal with an appropriate bit number. After that, the converted digital signal is inputted to the frame memory 9802 and the correction circuit 9803 in each. A video signal of the previous frame which has been held in the frame memory 9802 is also inputted to the correction circuit 9803 at the same time. Then, video signals that are corrected from the video signal of the frame and the video signal of the previous frame in the correction circuit 9803 according to a numeric value table that is prepared beforehand are outputted. At this time, an output switching signal may be inputted to the correction circuit 9803 and the corrected video signal and the video signal of the frame may be switched to be outputted. Next, the corrected video signal or the video signal of the frame is inputted to the DA converter circuit 9804. Further, the output video signal $G_o$ which is an analog signal of a value in accordance with the corrected video signal or the video signal of the frame is outputted. In this manner, the overdriving can be realized.

Next, the case where an input video signal $G_i$ is a signal of a digital value and an output video signal $G_o$ is also a signal of a digital value is described with reference to FIG. 98C. An overdrive circuit shown in FIG. 98C includes a frame memory 9812 and a correction circuit 9813.

The input video signal $G_i$ is a digital signal, and first, inputted to the frame memory 9812 and the correction circuit 9813 in each. A video signal of the previous frame which has been held in the frame memory 9812 is also inputted to the correction circuit 9813 at the same time. Then, video signals that are corrected from the video signal of the frame and the video signal of the previous frame in the correction circuit 9813 according to a numeric value table that is prepared beforehand are outputted. At this time, an output switching signal may be inputted to the correction circuit 9813 and the corrected video signal and the video signal of the frame may be switched to be outputted. In this manner, the overdriving can be realized.

It is to be noted that a combination of the numeric value table for obtaining a corrected video signal is the product of the number of gray scales, which 1SF may take, and the number of gray scales, which 2SF may take. The smaller the number of this combination, the more preferable, since data amount to be stored in the correction circuit 9813 becomes small. In this embodiment mode, in halftone before the subframe displaying a light image reaches the maximum luminance, the luminance of a dark image is 0; and after the subframe displaying a light image reaches the maximum luminance and until the maximum gray scale is displayed, the luminance of a light image is constant; therefore, the number of this combination can be significantly small. Accordingly, when the driving method of a display device of the present invention is carried out in combination with the overdriving, a great effect can be obtained.

It is to be noted that the overdrive circuit of the present invention includes the case where the input video signal $G_i$ is an analog signal and the output video signal $G_o$ is a digital signal. In this case, the DA converter circuit 9804 may be omitted from the circuit shown in FIG. 98B. In addition, the overdrive circuit of the present invention includes the case where the input video signal $G_i$ is a digital signal and the output video signal $G_o$ is an analog signal. In this case, the coding circuit 9801 may be omitted from the circuit shown in FIG. 98B.

Embodiment 10

Figure 109A:
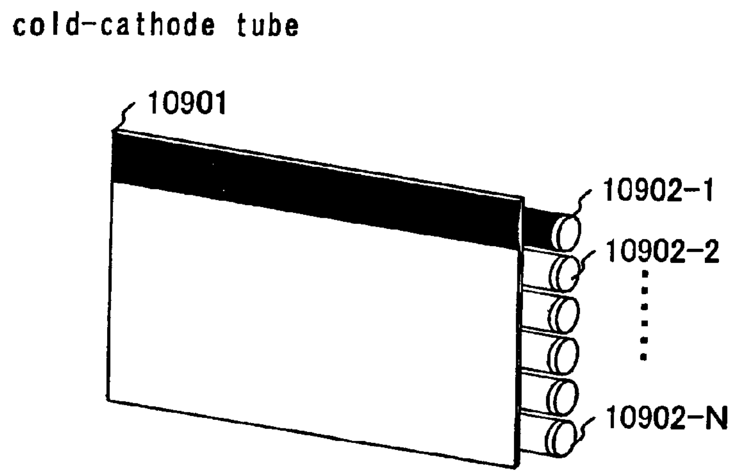
FIGS. 109A to 109C are diagrams each showing a scanning backlight.
Figure 109B:
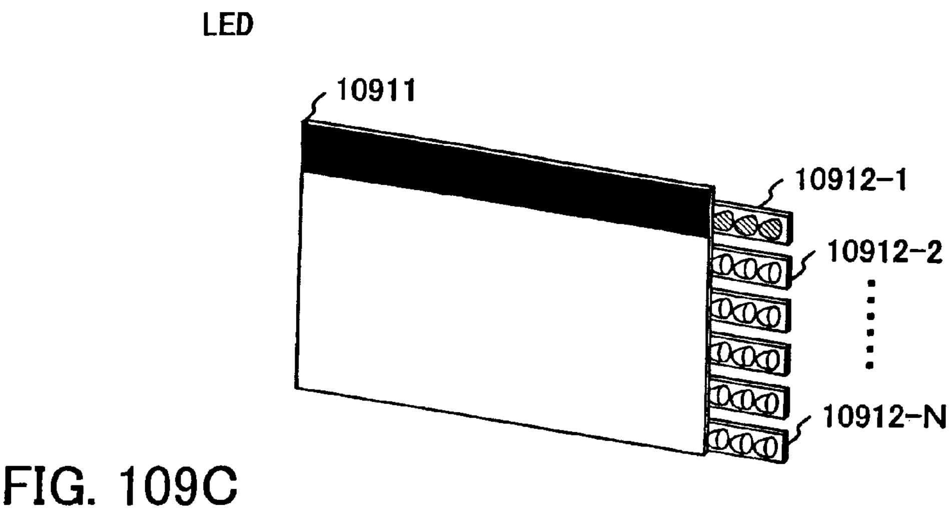
Figure 109C:
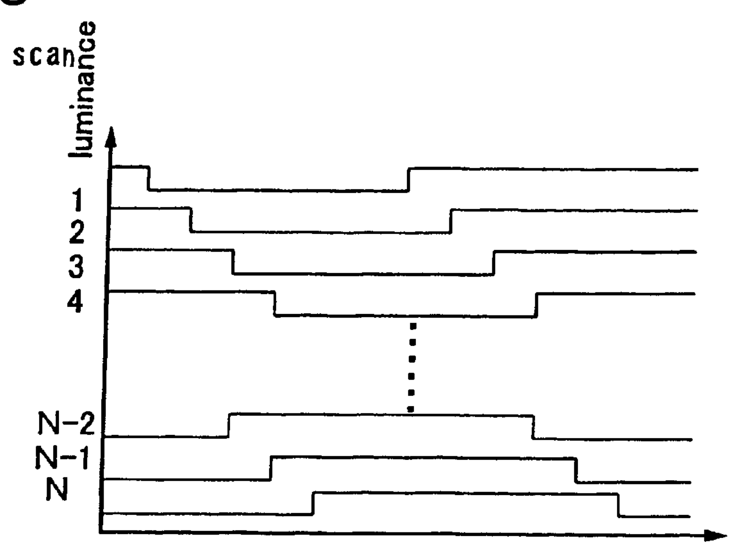

The scanning backlight is described with reference to FIGS. 109A to 109C. FIG. 109A is a view showing a scanning backlight in which cold cathode tubes are opposed. The scanning backlight shown in FIG. 109A includes a diffuser plate 10901 and N pieces of cold cathode tubes 10902-1 to 10902-N. When the N pieces of cold cathode tubes 10902-1 to 10902-N are opposed behind the diffuser plate 10901, the N pieces of cold cathode tubes 10902-1 to 10902-N can be scanned while changing the luminance.

A change in luminance of each cold cathode tube when scanning is described with reference to FIG. 109C. First, the luminance of the cold cathode tube 10902-1 is changed for a certain amount of time. After that, the luminance of the cold cathode tube 10902-2 that is placed next to the cold cathode tube 10902-1 is changed for the same amount of time. In this manner, the luminance of the cold cathode tubes 10902-1 to 10902-N is changed in order. Although the luminance is changed to be lower than the original luminance for a certain amount of time in FIG. 109C, the luminance may be changed to be higher than the original luminance. In addition, although the cold cathode tubes scan from 10902-1 to 10902-N here, the order may be reversed and the cold cathode tubes 10902-N to 10902-1 may be scanned in this order.

The driving method of a display device shown in FIGS. 1A and 1B is carried out in combination with the scanning backlight, thereby a special effect can be obtained. That is, a subframe period in which a dark image is inserted in the driving method of a display device shown in FIGS. 1A and 1B and a period in which the luminance of each cold cathode tube is lowered shown in FIG. 109C are synchronized, thereby display that is similar to that of the case where a scanning backlight is not used is obtained and the average luminance of the backlight can be lowered. Accordingly, power consumption of the backlight, which is a major part of power consumption of a liquid crystal display device as a whole, can be reduced.

It is preferable that the backlight luminance in a period with low luminance be approximately the same as the maximum luminance of the subframe in which a dark image is inserted. In specific, it is preferable that the luminance be the maximum luminance Lmax1 of 1SF in the case where a dark image is inserted in 1SF, and the maximum luminance Lmax2 of 2SF in the case where a dark image is inserted in 2SF.

It is to be noted that LEDs may be used as a light source of the scanning backlight. A scanning backlight in this case is as shown in FIG. 109B. The scanning backlight shown in FIG. 109B includes a diffuser plate 10911 and light sources 10912-1 to 10912-N in each of which LEDs are opposed. In the case where LEDs are used as a light source of the scanning backlight, there is an advantage in that the backlight can be formed to be thin and lightweight. Furthermore, there is an advantage in that color reproduction range can be widened. Furthermore, since the LEDs that are opposed in each of the light sources 10912-1 to 10912-N can be scanned similarly, the backlight may be a point-scanning backlight. When the backlight is of a point-scanning type, the quality of moving images can be further improved.

Embodiment 11

Figure 110A:
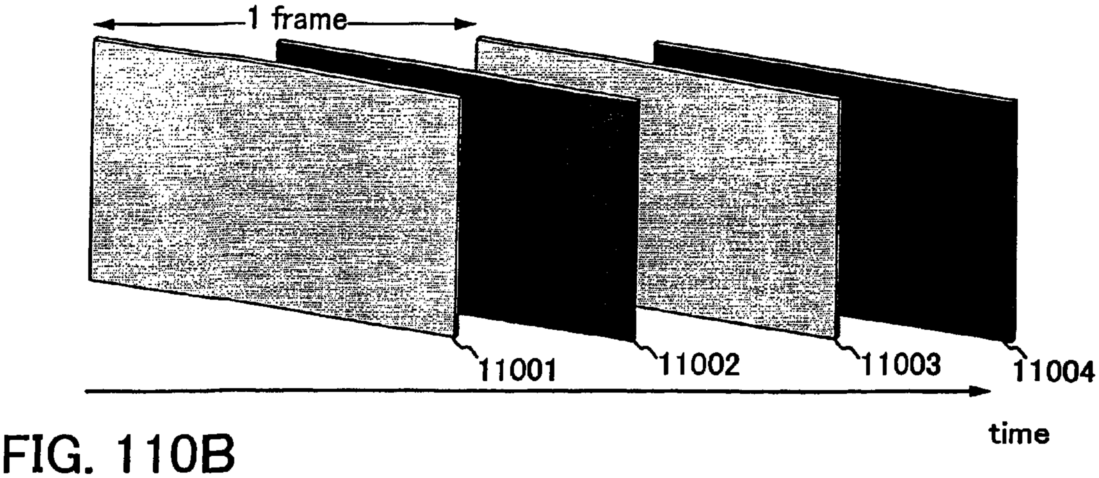
FIGS. 110A to 110C are diagrams each showing high-frequency driving.

The high frequency driving is described with reference to FIGS. 110A to 110C. FIG. 110A is a view showing the driving with an insertion of a dark image when the frame frequency is 60 Hz. A reference numeral 11001 denotes a light image of the frame; 11002 denotes a dark image of the frame; 11003 denotes a light image of the next frame; and 11004 denotes a dark image of the next frame. In the case where the driving is performed at 60 Hz, there are advantages in that consistency with a frame rate of video signals can be easily obtained and an image processing circuit is not complex.

Figure 110B:
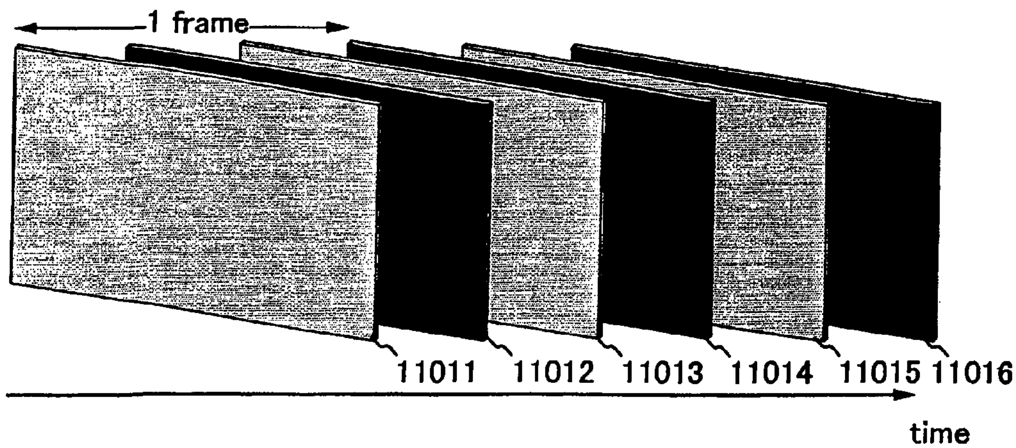

FIG. 110B is a view showing the driving with an insertion of a dark image when the frame frequency is 90 Hz. A reference numeral 11011 denotes a light image of the frame; 11012 denotes a dark image of the frame; 11013 denotes a light image of a first image formed by the frame, the next frame, and the after next frame; 11014 denotes a dark image of the first image that is formed by the frame, the next frame, and the after next frame; 11015 denotes a light image of a second image that is formed by the frame, the next frame, and the after next frame; and 11016 denotes a dark image of the second image formed by the frame, the next frame, and the after next frame. In the case where the driving is performed at 90 Hz, there is an advantage in that the quality of moving images can be improved effectively without increase of the operating frequency of a peripheral driver circuit so much.

Figure 110C:
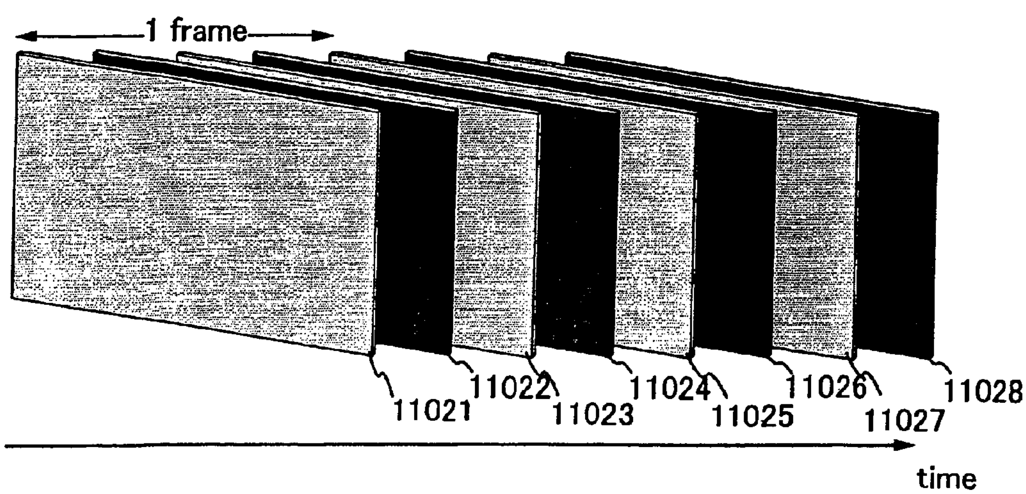

FIG. 110C is a view showing the driving with an insertion of a dark image when the frame frequency is 120 Hz. A reference numeral 11021 denotes a light image of the frame; 11022 denotes a dark image of the frame; 11023 denotes a light image of an image that is formed by the frame and the next frame; 11024 denotes a dark image of an image that is formed by the frame and the next frame; 11025 denotes a light image of the next frame; 11026 denotes a dark image of the next frame; 11027 denotes a light image of an image that is formed by the next frame and the after next frame; and 11028 denotes a dark image of the image that is formed by the next frame and the after next frame. In the case where the driving is performed at 120 Hz, there is an advantage in that an effect of improving the quality of moving images is so significant that a residual image is hardly perceived.

Embodiment 12

The display device of the present invention can be applied to various electronic appliances, specifically a display portion of electronic appliances. The electronic appliances include cameras such as a video camera and a digital camera, a goggle-type display, a navigation system, an audio reproducing device (a car audio component stereo, an audio component stereo, or the like), a computer, a game machine, a portable information terminal (a mobile computer, a mobile phone, a mobile game machine, an electronic book, or the like), an image reproducing device having a recording medium (specifically, a device for reproducing a recording medium such as a digital versatile disc (DVD) and having a display for displaying the reproduced image) and the like.

Figure 111A:
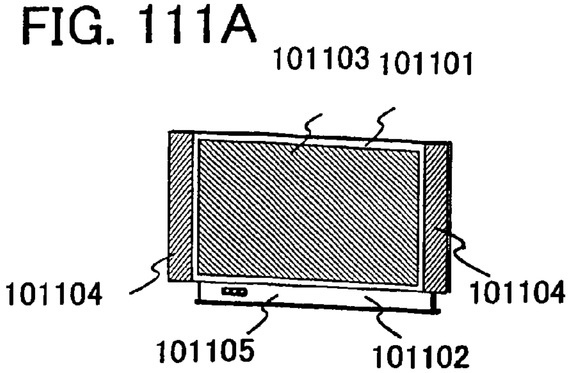
FIGS. 111A to 111H are diagrams each showing an example of an electronic appliance having a display device of the present invention for a display portion.

FIG. 111A shows a display which includes a housing 101101, a supporting base 101102, a display portion 101103, a speaker portion 101104, a video inputting terminal 101105, and the like. A display device of the present invention can be used for the display portion 101103. Note that the display includes all display devices for displaying information for a personal computer, for receiving television broadcasting, for displaying an advertisement, and the like.

In recent years, the need to grow in size of a display has been increased. In accordance with the enlargement of a display, rise in price becomes a problem. Therefore, an object is to reduce the manufacturing cost as much as possible and to provide a high quality product at as low price as possible. A display using the display device of the present invention for the display portion 101103 can be reduced in cost.

Figure 111B:
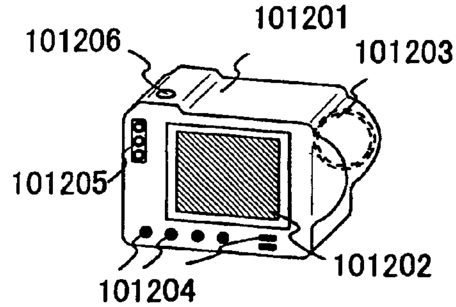

FIG. 111B shows a camera which includes a main body 101201, a display portion 101202, an image receiving portion 101203, operating keys 101204, an external connection port 101205, a shutter button 101206, and the like.

In recent years, in accordance with advance in performance of a digital camera and the like, competitive manufacturing thereof has been intensified. Thus, it is important to provide a higher-performance product at as low price as possible. A digital camera using the display device of the present invention for the display portion 101202 can be reduced in cost.

Figure 111C:
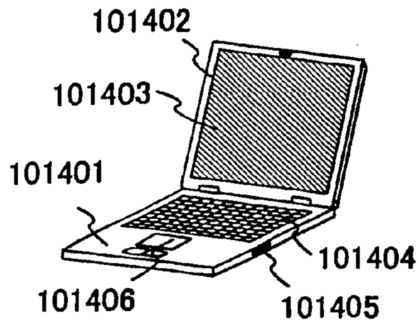

FIG. 111C shows a computer which includes a main body 101301, a housing 101302, a display portion 101303, a keyboard 101304, an external connection port 101305, a pointing device 101306, and the like. A computer using the display device of the present invention for the display portion 101303 can be reduced in cost.

Figure 111D:
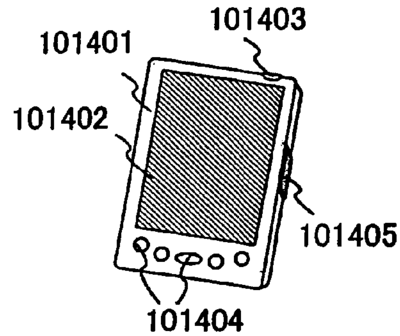

FIG. 111D shows a mobile computer which includes a main body 101401, a display portion 101402, a switch 101403, operating keys 101404, an infrared port 101405, and the like. A mobile computer using the display device of the present invention for the display portion 101402 can be reduced in cost.

Figure 111E:
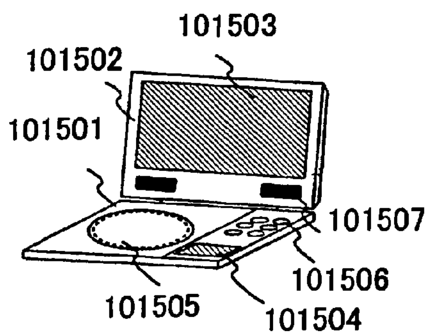

FIG. 111E shows a portable image reproducing device having a recording medium (specifically, a DVD reproducing device), which includes a main body 101501, a housing 101502, a display portion A 101503, a display portion B 101504, a recording medium (DVD or the like) reading portion 101505, an operating key 101506, a speaker portion 101507, and the like. The display portion A 101503 mainly displays image data and the display portion B 101504 mainly displays text data. An image reproducing device using the display device of the present invention for the display portions A 101503 and B 101504 can be reduced in cost.

Figure 111F:
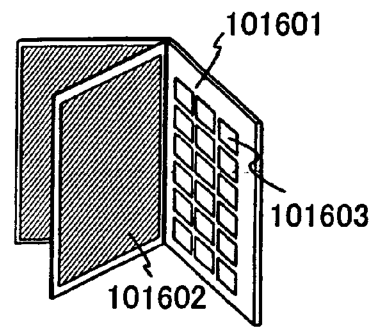

FIG. 111F shows a goggle-type display which includes a main body 101601, a display portion 101602, and an arm portion 101603. A goggle type display using the display device of the present invention for the display portion 101602 can be reduced in cost.

Figure 111G:
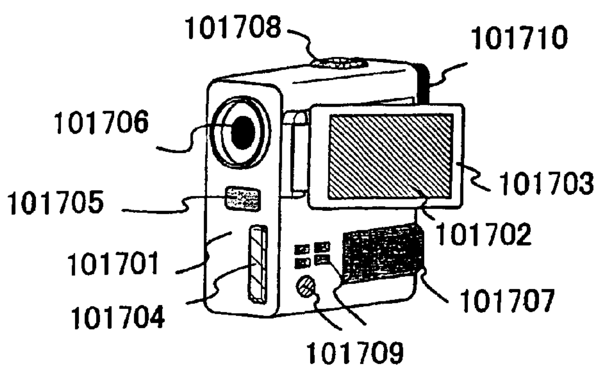

FIG. 111G shows a video camera which includes a main body 1017001, a display portion 1017002, a housing 1017003, an external connection port 1017004, a remote control receiving portion 1017005, an image receiving portion 1017006, a battery 1017007, an audio inputting portion 1017008, operating keys 1017009, an eye piece portion 101710, and the like. A video camera using the display device of the present invention for the display portion 1017002 can be reduced in cost.

Figure 111H:
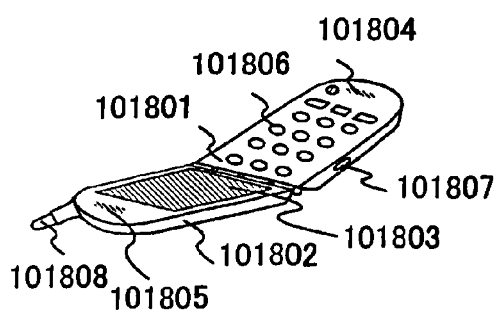

FIG. 111H shows a mobile phone which includes a main body 101801, a housing 101802, a display portion 101803, an audio inputting portion 101804, an audio outputting portion 101805, operating keys 101806, an external connection port 101807, an antenna 101808, and the like.

In recent years, a mobile phone is provided with a game function, a camera function, an electronic money function, or the like, and the need for a high-value added mobile phone has been increased. Further, the high definition display has been required. The mobile phone using the display device of the present invention for the display portion 101803 can be reduced in cost.

Thus, the present invention can be applied to various electronic appliances.

As described above, an electronic appliance according to the present invention is completed by incorporation of a liquid crystal display device of the present invention into a display portion. Such an electronic appliance of the present invention can display an image that is favorable both indoors and outdoors. In particular, an electronic appliance such as a camera or an image pickup device which is often used outdoors and indoors can fully exert advantageous effects, such as a wide viewing angle and less color-shift depending on an angle at which a display screen is seen, both indoors and outdoors.

Embodiment 13

In this embodiment, an application example where a display panel of the present invention is used is described by illustration of an application mode. A display panel of the present invention may be incorporated in a moving object, a structure, or the like.

Figure 113A:
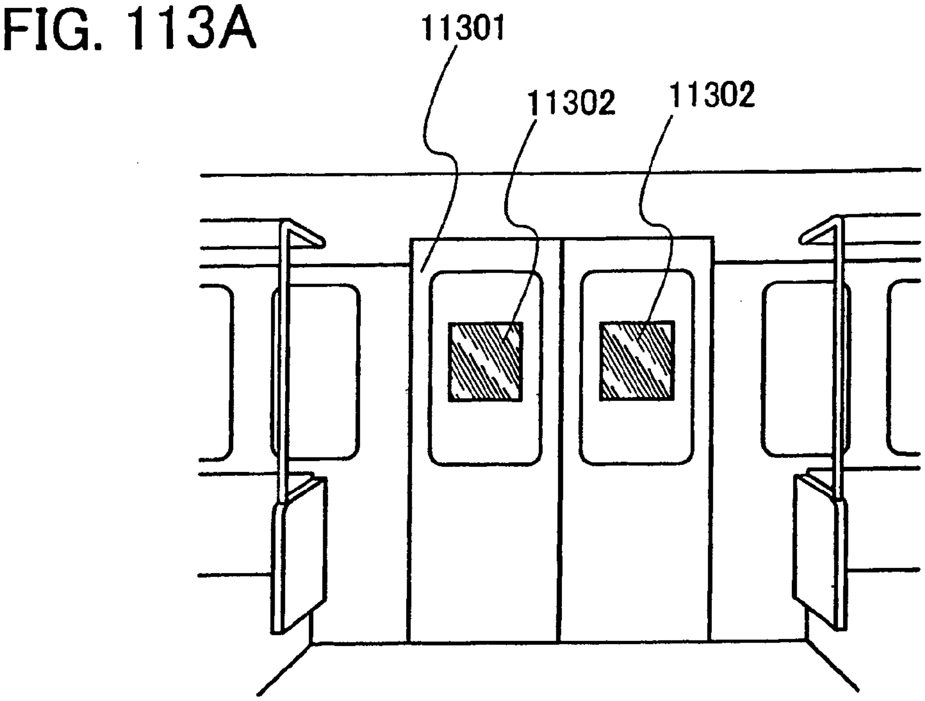
FIGS. 113A and 113B are each an application example of a display panel.
Figure 113B:
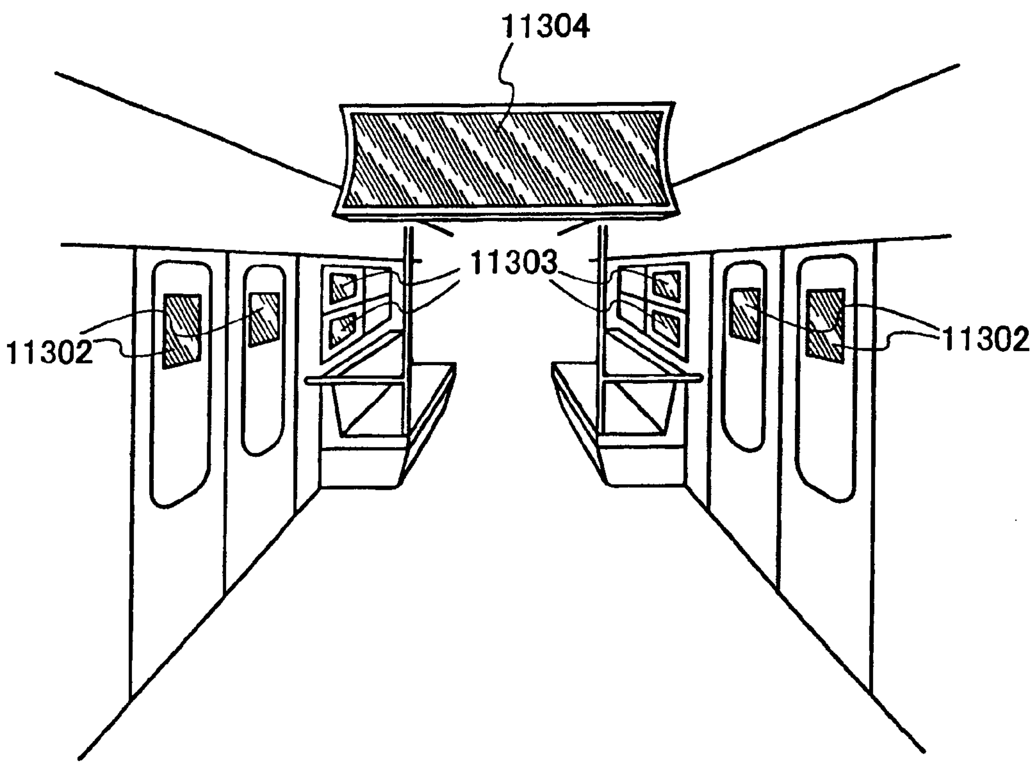

FIGS. 113A and 113B each show a moving object incorporating a display device as an example. FIG. 113A shows a display panel 11302 which is attached to a glass door in a train car body 11301, as an exemplary moving object incorporating a display device. The display panel 11302 shown in FIG. 113A can easily switch images displayed on the display portion in response to external signals. Therefore, images on the display panel can be periodically switched in accordance with the time cycle through which passengers' ages or sex vary, thereby more efficient advertising effect can be obtained.

Note that the position for setting a display panel of the present invention is not limited to a glass door of a train car body as shown in FIG. 113A, and thus a display panel can be applied to anywhere by change of the shape of the display panel. FIG. 113B shows an example thereof.

FIG. 113B shows an interior view of a train car body. In FIG. 113B, display panels 11303 attached to glass windows and a display panel 11304 hung on the ceiling are shown in addition to the display panels 11302 attached to the glass doors shown in FIG. 113A. The display panels 11303 have self-luminous display elements. Therefore, images are displayed for advertisement in rush hours, while no images are displayed in off-peak hours so that outside views can be seen from the train windows. In addition, the display panel 11304 of the present invention can be flexibly bent to perform display by provision of switching elements such as organic transistors over a substrate in a film form, and drive of self-luminous display elements.

Another application example of a moving object incorporating a display device using a display panel of the present invention is described with reference to FIG. 115.

Figure 115:
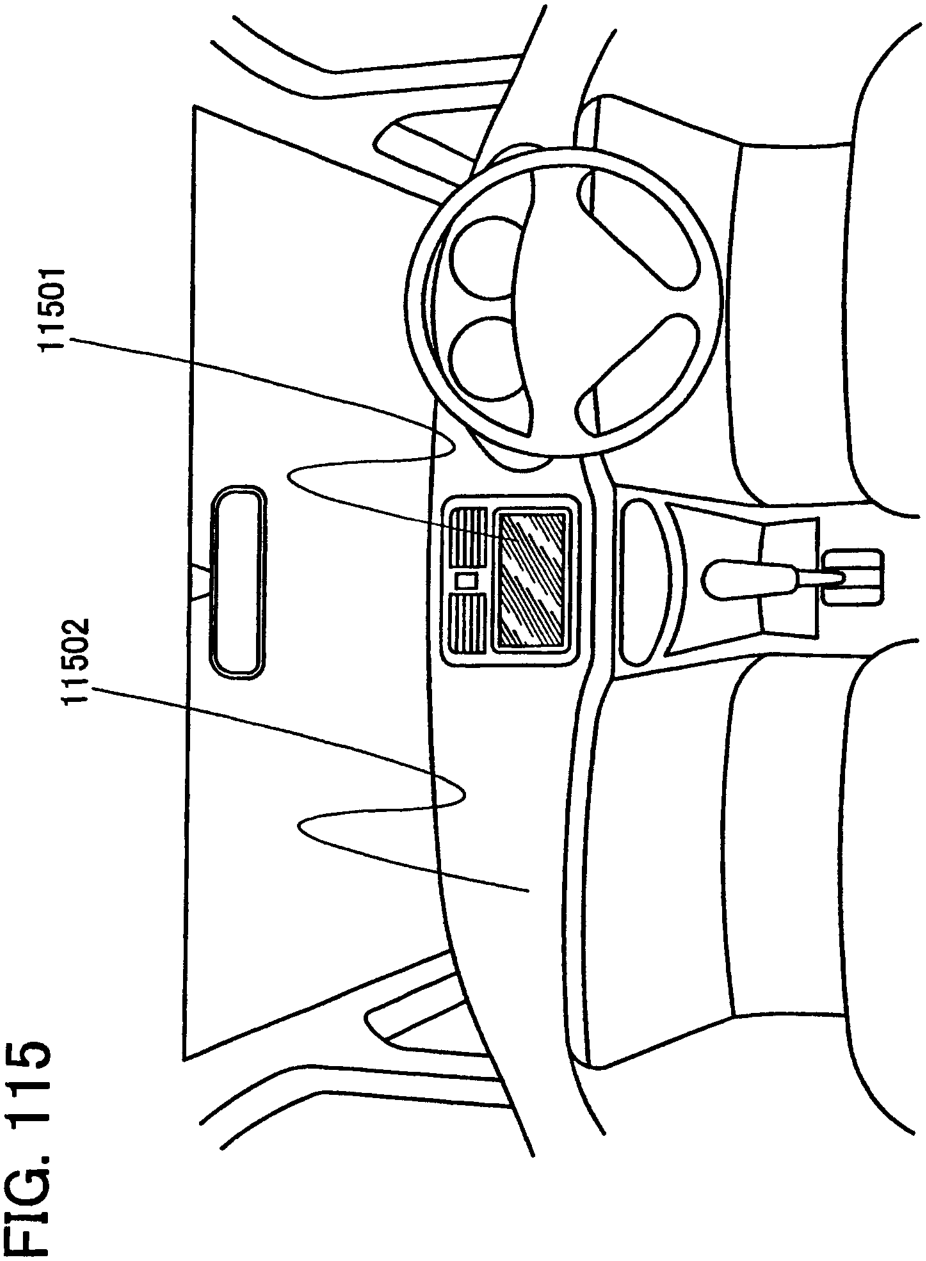
FIG. 115 is an application example of a display panel.

FIG. 115 shows a moving object incorporating a display device, as an exemplary display panel of the present invention. FIG. 115 shows an example of a display panel 11502 which is incorporated in a body 11501 of a car, as an exemplary moving object incorporating a display device. The display panel 11502 of the present invention shown in FIG. 115 is incorporated in a body of a car, and displays information on the operation of the car or information inputted from outside of the car on an on-demand basis. Further, it has a navigation function to a destination of the car.

Note that the position for setting a display panel of the present invention is not limited to a front portion of a car body as shown in FIG. 115, and thus a display panel can be applied to anywhere such as glass windows or doors by change of the shape of the display panel.

Another application example of a moving object incorporating a display device using a display panel of the present invention is described with reference to FIGS. 117A and 117B.

Figure 117A:
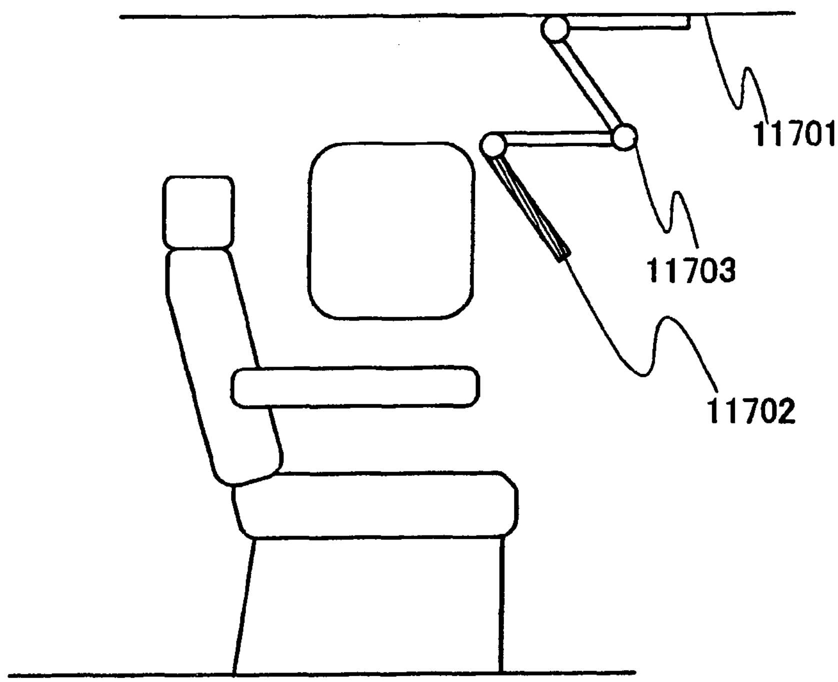
FIGS. 117 A and 117B are each an application example of a display panel.
Figure 117B:
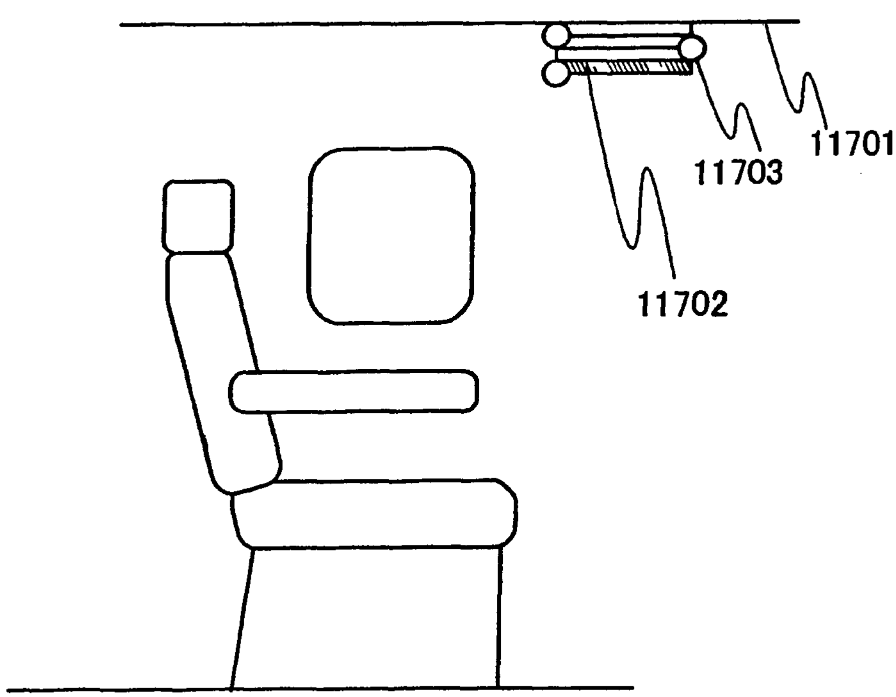

FIGS. 117A and 117B each show a moving object incorporating a display device, as an exemplary display panel of the present invention. FIG. 117A shows a display panel 11702 which is incorporated in the ceiling above the passenger's seat inside an airplane body 11701, as an exemplary moving object incorporating a display device. The display panel 11702 of the present invention shown in FIG. 117A is fixed on the airplane body 11701 with a hinge portion 11703, so that passengers can see the display panel 11702 with the help of a telescopic motion of the hinge portion 11703. The display panel 11702 has a function of displaying information or a function of an advertisement or amusement means with the operation of passengers. In addition, the display panel 11702 is stored in the airplane body 11701 by fold of the hinge portion 11703 as shown in FIG. 117B, thereby safety during the airplane's takeoff and landing can be secured. Note that display elements of the display panel are lighted in an emergency, thereby the display panel can also be utilized as a guide light of the airplane body 11701.

Note that the position for setting a display panel of the present invention is not limited to the ceiling of the airplane body 11701 shown in FIGS. 117A and 117B, and thus a display panel can be applied to anywhere such as seats or doors by change of the shape of the display panel. For example, the display panel may be set on the backside of a seat so that a passenger on the rear seat can operate and view the display panel.

Although this embodiment has illustrated a train car body, a car body, and an airplane body as exemplary moving objects, the present invention is not limited to these, and can be applied to motorbikes, four-wheeled vehicles (including cars, buses, and the like), trains (including monorails, railroads, and the like), ships and vessels, and the like. By employment of a display panel of the present invention, manufacturing cost of a display panel can be reduced, as well as a moving object having a display medium with an excellent operation can be provided. In addition, since images displayed on display panels incorporated in a moving object can be switched all at once by an external signal, in particular, the present invention is quite advantageous to be applied to advertisement display boards for unspecified number of customers, or information display boards in an emergency.

An example where a display panel of the present invention is applied to a structure is described with reference to FIG. 114.

Figure 114:
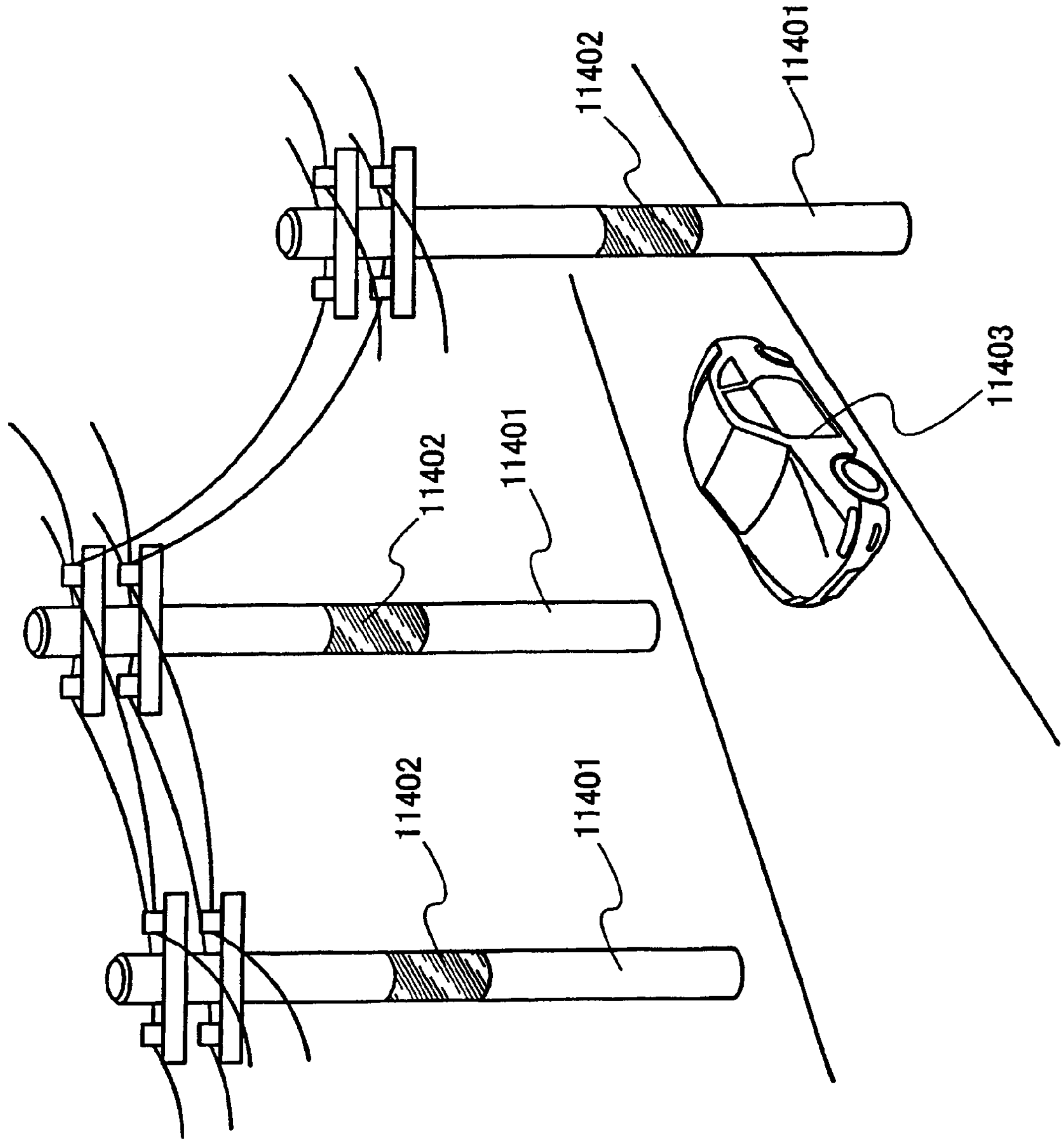
FIG. 114 is an application example of a display panel.

FIG. 114 illustrates an application example where a flexible display panel can be flexibly bent to perform display by provision of switching elements such as organic transistors over a substrate in a film form, and drive of self-luminous display elements, as an exemplary display panel of the present invention. In FIG. 114, a display panel is provided on a curved surface of an outside columnar object such as a telephone pole as a structure, and specifically, shown here is a structure where display panels 11402 are attached to telephone poles 11401 which are columnar objects.

The display panels 11402 shown in FIG. 114 are positioned at about a half height of the telephone poles, so as to be higher than the eye level of humans. When the display panels are viewed from a moving object 11403, images on the display panels 11402 can be recognized. By display of the same images on the display panels 11402 provided on the telephone poles standing together in large numbers, such as outside telephone poles, viewers can recognize the displayed information or advertisement. The display panels 11402 provided on the telephone poles 11401 in FIG. 114 can easily display the same images by using external signals; therefore, quite effective information display and advertising effects can be obtained. In addition, since self-luminous display elements are provided as display elements in the display panel of the present invention, it can be effectively used as a highly visible display medium even at night.

Another example where a display panel of the present invention is applied to a structure is described with reference to FIG. 116, which differs from FIG. 114.

Figure 116:
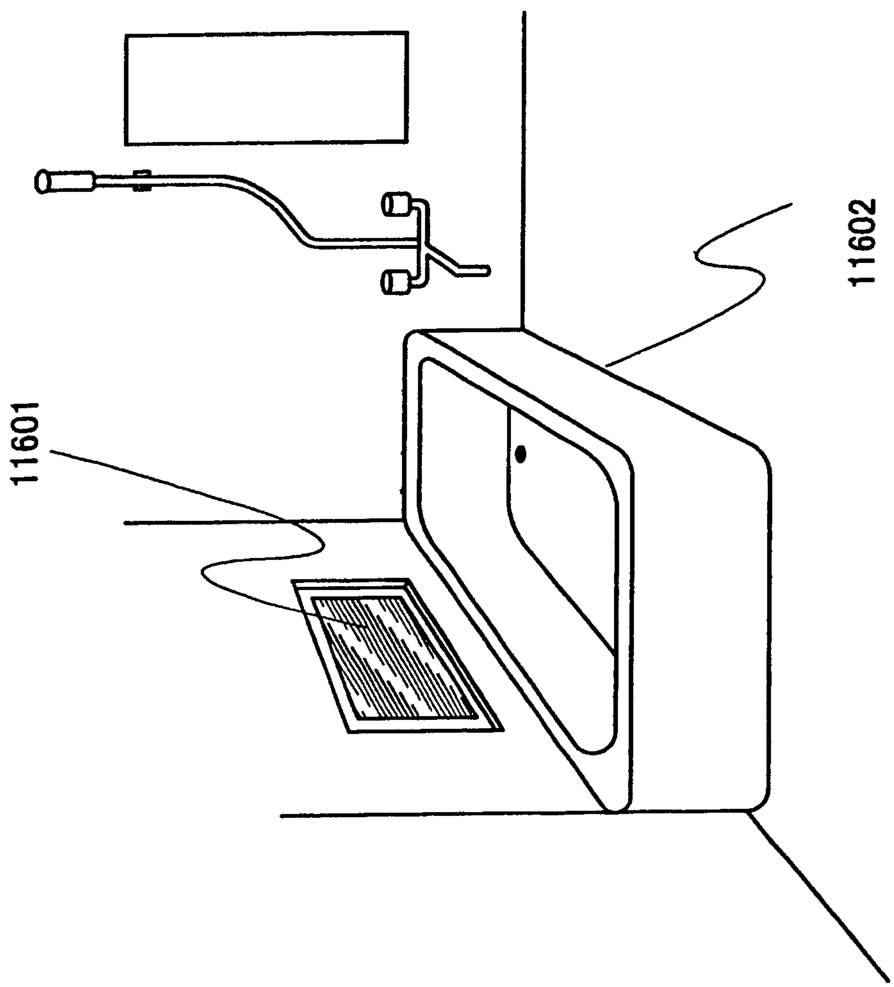
FIG. 116 is an application example of a display panel.

FIG. 116 shows another application example of a display panel which of the present invention. In FIG. 116, an example of a display panel 11602 which is incorporated in the sidewall of a prefabricated bath unit 11601 is shown. The display panel 11602 of the present invention shown in FIG. 116 is incorporated in the prefabricated bath unit 11601, so that a bather can view the display panel 11602. The display panel 11602 has a function of displaying information or a function of an advertisement or amusement means with the operation of a bather.

The position for setting a display panel of the present invention is not limited to the sidewall of the prefabricated bath unit 11601 shown in FIG. 116, and thus a display panel can be applied to anywhere by change of the shape of the display panel, for example, it can be incorporated in a part of a mirror or a bathtub.

Figure 112:
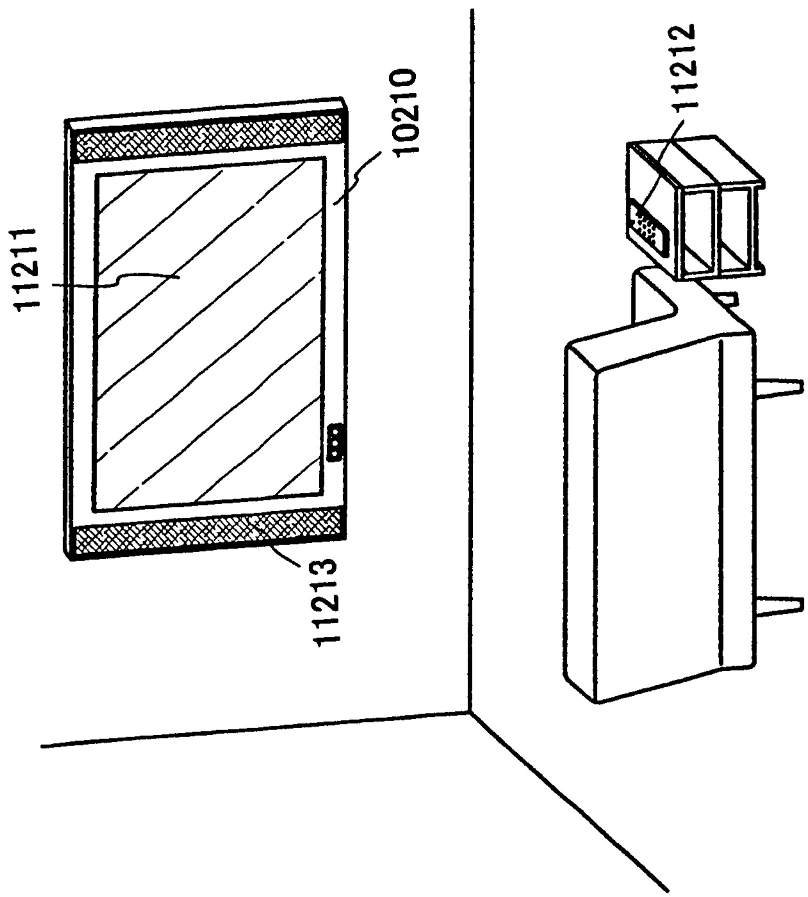
FIG. 112 is an application example of a display panel.

FIG. 112 shows an example where a television set having a large display portion is provided in a structure. FIG. 112 includes a housing 11210, a display portion 11211, a remote controlling device 11212 which is an operating portion, a speaker portion 11213, and the like. A display panel of the present invention is applied to the manufacturing of the display portion 11211. The television set in FIG. 112 is incorporated in a structure as a wall-hanging television set, and can be set without requiring a large space.

Although this embodiment has illustrated a telephone pole, a prefabricated bath unit, and the like as exemplary structures, this embodiment is not limited to these, and can be applied to any structures which can incorporate a display panel. By application of the display device of the present invention, manufacturing cost of a display device can be reduced, as well as a moving object having a display medium with an excellent operation can be provided.

This application is based on Japanese Patent Application serial no. 2006-155471 filed in Japan Patent Office on 2, Jun. 2006, the entire contents of which are hereby incorporated by reference.

What is claimed is:

1. A liquid crystal display device comprising:
a first substrate;
a semiconductor film comprising a channel formation region over the first substrate;
a gate electrode adjacent to the channel formation region with a gate insulating film interposed between the semiconductor film and the gate electrode;
a pixel electrode over the first substrate;
a conductive film over the pixel electrode;
a first insulating film over the pixel electrode;
a second insulating film over the first insulating film;
a common electrode over the second insulating film;
a liquid crystal over the common electrode; and
a second substrate over the liquid crystal,
wherein the first insulating film and the second insulating film comprise silicon nitride,
wherein the common electrode comprises indium and tin,
wherein the channel formation region of the semiconductor film does not overlap the common electrode,
wherein the pixel electrode and the common electrode overlap each other at least partially,
wherein the pixel electrode does not include a slit,
wherein the pixel electrode and the common electrode have transparent characteristic, and
wherein the conductive film is electrically connected to the pixel electrode and the conductive film is electrically connected to the semiconductor film.

2. The liquid crystal display device according to claim 1, wherein the conductive film comprises molybdenum.

3. The liquid crystal display device according to claim 1,
wherein the common electrode comprises a first slit and a second slit, and
wherein a long side of the first slit and a long side of the second slit are aligned along different directions.

4. The liquid crystal display device according to claim 1,
wherein the common electrode has a herring-bone structure, and
wherein the common electrode includes a plurality of slits in multiple directions.

5. The liquid crystal display device according to claim 1,
wherein the liquid crystal display device is configured so that orientation of the liquid crystal is controlled by an electric field generated by a voltage applied between the pixel electrode and the common electrode.

6. The liquid crystal display device according to claim 1, wherein the pixel electrode is in contact with the first substrate.

7. The liquid crystal display device according to claim 1, wherein the gate electrode is located under the gate insulating film.

8. An electronic device comprising the liquid crystal display device according to claim 1.

9. An electronic device comprising an antenna, a battery, and the liquid crystal display device according to claim 1,
wherein the liquid crystal display device is electrically connected to the antenna and the battery.

10. A portable information terminal comprising an operating key and the liquid crystal display device according to claim 1.

11. A liquid crystal display device comprising:
a first substrate;
a semiconductor film comprising a channel formation region over the first substrate;
a gate electrode adjacent to the channel formation region with a gate insulating film interposed between the semiconductor film and the gate electrode;
a pixel electrode over the first substrate
a conductive film over the semiconductor film;
a first insulating film over the pixel electrode;
a second insulating film over the first insulating film;
a common electrode over the second insulating film;
a liquid crystal over the common electrode; and
a second substrate over the liquid crystal,
wherein the first insulating film and the second insulating film comprise silicon nitride,
wherein the common electrode comprises indium and tin,
wherein the channel formation region of the semiconductor film does not overlap the common electrode,
wherein the pixel electrode and the common electrode overlap each other at least partially,
wherein the pixel electrode does not include a slit,
wherein the pixel electrode and the common electrode have transparent characteristic,
wherein the conductive film is electrically connected to the pixel electrode, and
wherein the channel formation region of the semiconductor film does not overlap the pixel electrode.

12. The liquid crystal display device according to claim 11, wherein the conductive film comprises molybdenum.

13. The liquid crystal display device according to claim 11,
wherein the common electrode comprises a first slit and a second slit, and
wherein a long side of the first slit and a long side of the second slit are aligned along different directions.

14. The liquid crystal display device according to claim 11,
wherein the common electrode has a herring-bone structure, and
wherein the common electrode includes a plurality of slits in multiple directions.

15. The liquid crystal display device according to claim 11,
wherein the liquid crystal display device is configured so that orientation of the liquid crystal is controlled by an electric field generated by a voltage applied between the pixel electrode and the common electrode.

16. The liquid crystal display device according to claim 11, wherein the pixel electrode is in contact with the first substrate.

17. The liquid crystal display device according to claim 11, wherein the gate electrode is located under the gate insulating film.

18. An electronic device comprising the liquid crystal display device according to claim 17.

19. An electronic device comprising an antenna, a battery, and the liquid crystal display device according to claim 11,
wherein the liquid crystal display device is electrically connected to the antenna and the battery.

20. A portable information terminal comprising an operating key and the liquid crystal display device according to claim 11.

21. A liquid crystal display device comprising:
a first substrate;
a semiconductor film comprising a channel formation region over the first substrate;
a gate electrode adjacent to the channel formation region with a gate insulating film interposed between the semiconductor film and the gate electrode;
a pixel electrode over the first substrate;
a conductive film over the pixel electrode;
a first insulating film over the pixel electrode;
a second insulating film over the first insulating film;
a common electrode over the second insulating film;
a liquid crystal over the common electrode; and
a second substrate over the liquid crystal, wherein the semiconductor film comprises a-InGaZnO, wherein the first insulating film and the second insulating film comprise silicon nitride, wherein the common electrode comprises indium and tin, wherein the channel formation region of the semiconductor film does not overlap the common electrode, wherein the pixel electrode and the common electrode overlap each other at least partially, wherein the pixel electrode does not include a slit, wherein the pixel electrode and the common electrode have transparent characteristic, and wherein the conductive film is electrically connected to the pixel electrode and the conductive film is electrically connected to the semiconductor film.

22. The liquid crystal display device according to claim 21, wherein the conductive film comprises molybdenum.

23. The liquid crystal display device according to claim 21, wherein the common electrode comprises a first slit and a second slit, and wherein a long side of the first slit and a long side of the second slit are aligned along different directions.

24. The liquid crystal display device according to claim 21, wherein the common electrode has a herring-bone structure, and wherein the common electrode includes a plurality of slits in multiple directions.

25. The liquid crystal display device according to claim 21, wherein the liquid crystal display device is configured so that orientation of the liquid crystal is controlled by an electric field generated by a voltage applied between the pixel electrode and the common electrode.

26. The liquid crystal display device according to claim 21, wherein the pixel electrode is in contact with the first substrate.

27. The liquid crystal display device according to claim 21, wherein the gate electrode is located under the gate insulating film.

28. An electronic device comprising the liquid crystal display device according to claim 21.

29. An electronic device comprising an antenna, a battery, and the liquid crystal display device according to claim 21, wherein the liquid crystal display device is electrically connected to the antenna and the battery.

30. A portable information terminal comprising an operating key and the liquid crystal display device according to claim 21.

* * * * *

UNITED STATES PATENT AND TRADEMARK OFFICE

CERTIFICATE OF CORRECTION

PATENT NO. : 8,610,862 B2
APPLICATION NO. : 13/795173
DATED : December 17, 2013
INVENTOR(S) : Hajime Kimura It is certified that error appears in the above-identified patent and that said Letters Patent is hereby corrected as shown below:

In the Specification:

Col. 7, line 24, "a part, of a gate electrode" should read --a part of a gate electrode--

Col. 9, line 36, "FIG. 19 is, a diagram" should read --FIG. 19 is a diagram--

Col. 14, line 25, "section of a Main structure" should read --section of a main structure--

Col. 15, line 13, "The transistor, of each" should read --The transistor of each--

Col. 22, line 62, "a so-called LPS mode" should read --a so-called IPS mode--

Col. 28, line 45, "The twenty-fifth, structure" should read --The twenty-fifth structure--

Col. 31, line 4, "as shown, in FIG." should read --as shown in FIG.--

Col. 36, line 36, "a main component; a" should read --a main component, a--

Col. 37, line 18, "(second electrode 1020 in" should read --(second electrode **102*f***) in--

Col. 37, line 60, "to cover, the gate" should read --to cover the gate--

Col. 38, line 62, "the second electrode 2031" should read --the second electrode **203*f***--

Col. 39, line 26, "the second electrode 2031" should read --the second electrode **203*f***--

Col. 39, line 54, "attached, to each other." should read --attached to each other.--

Col. 43, line 45, "FIG. 9 shows, a part of" should read --FIG. 9 shows a part of--

Col. 48, line 45, "first insulating, interposed" should read --first insulating film interposed--

Col. 54, line 42, "such as disinclination is" should read --such as disclination is--

Col. 58, line 14, "change in a potential, of" should read --change in a potential of--

Col. 66, line 23, "the first wiring **104*h*" should read --the first wiring --104*b***--

Col. 74, line 31, "plate-like (a, shape" should read --plate-like (a shape--

Col. 76, line 24, "the rust wiring **106*a*." should read --the first wiring 106*a***.--

Col. 76, line 26, "rust wiring **205*a*." should read --first wiring 205*a***.--

Col. 81, line 40, "may be, attached to" should read --may be attached to--

Signed and Sealed this
Twenty-second Day of April, 2014

*Michelle K. Lee*

Michelle K. Lee
*Deputy Director of the United States Patent and Trademark Office*